US011925104B2

(12) United States Patent
Ko et al.

(10) Patent No.: US 11,925,104 B2
(45) Date of Patent: Mar. 5, 2024

(54) ORGANOMETALLIC COMPOUND AND ORGANIC LIGHT-EMITTING DEVICE INCLUDING THE SAME

(71) Applicant: Samsung Display Co., Ltd., Yongin-si (KR)

(72) Inventors: Soobyung Ko, Yongin-si (KR); Sungbum Kim, Yongin-si (KR); Mina Jeon, Yongin-si (KR); Heechoon Ahn, Yongin-si (KR); Mieun Jun, Yongin-si (KR); Youngkook Kim, Yongin-si (KR); Seokhwan Hwang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 631 days.

(21) Appl. No.: 15/868,949

(22) Filed: Jan. 11, 2018

(65) Prior Publication Data

US 2019/0027699 A1 Jan. 24, 2019

(30) Foreign Application Priority Data

Jul. 21, 2017 (KR) ........................ 10-2017-0092947

(51) Int. Cl.
*H10K 85/30* (2023.01)
*C07F 15/00* (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
CPC ............... H01L 51/008; H01L 51/0062; H01L 51/0077; H01L 51/0079; H01L 51/0084;
(Continued)

(56) References Cited

U.S. PATENT DOCUMENTS 6,203,039 B1 3/2001 Gorden
7,381,479 B2 6/2008 Lamansky et al.
(Continued)

FOREIGN PATENT DOCUMENTS

CN 102382131 A 3/2012
CN 103102370 A 5/2013
(Continued)

OTHER PUBLICATIONS

Bell, Bruce et al. "Boron-Based TADF Emitters With Improved OLED Device Efficiency Roll-Off and Long Lifetime." Dyes and Pigments. 141 (2017): 83-92.) (Year: 2017).*
(Continued)

*Primary Examiner* — Jenna N Chandhok
(74) *Attorney, Agent, or Firm* — Lewis Roca Rothgerber Christie LLP

(57) ABSTRACT

Provided are an organometallic compound represented by Formula 1 and an organic light-emitting device including the same. The organic light-emitting device includes: a first electrode; a second electrode; an organic layer disposed between the first electrode and the second electrode, the organic layer including an emission layer and the organometallic compound represented by Formula 1.

19 Claims, 2 Drawing Sheets

(51) Int. Cl.

| | |
|---|---|
| ***C09K 11/06*** | (2006.01) |
| ***H10K 50/11*** | (2023.01) |
| ***H10K 50/81*** | (2023.01) |
| ***H10K 50/82*** | (2023.01) |
| ***H10K 101/10*** | (2023.01) |

(52) U.S. Cl.
CPC ......... *H10K 85/341* (2023.02); *H10K 85/371* (2023.02); *C09K 2211/1029* (2013.01); *C09K 2211/1044* (2013.01); *C09K 2211/1059* (2013.01); *C09K 2211/185* (2013.01); *C09K 2211/188* (2013.01); *H10K 50/11* (2023.02); *H10K 50/81* (2023.02); *H10K 50/82* (2023.02); *H10K 85/322* (2023.02); *H10K 2101/10* (2023.02)

(58) Field of Classification Search
CPC ............. H01L 51/0085; H01L 51/0086; H01L 51/0087; H01L 51/0088; H01L 51/0092; C09K 11/63; C09K 2211/1059; C09K 2211/1029; C09K 2211/1044; C09K 2211/188; C09K 2211/185; C07F 15/0086; C07F 1/08; C07F 1/10; C07F 1/12; C07F 15/006; H10K 85/346; H10K 85/341; H10K 85/371; H10K 85/322
See application file for complete search history.

(56) References Cited

U.S. PATENT DOCUMENTS

| | | | |
|---|---|---|---|
| 7,393,599 | B2 | 7/2008 | Thompson et al. |
| 7,482,451 | B2 | 1/2009 | Thompson et al. |
| 7,585,573 | B2 | 9/2009 | Lee et al. |
| 7,776,458 | B2 | 8/2010 | Ragini et al. |
| 8,106,199 | B2 | 1/2012 | Jabbour et al. |
| 8,389,725 | B2 | 3/2013 | Li et al. |
| 8,586,203 | B2 | 11/2013 | Kwong et al. |
| 8,669,364 | B2 | 3/2014 | Li et al. |
| 8,680,760 | B2 | 3/2014 | Cheng et al. |
| 8,816,080 | B2 | 8/2014 | Li et al. |
| 8,835,021 | B2 | 9/2014 | Yersin et al. |
| 8,846,940 | B2 | 9/2014 | Li et al. |
| 8,871,361 | B2 | 10/2014 | Xia et al. |
| 8,946,417 | B2 | 2/2015 | Jian et al. |
| 9,051,344 | B2 | 6/2015 | Lin et al. |
| 9,076,974 | B2 | 7/2015 | Li et al. |
| 9,203,039 | B2 | 12/2015 | Li et al. |
| 9,221,770 | B2 | 12/2015 | Kathirgamanathan et al. |
| 9,221,857 | B2 | 12/2015 | Li et al. |
| 9,224,963 | B2 | 12/2015 | Li et al. |
| 9,231,218 | B2 | 1/2016 | Lin et al. |
| 9,238,668 | B2 | 1/2016 | Li et al. |
| 9,312,502 | B2 | 4/2016 | Li et al. |
| 9,324,957 | B2 | 4/2016 | Li et al. |
| 9,382,273 | B2 | 7/2016 | Li et al. |
| 9,425,415 | B2 | 8/2016 | Li et al. |
| 9,493,698 | B2 | 11/2016 | Beers et al. |
| 9,673,409 | B2 | 6/2017 | Li et al. |
| 9,783,564 | B2 | 10/2017 | Kottas et al. |
| 2005/0287394 | A1 | 12/2005 | Yang et al. |
| 2008/0018221 | A1 | 1/2008 | Egen et al. |
| 2011/0301351 | A1 | 12/2011 | Li et al. |
| 2012/0223634 | A1 | 9/2012 | Xia et al. |
| 2013/0082245 | A1 | 4/2013 | Kottas et al. |
| 2013/0168656 | A1 | 7/2013 | Tsai et al. |
| 2014/0309428 | A1 | 10/2014 | Egen et al. |
| 2015/0021590 | A1 | 1/2015 | Wu et al. |
| 2015/0194616 | A1 | 7/2015 | Li et al. |
| 2015/0228914 | A1 | 8/2015 | Li et al. |
| 2015/0274762 | A1 | 10/2015 | Li et al. |
| 2015/0349279 | A1 | 12/2015 | Li et al. |
| 2016/0028028 | A1 | 1/2016 | Li et al. |
| 2016/0028029 | A1 | 1/2016 | Li et al. |
| 2016/0043331 | A1 | 2/2016 | Li et al. |
| 2016/0133861 | A1 | 5/2016 | Li et al. |
| 2016/0133862 | A1 | 5/2016 | Li et al. |
| 2016/0194344 | A1 | 7/2016 | Li et al. |
| 2016/0197291 | A1 | 7/2016 | Li et al. |
| 2016/0285014 | A1 | 9/2016 | Kottas et al. |
| 2016/0285015 | A1 | 9/2016 | Li et al. |

FOREIGN PATENT DOCUMENTS

| | | | |
|---|---|---|---|
| CN | 103102372 | A | 5/2013 |
| CN | 103476781 | A | 12/2013 |
| CN | 104370974 | A | 2/2015 |
| EP | 2574613 | A1 | 4/2013 |
| JP | 2005-535719 | A | 11/2005 |
| JP | 2007-45742 | | 2/2007 |
| JP | 2009-096946 | A | 5/2009 |
| JP | 2012-500235 | A | 1/2012 |
| JP | 2012-527472 | A | 11/2012 |
| JP | 2013-053149 | A | 3/2013 |
| JP | 2013-079235 | A | 5/2013 |
| JP | 2014-507444 | A | 3/2014 |
| JP | 2014-058504 | A | 4/2014 |
| JP | 2014-239225 | A | 12/2014 |
| KR | 10-0730115 | | 6/2007 |
| KR | 10-2011-0063713 | | 6/2011 |
| WO | WO 2005-118606 | A1 | 12/2005 |
| WO | WO 2006/098120 | A1 | 9/2006 |
| WO | WO 2012/116231 | A2 | 8/2012 |
| WO | WO 2012-121936 | A2 | 9/2012 |

OTHER PUBLICATIONS

Kanno, et al. "Stacked White Organic Light-Emitting Devices Based on a Combination of Fluoescent and Phosphorescent Emitters." Applied Physics Letters. 89 (2006): 023503 (Year: 2006).*

Rao, Ying-Li et al. "Stepwise Intramolecular Photoisomerization of NHC-Chelate Dimesitylboron Compounds with C—C bond Formation and C—H Bond Insertion." JACS. 134 (2012): 11026-11034. (Year: 2012).*

Venkata S. Sadu, et al., "One-pot synthesis of four-coordinate boron (III) complexes by the ligand-promoted organic group migration between boronic acids," Scientific Reports, vol. 7, No. 242, Mar. 21, 2017, pp. 1-10.

EPO Extended Search Report dated Nov. 6, 2018, for corresponding European Patent Application No. 18184583.5 (8 pages).

* cited by examiner

ORGANOMETALLIC COMPOUND AND ORGANIC LIGHT-EMITTING DEVICE INCLUDING THE SAME

CROSS-REFERENCE TO RELATED APPLICATION

This application claims priority to and the benefit of Korean Patent Application No. 10-2017-0092947, filed on Jul. 21, 2017, in the Korean Intellectual Property Office, the disclosure of which is incorporated herein in its entirety by reference.

BACKGROUND

1. Field

One or more embodiments relate to an organometallic compound and an organic light-emitting device including the same.

2. Description of the Related Art

Organic light-emitting devices are self-emission devices that produce full-color images, and also have wide viewing angles, high contrast ratios, short response times, as well as excellent characteristics in terms of brightness, driving voltage, and response speed.

An example of such organic light-emitting devices may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state, thereby generating light.

SUMMARY

Aspects of the present disclosure provide an organometallic compound and an organic light-emitting device including the same.

Additional aspects will be set forth in part in the description which follows and, in part, will be apparent from the description, or may be learned by practice of the presented embodiments.

An aspect provides an organometallic compound represented by Formula 1 below:

Formula 1

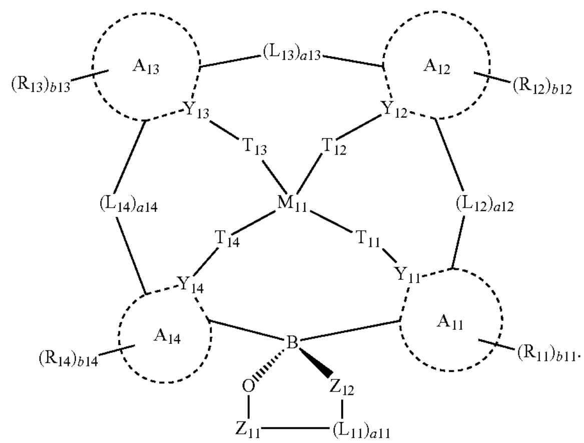

In Formula 1, $M_{11}$ may be selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm), $A_{11}$ to $A_{14}$ may each independently be a $C_5$-$C_{60}$ carbocyclic group or a $C_1$-$C_{60}$ heterocyclic group, $Y_{11}$ to $Y_{14}$ may each independently be N or C, $Z_{11}$ and $Z_{12}$ may each independently be selected from N, C, O, S, a single bond, a substituted or unsubstituted $C_5$-$C_{60}$ carbocyclic group, and a substituted or unsubstituted $C_1$-$C_{60}$ heterocyclic group, $T_{11}$ to $T_{14}$ may each independently be selected from a single bond, O, and S, $L_{11}$ to $L_{14}$ may each independently be selected from a single bond, *—O—*', *—S—*', *—C($R_{17}$)($R_{18}$)—*', *—C($R_{17}$)=*', *=C($R_{17}$)—*', *—C($R_{17}$)=C($R_{18}$)—*', *—C(=O)—*', *—C(=S)—*', *—C≡C—*', *—B($R_{17}$)—*', *—N($R_{17}$)—*', *—P($R_{17}$)—*', *—Si($R_{17}$)($R_{18}$)—*', *—P($R_{17}$)($R_{18}$)—*', and *—Ge($R_{17}$)($R_{18}$)—*', a11 to a14 may each independently be selected from 0, 1, 2, and 3, at least two of a12, a13, and a14 may each independently be selected from 1, 2, and 3, when a11 is zero, $(L_{11})_{a11}$ is a single bond, when a12 is zero, $A_{11}$ and $A_{12}$ are not linked to each other, when a13 is zero, $A_{12}$ and $A_{13}$ are not linked to each other, and when a14 is zero, $A_{13}$ and $A_{14}$ are not linked to each other, $R_{11}$ to $R_{14}$, $R_{17}$, and $R_{18}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—B(Q_1)(Q_2)$, $—N(Q_1)(Q_2)$, $—P(Q_1)(Q_2)$, $—C(=O)(Q_1)$, $—S(=O)(Q_1)$, $—S(=O)_2(Q_1)$, $—P(=O)(Q_1)(Q_2)$, and $—P(=S)(Q_1)(Q_2)$, $R_{17}$ and $R_{11}$, $R_{17}$ and $R_{12}$, $R_{17}$ and $R_{13}$, and/or $R_{17}$ and $R_{14}$ may optionally be linked to form a substituted or unsubstituted $C_5$-$C_{60}$ carbocyclic group or a substituted or unsubstituted $C_1$-$C_{60}$ heterocyclic group, $R_{17}$ and $R_{18}$ may optionally be linked to form a substituted or unsubstituted $C_5$-$C_{60}$ carbocyclic group or a substituted or unsubstituted $C_1$-$C_{60}$ heterocyclic group, b11 to b14 may each independently be selected from 1, 2, 3, 4, 5, 6, 7, and 8, $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group, and

* and *' each indicate a binding site to a neighboring atom.

Another aspect provides an organic light-emitting device including: a first electrode; a second electrode; an organic layer disposed between the first electrode and the second electrode, wherein the organic layer includes an emission layer and the organometallic compound represented by Formula 1.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
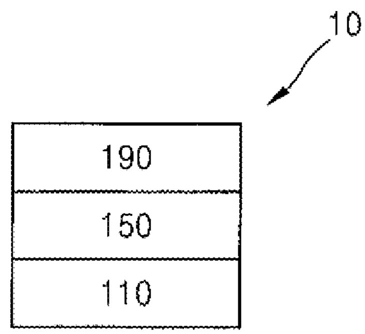
FIG. 1 is a schematic cross-sectional view of an organic light-emitting device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain certain aspects. As used herein, the term "and/or" includes any and all combinations of one or more of the associated listed items. Expressions such as "at least one of," when preceding a list of elements, modify the entire list of elements and do not modify the individual elements of the list.

The present disclosure will now be described more fully with reference to exemplary embodiments. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Features of embodiments of the present disclosure, and how to achieve them, will become apparent by reference to the embodiment that will be described later in more detail, together with the accompanying drawings. The subject matter of the present disclosure may, however, be embodied in many different forms and should not be limited to the exemplary embodiments.

Hereinafter, embodiments are described in more detail by referring to the attached drawings, and in the drawings, like reference numerals denote like elements, and a redundant explanation thereof will not be provided herein.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. For example, intervening layers, regions, or components may be present.

In the drawings, components may be exaggerated or reduced in size for convenience of explanation. In other words, since sizes and thicknesses of components in the drawings may be arbitrarily illustrated for convenience of explanation, the following embodiments of the present disclosure are not limited thereto.

An organometallic compound according to an embodiment is represented by Formula 1 below:

Formula 1

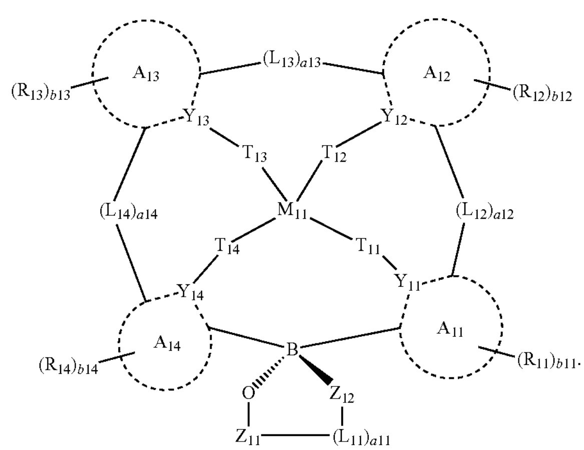

$M_{11}$ in Formula 1 may be selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm).

For example, $M_{11}$ in Formula 1 may be selected from Pt, Pd, Cu, Ag, Au, Rh, Ir, Ru, and Os, but embodiments of the present disclosure are not limited thereto.

In one embodiment, $M_{11}$ in Formula 1 may be selected from Pt, Pd, Cu, Ag, and Au, but embodiments of the present disclosure are not limited thereto.

$A_{11}$ to $A_{14}$ in Formula 1 may each independently be a $C_5$-$C_{60}$ carbocyclic group or a $C_1$-$C_{60}$ heterocyclic group, but embodiments of the present disclosure are not limited thereto.

For example, $A_{11}$ to $A_{14}$ in Formula 1 may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indeno pyridine group, an indolopyridine group, a benzofuropyridine group, a benzothienopyridine group, a benzosilolopyridine group, an indeno pyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline, but embodiments of the present disclosure are not limited thereto.

In one embodiment, $A_{11}$ to $A_{14}$ in Formula 1 may each independently be selected from a benzene group, a naphthalene group, a cyclopentadiene group, a 1,2,3,4-tetrahydronaphthalene group, a furan group, a thiophene group, an indene group, a fluorene group, an indole group, a carbazole group, a benzofuran group, a dibenzofuran group, a benzothiophene group, a dibenzothiophene group, an indeno pyridine group, an indolopyridine group, a benzofuropyridine group, a benzothienopyridine group, an indeno pyrimidine group, an indolopyrimidine group, a benzofuropyrimidine group, a benzothienopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline, but embodiments of the present disclosure are not limited thereto.

In one embodiment, $A_{11}$ to $A_{14}$ in Formula 1 may each independently be selected from a benzene group, a naphthalene group, an indene group, a fluorene group, an indole group, a carbazole group, a benzofuran group, a dibenzofuran group, a benzothiophene group, a dibenzothiophene group, a pyridine group, a pyrimidine group, a pyrazine group, a triazine group, a quinoline group, an isoquinoline group, a quinoxaline group, a quinazoline group, a pyrazole group, an imidazole group, a 2,3-dihydroimidazole group, a triazole group, a 2,3-dihydrotriazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, and a 2,3-dihydroimidazopyrazine group, but embodiments of the present disclosure are not limited thereto.

In one embodiment, $A_{11}$ to $A_{14}$ in Formula 1 may each independently be represented by one of Formulae 2-1 to 2-43, but embodiments of the present disclosure are not limited thereto:

2-1

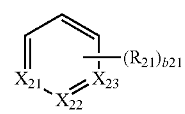

2-2

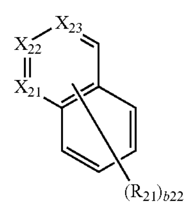

2-3

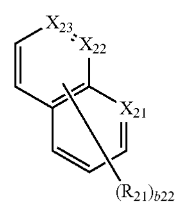

2-4

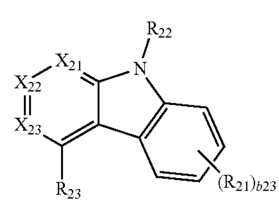

2-5

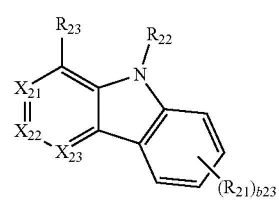

-continued
2-6
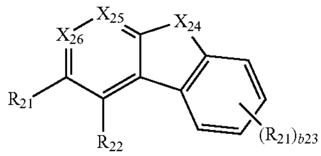
2-7
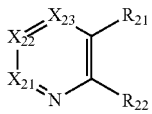
2-8
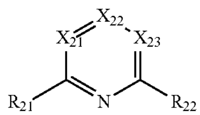
2-9
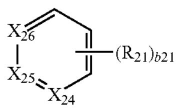
2-10
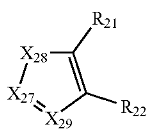
2-11
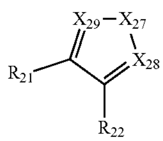
2-12
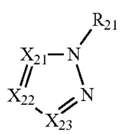
2-13
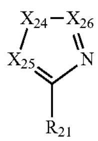
2-14
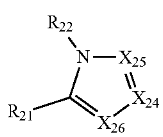
2-15
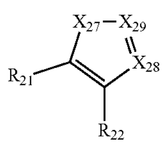
2-16
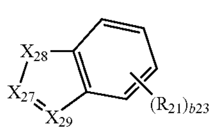
-continued
2-17
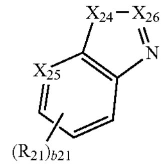
2-18
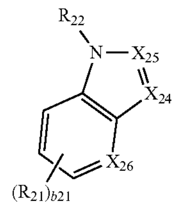
2-19
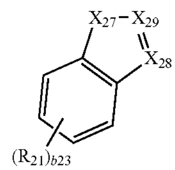
2-20
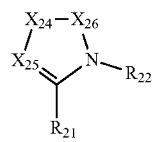
2-21
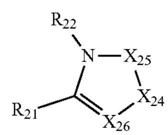
2-22
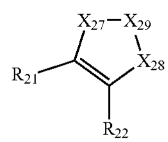
2-23
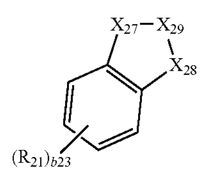
2-24
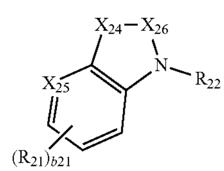
2-25
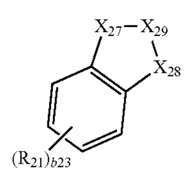

-continued 2-26

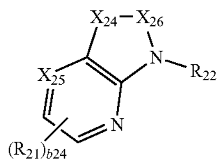

2-27

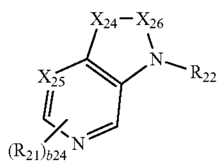

2-28

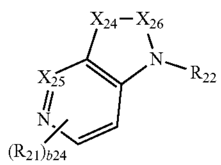

2-29

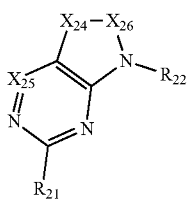

2-30

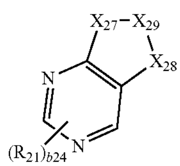

2-31

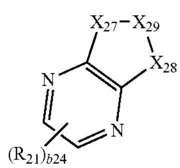

2-32

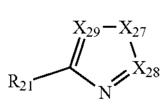

2-33

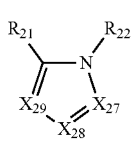

2-34

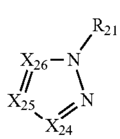

2-35

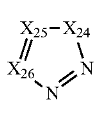

-continued 2-36

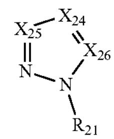

2-37

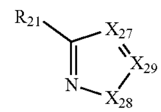

2-38

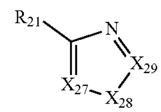

2-39

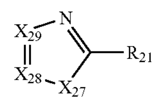

2-40

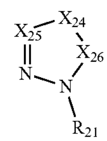

2-41

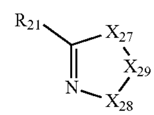

2-42

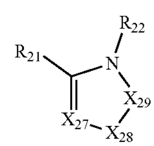

2-43

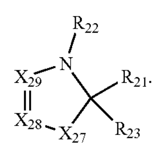

In Formulae 2-1 to 2-43, $X_{21}$ to $X_{23}$ may each independently be $C(R_{24})$ or C—*, provided that at least two of $X_{21}$ to $X_{23}$ are each C—*, $X_{24}$ may be N—*, and $X_{25}$ and $X_{26}$ may each independently be $C(R_{24})$ or C—*, provided that at least one of $X_{25}$ and $X_{26}$ is C—*, $X_{27}$ and $X_{28}$ may each independently be selected from N, $N(R_{25})$, and N—*, and $X_{29}$ may be $C(R_{24})$ or C—*, provided that i) at least one of $X_{27}$ and $X_{28}$ is N—*, and $X_{29}$ is C—*, or ii) $X_{27}$ and $X_{28}$ are each N—*, and $X_{29}$ is $C(R_{24})$, $R_{21}$ to $R_{24}$ are each independently the same as described in connection with $R_{11}$ in Formula 1, b21 may be selected from 1, 2, and 3, b22 may be selected from 1, 2, 3, 4, and 5, b23 may be selected from 1, 2, 3, and 4, b24 may be 1 or 2, and

* indicates a binding site to a neighboring atom.

$Y_{11}$ to $Y_{14}$ in Formula 1 may each independently be N or C.

For example, in Formula 1, $Y_{11}$, $Y_{12}$, and $Y_{13}$ may each be C, and $Y_{14}$ may be N;

$Y_{11}$, $Y_{12}$, and $Y_{14}$ may each be C, and $Y_{13}$ may be N;

$Y_{11}$, $Y_{13}$, and $Y_{14}$ may each be C, and $Y_{12}$ may be N;

$Y_{12}$, $Y_{13}$, and $Y_{14}$ may each be C, and $Y_{11}$ may be N;

$Y_{11}$ and $Y_{14}$ may each be C, and $Y_{12}$ and $Y_{13}$ may each be N;

$Y_{11}$ and $Y_{14}$ may each be N, and $Y_{12}$ and $Y_{13}$ may each be C;

$Y_{11}$ and $Y_{12}$ may each be C, and $Y_{13}$ and $Y_{14}$ may each be N;

$Y_{11}$ and $Y_{12}$ may each be N, and $Y_{13}$ and $Y_{14}$ may each be C;

$Y_{11}$ and $Y_{13}$ may each be C, and $Y_{12}$ and $Y_{14}$ may each be N; or $Y_{11}$ and $Y_{13}$ may each be N, and $Y_{12}$ and $Y_{14}$ may each be C, but embodiments of the present disclosure are not limited thereto.

In one embodiment, in Formula 1, $Y_{11}$, $Y_{13}$, and $Y_{14}$ may each be C, and $Y_{12}$ may be N;

$Y_{11}$ and $Y_{14}$ may each be C, and $Y_{12}$ and $Y_{13}$ may each be N; or $Y_{11}$ and $Y_{13}$ may each be C, and $Y_{12}$ and $Y_{14}$ may each be N, but embodiments of the present disclosure are not limited thereto.

$Z_{11}$ and $Z_{12}$ in Formula 1 may each independently be selected from N, C, O, S, a single bond, a substituted or unsubstituted $C_5$-$C_{60}$ carbocyclic group, and a substituted or unsubstituted $C_1$-$C_{60}$ heterocyclic group, but embodiments of the present disclosure are not limited thereto.

For example, $Z_{11}$ and $Z_{12}$ in Formula 1 may each independently be selected from:

N, C, O, S, a single bond, a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indeno pyridine group, an indolopyridine group, a benzofuropyridine group, a benzothienopyridine group, a benzosilolopyridine group, an indeno pyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline;

a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indeno pyridine group, an indolopyridine group, a benzofuropyridine group, a benzothienopyridine group, a benzosilolopyridine group, an indeno pyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline, each substituted with at least one selected from deuterium, —F, —Cl, —Br, —I, a hydroxyl group, a cyano group, a nitro group, an amidino group, a hydrazino group, a hydrazono group, $—CD_3$, $—CD_2H$, $—CDH_2$, $—CF_3$, $—CF_2H$, $—CFH_2$, $C_1$-$C_{60}$ alkyl group, a $C_2$-$C_{60}$ alkenyl group, a $C_2$-$C_{60}$ alkynyl group, and a $C_1$-$C_{60}$ alkoxy group; and a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indeno pyridine group, an indolopyridine group, a benzofuropyridine group, a benzothienopyridine group, a benzosilolopyridine group, an indeno pyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{31})(Q_{32})(Q_{33})$, $—N(Q_{31})$ $(Q_{32})$, —$B(Q_{31})(Q_{32})$, —$C(=O)(Q_{31})$, —$S(=O)_2(Q_{31})$, and —$P(=O)(Q_{31})(Q_{32})$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group, but embodiments of the present disclosure are not limited thereto.

In one embodiment, $Z_{11}$ and $Z_{12}$ in Formula 1 may each independently be selected from:

N, C, O, S, a single bond, a benzene group, a cyclopentadiene group, a furan group, a thiophene group, a silole group, a dihydropyridine group, a pyridine group, a pyrimidine group, a pyrazine group, a pyridazine group, a triazine group, a quinoline group, an isoquinoline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group;

a benzene group, a cyclopentadiene group, a furan group, a thiophene group, a silole group, a dihydropyridine group, a pyridine group, a pyrimidine group, a pyrazine group, a pyridazine group, a triazine group, a quinoline group, an isoquinoline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group, each substituted with at least one selected from deuterium, —F, —Cl, —Br, —I, a hydroxyl group, a cyano group, a nitro group, an amidino group, a hydrazino group, a hydrazono group, —$CD_3$, —$CD_2H$, —$CDH_2$, —$CF_3$, —$CF_2H$, —$CFH_2$, a methyl group, an ethyl group, an n-propyl group, an iso-propyl group, an n-butyl group, an isobutyl group, a sec-butyl group, a tert-butyl group, an n-pentyl group, an iso-pentyl group, a sec-pentyl group, a tert-pentyl group, a methoxy group, an ethoxy group, a propoxy group, a butoxy group, and a pentoxy group; and a benzene group, a cyclopentadiene group, a furan group, a thiophene group, a silole group, a dihydropyridine group, a pyridine group, a pyrimidine group, a pyrazine group, a pyridazine group, a triazine group, a quinoline group, an isoquinoline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group, each substituted with at least one selected from deuterium, —F, —Cl, —Br, —I, a hydroxyl group, a cyano group, a nitro group, an amidino group, a hydrazino group, a hydrazono group, a cyclopentyl group, a cyclohexyl group, a cycloheptyl group, a phenyl group, a biphenyl group, a terphenyl group, a naphthyl group, —$Si(Q_{31})(Q_{32})(Q_{33})$, —$N(Q_{31})(Q_{32})$, and —$C(=O)(Q_{31})$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, a methoxy group, an ethoxy group, a propoxy group, a butoxy group, a pentoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a cyclopentyl group, a cyclohexyl group, a cycloheptyl group, a phenyl group, a biphenyl group, a terphenyl group, and a naphthyl group, but embodiments of the present disclosure are not limited thereto.

In one embodiment, in Formula 1, $Z_{11}$ may be selected from:

N, C, O, S, a single bond, a benzene group, a cyclopentadiene group, a furan group, a thiophene group, a silole group, a dihydropyridine group, a pyridine group, a pyrimidine group, a pyrazine group, a pyridazine group, a triazine group, a quinoline group, an isoquinoline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group;

a benzene group, a cyclopentadiene group, a furan group, a thiophene group, a silole group, a dihydropyridine group, a pyridine group, a pyrimidine group, a pyrazine group, a pyridazine group, a triazine group, a quinoline group, an isoquinoline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group, each substituted with at least one selected from deuterium, —F, —Cl, —Br, —I, a hydroxyl group, a cyano group, a nitro group, an amidino group, a hydrazino group, a hydrazono group, —$CD_3$, —$CD_2H$, —$CDH_2$, —$CF_3$, —$CF_2H$, —$CFH_2$, a methyl group, an ethyl group, an n-propyl group, an iso-propyl group, an n-butyl group, an isobutyl group, a sec-butyl group, a tert-butyl group, an n-pentyl group, an iso-pentyl group, a sec-pentyl group, a tert-pentyl group, a methoxy group, an ethoxy group, a propoxy group, a butoxy group, and a pentoxy group; and a benzene group, a cyclopentadiene group, a furan group, a thiophene group, a silole group, a dihydropyridine group, a pyridine group, a pyrimidine group, a pyrazine group, a pyridazine group, a triazine group, a quinoline group, an isoquinoline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group, each substituted with at least one selected from deuterium, —F, —Cl, —Br, —I, a hydroxyl group, a cyano group, a nitro group, an amidino group, a hydrazino group, a hydrazono group, a cyclopentyl group, a cyclohexyl group, a cycloheptyl group, a phenyl group, a biphenyl group, a terphenyl group, a naphthyl group, —$Si(Q_{31})(Q_{32})(Q_{33})$, —$N(Q_{31})(Q_{32})$, and —$C(=O)(Q_{31})$, and $Z_{12}$ may be selected from:

N, C, O, S, a single bond, a pyridine group, a pyrimidine group, a pyrazine group, a pyridazine group, a triazine group, a quinoline group, an isoquinoline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group;

a pyridine group, a pyrimidine group, a pyrazine group, a pyridazine group, a triazine group, a quinoline group, an isoquinoline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group, each substituted with at least one selected from deuterium, —F, —Cl, —Br, —I, a hydroxyl group, a cyano group, a nitro group, an amidino group, a hydrazino group, a hydrazono group, $—CD_3$, $—CD_2H$, $—CDH_2$, $—CF_3$, $—CF_2H$, $—CFH_2$, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, a methoxy group, an ethoxy group, a propoxy group, a butoxy group, and a pentoxy group; and a pyridine group, a pyrimidine group, a pyrazine group, a pyridazine group, a triazine group, a quinoline group, an isoquinoline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group, each substituted with at least one selected from deuterium, —F, —Cl, —Br, —I, a hydroxyl group, a cyano group, a nitro group, an amidino group, a hydrazino group, a hydrazono group, a cyclopentyl group, a cyclohexyl group, a cycloheptyl group, a phenyl group, a biphenyl group, a terphenyl group, a naphthyl group, $—Si(Q_{31})(Q_{32})(Q_{33})$, $—N(Q_{31})(Q_{32})$, and $—C(═O)(Q_{31})$, but embodiments of the present disclosure are not limited thereto.

In one embodiment, a substructure represented by

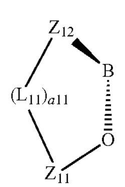

in Formula 1 may be represented by Formula 9, but embodiments of the present disclosure are not limited thereto:

Formula 9

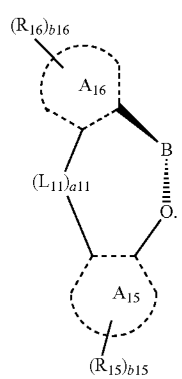

In Formula 9, $A_{15}$ and $A_{16}$ may each independently be a $C_5$-$C_{60}$ carbocyclic group or a $C_1$-$C_{60}$ heterocyclic group, $R_{15}$ and $R_{16}$ are each independently the same as described in connection with $R_{11}$ in Formula 1, b15 and b16 are each independently the same as described in connection with b11 in Formula 1.

For example, $A_{15}$ and $A_{16}$ in Formula 9 may each independently be selected from a benzene group, a cyclopentadiene group, a furan group, a thiophene group, a silole group, a dihydropyridine group, a pyridine group, a pyrimidine group, a pyrazine group, a pyridazine group, a triazine group, a quinoline group, an isoquinoline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group, but embodiments of the present disclosure are not limited thereto.

In one embodiment, in Formula 9, $A_{15}$ may be selected from a benzene group, a pyridine group, a pyrimidine group, a pyrazine group, a pyridazine group, and a triazine group, and $A_{16}$ may be selected from a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group;

$A_{15}$ may be selected from a benzene group, a pyridine group, a pyrimidine group, a pyrazine group, a pyridazine group, and a triazine group, and $A_{16}$ may be selected from a benzene group, a pyridine group, a pyrimidine group, a pyrazine group, a pyridazine group, and a triazine group;

$A_{15}$ may be selected from a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group, and $A_{16}$ may be selected from a benzene group, a pyridine group, a pyrimidine group, a pyrazine group, a pyridazine group, and a triazine group; or $A_{15}$ may be selected from a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group, and $A_{16}$ may be selected from a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group, but embodiments of the present disclosure are not limited thereto.

In one embodiment, a substructure represented by

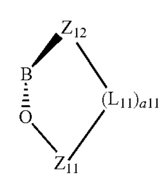

in Formula 1 may be represented by one of Formulae 9-1 to 9-112, but embodiments of the present disclosure are not limited thereto:

9-1
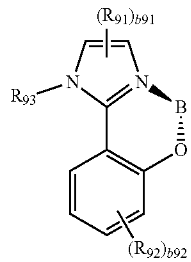
9-2
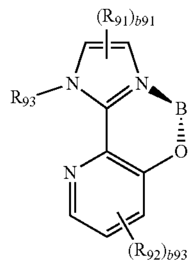
9-3
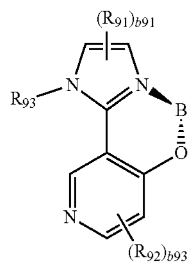
9-4
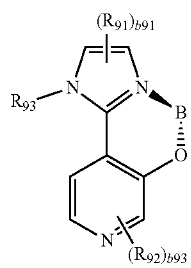
9-5
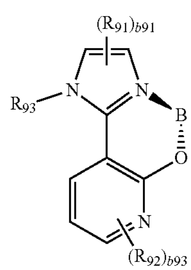
9-6
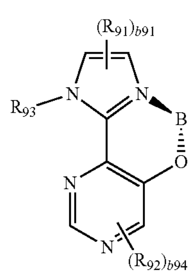
-continued
9-7
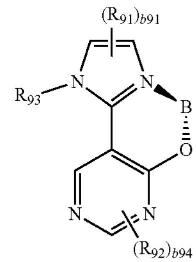
9-8
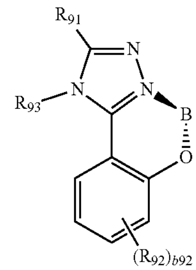
9-9
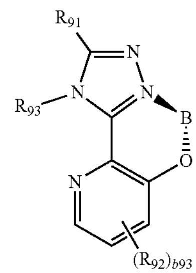
9-10
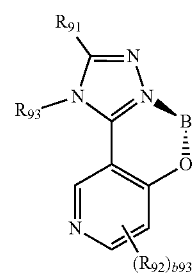
9-11
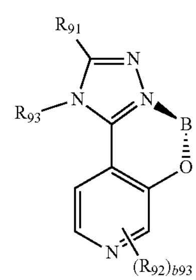
9-12
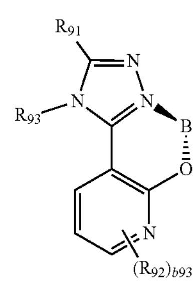

-continued
9-13
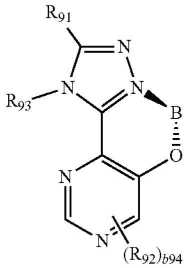
9-14
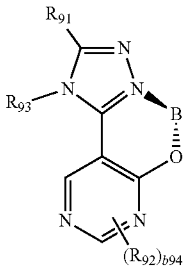
9-15
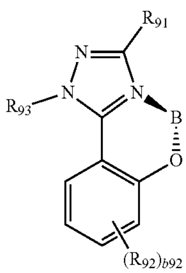
9-16
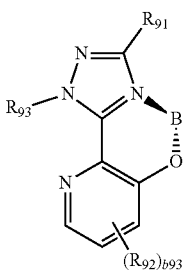
9-17
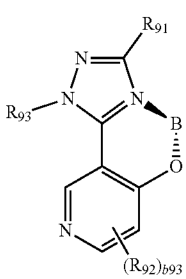
9-18
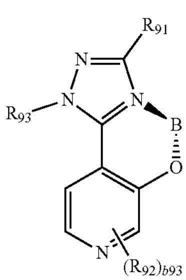
-continued
9-19
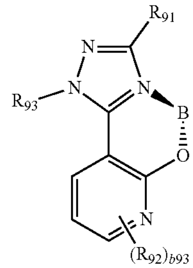
9-20
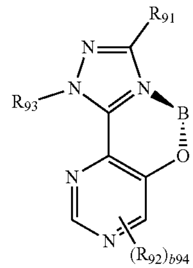
9-21
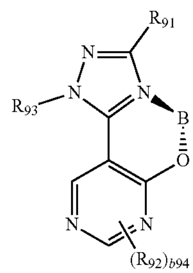
9-22
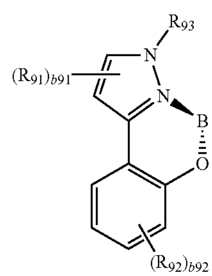
9-23
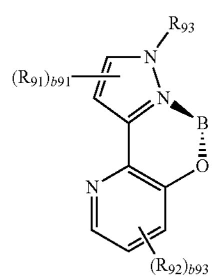
9-24
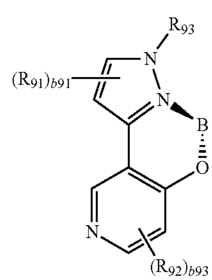

-continued
9-25
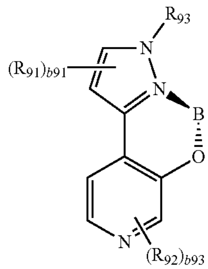
9-26
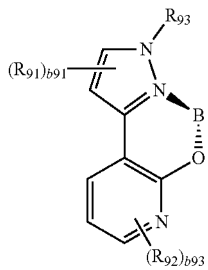
9-27
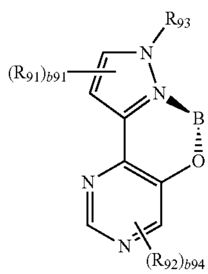
9-28
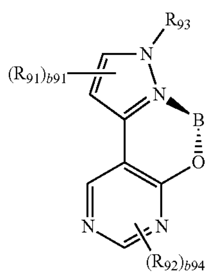
9-29
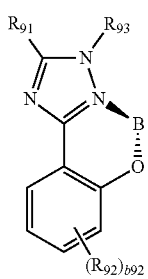
9-30
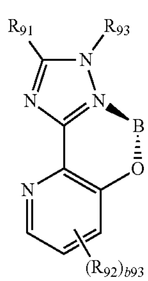
-continued
9-31
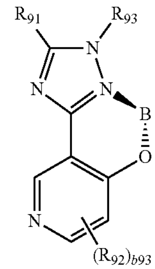
9-32
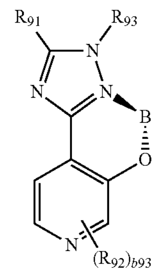
9-33
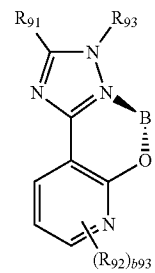
9-34
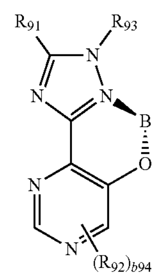
9-35
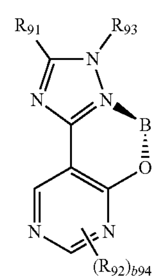
9-36
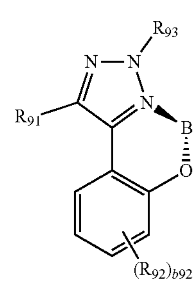

-continued
9-37
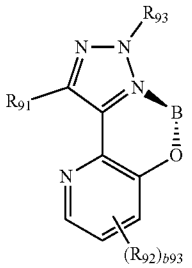
9-38
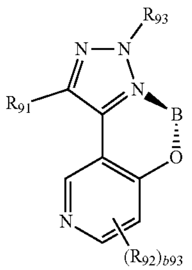
9-39
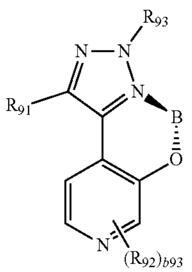
9-40
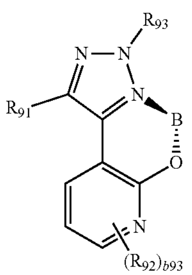
9-41
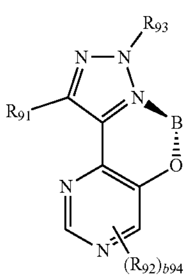
9-42
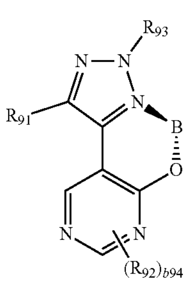
-continued
9-43
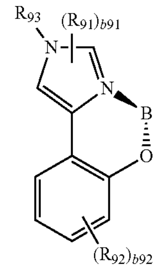
9-44
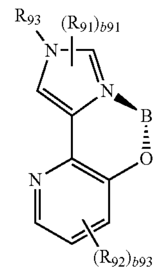
9-45
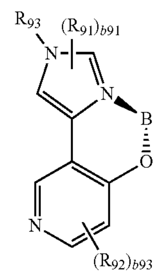
9-46
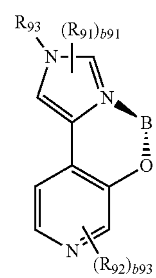
9-47
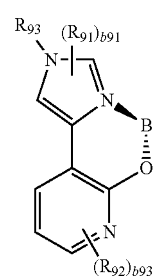

-continued
9-48
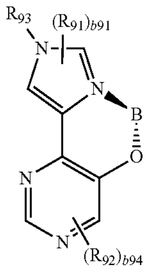
9-49
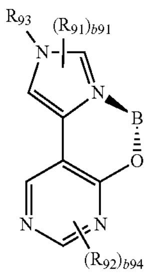
9-50
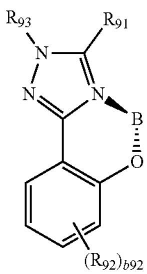
9-51
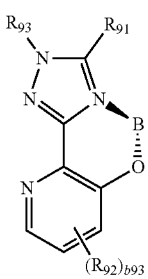
9-52
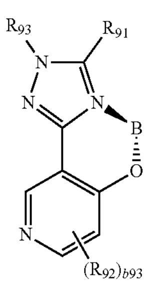
-continued
9-53
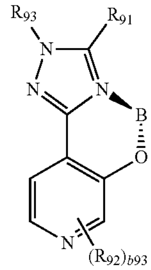
9-54
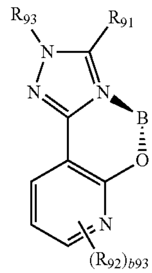
9-55
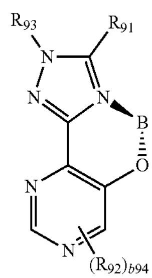
9-56
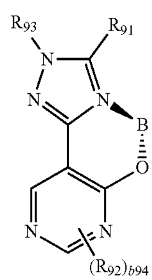
9-57
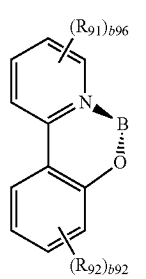

-continued
9-58
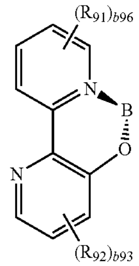
9-59
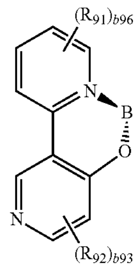
9-60
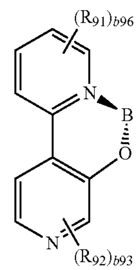
9-61
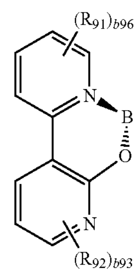
9-62
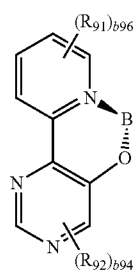
9-63
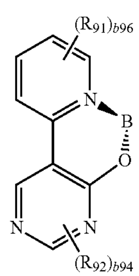
-continued
9-64
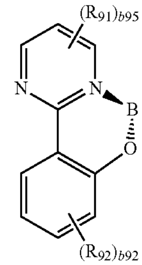
9-65
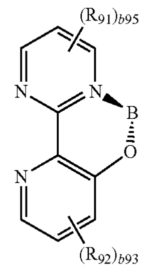
9-66
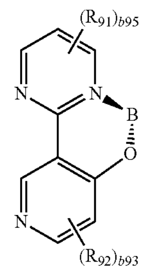
9-67
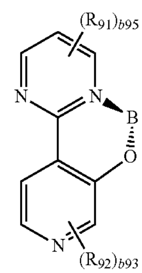
9-68
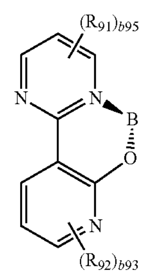
9-69
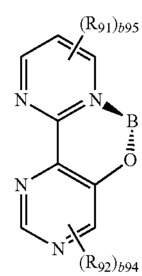

-continued
9-70
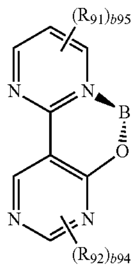
9-71
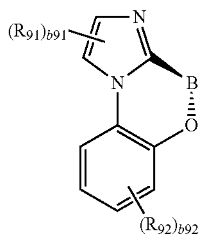
9-72
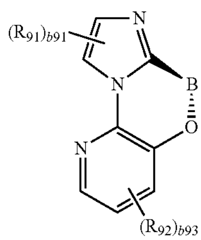
9-73
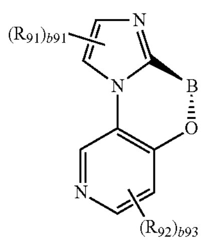
9-74
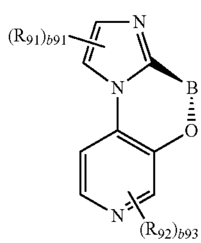
9-75
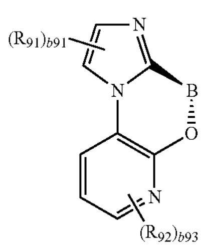
-continued
9-76
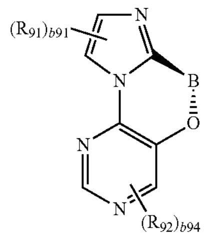
9-77
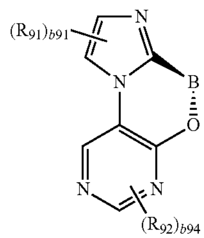
9-78
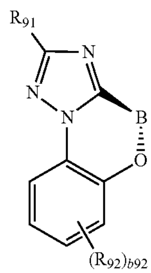
9-79
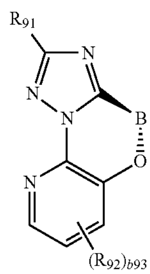
9-80
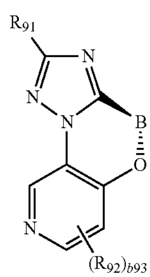
9-81
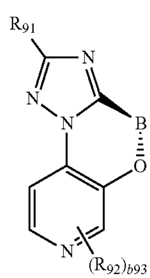

-continued
9-82
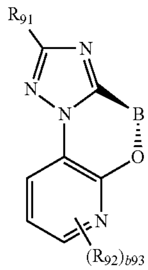
9-83
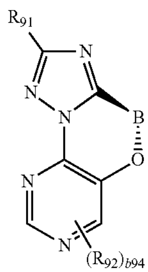
9-84
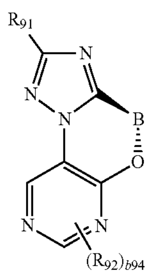
9-85
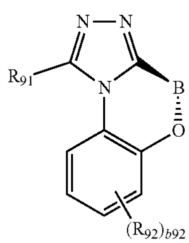
9-86
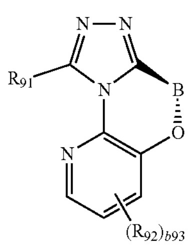
9-87
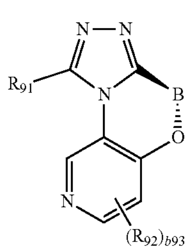
-continued
9-88
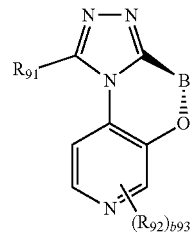
9-89
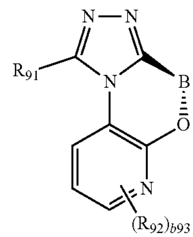
9-90
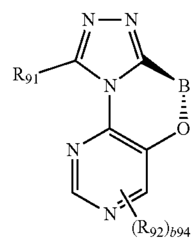
9-91
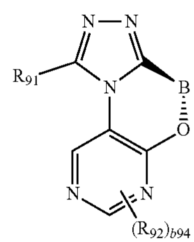
9-92
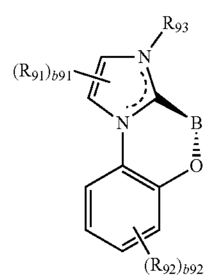
9-93
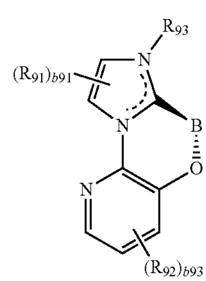

-continued
9-94
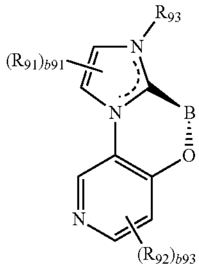
9-95
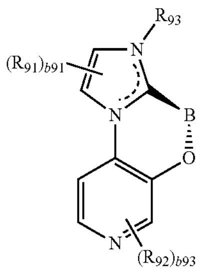
9-96
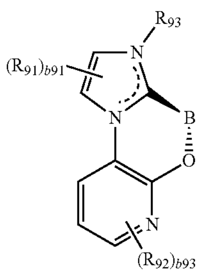
9-97
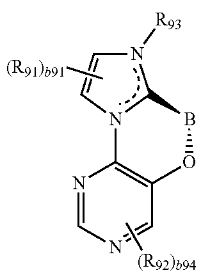
9-98
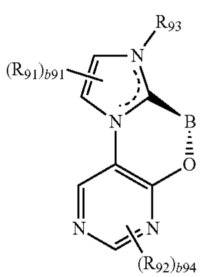
9-99
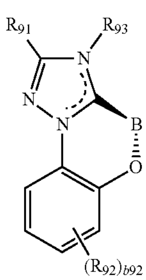
-continued
9-100
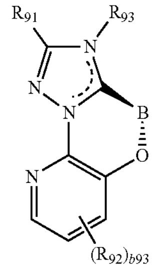
9-101
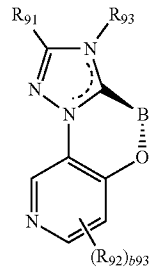
9-102
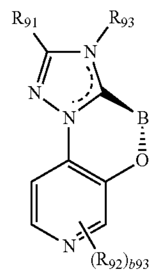
9-103
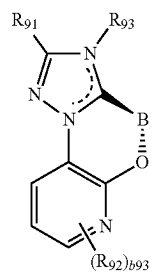
9-104
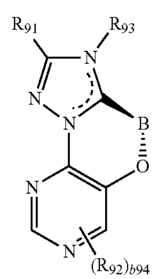
9-105
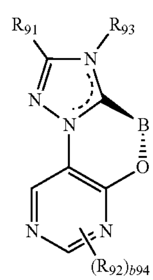

-continued 9-106

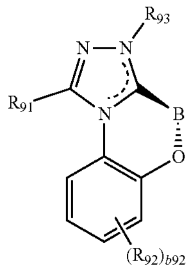

9-107

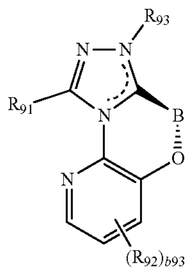

9-108

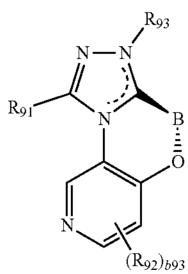

9-109

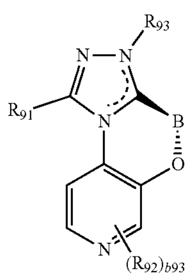

9-110

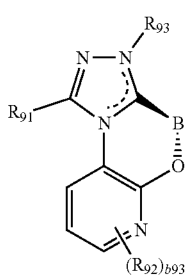

9-111

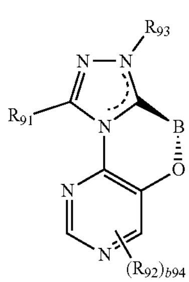

-continued 9-112

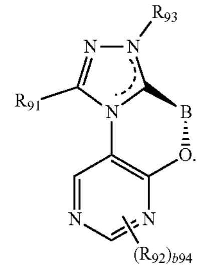

In Formulae 9-1 to 9-112, $R_{91}$ to $R_{93}$ may each independently be selected from hydrogen, —F, a cyano group, a nitro group, a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-heptyl group, an iso-heptyl group, a sec-octyl group, a tert-heptyl group, an n-nonyl group, an iso-nonyl group, a sec-nonyl group, a tert-nonyl group, an n-decanyl group, an iso-decanyl group, a sec-decanyl group, a tert-decanyl group, a methoxy group, an ethoxy group, a propoxy group, a butoxy group, a pentoxy group, a phenyl group, a naphthyl group, a pyridinyl group, a pyrimidinyl group, a triazinyl group, a dibenzofuranyl group, and a dibenzothiophenyl group; and a methyl group, an ethyl group, a propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decanyl group, an iso-decanyl group, a sec-decanyl group, a tert-decanyl group, a methoxy group, an ethoxy group, a propoxy group, a butoxy group, a pentoxy group, a phenyl group, a naphthyl group, a pyridinyl group, a pyrimidinyl group, a triazinyl group, a dibenzofuranyl group, and a dibenzothiophenyl group, each substituted with at least one selected from —F, a cyano group, and a nitro group, b91 and b94 may each independently be 1 or 2, b93 and b95 may each independently be selected from 1, 2, and 3, and b92 and b96 may each independently be selected from 1, 2, 3, and 4.

In one embodiment, in Formula 1, a ring formed by B, O, $Z_{11}$, $Z_{12}$, and $(L_{11})_{a11}$ may be selected from a 5-membered ring, a 6-membered ring, a 7-membered ring, an 8-membered ring, and a 9-membered ring, but embodiments of the present disclosure are not limited thereto.

$T_{11}$ to $T_{14}$ in Formula 1 may each independently be selected from a single bond, O, and S.

For example, in Formula 1, $T_{11}$ to $T_{14}$ may each be a single bond;

$T_{11}$ may be O or S, and $T_{12}$ to $T_{14}$ may each be a single bond;

$T_{12}$ may be O or S, and $T_{11}$, $T_{13}$, and $T_{14}$ may each be a single bond;

$T_{13}$ may be O or S, and $T_{11}$, $T_{12}$, and $T_{14}$ may each be a single bond; or $T_{14}$ may be O or S, and $T_{11}$, $T_{12}$, and $T_{13}$ may each be a single bond, but embodiments of the present disclosure are not limited thereto.

In one embodiment, $T_{11}$ to $T_{14}$ in Formula 1 may each be a single bond, but embodiments of the present disclosure are not limited thereto.

In Formula 1, $L_{11}$ to $L_{14}$ may each independently be selected from a single bond, *—O—*', *—S—*', *—C($R_{17}$)($R_{18}$)—*', *—C($R_{17}$)═*', *═C($R_{17}$)—*', *—C($R_{17}$)═C($R_{18}$)—*', *—C(═O)—*', *—C(═S)—*', *—C≡C—*', *—B($R_{17}$)—*', *—N($R_{17}$)—*', *—P($R_{17}$)—*', *—Si($R_{17}$)($R_{18}$)—*', *—P($R_{17}$)($R_{18}$)—*', and *—Ge($R_{17}$)($R_{18}$)—*', * and *' each indicate a binding site to a neighboring atom, and $R_{17}$ and $R_{18}$ are the same as described below.

For example, $L_{11}$ to $L_{14}$ in Formula 1 may each independently be selected from a single bond, *—O—*', *—S—*', *—C($R_{15}$)($R_{16}$)—*', *—C($R_{15}$)═*', *═C($R_{15}$)—*', *—B($R_{15}$)—*', *—N($R_{15}$)—*', *—Si($R_{15}$)($R_{16}$)—*', and *—P($R_{15}$)($R_{16}$)—*', but embodiments of the present disclosure are not limited thereto. * and *' each indicate a binding site to a neighboring atom, and $R_{17}$ and $R_{18}$ are the same as described below.

In one embodiment, $L_{11}$ to $L_{14}$ in Formula 1 may each be a single bond, but embodiments of the present disclosure are not limited thereto.

a11 in Formula 1 indicates the repeating number of $L_{11}$(s) and may be selected from 0, 1, 2, and 3. When a11 in Formula 1 is zero, $(L_{11})_{a11}$ may be a single bond. When a11 in Formula 1 is two or more, a plurality of $L_{11}$(s) may be identical to or different from each other.

For example, a11 in Formula 1 may be 0 or 1, but embodiments of the present disclosure are not limited thereto.

a12, a13, and a14 in Formula 1 respectively the repeating number of $L_{12}$(s), the repeating number of $L_{13}$(s), and the repeating number of $L_{14}$(s), and may be selected from 0, 1, 2, and 3, provided that at least two of a12, a13, and a14 are each independently selected from 1, 2, and 3. In Formula 1, when a12 is zero, $A_{11}$ and $A_{12}$ are not linked to each other, when a13 is zero, $A_{12}$ and $A_{13}$ are not linked to each other, and when a14 is zero, $A_{13}$ and $A_{14}$ are not linked to each other. When a12 in Formula 1 is two or more, a plurality of $L_{12}$(s) may be identical to or different from each other. When a13 in Formula 1 is two or more, a plurality of $L_{13}$(s) may be identical to or different from each other. When a14 in Formula 1 is two or more, a plurality of $L_{14}$(s) may be identical to or different from each other.

For example, the sum of a12, a13, and a14 in Formula 1 may be selected from 2, 3, 4, 5, 6, 7, and 8, but embodiments of the present disclosure are not limited thereto.

In one embodiment, in Formula 1, a12, a13, and a14 may each independently be selected from 1, 2, and 3;

a12 may be 0, and a13 and a14 may each independently be selected from 1, 2, and 3;

a13 may be 0, and a12 and a14 may each independently be selected from 1, 2, and 3; or a14 may be 0, and a12 and a13 may each independently be selected from 1, 2, and 3, but embodiments of the present disclosure are not limited thereto.

In one embodiment, in Formula 1, a12, a13, and a14 may each be 1;

a12 may be 0, and a13 and a14 may each be 1;

a13 may be 0, and a12 and a14 may each be 1; or a14 may be 0, and a12 and a13 may each be 1, but embodiments of the present disclosure are not limited thereto.

In Formula 1, $R_{11}$ to $R_{14}$, $R_{17}$, and $R_{18}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), and —P(═S)($Q_1$)($Q_2$), $R_{17}$ and $R_{11}$, $R_{17}$ and $R_{12}$, $R_{17}$ and $R_{13}$, and/or $R_{17}$ and $R_{14}$ may optionally be linked to form a substituted or unsubstituted $C_5$-$C_{60}$ carbocyclic group or a substituted or unsubstituted $C_1$-$C_{60}$ heterocyclic group, $R_{17}$ and $R_{18}$ may optionally be linked to form a substituted or unsubstituted $C_5$-$C_{60}$ carbocyclic group or a substituted or unsubstituted $C_1$-$C_{60}$ heterocyclic group, and $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

For example, $R_{11}$ to $R_{14}$, $R_{17}$, and $R_{18}$ in Formula 1 may each independently be selected from hydrogen, deuterium, —F, —Cl, —Br, —I, a cyano group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a cyano group, a phenyl group, and a biphenyl group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, an isoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, and an indolocarbazolyl group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, an isoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, and an indolocarbazolyl group, each substituted with at least one selected from deuterium, —F, —Cl, —Br, —I, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, an isoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, an indolocarbazolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)(Q_{31})$, $—S(=O)_2(Q_{31})$, $—P(=O)(Q_{31})(Q_{32})$, and $—P(=S)(Q_{31})(Q_{32})$; and $—Si(Q_1)(Q_2)(Q_3)$, $—B(Q_1)(Q_2)$, $—N(Q_1)(Q_2)$, $—P(Q_1)(Q_2)$, $—C(=O)(Q_1)$, $—S(=O)(Q_1)$, $—S(=O)_2(Q_1)$, $—P(=O)(Q_1)(Q_2)$, and $—P(=S)(Q_1)(Q_2)$, and $Q_1$ to $Q_3$ and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group, but embodiments of the present disclosure are not limited thereto.

In one embodiment, $R_{11}$ to $R_{14}$, $R_{17}$, and $R_{18}$ in Formula 1 may each independently be selected from:

hydrogen, deuterium, —F, —Cl, —Br, —I, a cyano group, and a $C_1$-$C_{20}$ alkyl group;

a $C_1$-$C_{20}$ alkyl group, substituted with at least one selected from deuterium, —F, —Cl, —Br, —I, and a cyano group;

groups represented by Formulae 5-1 to 5-138; and

—Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), and —P(═S)($Q_1$)($Q_2$), but embodiments of the present disclosure are not limited thereto:

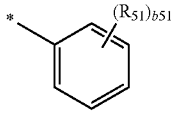

5-1

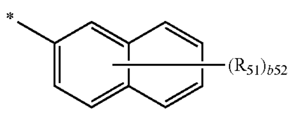

5-2

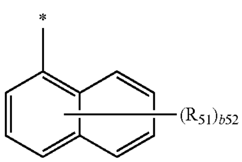

5-3

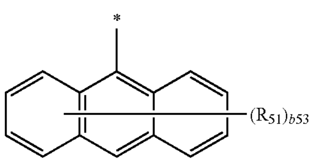

5-4

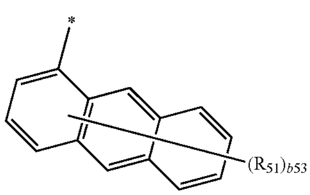

5-5

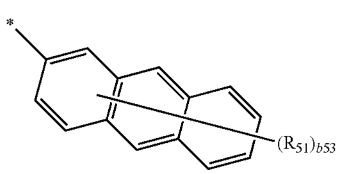

5-6

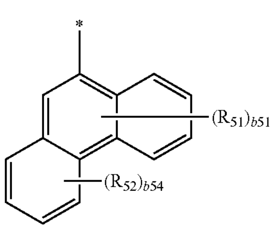

5-7

-continued

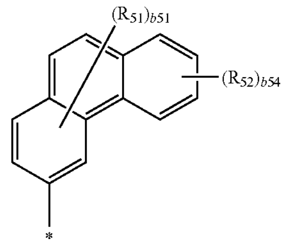

5-8

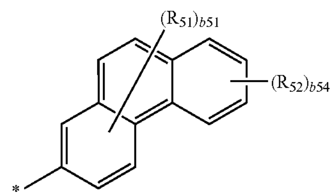

5-9

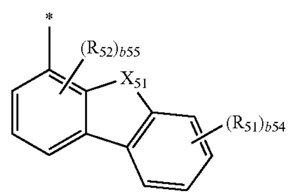

5-10

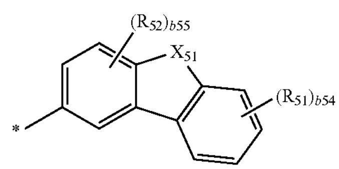

5-11

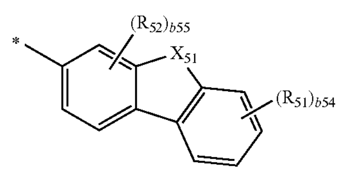

5-12

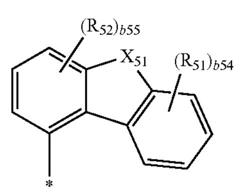

5-13

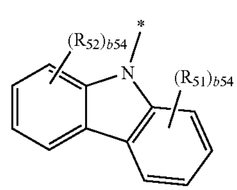

5-14

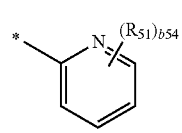

5-15

-continued
5-16
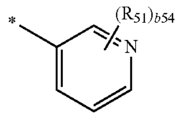
5-17
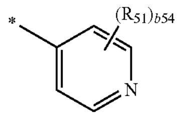
5-18
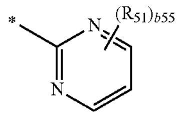
5-19
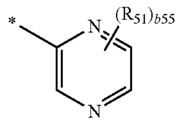
5-20
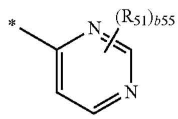
5-21
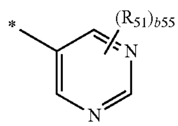
5-22
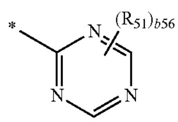
5-23
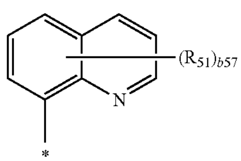
5-24
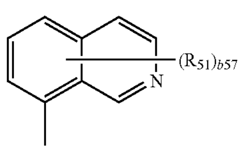
5-25
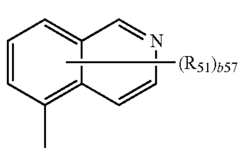
5-26
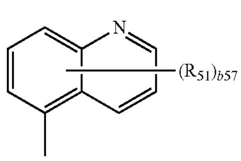
-continued
5-27
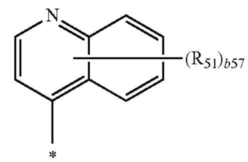
5-28
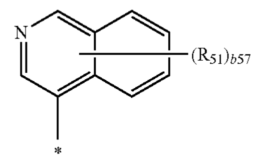
5-29
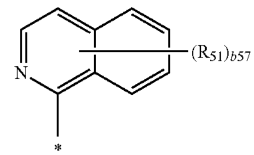
5-30
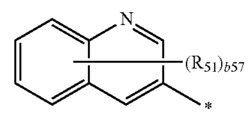
5-31
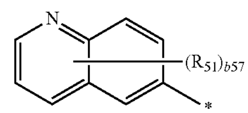
5-32
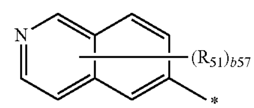
5-33
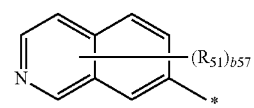
5-34
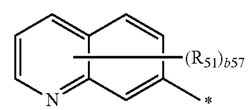
5-35
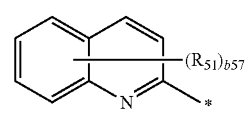
5-36
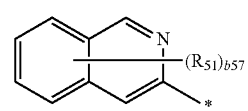
5-37
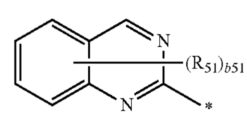

-continued
5-38
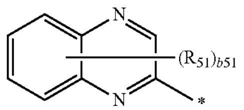
5-39
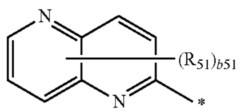
5-40
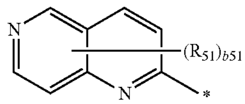
5-41
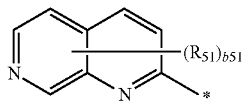
5-42
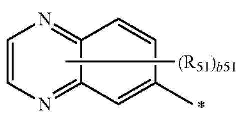
5-43
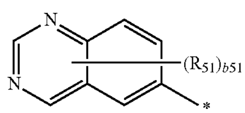
5-44
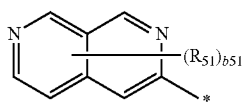
5-45
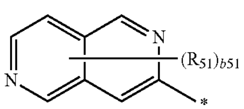
5-46
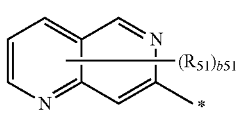
5-47
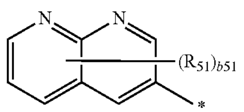
5-48
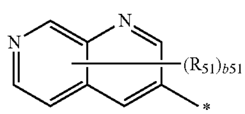
5-49
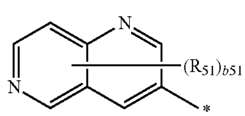
-continued
5-50
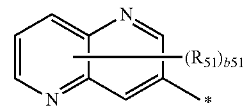
5-51
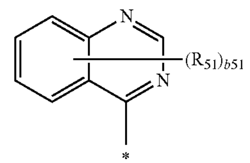
5-52
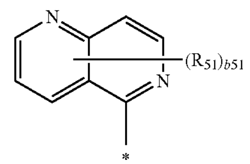
5-53
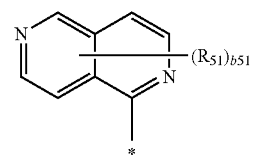
5-54
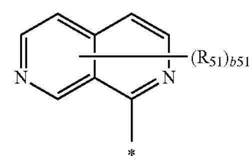
5-55
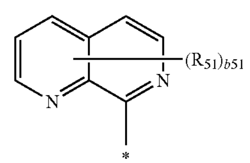
5-56
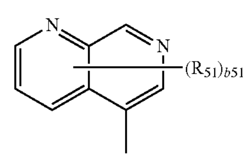
5-57
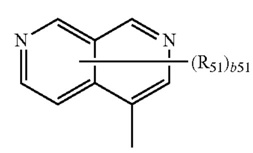
5-58
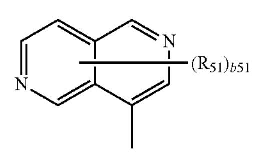

-continued
5-59
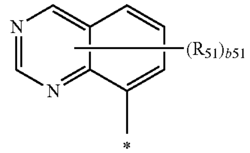
5-60
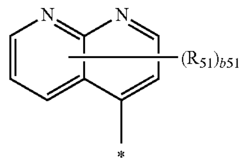
5-61
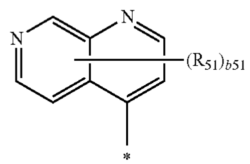
5-62
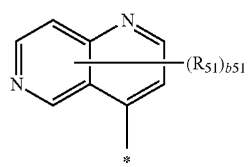
5-63
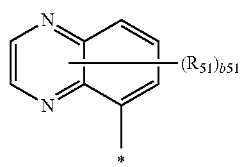
5-64
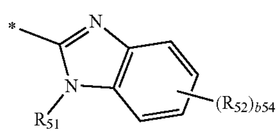
5-65
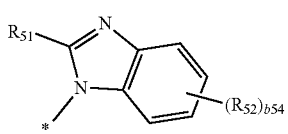
5-66
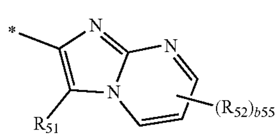
5-67
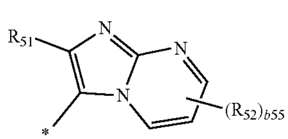
5-68
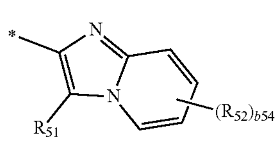
-continued
5-69
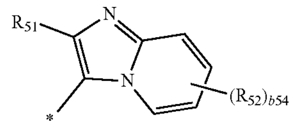
5-70
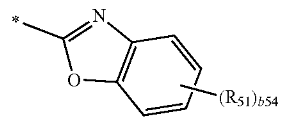
5-71
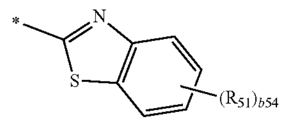
5-72
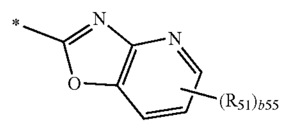
5-73
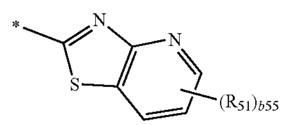
5-74
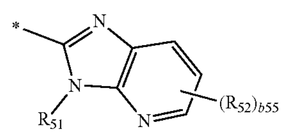
5-75
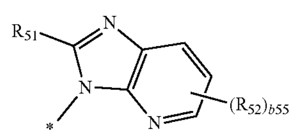
5-76
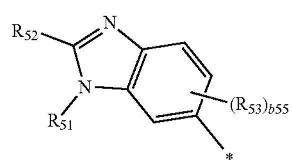
5-77
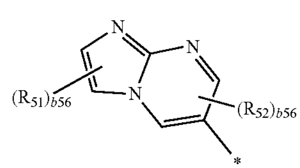
5-78
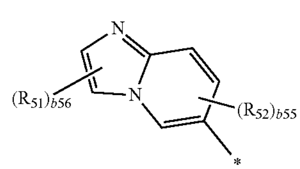

-continued
5-79
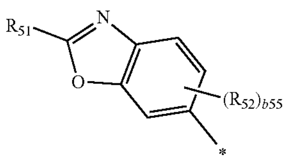
5-80
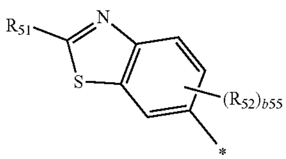
5-81
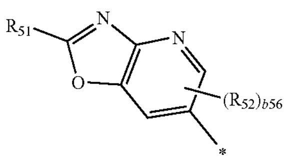
5-82
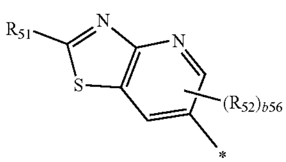
5-83
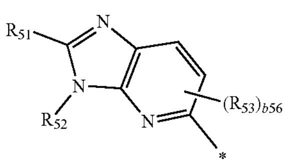
5-84
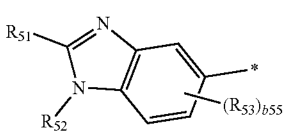
5-85
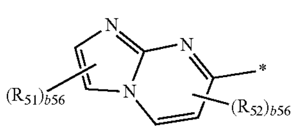
5-86
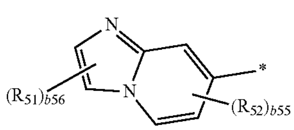
5-87
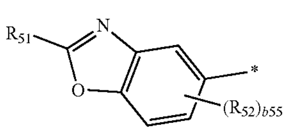
5-88
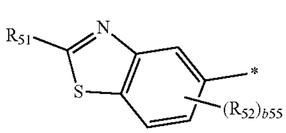
-continued
5-89
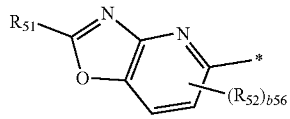
5-90
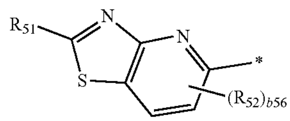
5-91
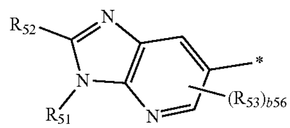
5-92
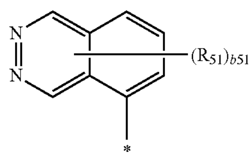
5-93
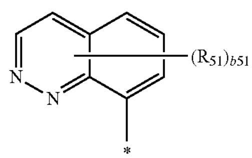
5-94
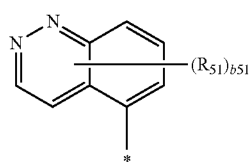
5-95
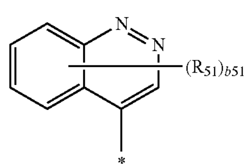
5-96
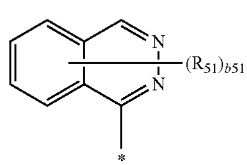
5-97
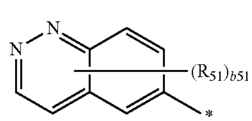
5-98
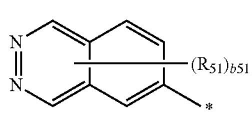

-continued
5-99
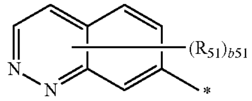
5-100
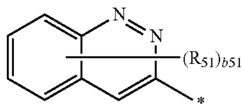
5-101
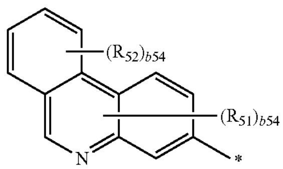
5-102
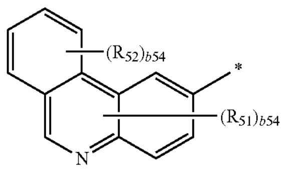
5-103
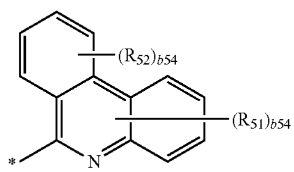
5-104
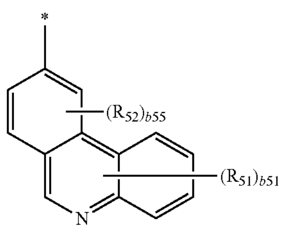
5-105
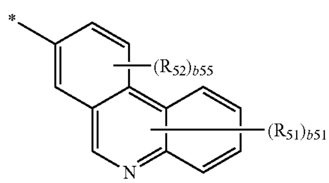
5-106
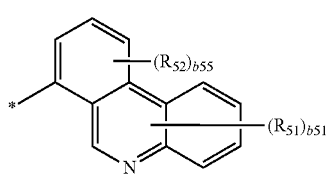
5-107
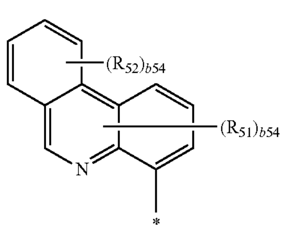
-continued
5-108
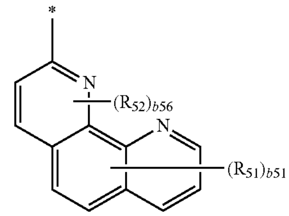
5-109
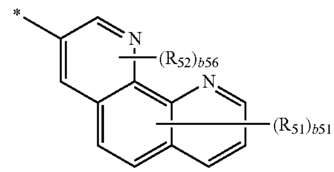
5-110
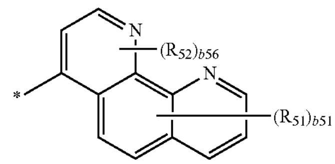
5-111
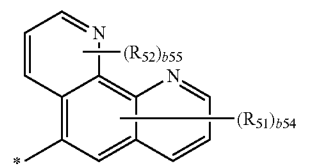
5-112
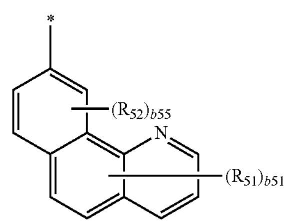
5-113
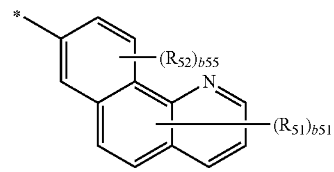
5-114
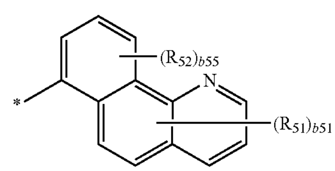
5-115
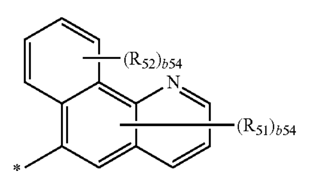

-continued
5-116
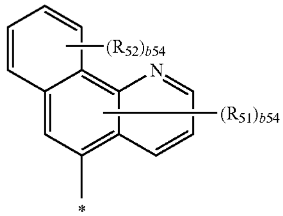
5-117
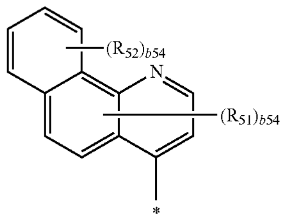
5-118
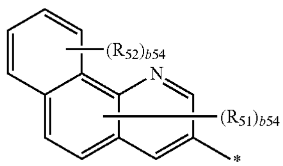
5-119
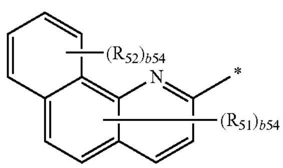
5-120
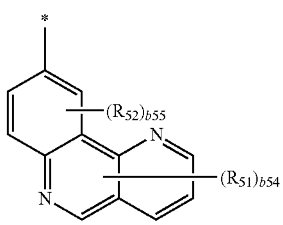
5-121
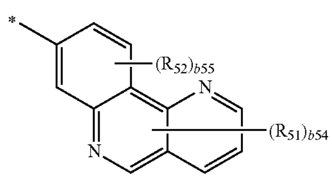
5-122
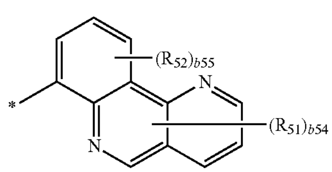
5-123
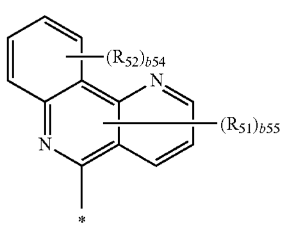
-continued
5-124
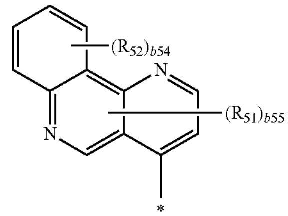
5-125
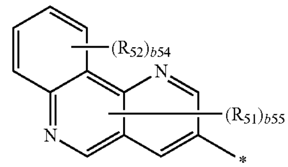
5-126
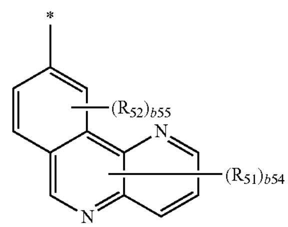
5-127
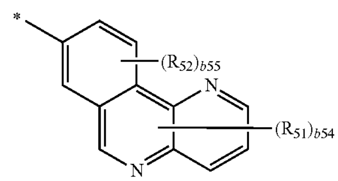
5-128
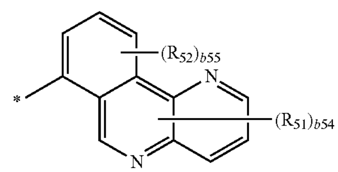
5-129
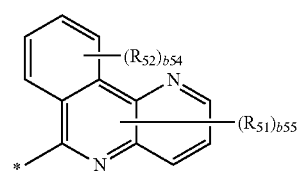
5-130
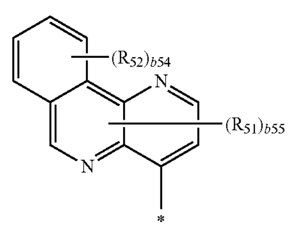
5-131
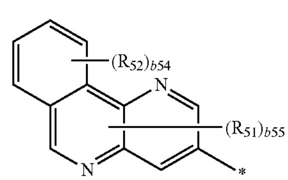

-continued 5-132

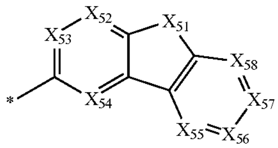

5-133

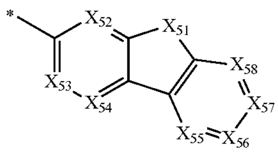

5-134

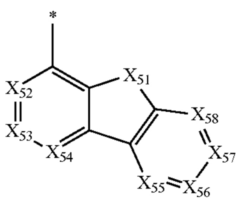

5-135

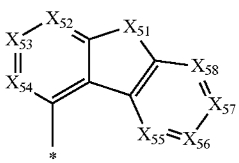

5-136

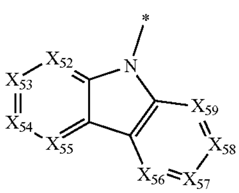

5-137

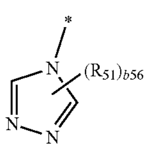

5-138

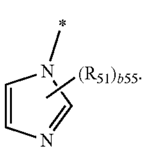

In Formulae 5-1 to 5-138, $X_{51}$ may be selected from O, S, $N(R_{51})$, and $C(R_{51})(R_{60})$, $X_{52}$ may be N or $C(R_{52})$, $X_{53}$ may be N or $C(R_{53})$, $X_{54}$ may be N or $C(R_{54})$, $X_{55}$ may be N or $C(R_{55})$, $X_{56}$ may be N or $C(R_{56})$, $X_{57}$ may be N or $C(R_{57})$, $X_{58}$ may be N or $C(R_{59})$, and $X_{59}$ may be N or $C(R_{59})$, $R_{51}$ to $R_{60}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a thiophenyl group, a furanyl group, a silolyl group, a carbazolyl group, an indolyl group, an isoindolyl group, a benzofuranyl group, a benzothiophenyl group, a benzosilolyl group, a dibenzofuranyl group, a dibenzothiophenyl group, a benzocarbazolyl group, a dibenzocarbazolyl group, a dibenzosilolyl group, $—Si(Q_{31})(Q_{32})(Q_{33})$, $—B(Q_{31})(Q_{32})$, $—N(Q_{31})(Q_{32})$, $—P(Q_{31})(Q_{32})$, $—C(=O)(Q_{31})$, $—S(=O)(Q_{31})$, $—S(=O)_2(Q_{31})$, $—P(=O)(Q_{31})(Q_{32})$, and $—P(=S)(Q_{31})(Q_{32})$;

$Q_1$ to $Q_3$ and $Q_{31}$ to $Q_{33}$ may each independently be selected from a $C_1$-$C_{60}$ alkyl group, a phenyl group, a biphenyl group, and a terphenyl group, b51 may be selected from 1, 2, 3, 4, and 5, b52 may be selected from 1, 2, 3, 4, 5, 6, and 7, b53 may be selected from 1, 2, 3, 4, 5, 6, 7, and 9, b54 may be selected from 1, 2, 3, and 4, b55 is selected from 1, 2, and 3, b56 may be 1 or 2, b57 may be selected from 1, 2, 3, 4, 5, and 6, and

* indicates a binding site to a neighboring atom.

In one embodiment, $R_{11}$ to $R_{14}$, $R_{17}$, and $R_{18}$ in Formula 1 may each independently be selected from:

hydrogen, deuterium, —F, —Cl, —Br, —I, a cyano group, a methyl group, an ethyl group, an n-propyl group, an iso-propyl group, an n-butyl group, an iso-butyl group, a sec-butyl group, and a tert-butyl group;

a methyl group, an ethyl group, an n-propyl group, an iso-propyl group, an n-butyl group, an iso-butyl group, a sec-butyl group, and a tert-butyl group, each substituted with at least one selected from deuterium, —F, —Cl, —Br, —I, and a cyano group; and a phenyl group, a naphthyl group, and a pyridinyl group, but embodiments of the present disclosure are not limited thereto.

b11, b12, b13, and b14 respectively indicate the number of $R_{11}$(s), the number of $R_{12}$(s), the number of $R_{13}$(s), and the number of $R_{14}$(s), and b11 to b14 may each independently be selected from 1, 2, 3, 4, 5, 6, 7, and 8. When b11 is two or more, a plurality of $R_{11}$(s) may be identical to or different from each other. When b12 is two or more, a plurality of $R_{12}$(s) may be identical to or different from each other. When b13 is two or more, a plurality of $R_{13}$(s) may be identical to or different from each other. When b14 is two or more, a plurality of $R_{14}$(s) may be identical to or different from each other.

For example, the organometallic compound represented by Formula 1 may be represented by one of Formulae 1-1 to 1-4 below, but embodiments of the present disclosure are not limited thereto:

1-1

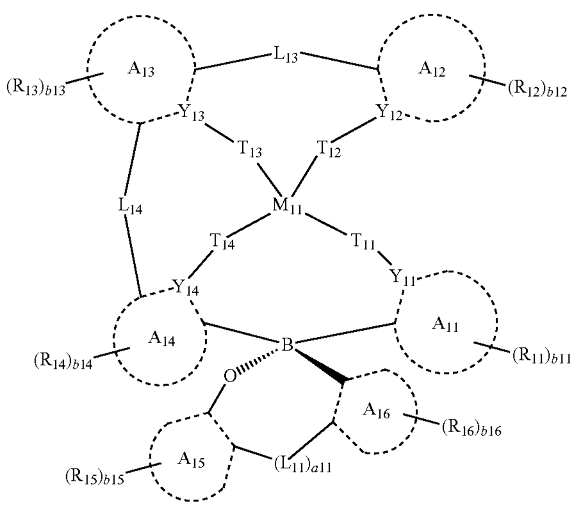

1-2

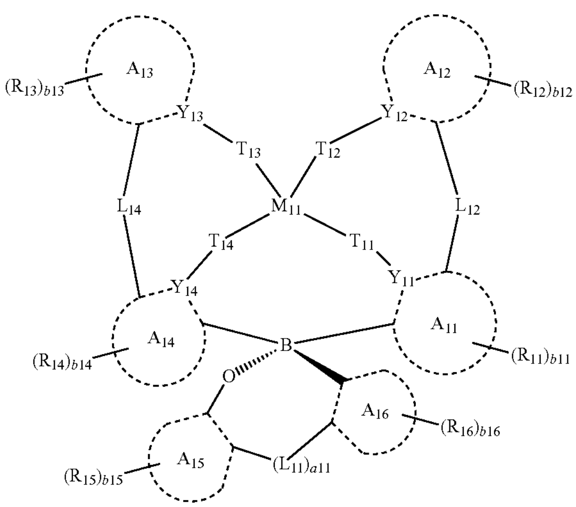

1-3

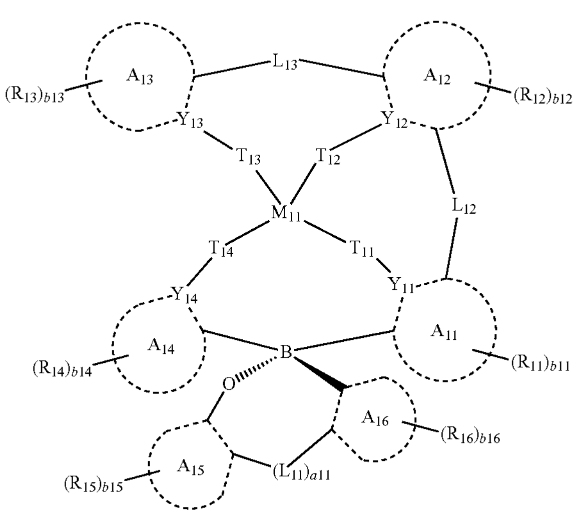

-continued 1-4

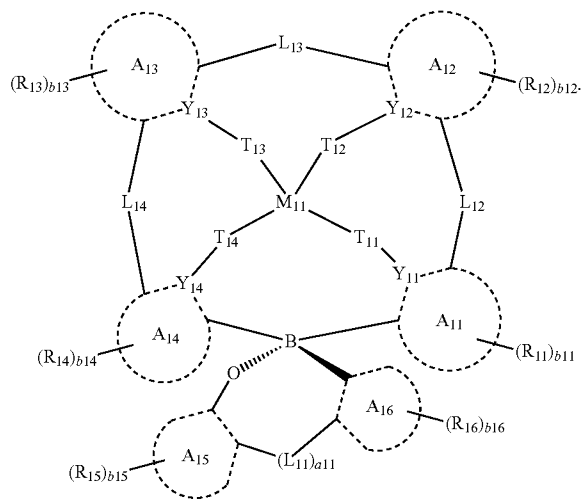

In Formulae 1-1 to 1-4, $M_{11}$, $A_{11}$ to $A_{14}$, $Y_{11}$ to $Y_{14}$, $T_{11}$ to $T_{14}$, $L_{11}$ to $L_{14}$, a11 to a14, $R_{11}$ to $R_{14}$, and b11 to b14 are each independently the same as described in Formula 1, $A_{15}$ and $A_{16}$ may each independently be a $C_5$-$C_{60}$ carbocyclic group or a $C_1$-$C_{60}$ heterocyclic group, $R_{15}$ and $R_{16}$ are each independently the same as described in connection with $R_{11}$ in Formula 1, and b15 and b16 are each independently the same as described in connection with b11 in Formula 1.

In one embodiment, the organometallic compound represented by Formula 1 may be represented by one of Formulae 1-11 to 1-14, but embodiments of the present disclosure are not limited thereto:

1-11

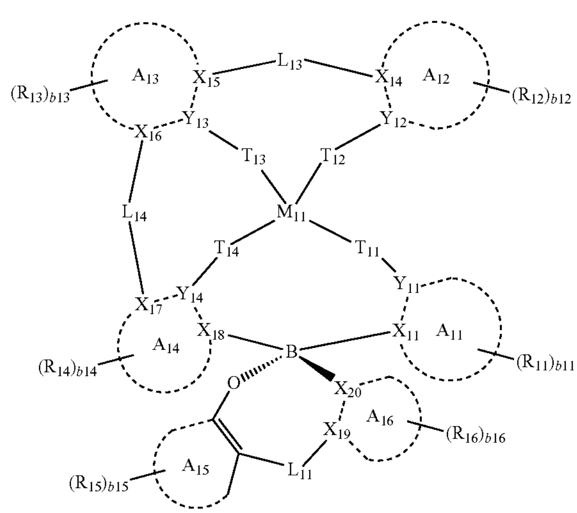

-continued 1-12

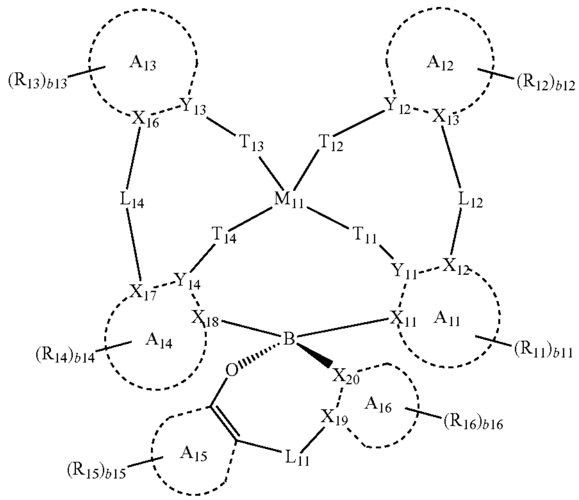

1-13

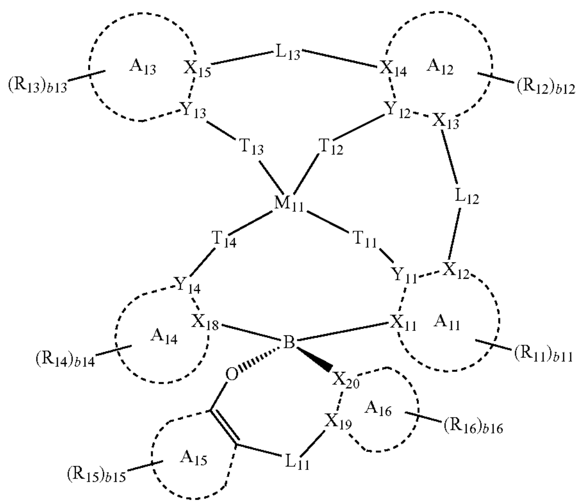

1-14

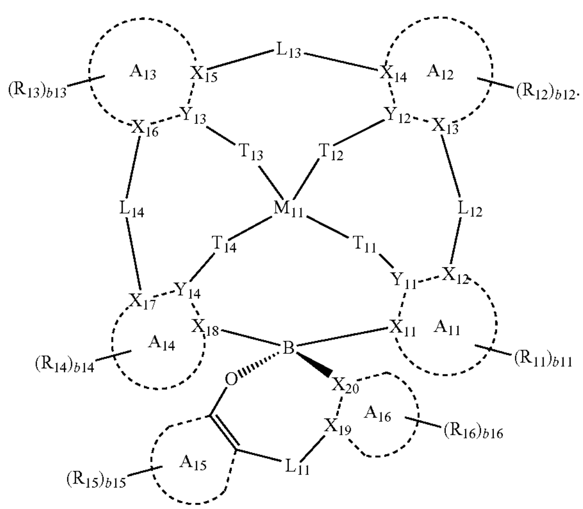

In Formulae 1-11 to 1-14, $M_{11}$ may be selected from Pt, Pd, Cu, Ag, Au, Rh, Ir, Ru, and Os, $X_{11}$ to $X_{20}$ may each independently N or C, $Y_{11}$, $Y_{12}$, and $Y_{13}$ may each be C, and $Y_{14}$ may be N;

$Y_{11}$, $Y_{12}$, and $Y_{14}$ may each be C, and $Y_{13}$ may be N;

$Y_{11}$, $Y_{13}$, and $Y_{14}$ may each be C, and $Y_{12}$ may be N;

$Y_{12}$, $Y_{13}$, and $Y_{14}$ may each be C, and $Y_{11}$ may be N;

$Y_{11}$ and $Y_{14}$ may each be C, and $Y_{12}$ and $Y_{13}$ may each be N;

$Y_{11}$ and $Y_{14}$ may each be N, and $Y_{12}$ and $Y_{13}$ may each be C;

$Y_{11}$ and $Y_{12}$ may be C, and $Y_{13}$ and $Y_{14}$ may each be N;

$Y_{11}$ and $Y_{12}$ may each be N, and $Y_{13}$ and $Y_{14}$ may each be C;

$Y_{11}$ and $Y_{13}$ may each be C, and $Y_{12}$ and $Y_{14}$ may each be N; or $Y_{11}$ and $Y_{13}$ may each be N, and $Y_{12}$ and $Y_{14}$ may each be C, $T_{11}$ to $T_{14}$ may each be a single bond;

$T_{11}$ may be O or S, and $T_{12}$ to $T_{14}$ may each be a single bond;

$T_{12}$ may be O or S, and $T_{11}$, $T_{13}$, and $T_{14}$ may each be a single bond;

$T_{13}$ may be O or S, and $T_{11}$, $T_{12}$, and $T_{14}$ may each be a single bond; or $T_{14}$ may be O or S, and $T_{11}$, $T_{12}$, and $T_{13}$ may each be a single bond, $A_{11}$ to $A_{14}$, $L_{11}$ to $L_{14}$, $R_{11}$ to $R_{14}$, and b11 to b14 are each independently the same as described in Formula 1, $A_{15}$ and $A_{16}$ may each independently be a $C_5$-$C_{60}$ carbocyclic group or a $C_1$-$C_{60}$ heterocyclic group, $R_{15}$ and $R_{16}$ are each independently the same as described in connection with $R_{11}$ in Formula 1, and b15 and b16 are each independently the same as described in connection with b11 in Formula 1.

For example, in Formula 1-11 to 1-14, $A_{11}$ to $A_{14}$ may each independently be selected from a benzene group, a naphthalene group, an indene group, a fluorene group, an indole group, a carbazole group, a benzofuran group, a dibenzofuran group, a benzothiophene group, a dibenzothiophene group, a pyridine group, a pyrimidine group, a pyrazine group, a triazine group, a quinoline group, an isoquinoline group, a quinoxaline group, a quinazoline group, a pyrazole group, an imidazole group, a 2,3-dihydroimidazole group, a triazole group, a 2,3-dihydrotriazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, and a 2,3-dihydroimidazopyrazine group, and $A_{15}$ and $A_{16}$ may each independently be selected from a benzene group, a cyclopentadiene group, a furan group, a thiophene group, a silole group, a dihydropyridine group, a pyridine group, a pyrimidine group, a pyrazine group, a pyridazine group, a triazine group, a quinoline group, an isoquinoline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group, but embodiments of the present disclosure are not limited thereto.

In one embodiment, the organometallic compound represented by Formula 1 may be represented by one of Formulae 1-21 to 1-24, but embodiments of the present disclosure are not limited thereto:

1-21

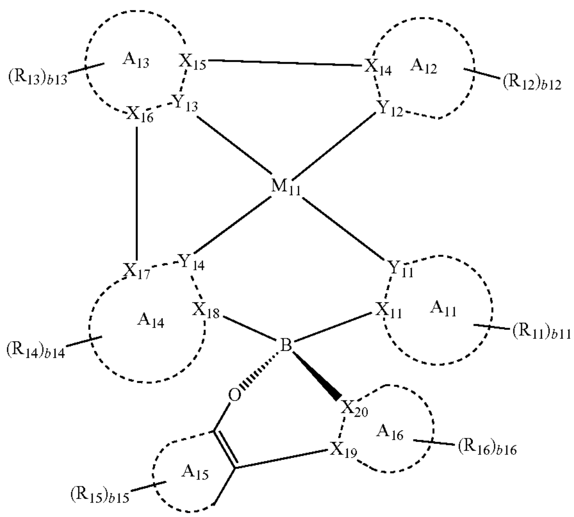

1-22

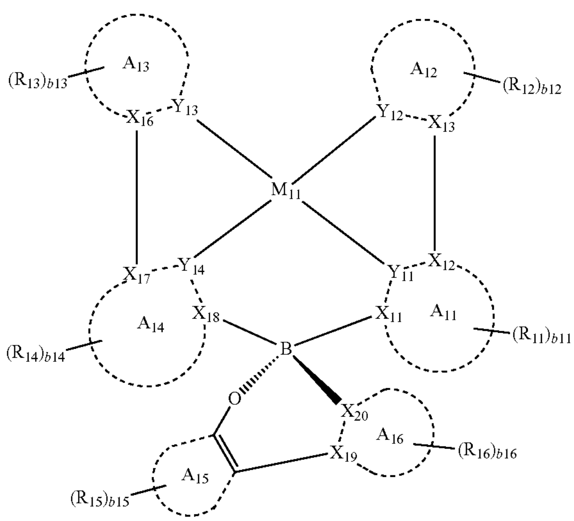

1-23

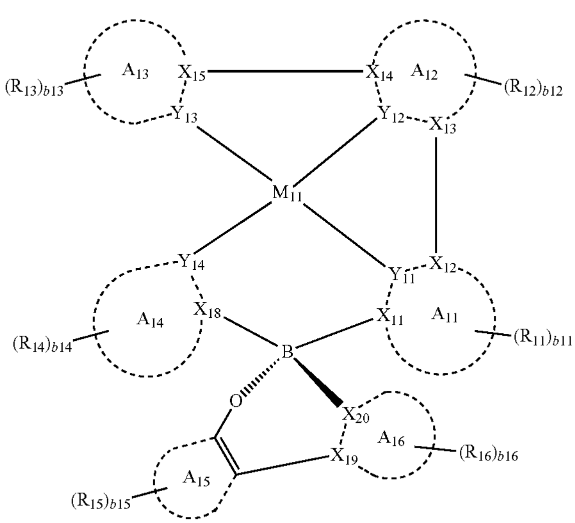

-continued 1-24

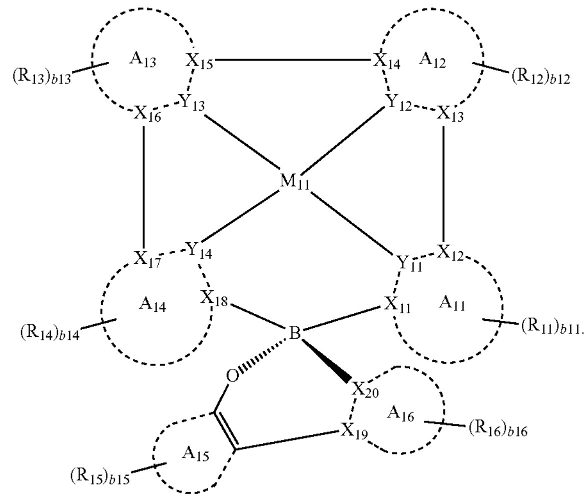

In Formulae 1-21 to 1-24, $M_{11}$ may be selected from Pt, Pd, Cu, Ag, Au, Rh, Ir, Ru, and Os, $X_{11}$ to $X_{20}$ may each independently N or C, $Y_{11}$, $Y_{12}$, and $Y_{13}$ may each be C, and $Y_{14}$ may be N;

$Y_{11}$, $Y_{12}$, and $Y_{14}$ may each be C, and $Y_{13}$ may be N;

$Y_{11}$, $Y_{13}$, and $Y_{14}$ may each be C, and $Y_{12}$ may be N;

$Y_{12}$, $Y_{13}$, and $Y_{14}$ may each be C, and $Y_{11}$ may be N;

$Y_{11}$ and $Y_{14}$ may each be C, and $Y_{12}$ and $Y_{13}$ may each be N;

$Y_{11}$ and $Y_{14}$ may each be N, and $Y_{12}$ and $Y_{13}$ may each be C;

$Y_{11}$ and $Y_{12}$ may each be C, and $Y_{13}$ and $Y_{14}$ may each be N;

$Y_{11}$ and $Y_{12}$ may each be N, and $Y_{13}$ and $Y_{14}$ may each be C;

$Y_{11}$ and $Y_{13}$ may each be C, and $Y_{12}$ and $Y_{14}$ may each be N; or $Y_{11}$ and $Y_{13}$ may each be N, and $Y_{12}$ and $Y_{14}$ may each be C, $A_{11}$ to $A_{14}$ may each independently be selected from a benzene group, a naphthalene group, an indene group, a fluorene group, an indole group, a carbazole group, a benzofuran group, a dibenzofuran group, a benzothiophene group, a dibenzothiophene group, a pyridine group, a pyrimidine group, a pyrazine group, a triazine group, a quinoline group, an isoquinoline group, a quinoxaline group, a quinazoline group, a pyrazole group, an imidazole group, a 2,3-dihydroimidazole group, a triazole group, a 2,3-dihydrotriazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, and a 2,3-dihydroimidazopyrazine group, $A_{15}$ and $A_{16}$ may each independently be selected from a benzene group, a cyclopentadiene group, a furan group, a thiophene group, a silole group, a dihydropyridine group, a pyridine group, a pyrimidine group, a pyrazine group, a pyridazine group, a triazine group, a quinoline group, an isoquinoline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group, $R_{11}$ to $R_{14}$ and b11 to b14 are each independently the same as described in Formula 1, $R_{15}$ and $R_{16}$ are each independently the same as described in connection with $R_{11}$ in Formula 1, and b15 and b16 are each independently the same as described in connection with b11 in Formula 1.

For example, $R_{11}$ to $R_{18}$ in Formulae 1-21 to 1-24 may each independently be selected from:

hydrogen, deuterium, —F, —Cl, —Br, —I, a cyano group, a methyl group, an ethyl group, an n-propyl group, an iso-propyl group, an n-butyl group, an iso-butyl group, a sec-butyl group, and a tert-butyl group;

a methyl group, an ethyl group, an n-propyl group, an iso-propyl group, an n-butyl group, an iso-butyl group, a sec-butyl group, and a tert-butyl group, each substituted with at least one selected from deuterium, —F, —Cl, —Br, —I, and a cyano group; and a phenyl group, a naphthyl group, and a pyridinyl group, but embodiments of the present disclosure are not limited thereto.

In one embodiment, the organometallic compound represented by Formula 1 may be selected from Compounds 1 to 250, but embodiments of the present disclosure are not limited thereto:

1

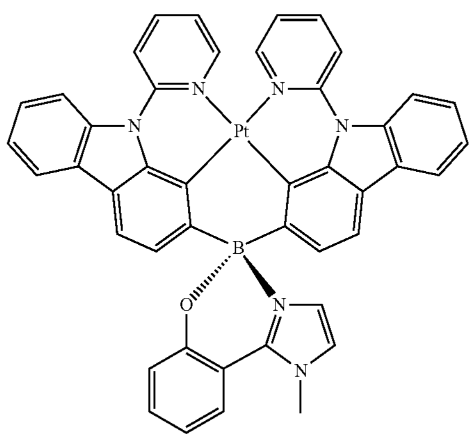

2

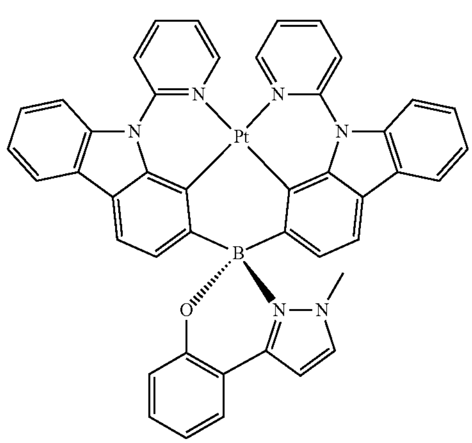

-continued

3

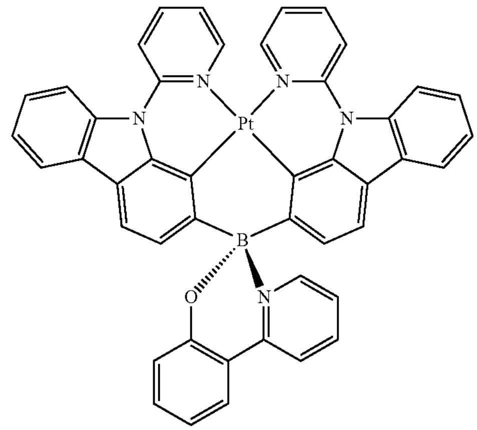

4

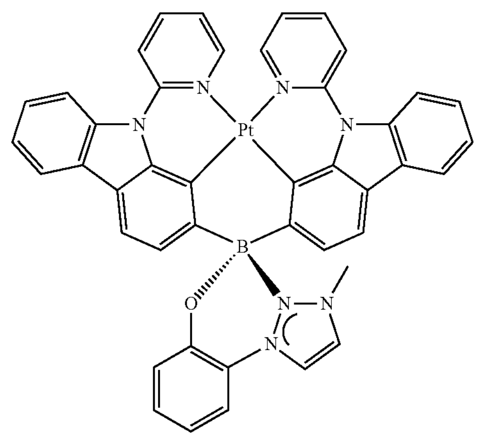

5

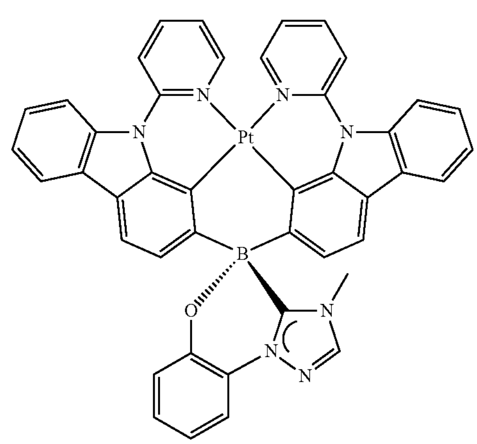

-continued
6
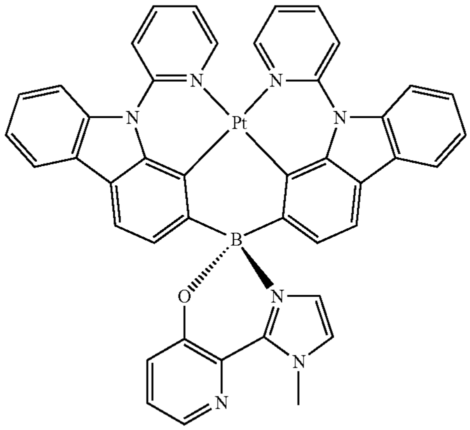
7
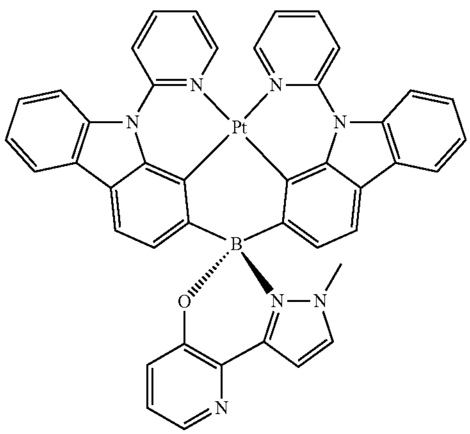
8
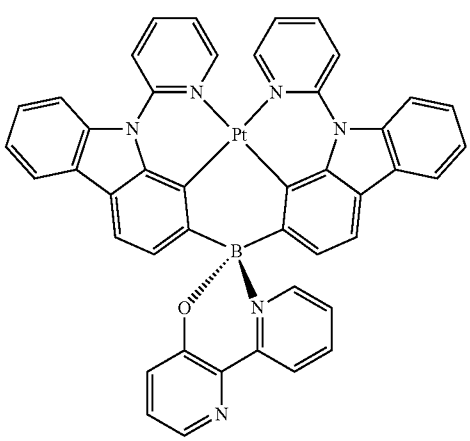
-continued
9
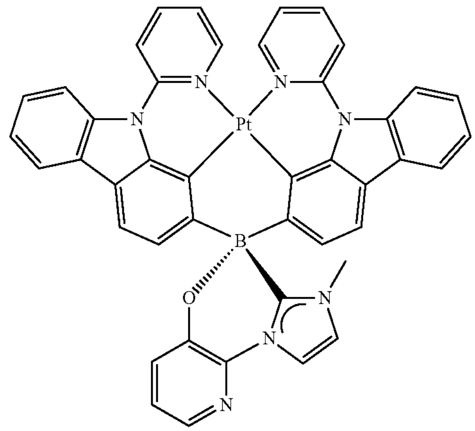
10
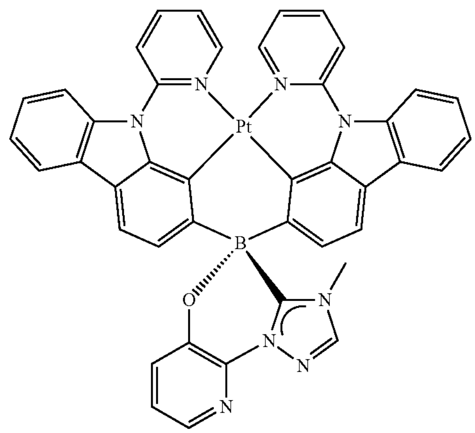
11
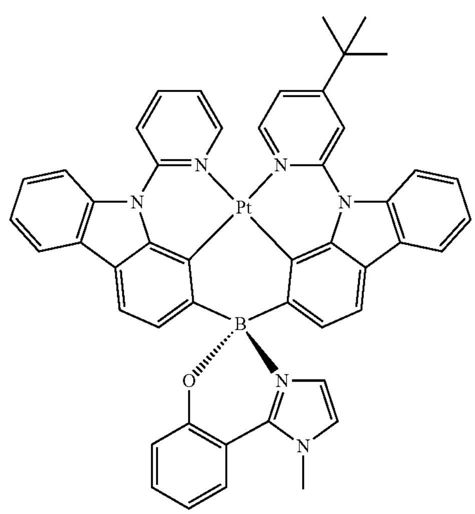

12
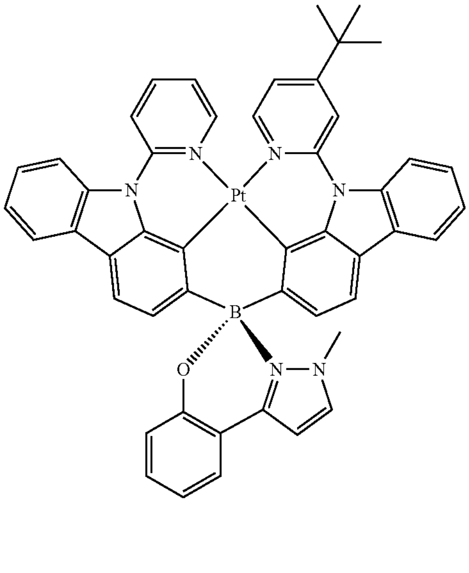
13
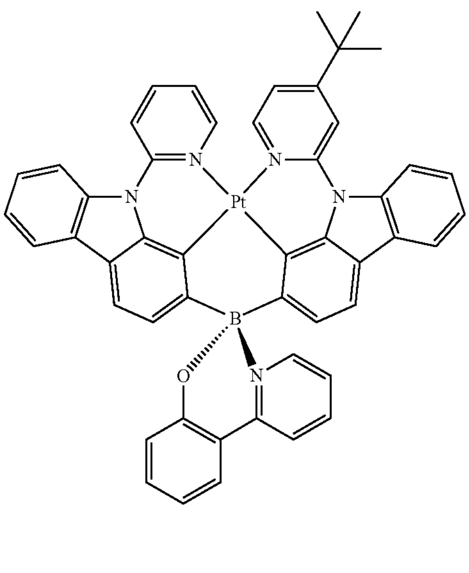
14
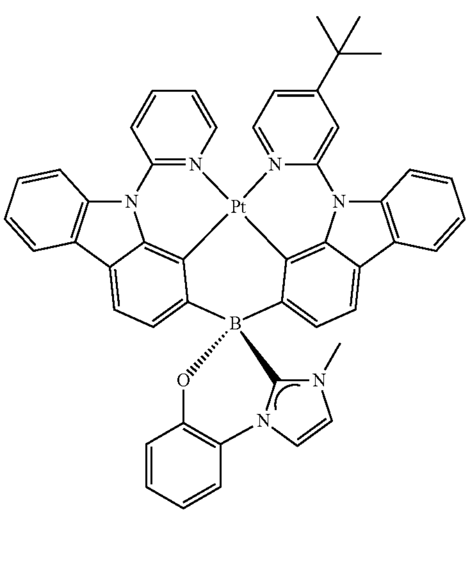
15
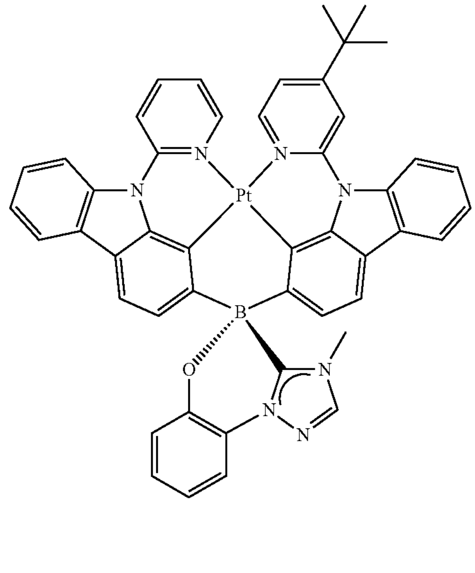
16
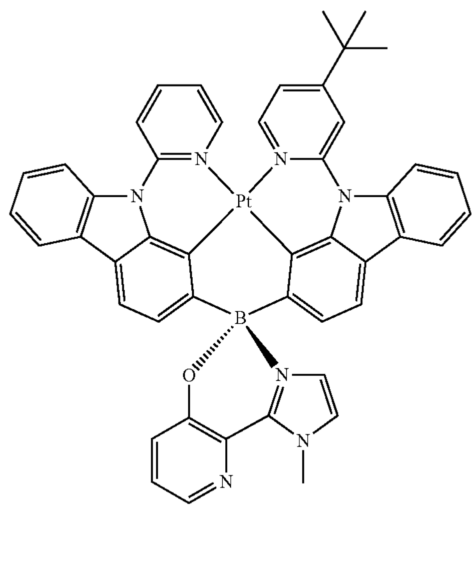
17
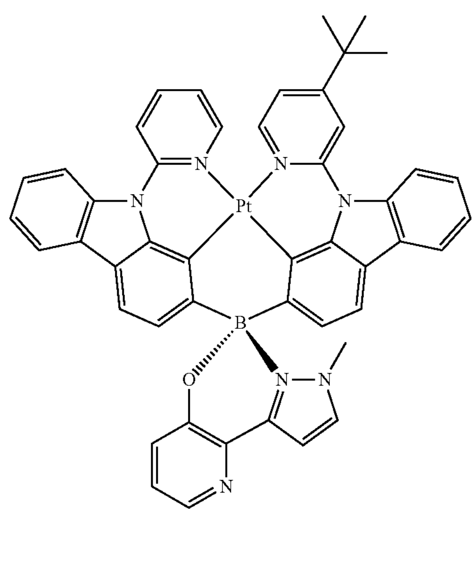

-continued
18
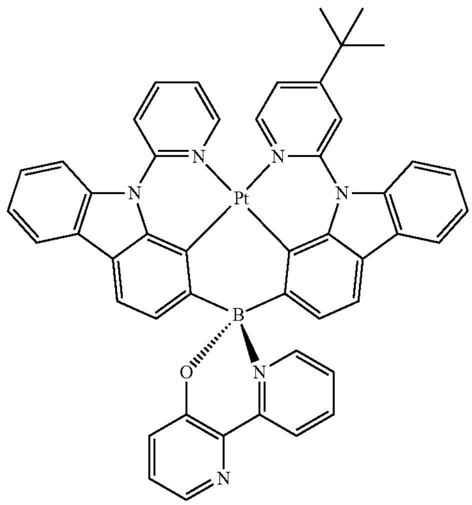
19
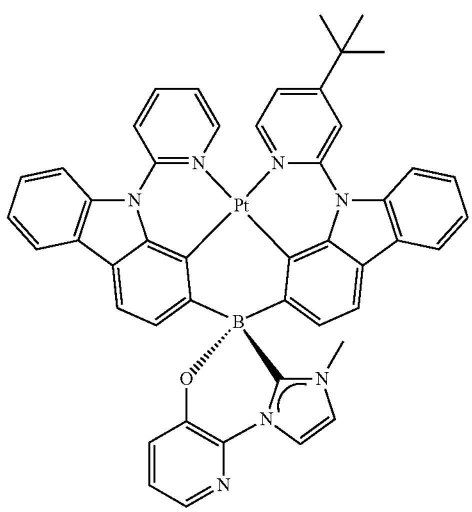
20
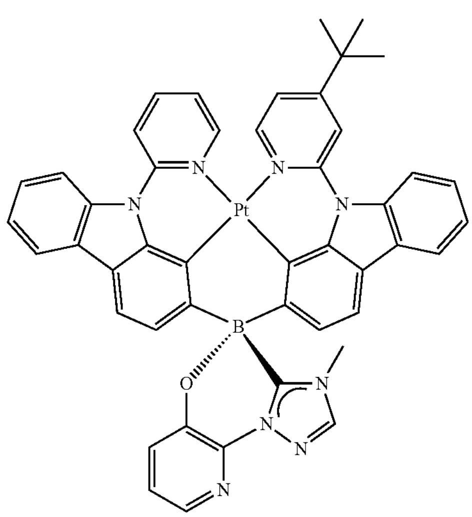
-continued
21
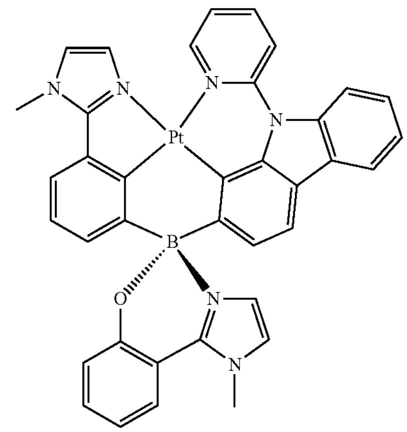
22
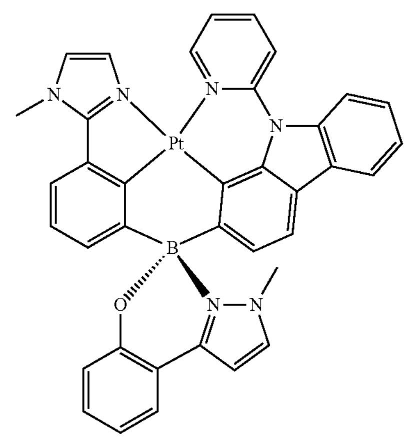
23
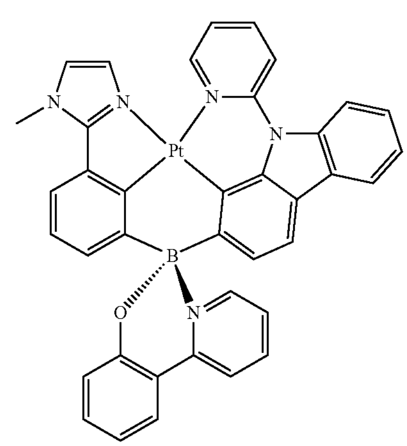

-continued
24
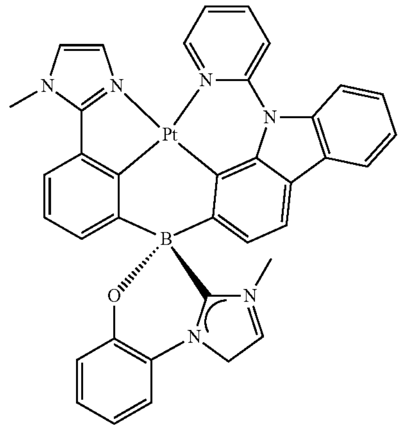
25
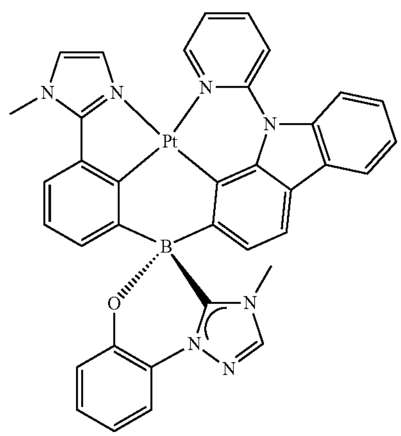
26
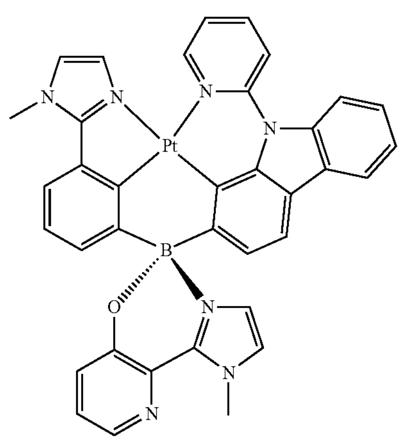
-continued
27
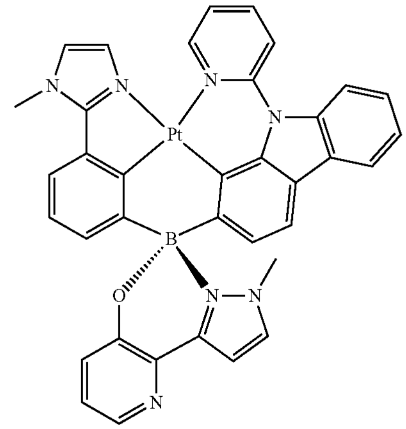
28
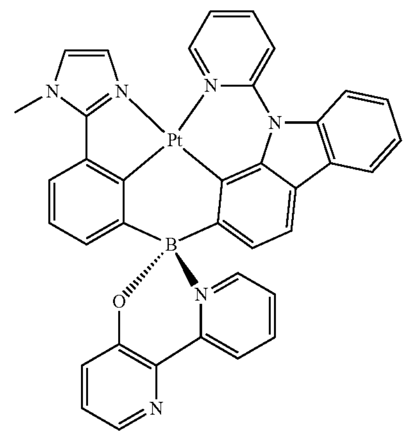
29
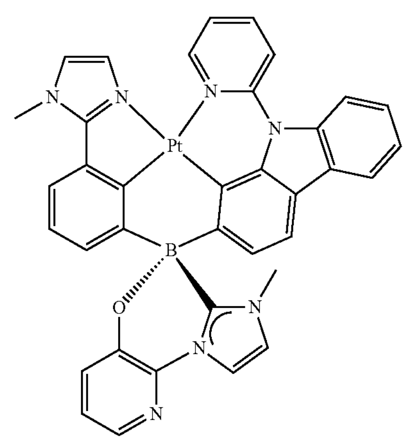

-continued
30
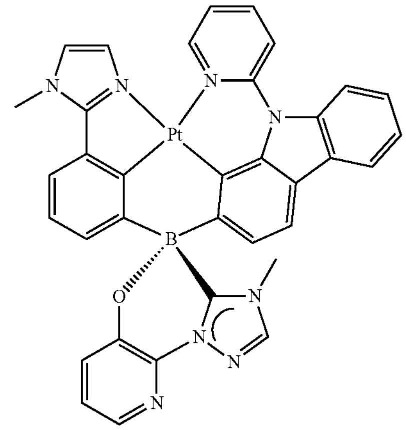
31
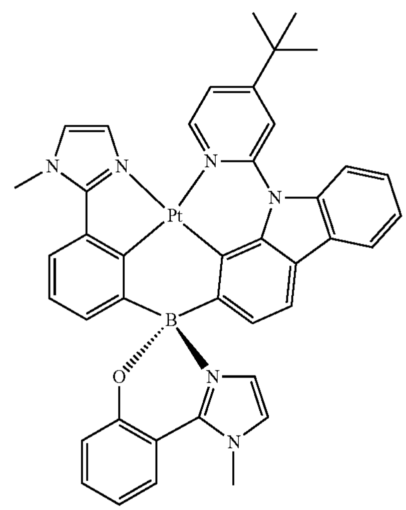
32
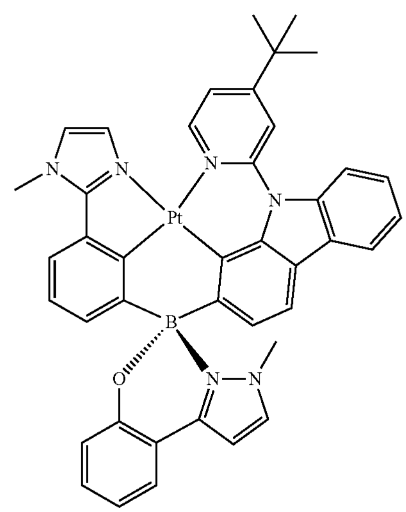
-continued
33
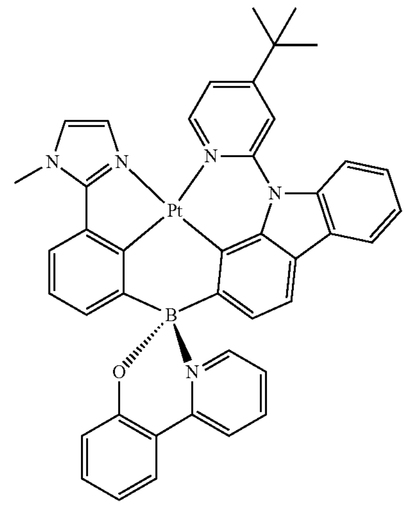
34
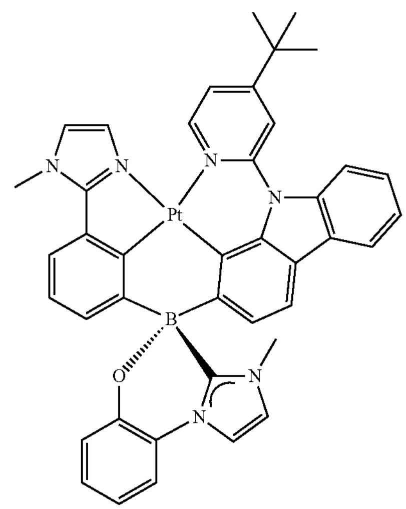
35
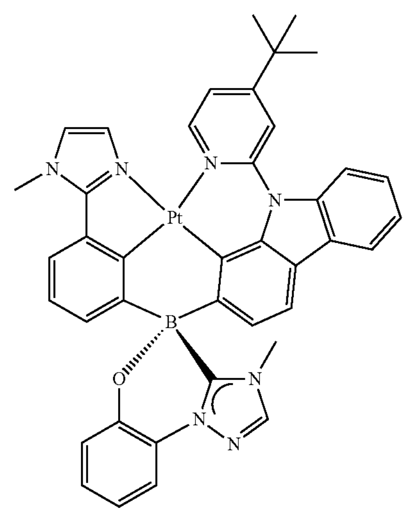

-continued
36
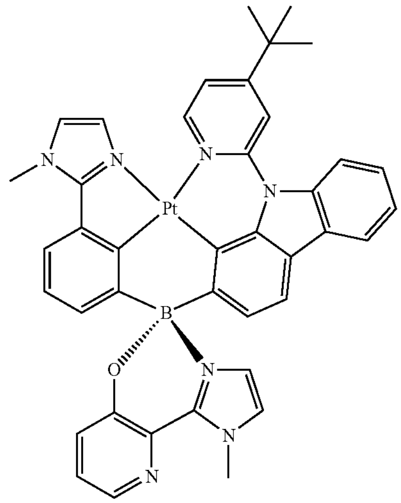
37
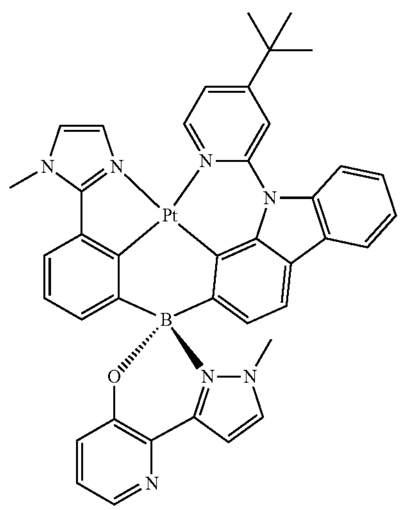
38
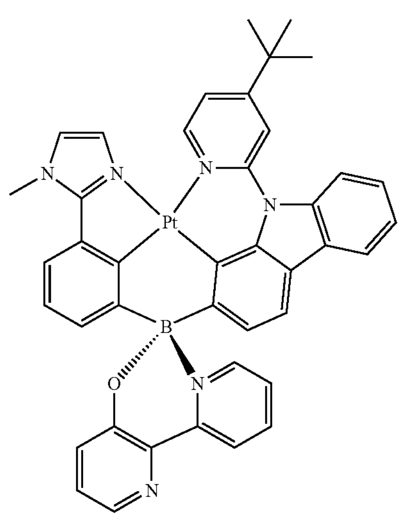
-continued
39
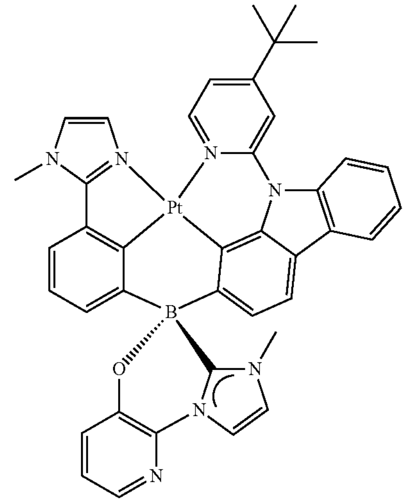
40
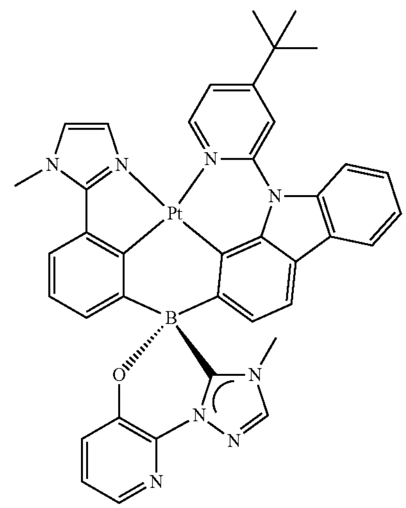
41
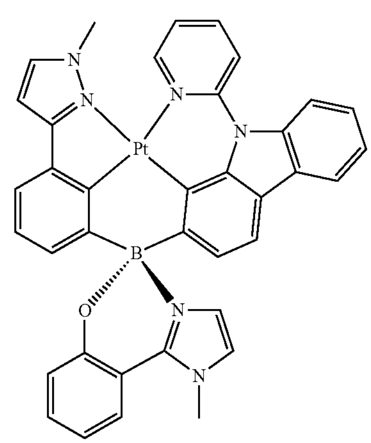

-continued
42
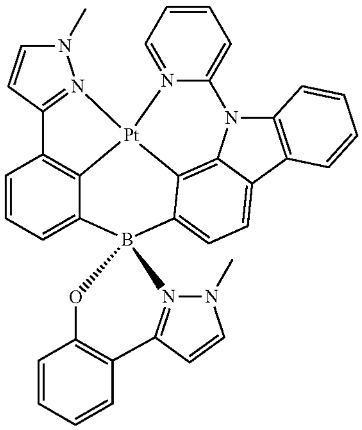
43
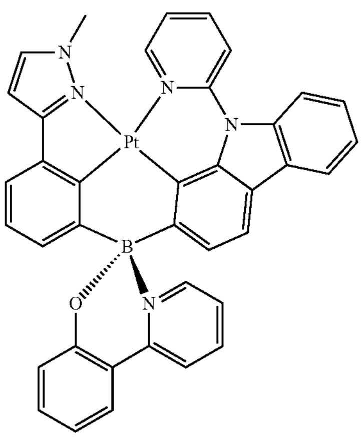
44
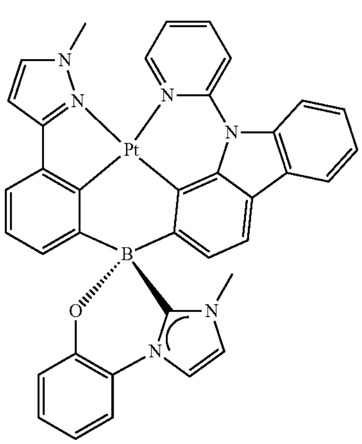
-continued
45
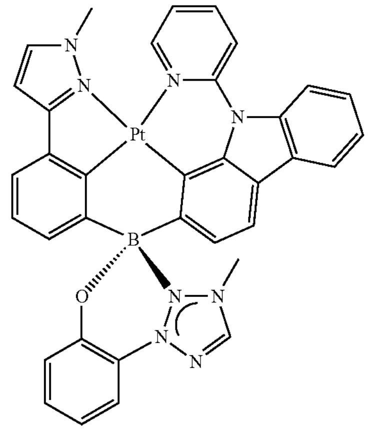
46
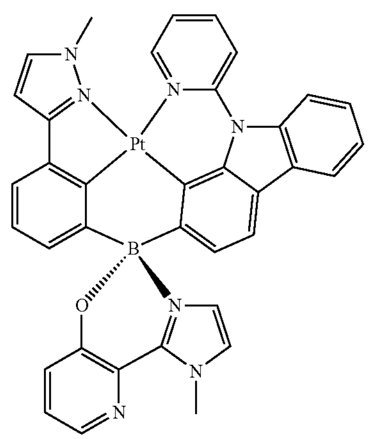
47
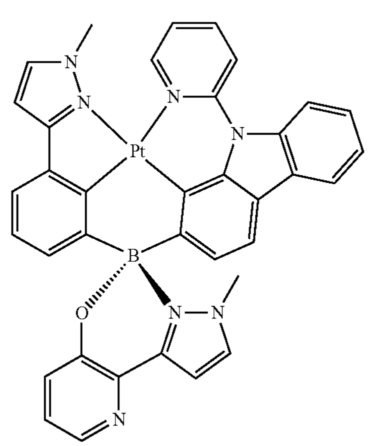

-continued
48
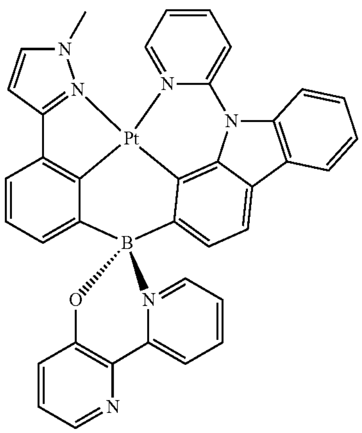
49
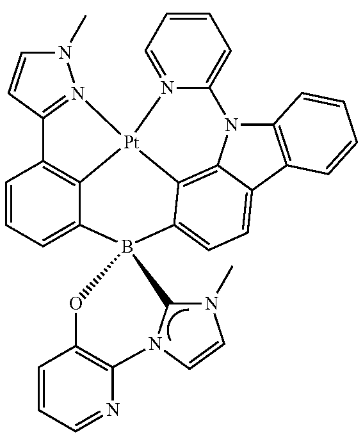
50
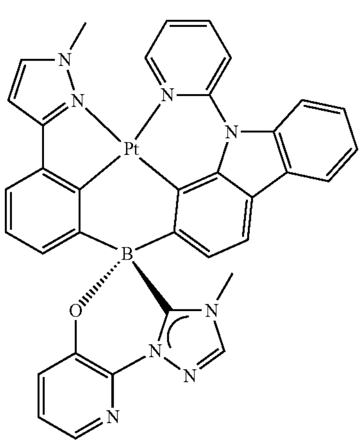
-continued
51
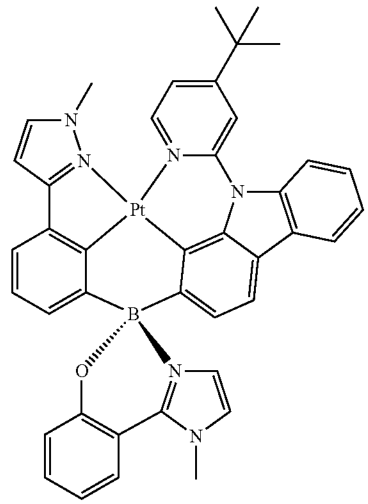
52
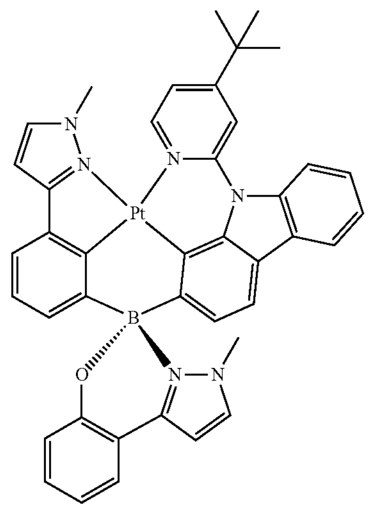
53
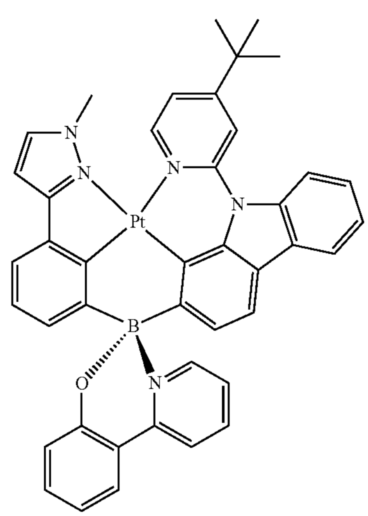

-continued
54
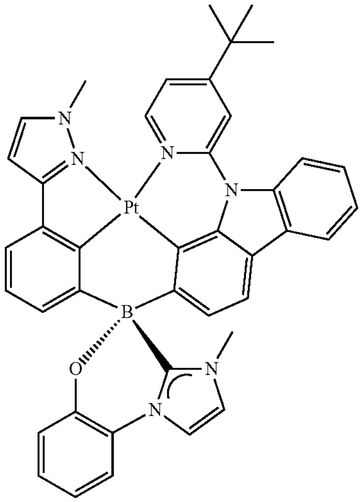
55
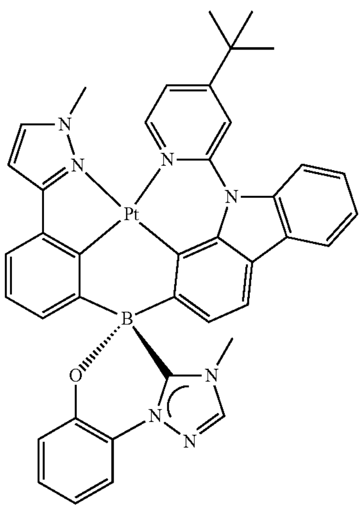
56
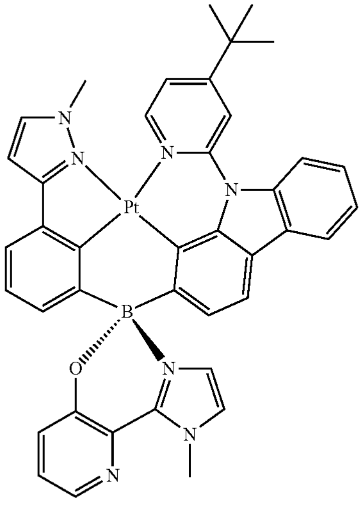
-continued
57
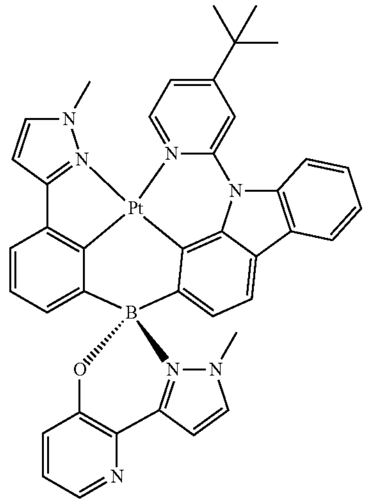
58
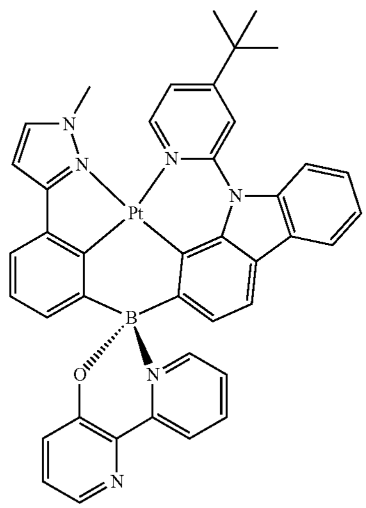
59
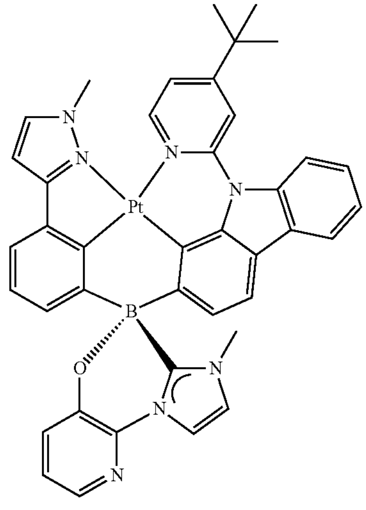

60
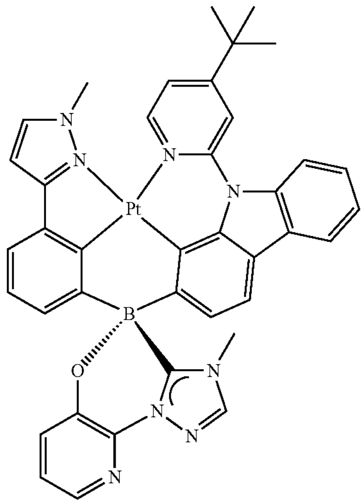
61
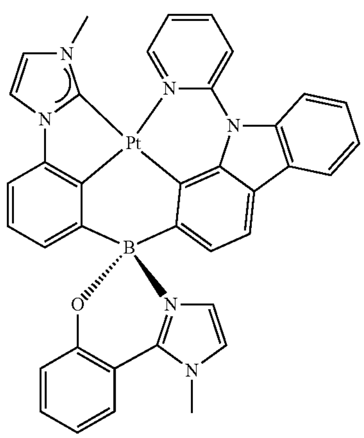
62
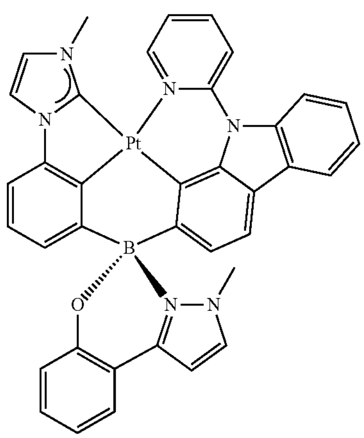
63
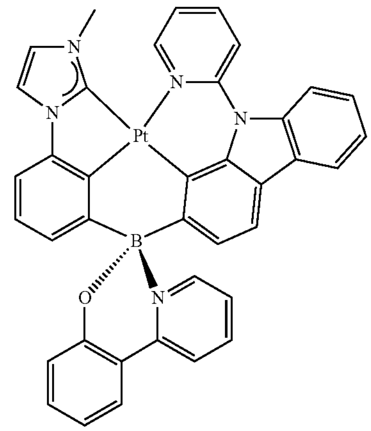
64
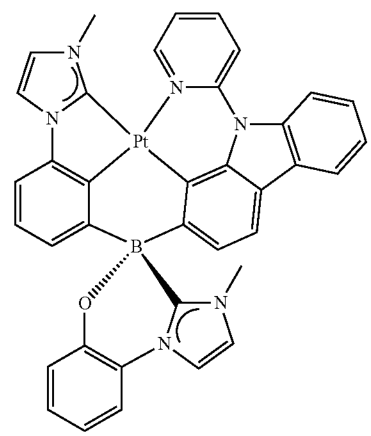
65
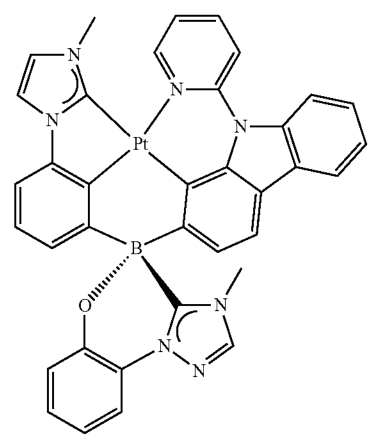

66
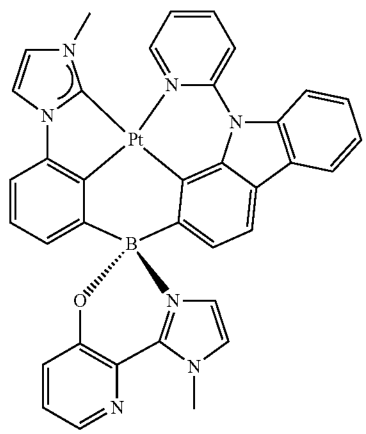
69
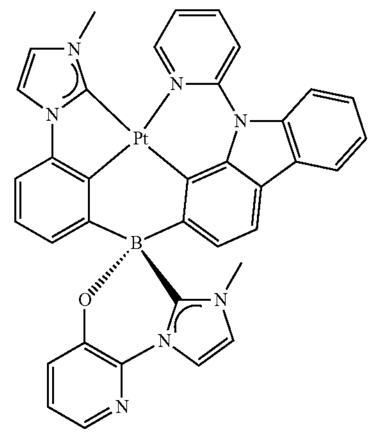
67
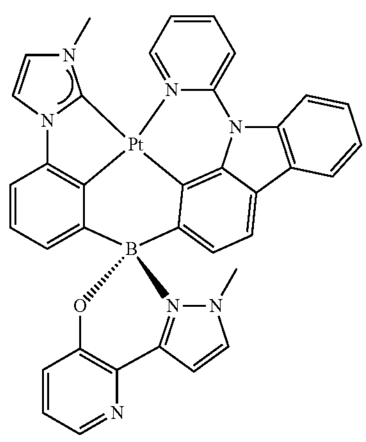
70
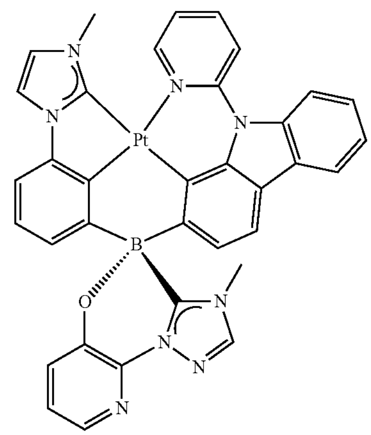
68
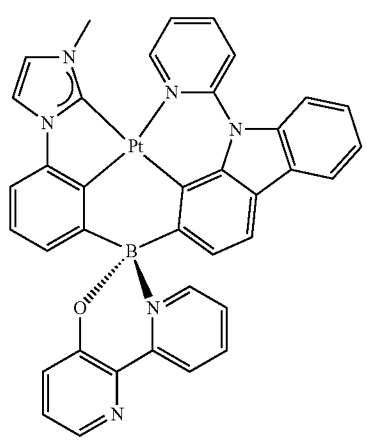
71
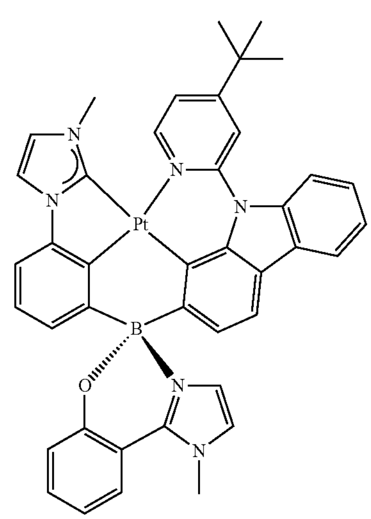

72
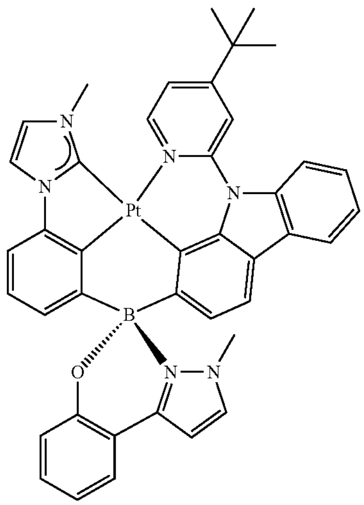
75
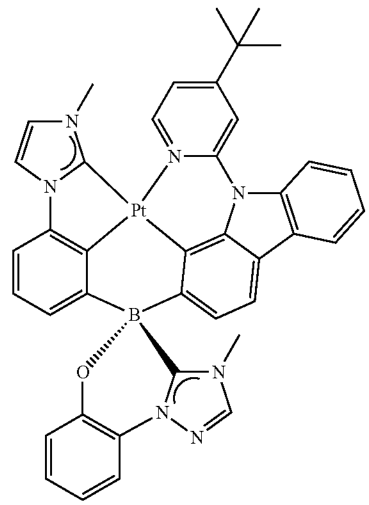
73
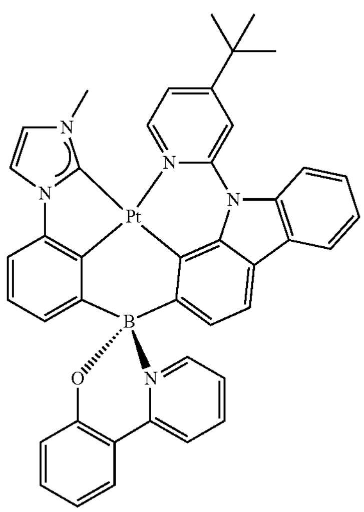
76
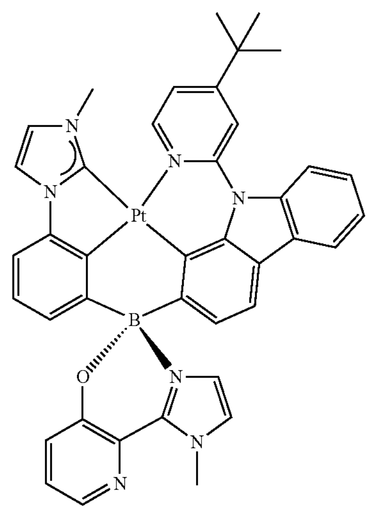
74
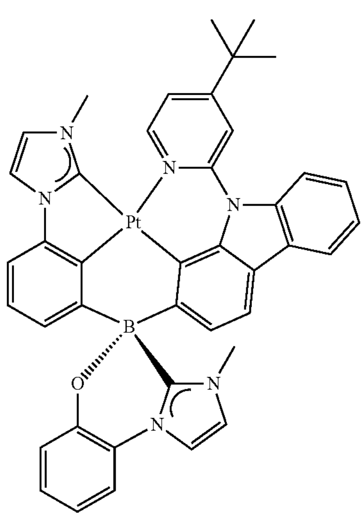
77
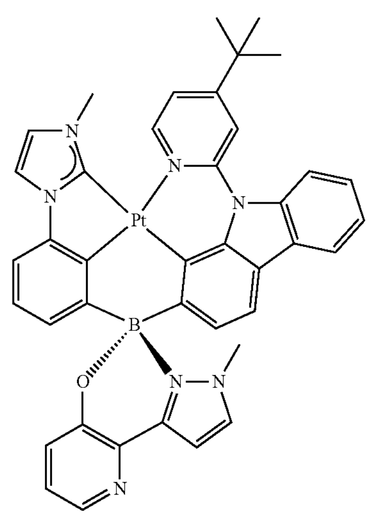

-continued
78
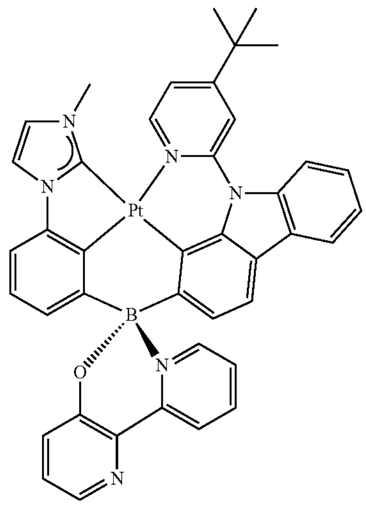
79
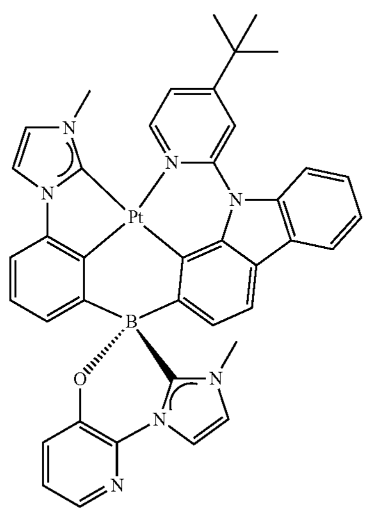
80
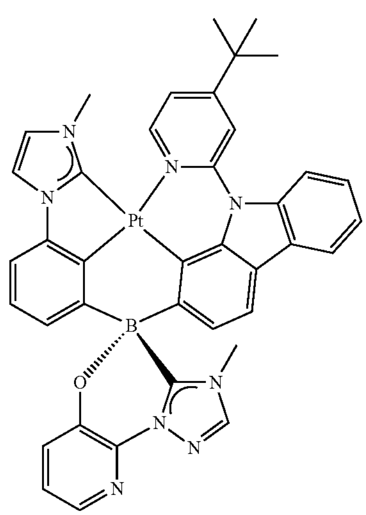
-continued
81
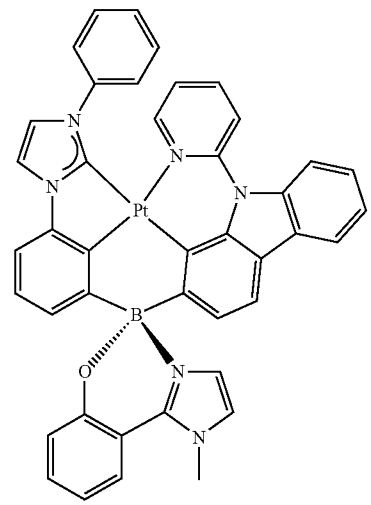
82
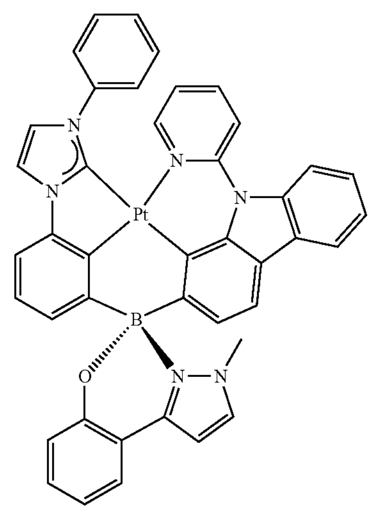
83
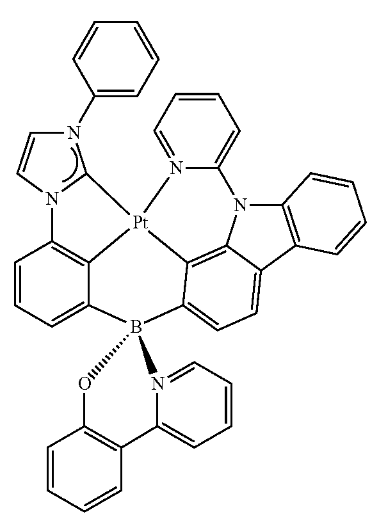

-continued
84
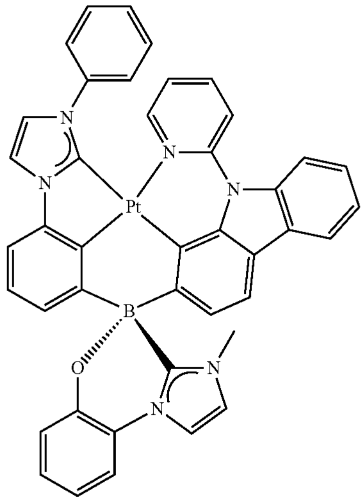
85
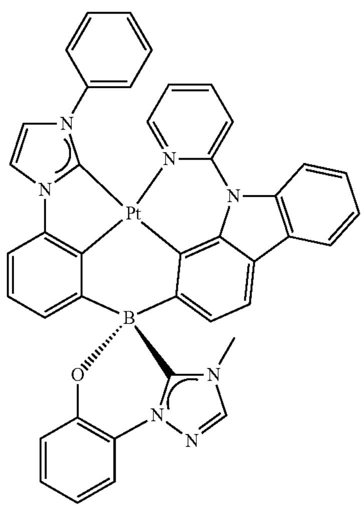
86
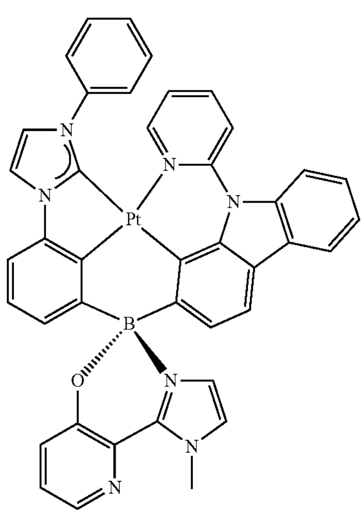
-continued
87
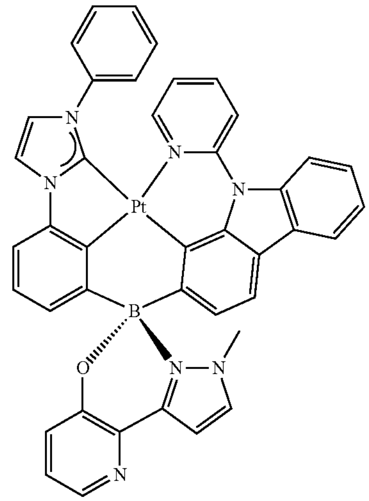
88
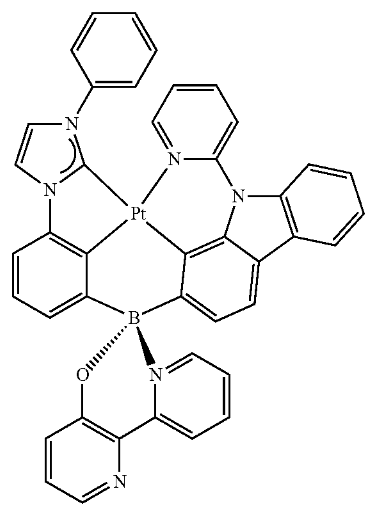
89
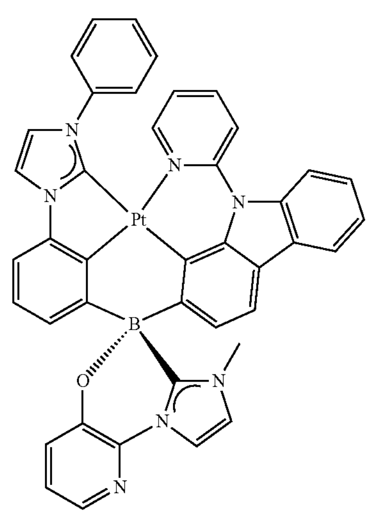

-continued
90
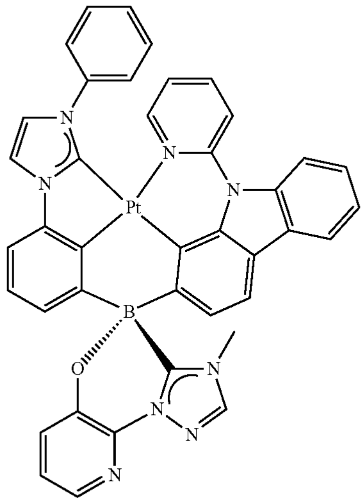
91
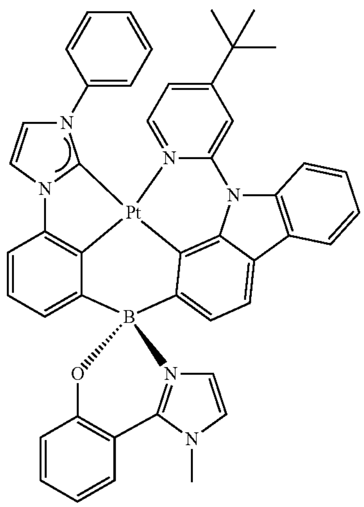
92
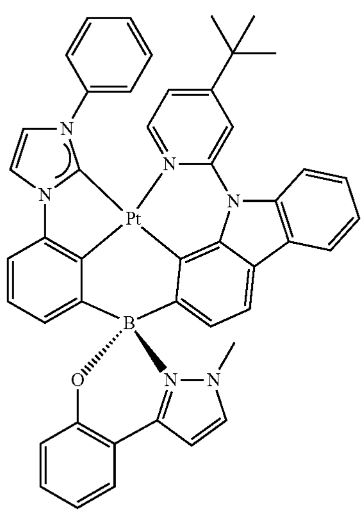
-continued
93
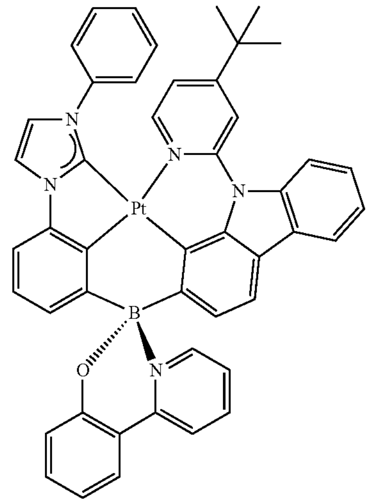
94
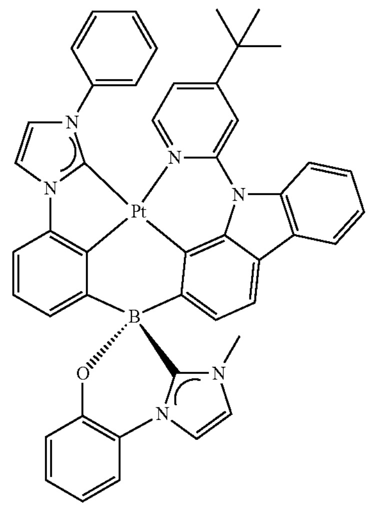
95
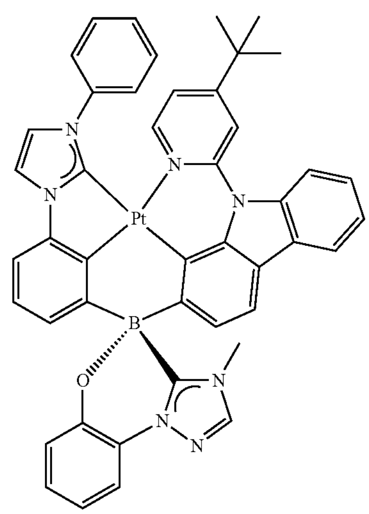

-continued
96
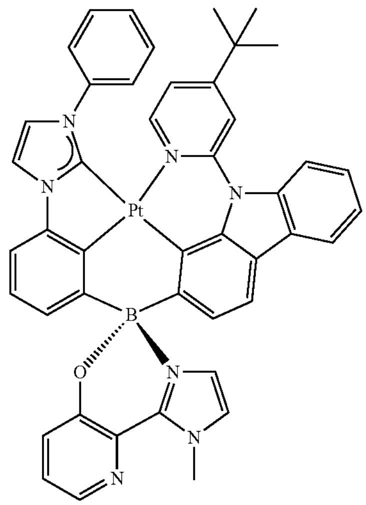
97
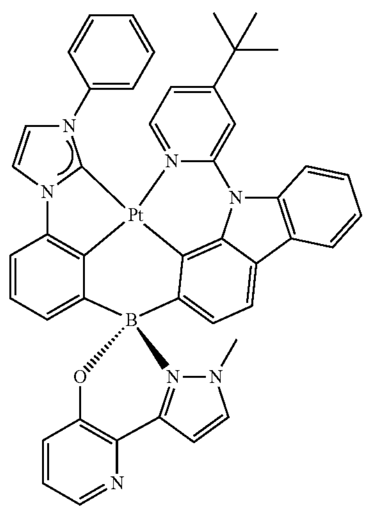
98
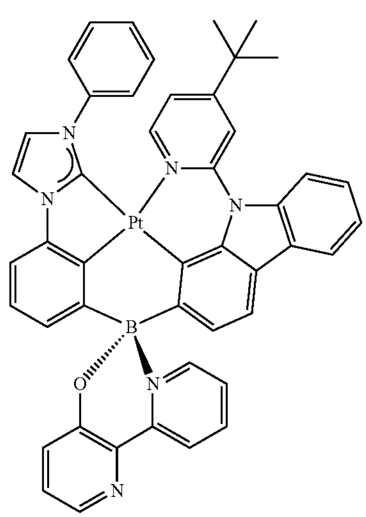
-continued
99
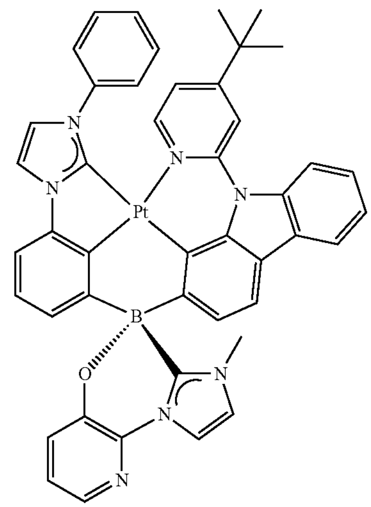
100
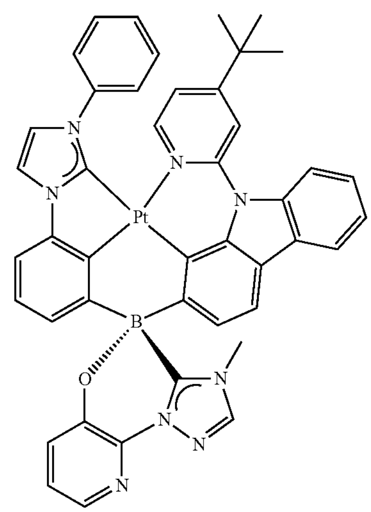
101
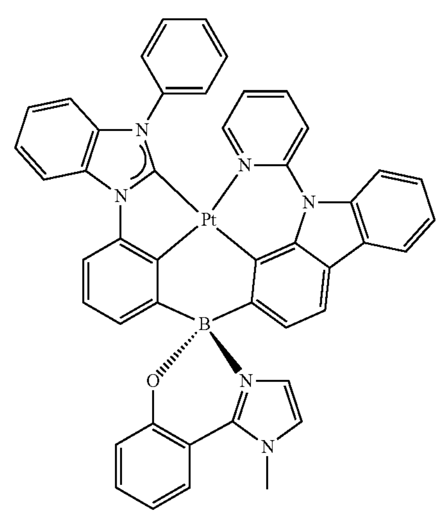

-continued
102
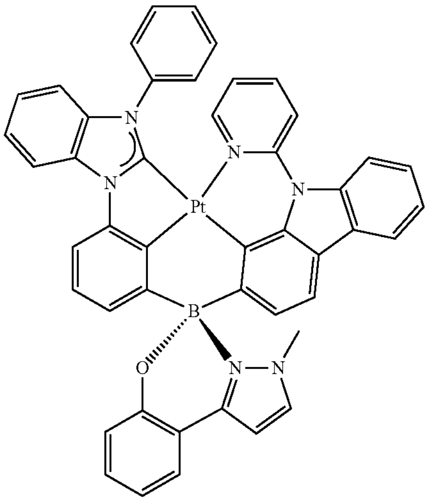
103
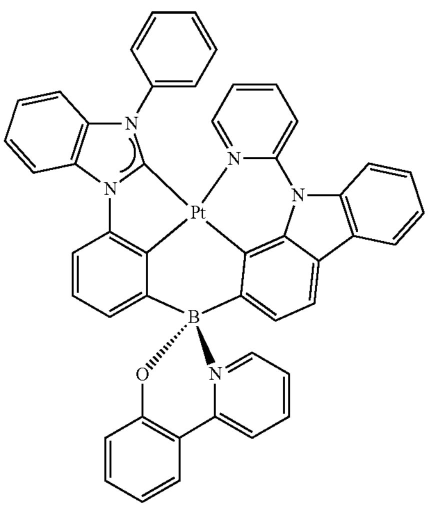
104
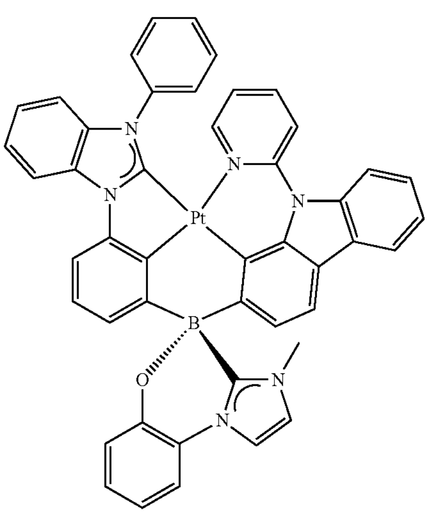
-continued
105
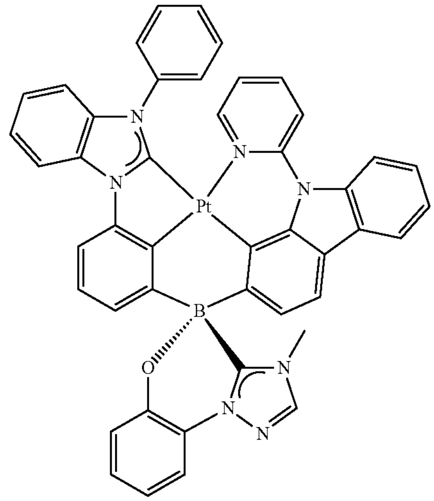
106
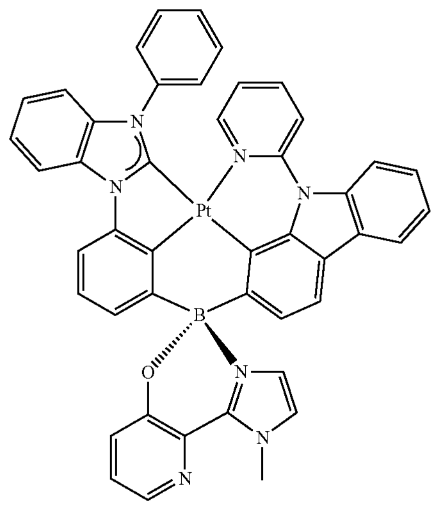
107
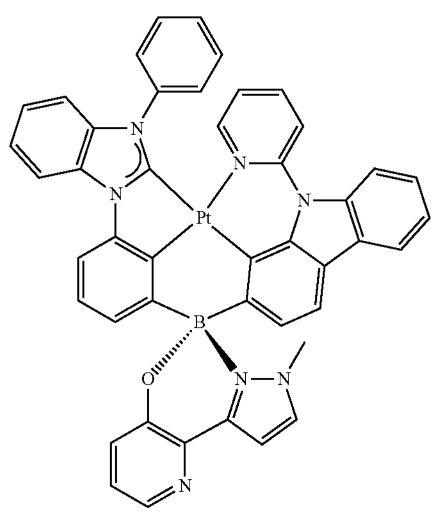

108
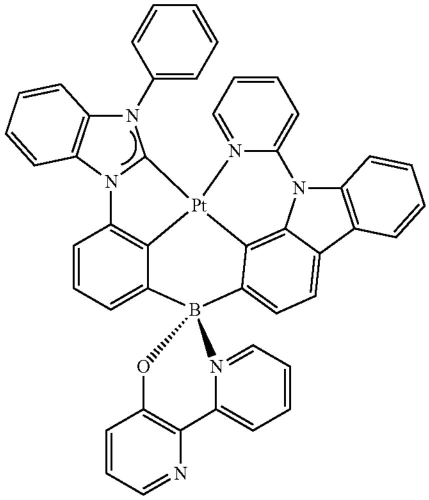
109
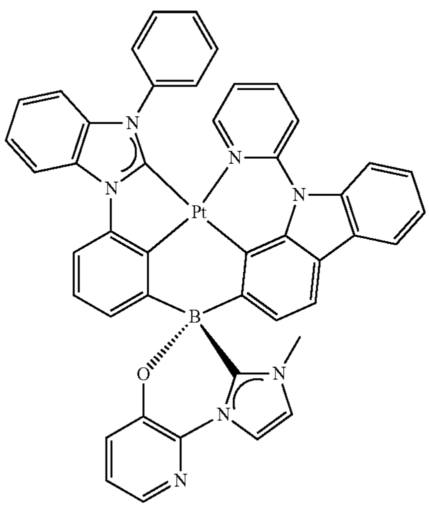
110
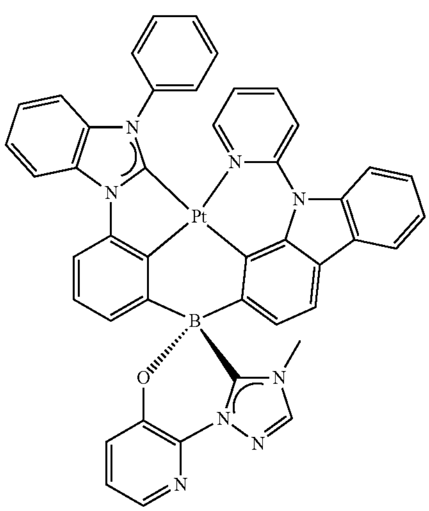
111
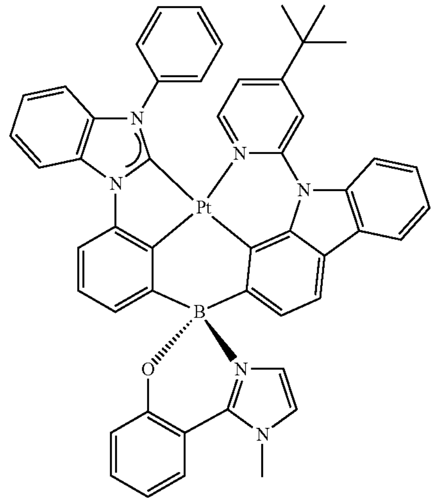
112
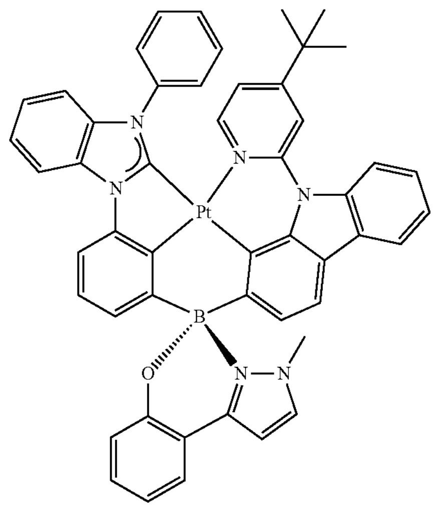
113
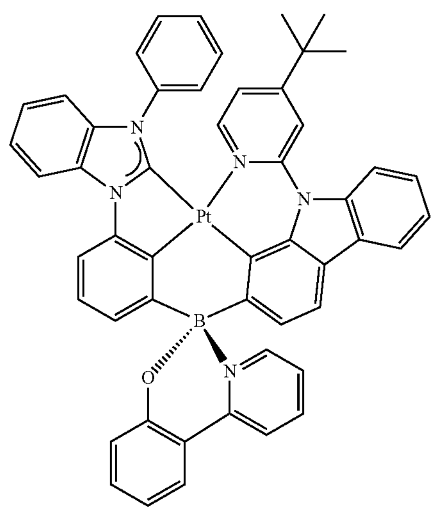

-continued
114
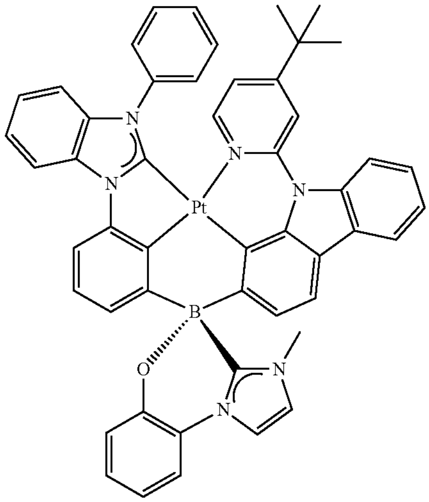
115
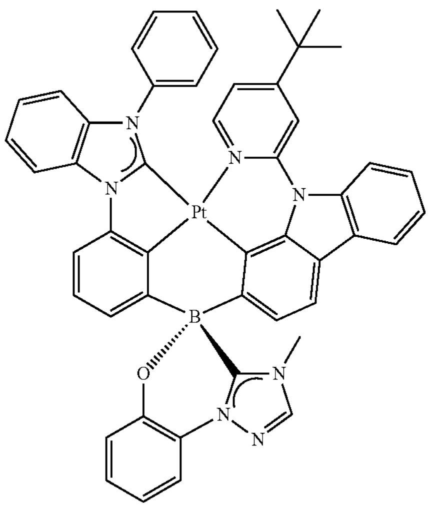
116
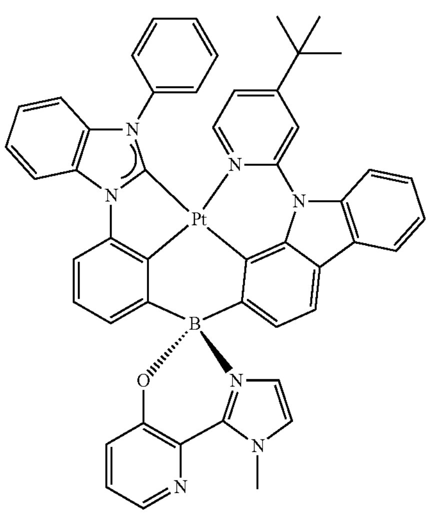
-continued
117
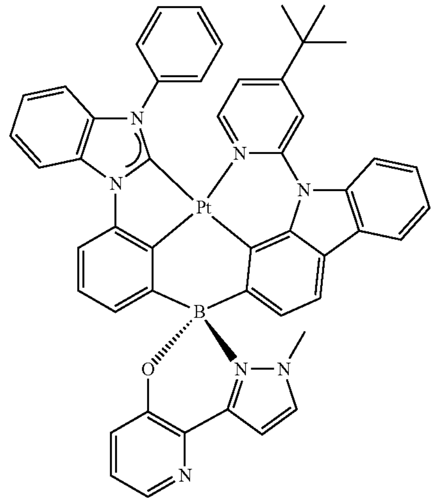
118
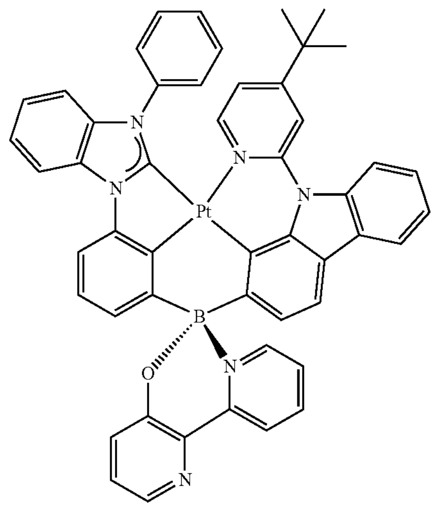
119
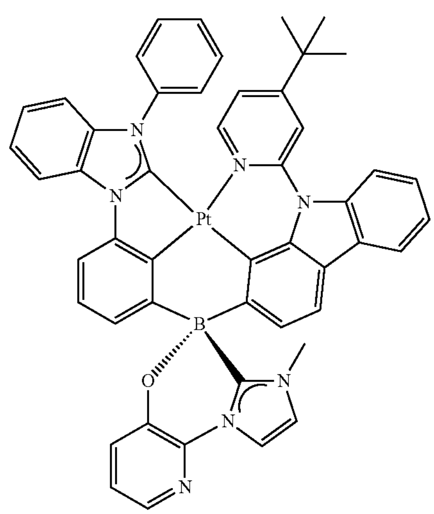

-continued
120
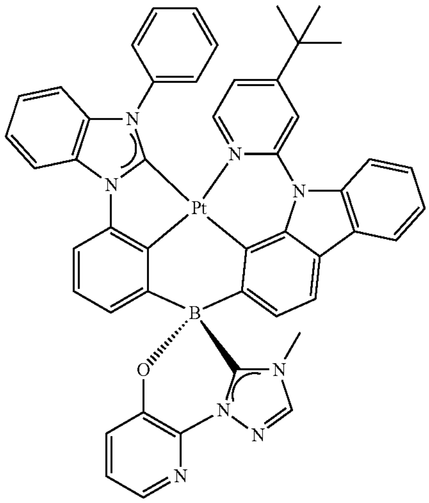
121
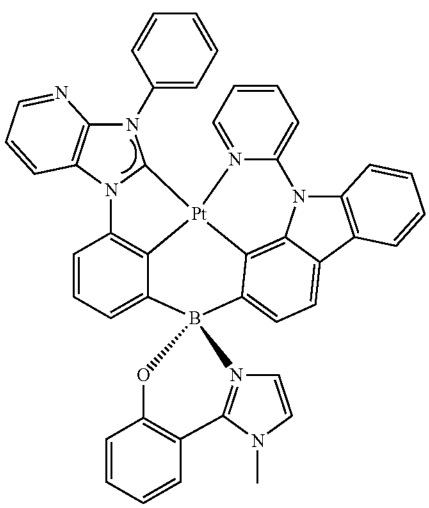
122
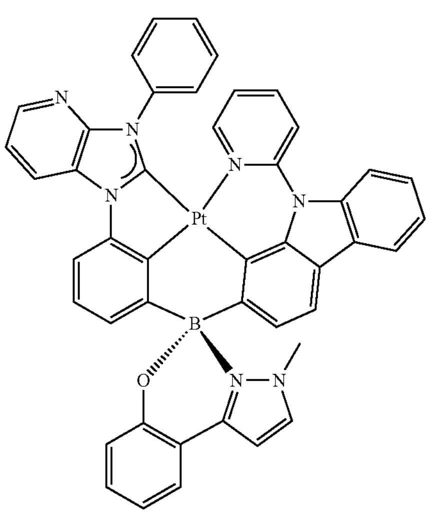
-continued
123
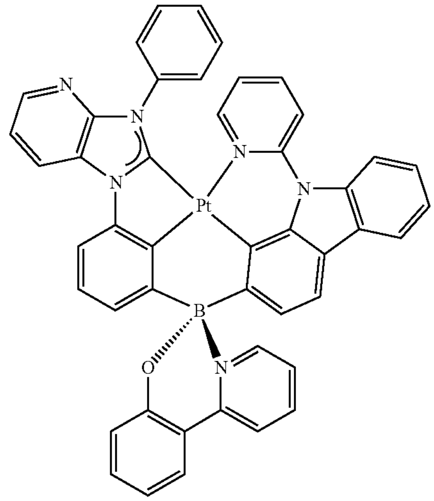
124
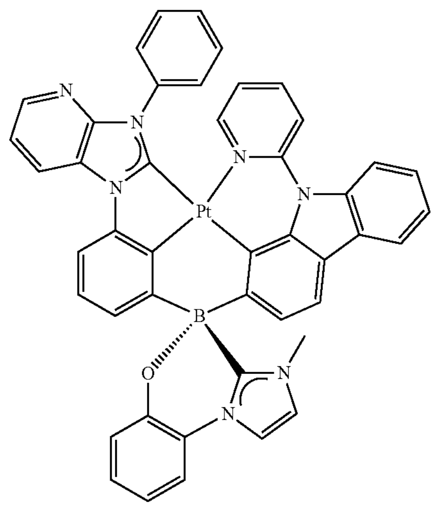
125
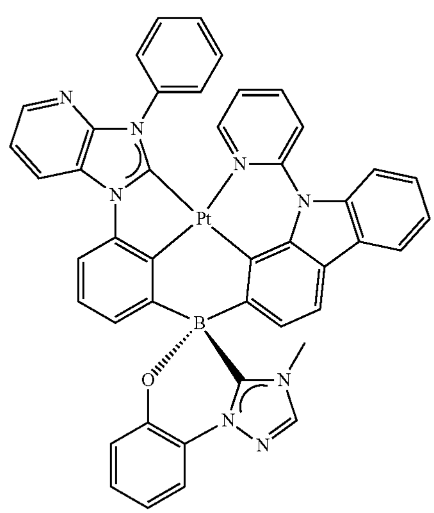

-continued
126
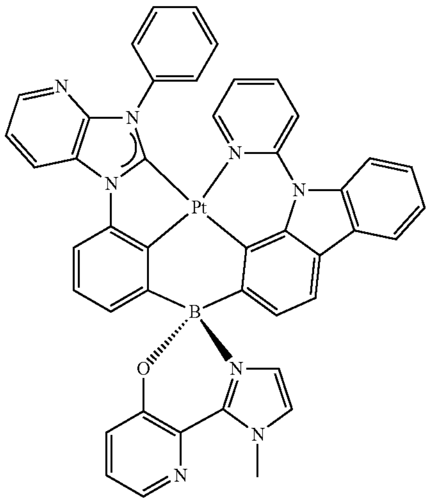
127
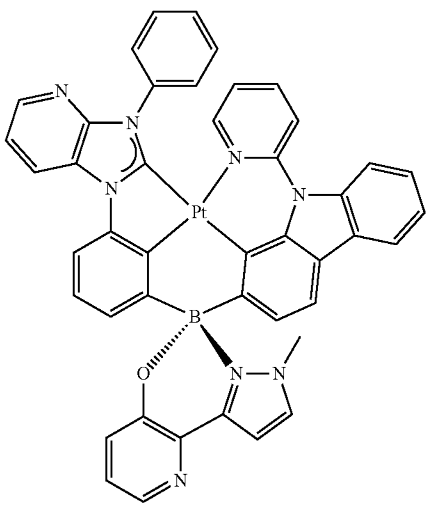
128
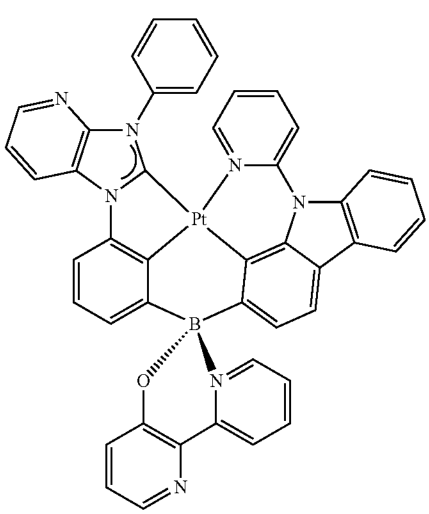
-continued
129
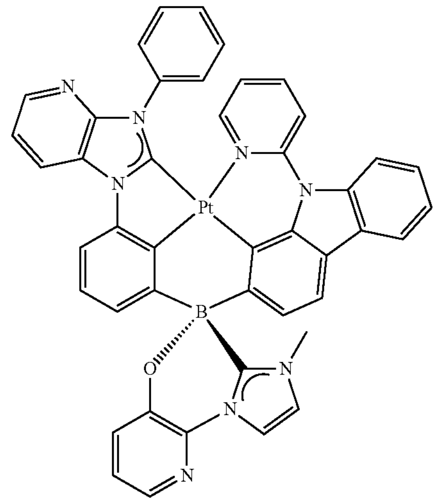
130
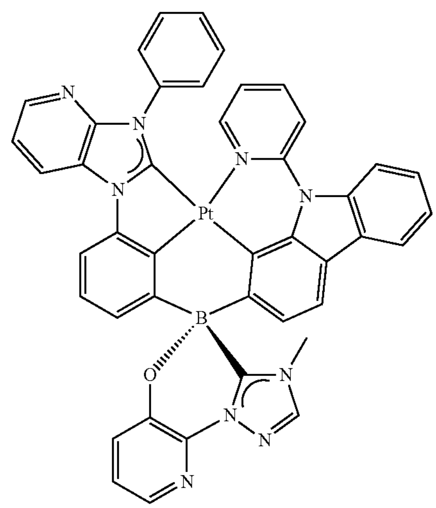
131
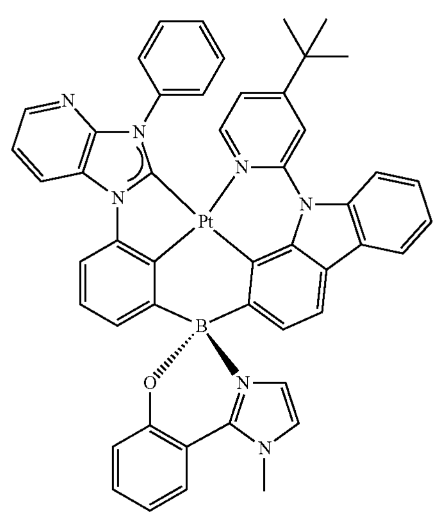

-continued
132
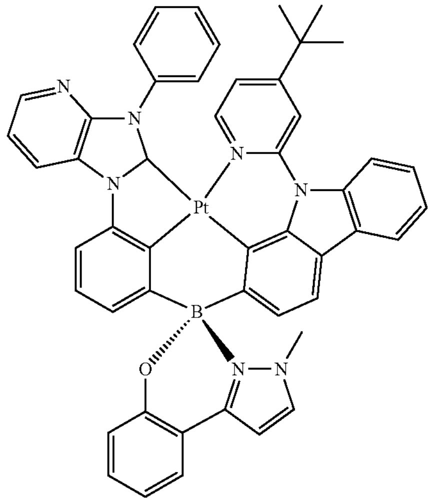
133
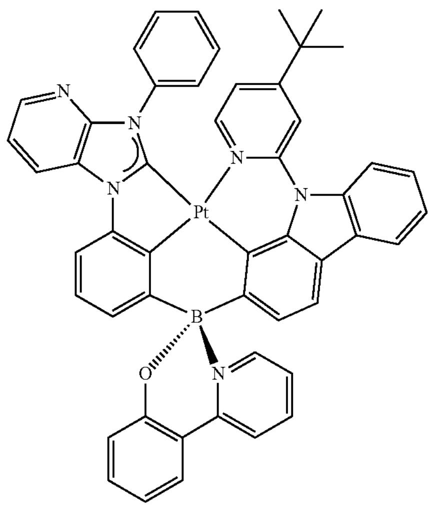
134
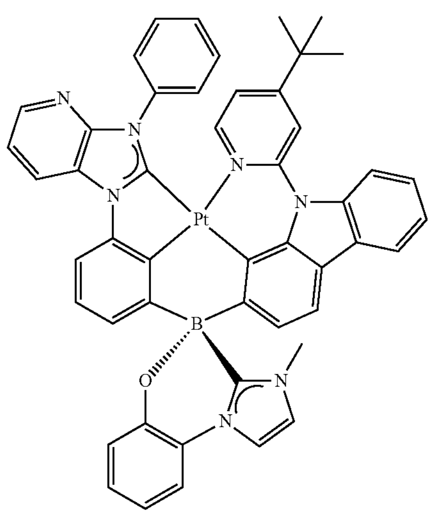
-continued
135
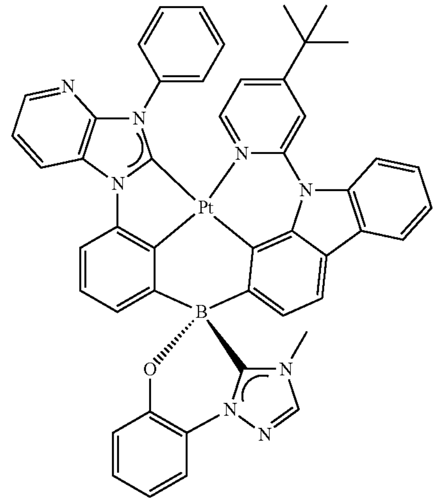
136
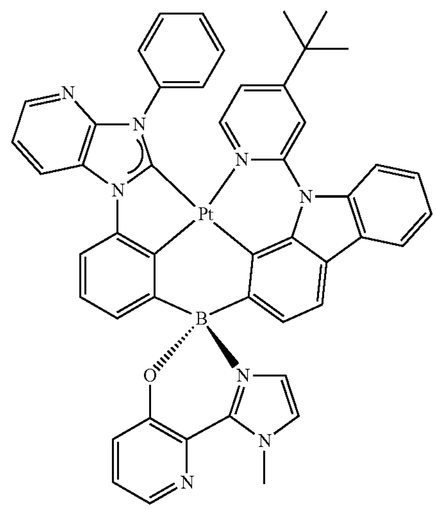
137
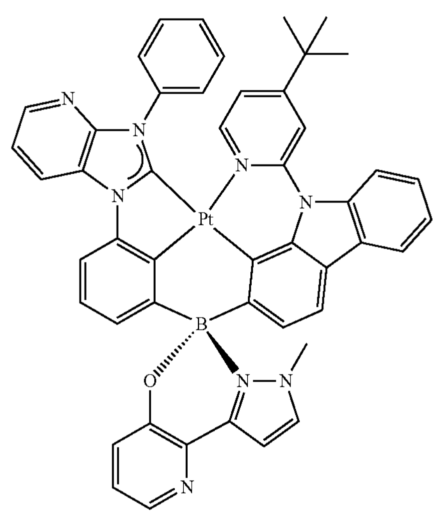

-continued
138
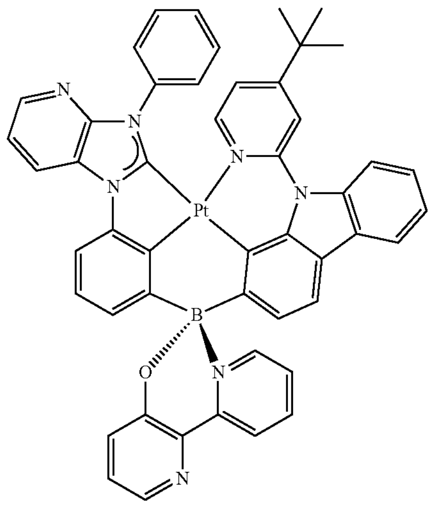
139
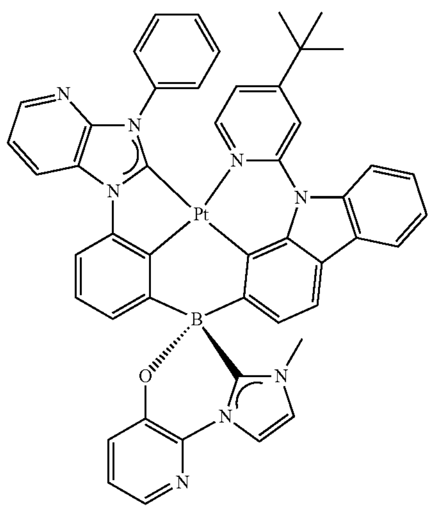
140
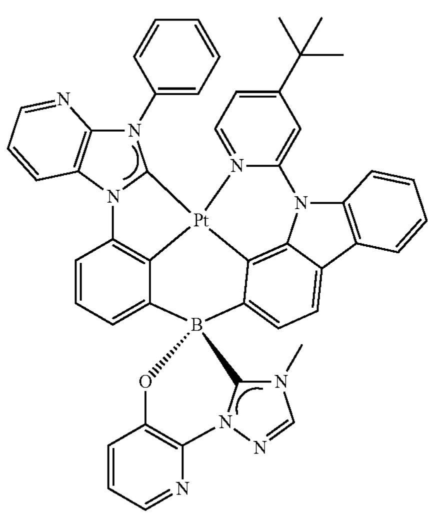
-continued
141
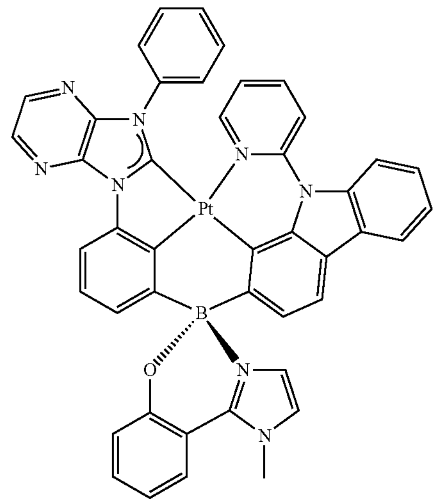
142
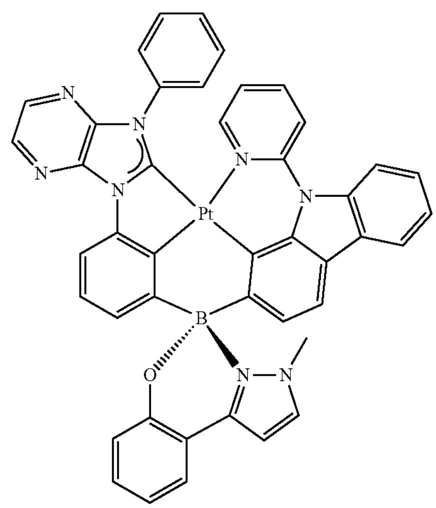
143
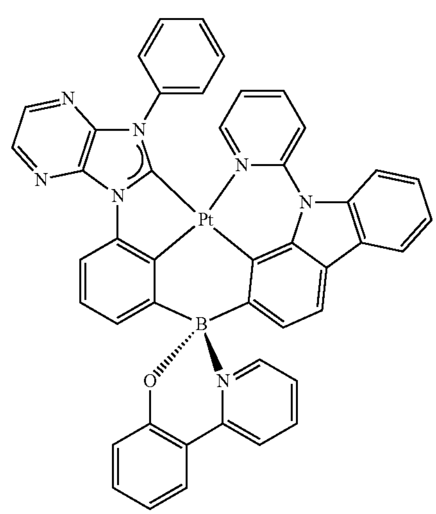

-continued
144
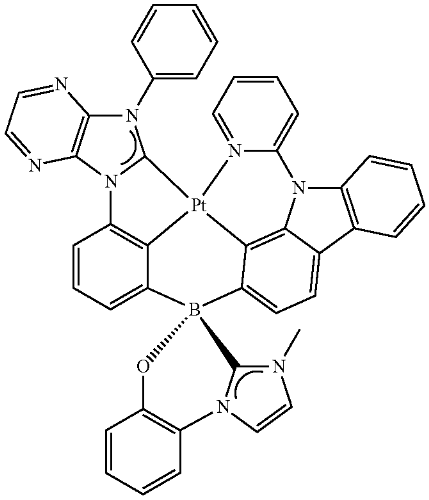
145
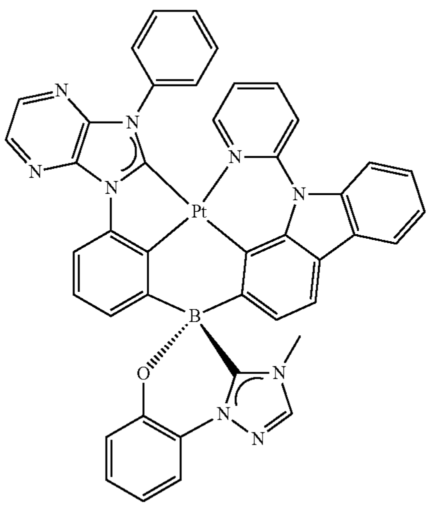
146
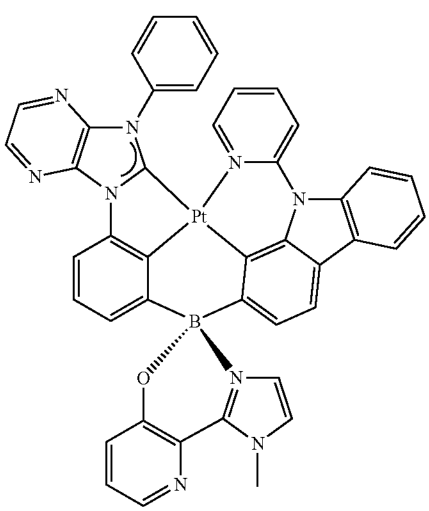
-continued
147
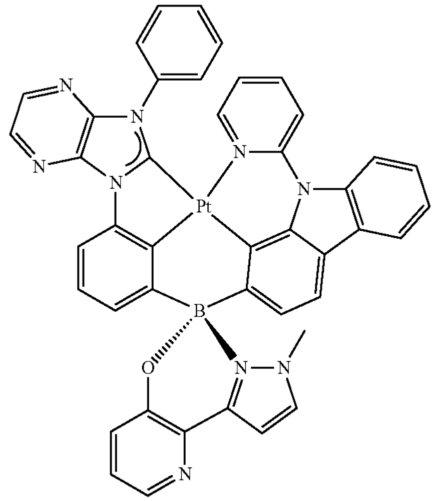
148
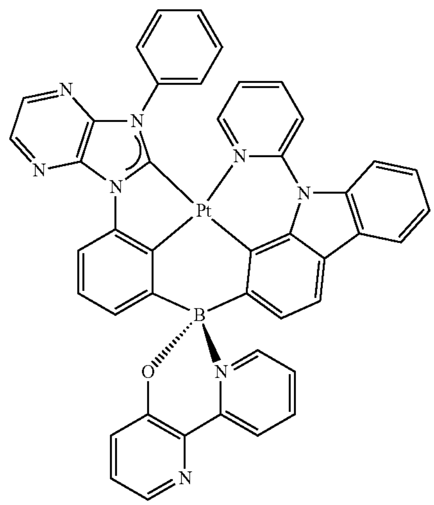
149
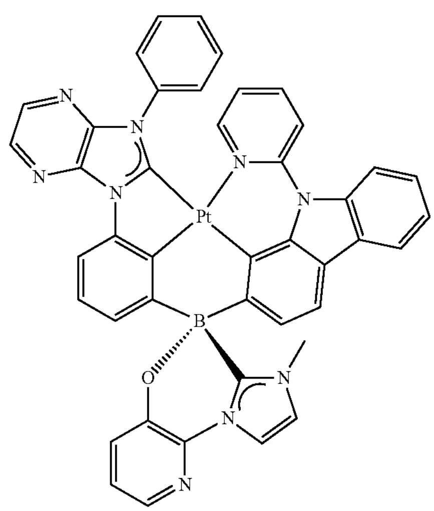

-continued
150
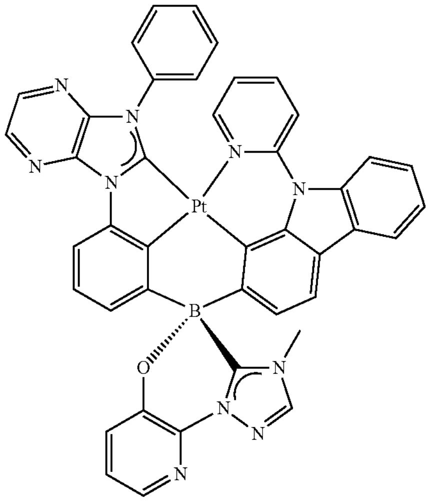
151
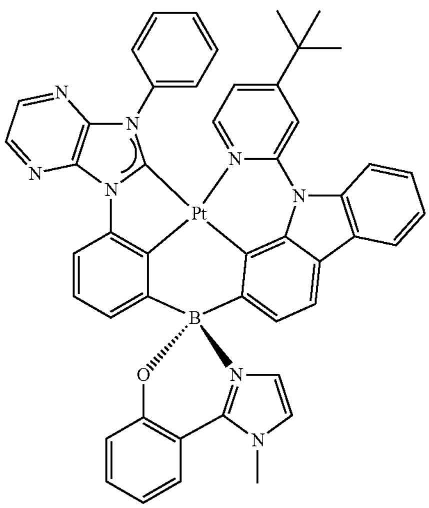
152
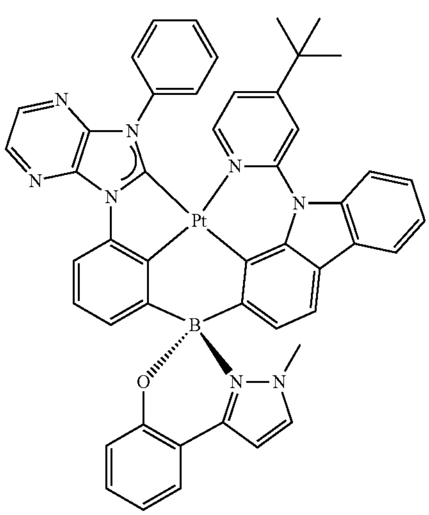
-continued
153
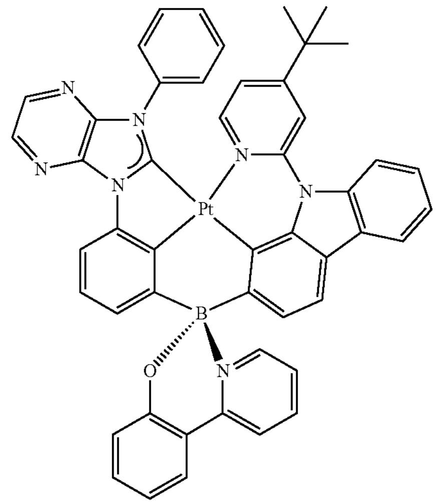
154
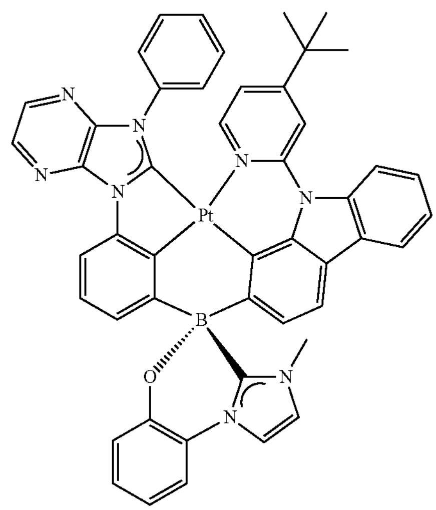
155
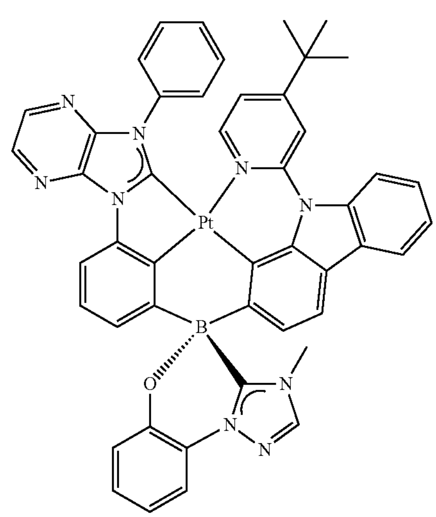

-continued
156
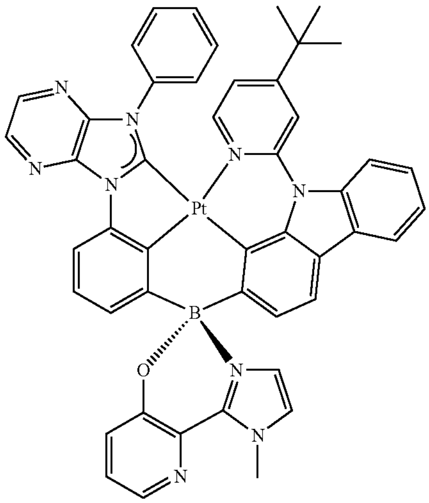
157
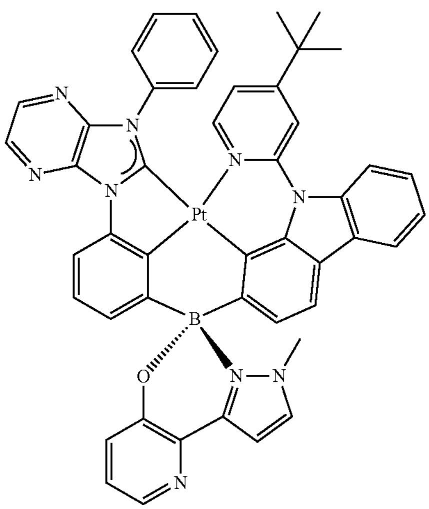
158
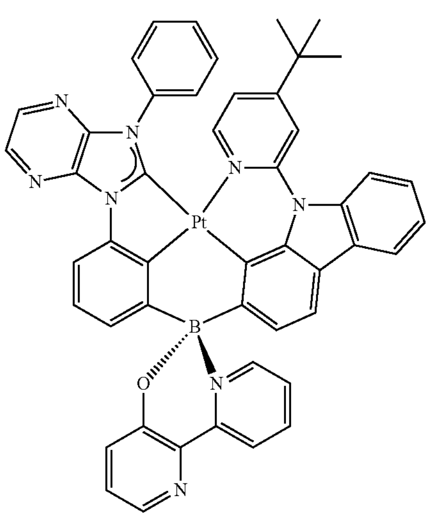
-continued
159
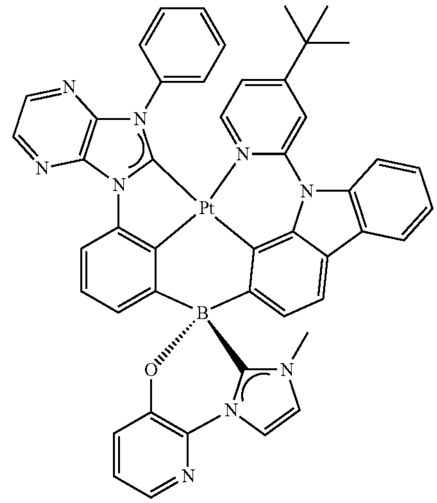
160
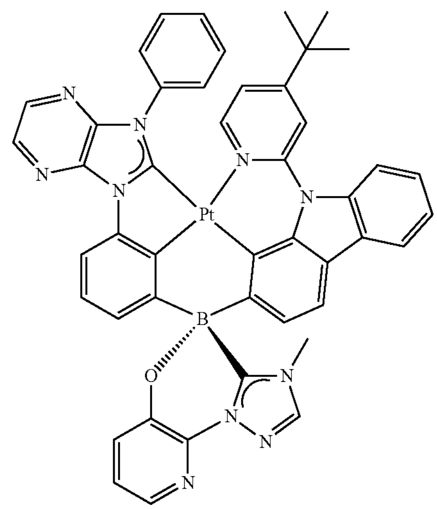
161
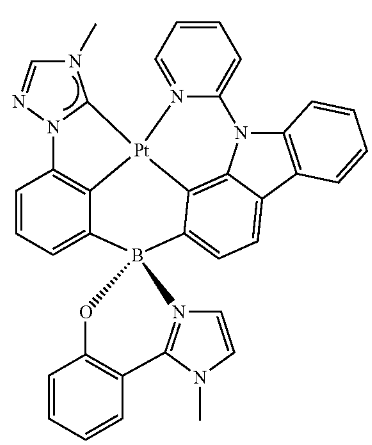

-continued
162
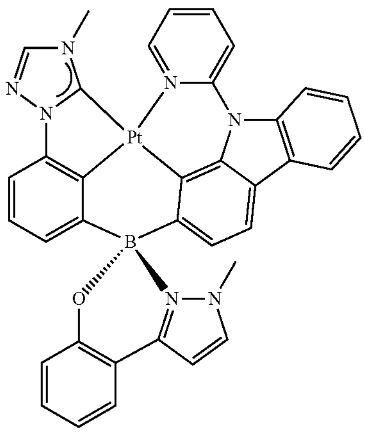
163
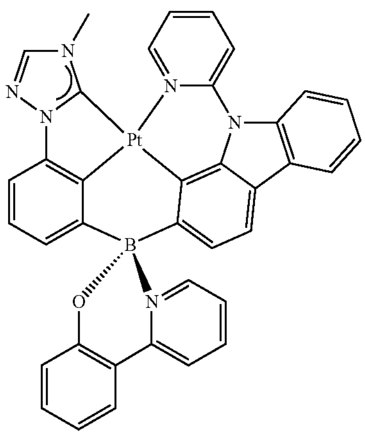
164
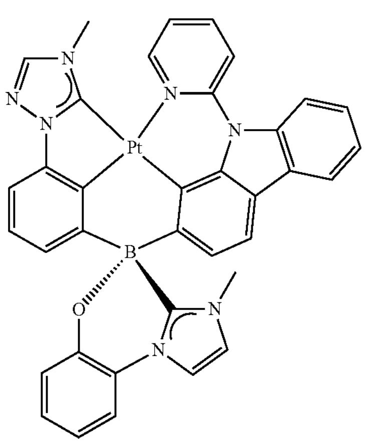
-continued
165
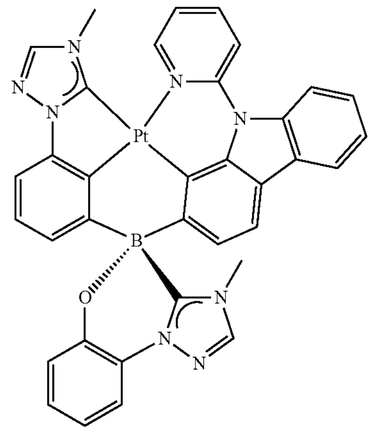
166
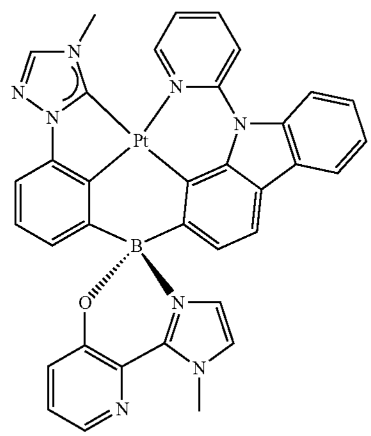
167
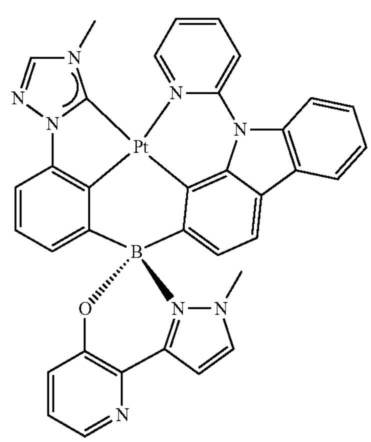

-continued
168
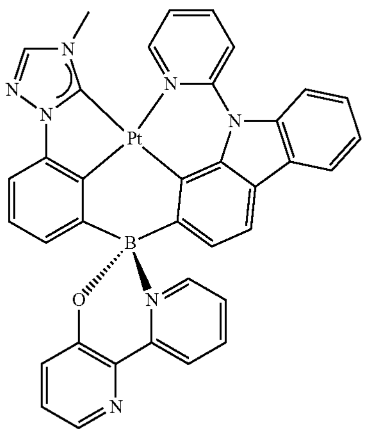
169
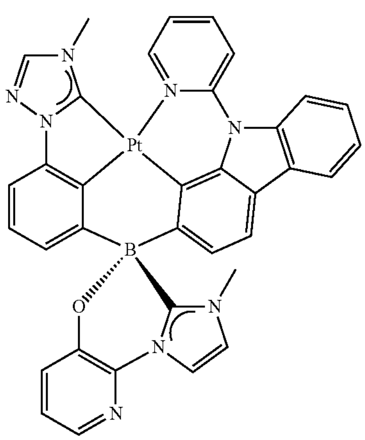
170
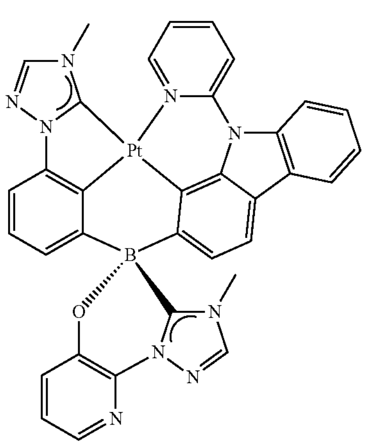
-continued
171
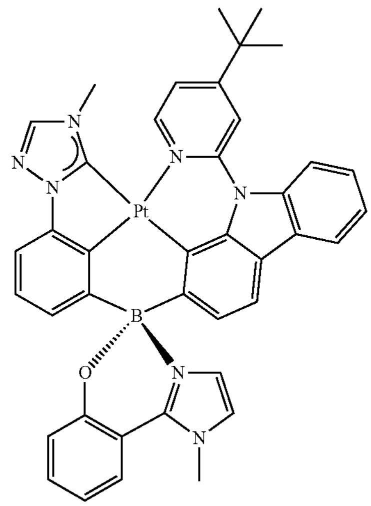
172
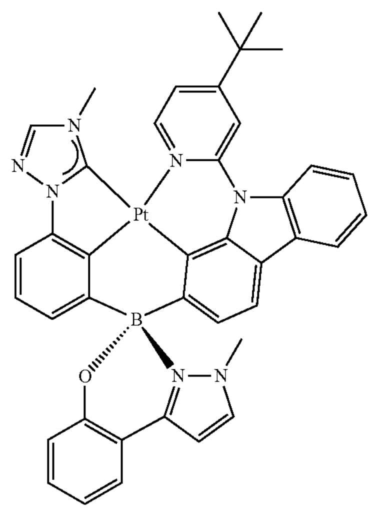
173
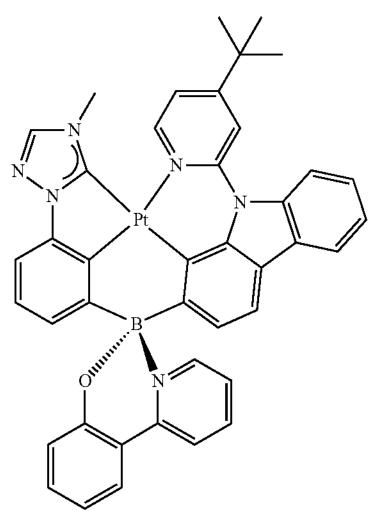

-continued
174
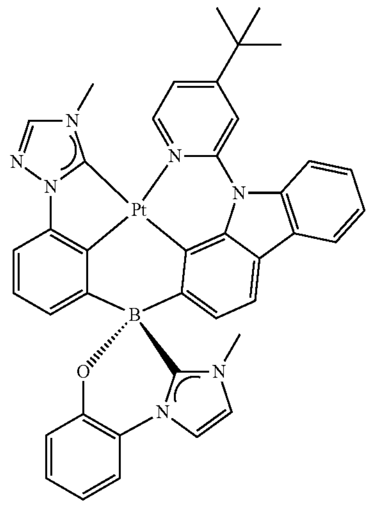
175
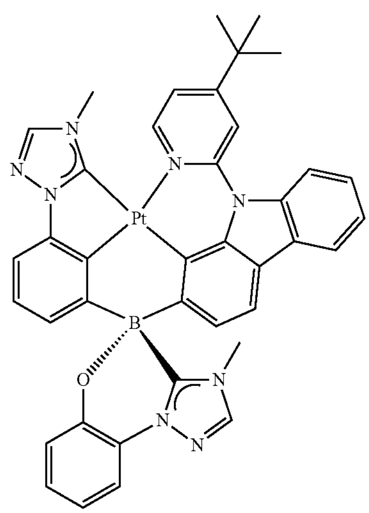
176
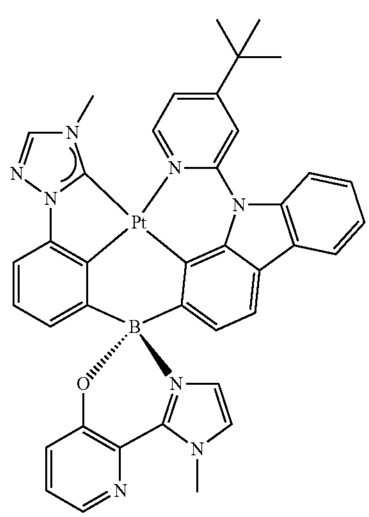
-continued
177
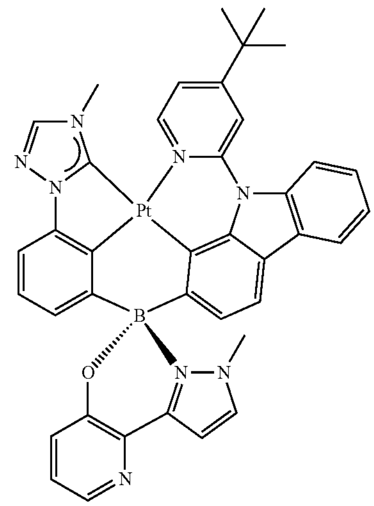
178
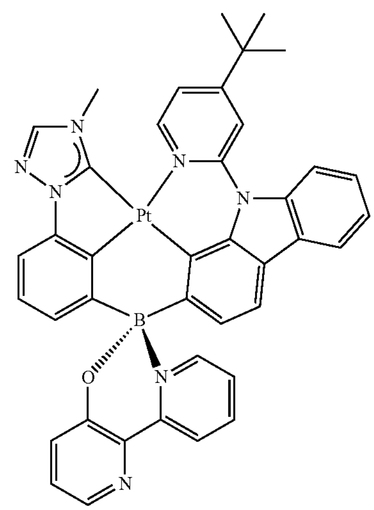
179
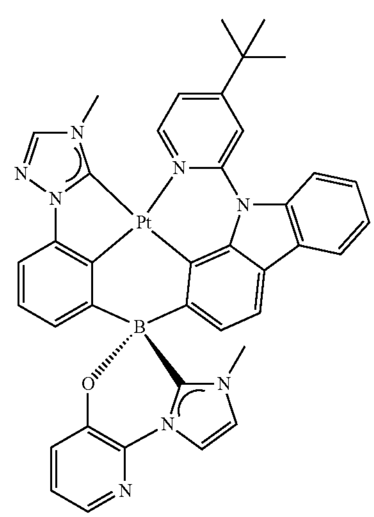

-continued
180
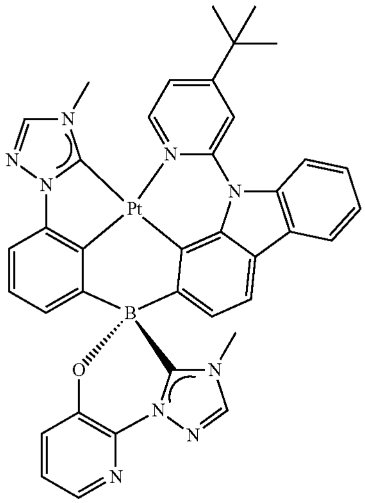
181
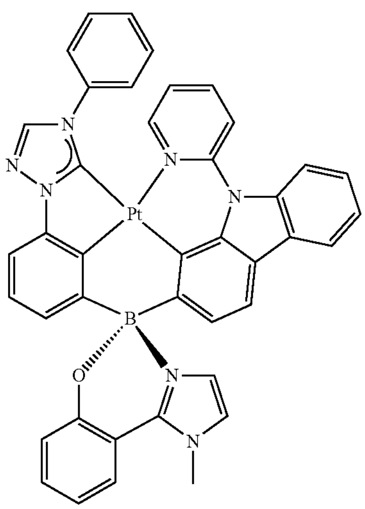
182
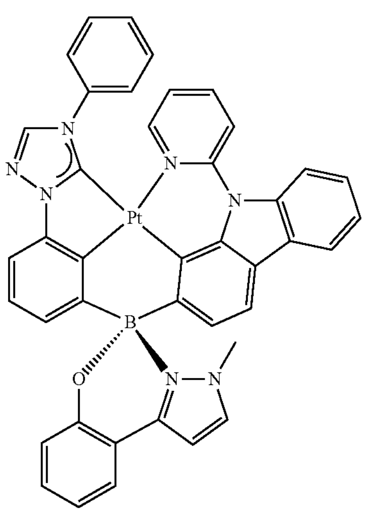
-continued
183
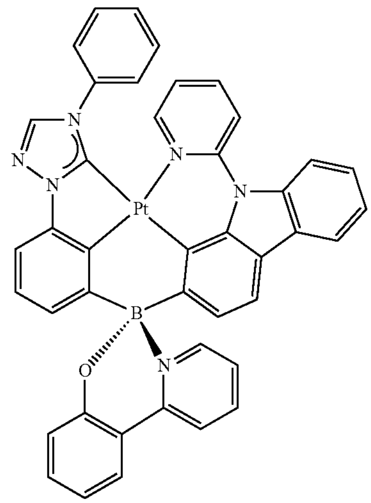
184
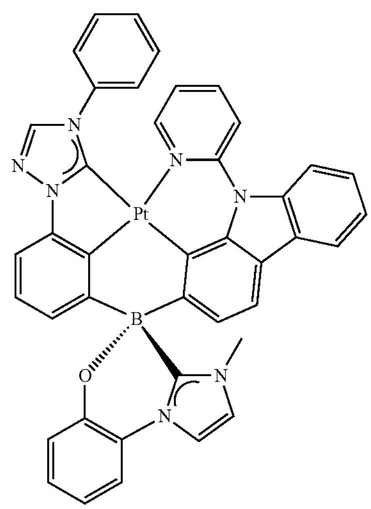
185
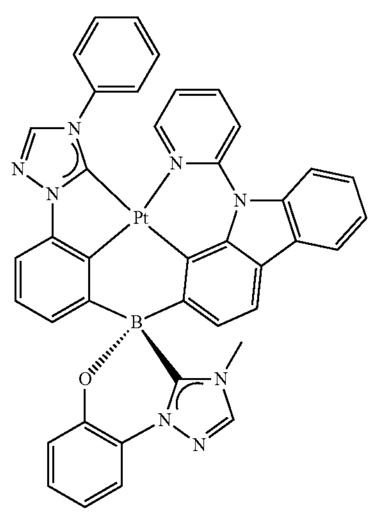

-continued
186
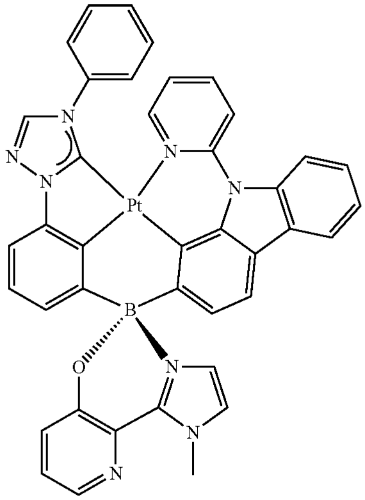
187
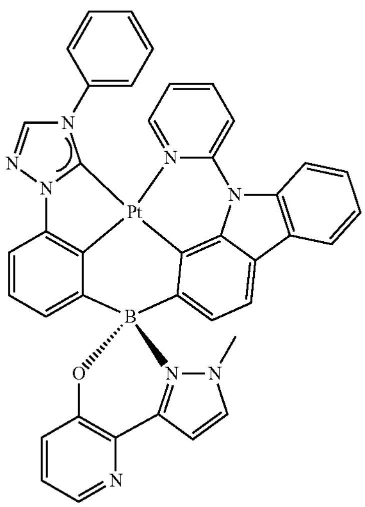
188
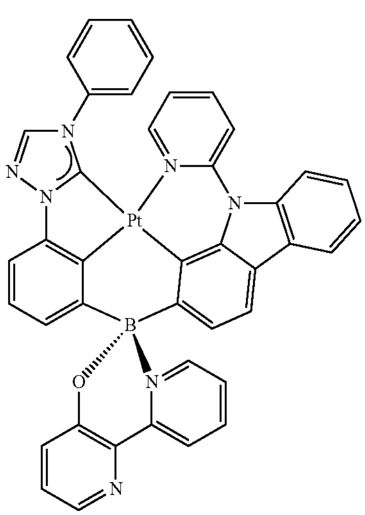
-continued
189
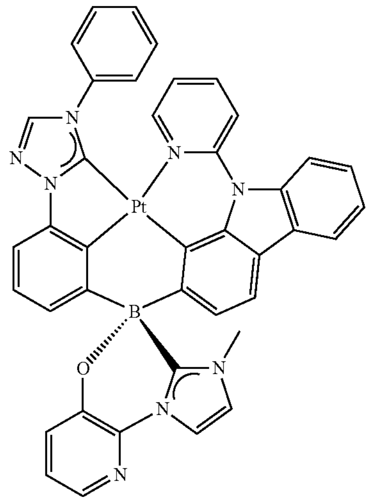
190
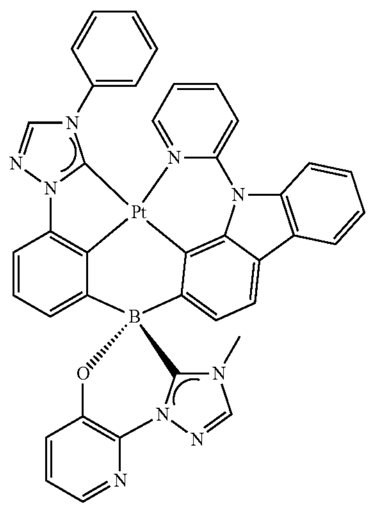
191
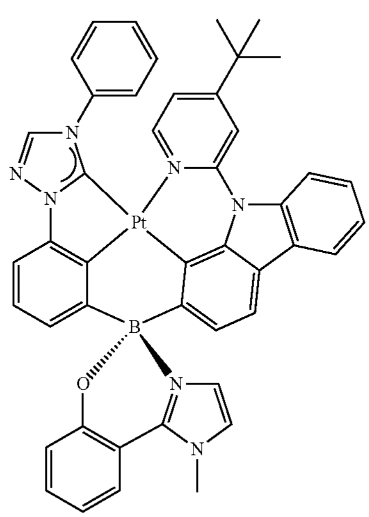

-continued
192
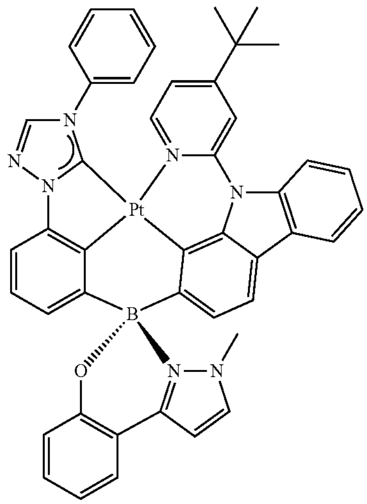
193
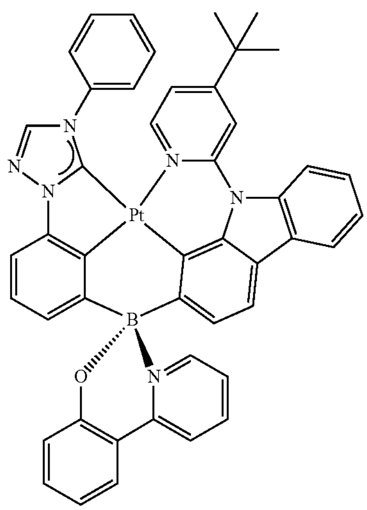
194
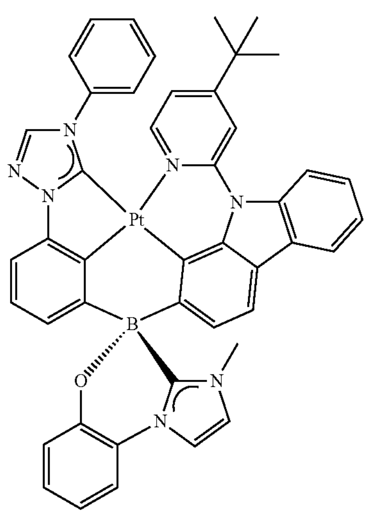
-continued
195
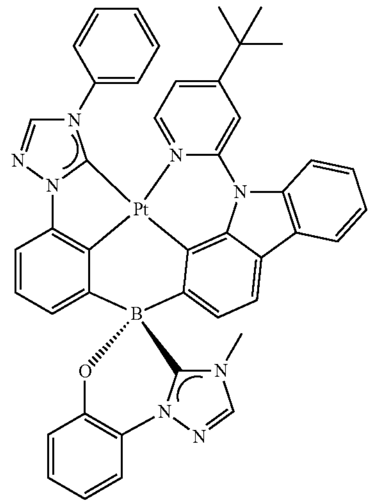
196
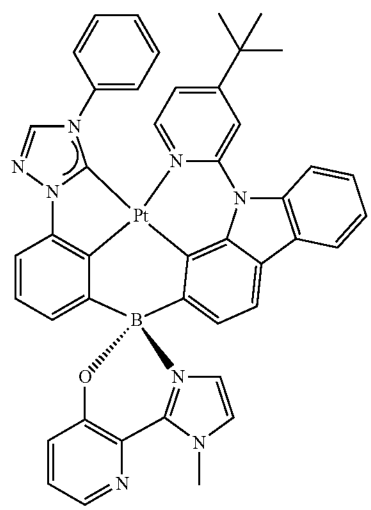
197
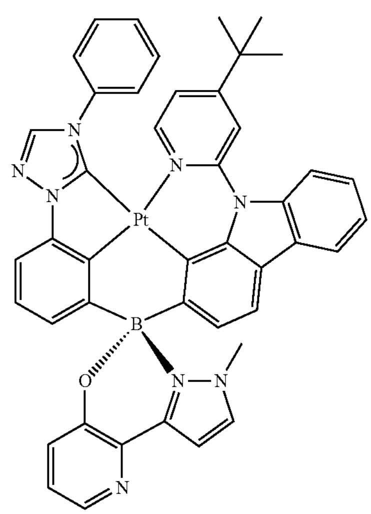

-continued
198
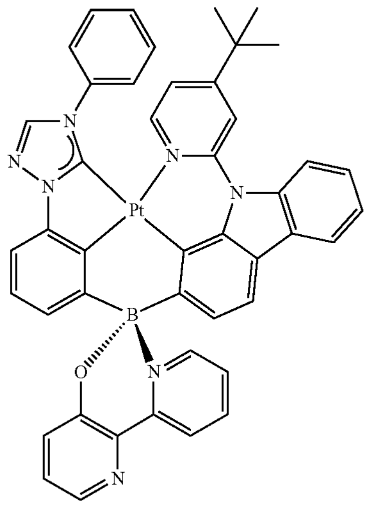
199
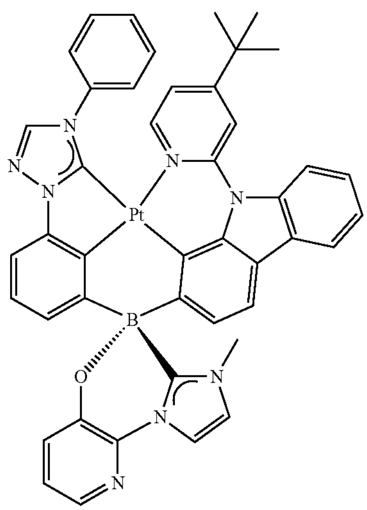
200
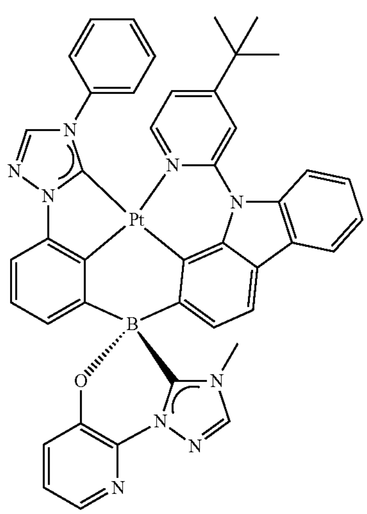
-continued
201
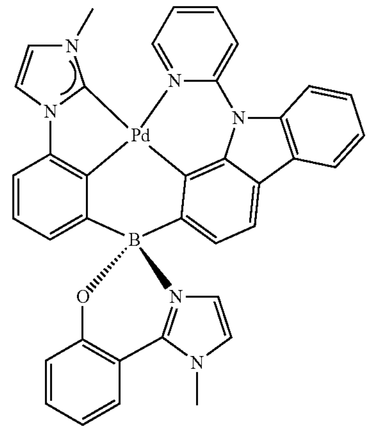
202
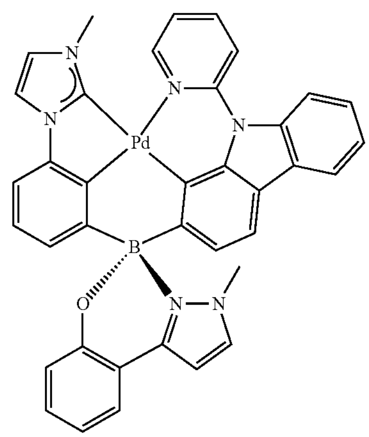
203
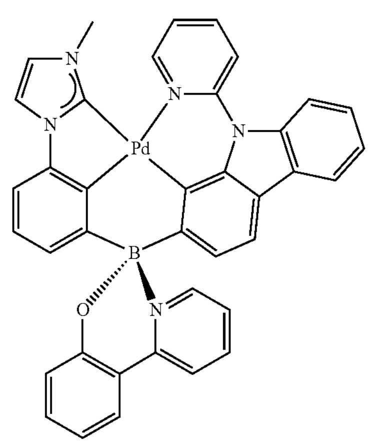

-continued
204
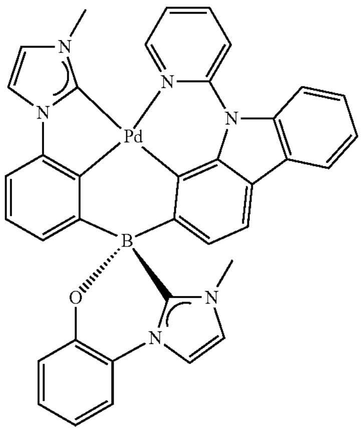
205
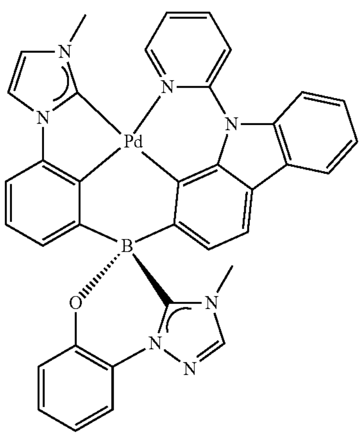
206
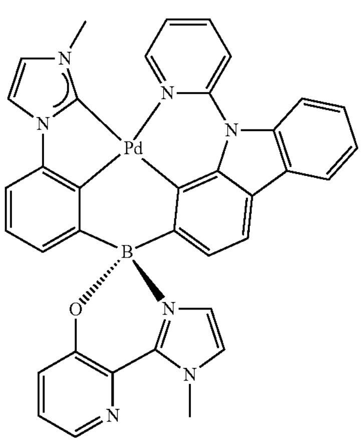
-continued
207
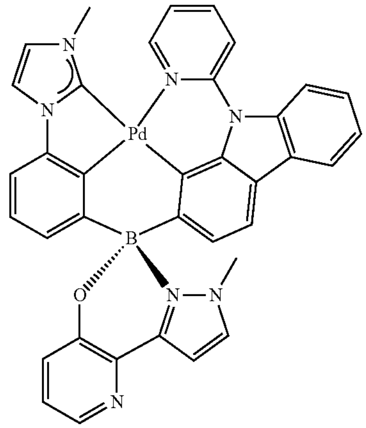
208
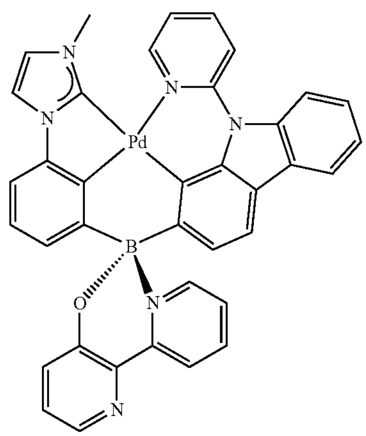
209
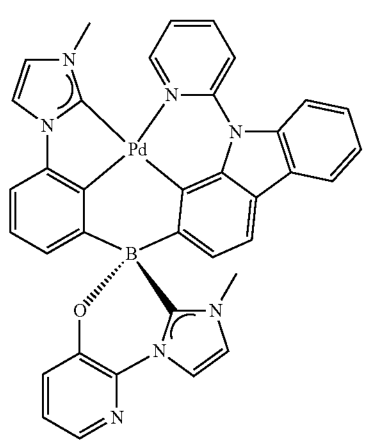

-continued
210
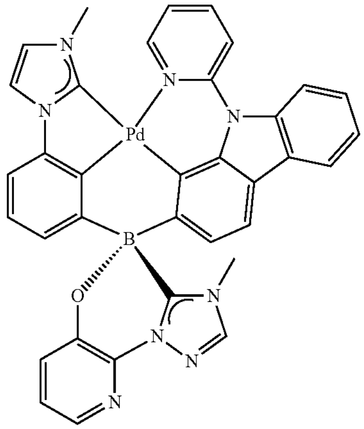
211
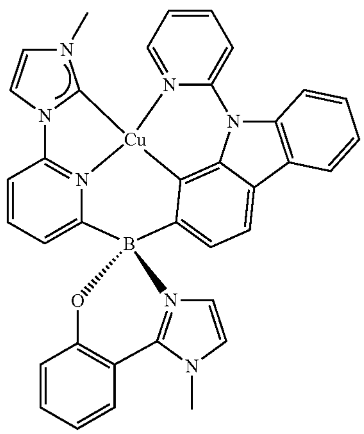
212
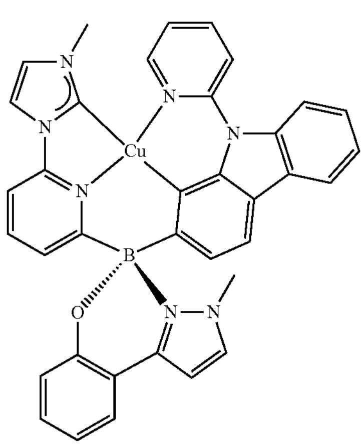
-continued
213
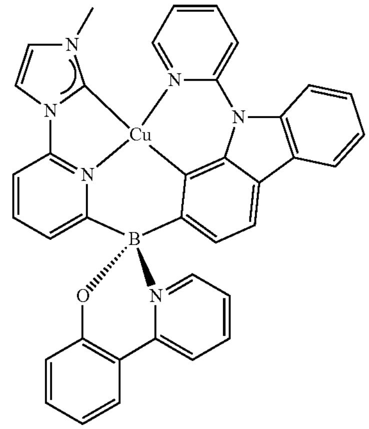
214
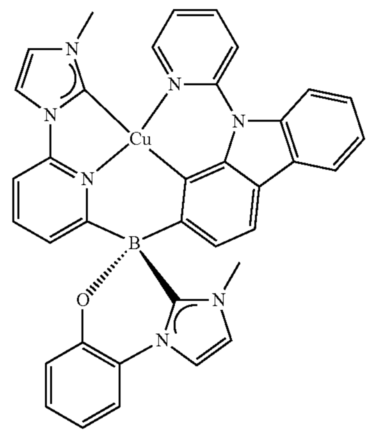
215
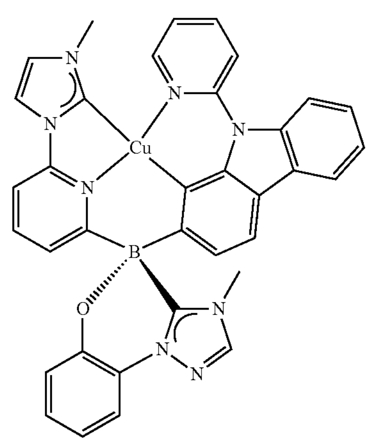

-continued
216
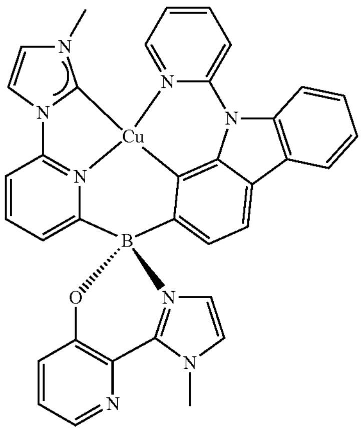
217
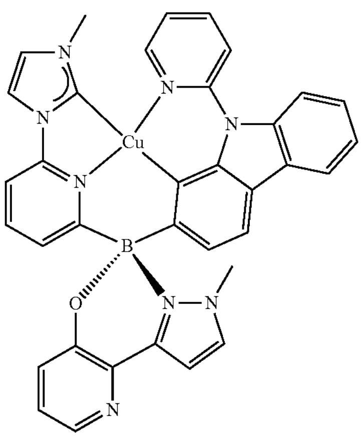
218
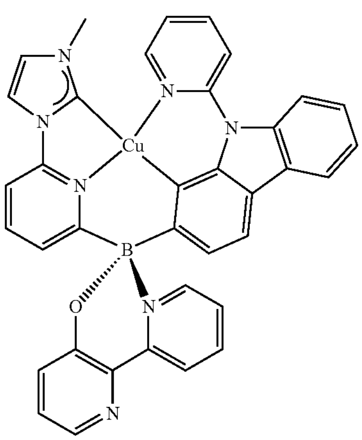
-continued
219
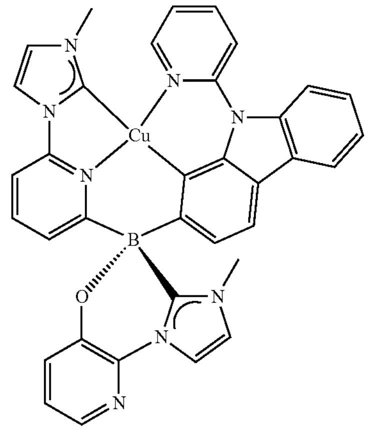
220
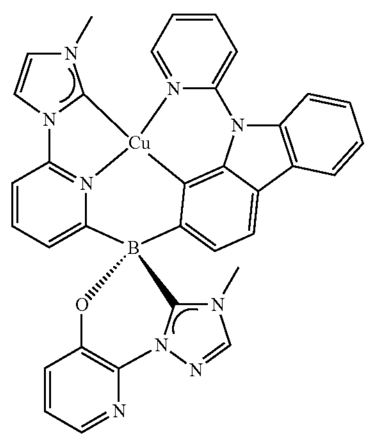
221
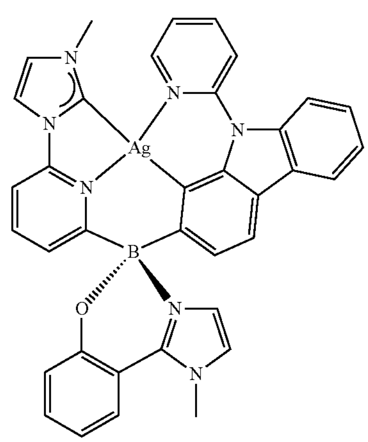

222
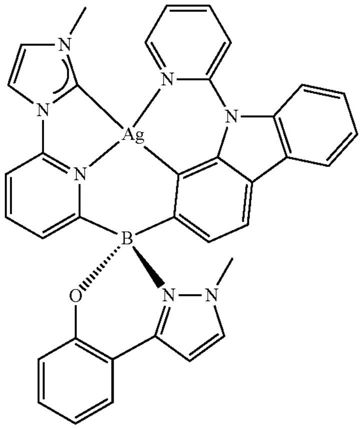
223
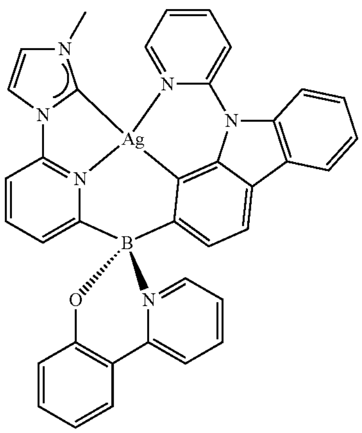
224
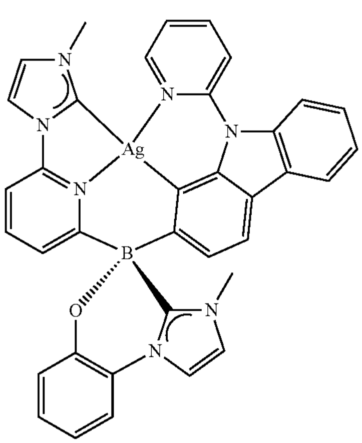
225
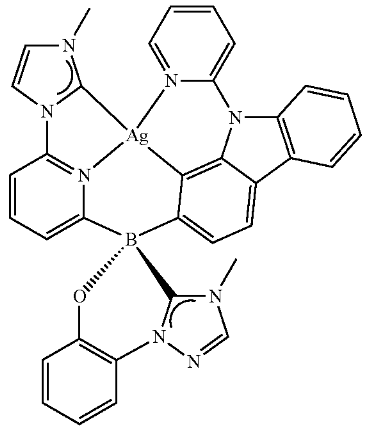
226
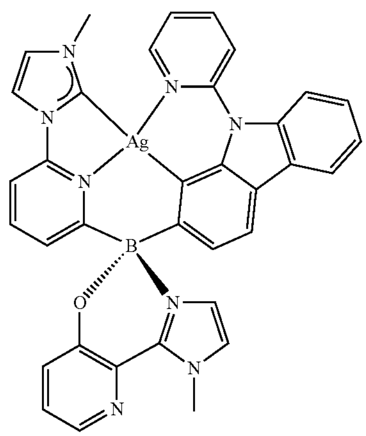
227
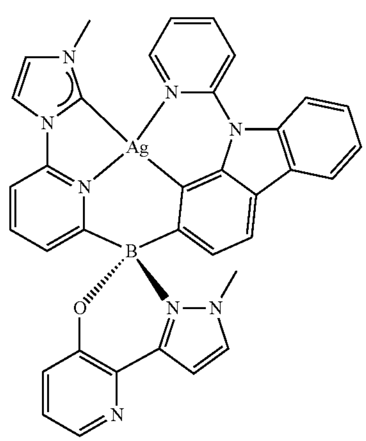

-continued
228
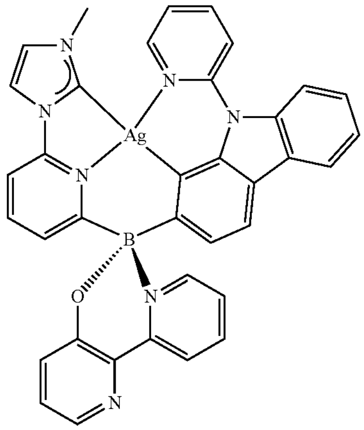
229
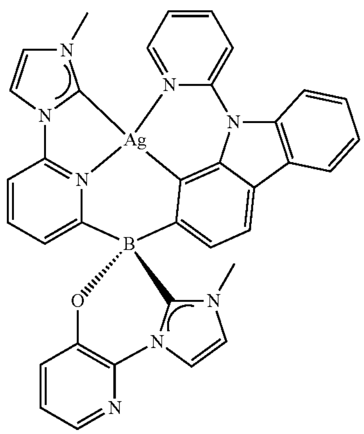
230
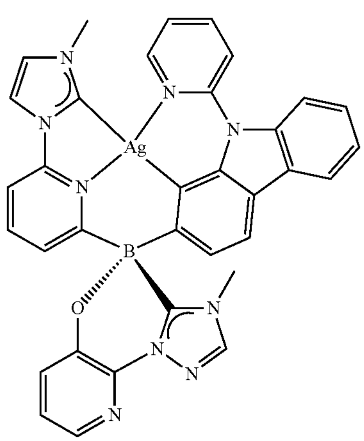
-continued
231
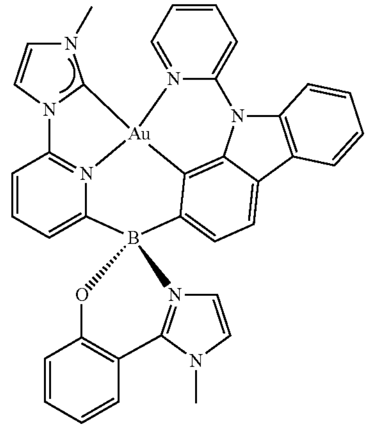
232
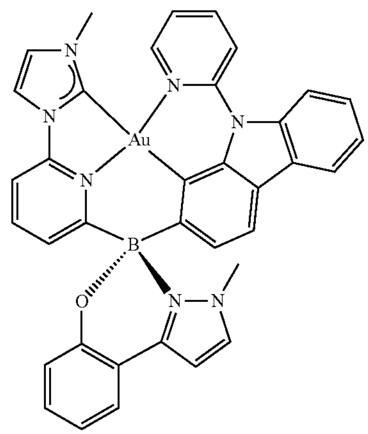
233
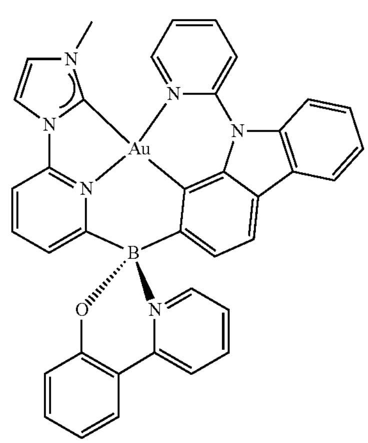

234
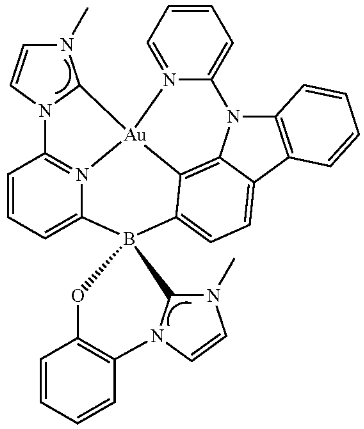
235
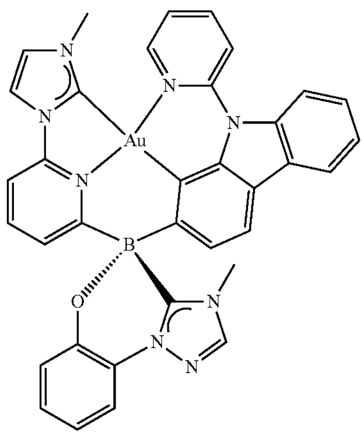
236
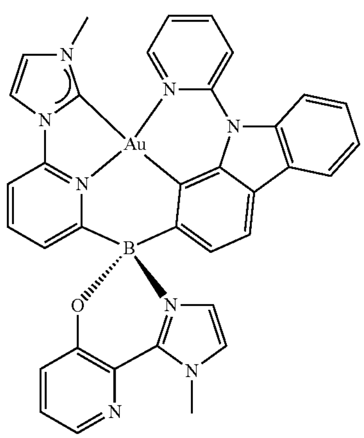
237
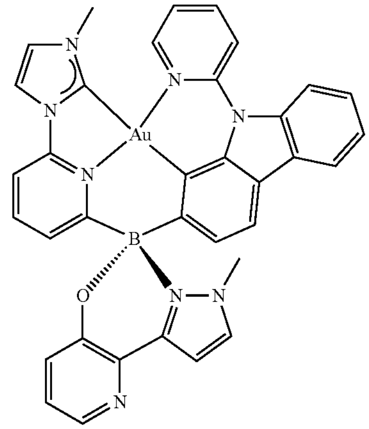
238
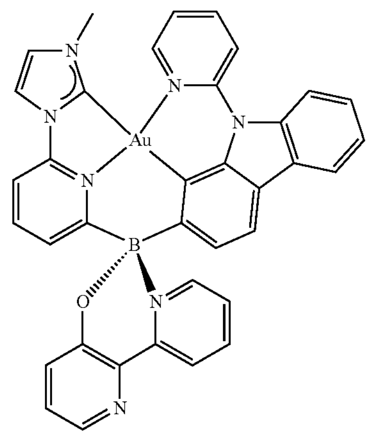
239
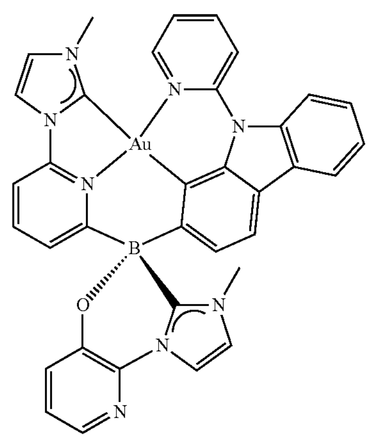

-continued
240
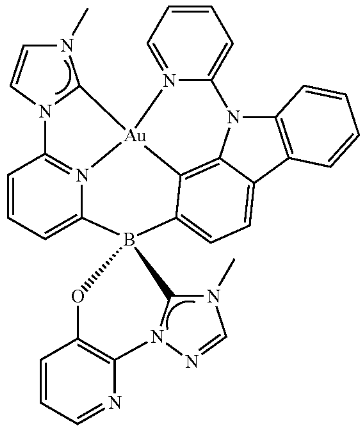
241
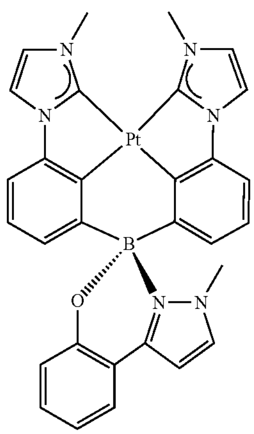
242
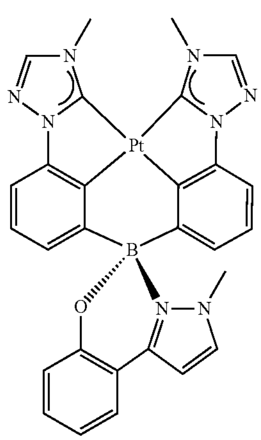
-continued
243
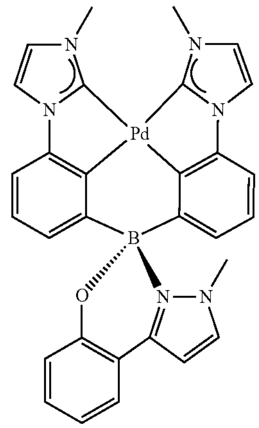
244
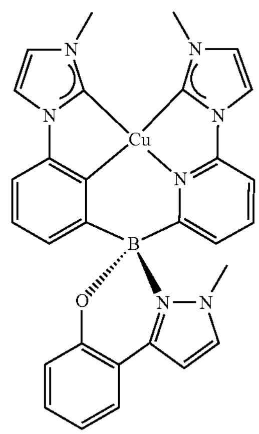
245
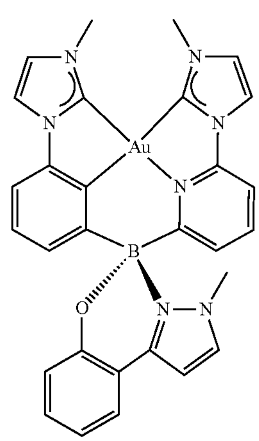

-continued

246

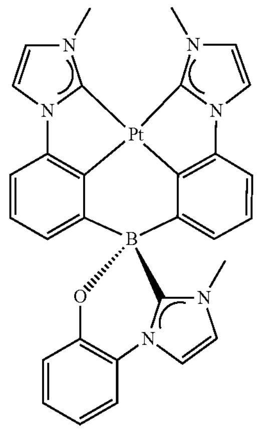

247

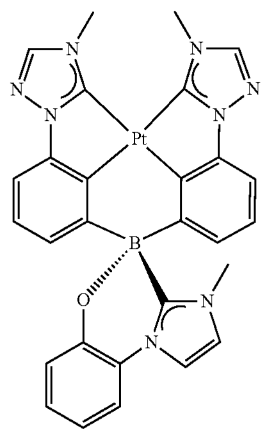

248

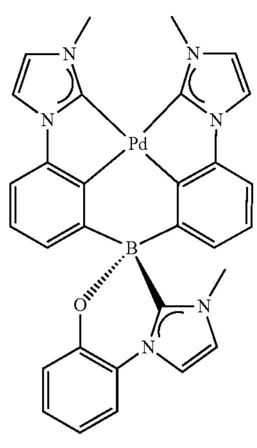

-continued

249

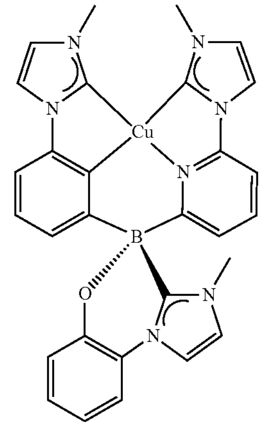

250

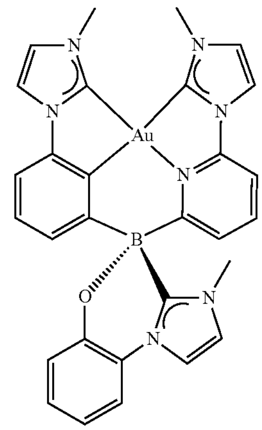

The organometallic compound represented by Formula 1 may emit visible light having an upper (e.g., a maximum) emission wavelength of greater than or equal to 380 nm to less than 800 nm. For example, the organometallic compound represented by Formula 1 may emit blue light having an upper (e.g., a maximum) emission wavelength of greater than or equal to 450 nm to less than 490 nm, green light having an upper (e.g., a maximum) emission wavelength of greater than or equal to 500 nm to less than 550 nm, or red light having an upper (e.g., a maximum) emission wavelength of greater than or equal to 620 nm to less than 790 nm, but embodiments of the present disclosure are not limited thereto.

The organometallic compound represented by Formula 1 essentially includes a substructure represented by

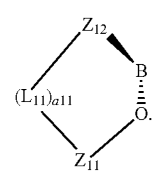

While the present disclosure is not limited to any particular mechanism or theory, it is believed that due to the presence of the foregoing substructure, in the organometallic compound represented by Formula 1, a first plane including $A_{11}$ to $A_{14}$ and a second plane including O, $Z_{11}$, $Z_{12}$, and $(L_{11})_{a11}$ are disposed to be not in parallel. Thus, it is possible to reduce an electron density of boron and also satisfy chemical and/or physical stability to the extent that an organometallic compound can exist. Due to a low electron density of boron, the organometallic compound represented by Formula 1 may emit deep blue light.

Also, since the organometallic compound represented by Formula 1 has a relatively great structural steric hindrance (e.g., a relatively large structural steric hindrance compared to similar compounds that do not include the foregoing substructure), it is possible to suppress or reduce interaction between the organometallic compounds represented by Formula 1 and/or between the organometallic compound represented by Formula 1 and the host. Therefore, since the formation of excimer and/or exciplex therebetween is reduced, an organic light-emitting device including the organometallic compound represented by Formula 1 may have high optical characteristics such as improved luminescent efficiency.

Also, since the organometallic compound represented by Formula 1 is chemically and/or physically stable, the lifespan of an organic light-emitting device including the organometallic compound may be improved.

In addition, the organometallic compound represented by the Formula 1 may have a lowest excited triplet energy level ($T_1$) and a lowest excited singlet energy level ($S_1$) suitable or appropriate for metal-assisted delayed fluorescence (MADF), that is, suitably or sufficiently close $T_1$ and $S_1$ (e.g., $T_1$ and $S_1$ are suitably close to one another in terms of energy), depending on a type or kind of a metal element. Therefore, the organometallic compound represented by Formula 1 may emit both phosphorescence and fluorescence. Accordingly, the efficiency of an organic light-emitting device including the organometallic compound represented by Formula 1 may be improved.

The organometallic compound represented by Formula 1 may be synthesized by using any suitable organic synthetic method available in the art. A synthesis method of the organometallic compound may be recognizable by one of ordinary skill in the art in view of the following embodiments.

The organometallic compound represented by Formula 1 may be used between a pair of electrodes of an organic light-emitting device.

Accordingly, another aspect of embodiments provides an organic light-emitting device that includes: a first electrode; a second electrode; and an organic layer that is disposed between the first electrode and the second electrode and includes an organic layer including an emission layer, and the organic layer includes at least one of the organometallic compound represented by Formula 1.

In an embodiment, the emission layer may include the organometallic compound, but embodiments of the present disclosure are not limited thereto.

In one or more embodiments, the emission layer may include a host and the organometallic compound, and an amount of the host in the emission layer may be greater than that of the organometallic compound in the emission layer, but embodiments of the present disclosure are not limited thereto.

The expression "(an organic layer) includes at least one of organometallic compounds," as used herein, may include a case in which "(an organic layer) includes identical organometallic compounds represented by Formula 1" and a case in which "(an organic layer) includes two or more different organometallic compounds represented by Formula 1."

For example, the organic layer may include, as the organometallic compound, only Compound 1. In this regard, Compound 1 may exist in an emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 may all exist in an emission layer), or different layers (for example, Compound 1 may exist in an emission layer and Compound 2 may exist in an electron transport layer).

The organic layer includes i) a hole transport region that is disposed between the first electrode (anode) and the emission layer and includes at least one of a hole injection layer, a hole transport layer, a buffer layer, and an electron blocking layer, and ii) an electron transport region that is disposed between the emission layer and the second electrode (cathode) and includes at least one selected from a hole blocking layer, an electron transport layer, and an electron injection layer. The emission layer may include at least one of the organometallic compounds represented by Formula 1.

The term "organic layer," as used herein, refers to a single layer and/or a plurality of layers disposed between the first electrode and the second electrode of the organic light-emitting device. A material included in the "organic layer" is not limited to an organic material.

[Description of the FIG. 1]

The FIG. 1 is a schematic view of an organic light-emitting device 10 according to an embodiment. The organic light-emitting device 10 includes a first electrode 110, an organic layer 150, and a second electrode 190.

Hereinafter, the structure of the organic light-emitting device 10 according to an embodiment and a method of manufacturing the organic light-emitting device 10 will be described in connection with the FIG. 1.

[First Electrode 110]

In FIG. 1, a substrate may be additionally disposed under the first electrode 110 or above the second electrode 190. The substrate may be a glass substrate or a plastic substrate, each having excellent mechanical strength, thermal stability, transparency, surface smoothness, ease of handling, and water resistance.

The first electrode 110 may be formed by depositing or sputtering a material for forming the first electrode 110 on the substrate. When the first electrode 110 is an anode, the material for a first electrode may be selected from materials with a high work function to facilitate hole injection.

The first electrode 110 may be a reflective electrode, a semi-transmissive electrode, or a transmissive electrode. When the first electrode 110 is a transmissive electrode, a material for forming a first electrode may be selected from indium tin oxide (ITO), indium zinc oxide (IZO), tin oxide ($SnO_2$), zinc oxide (ZnO), and any combinations thereof, but embodiments of the present disclosure are not limited thereto. In one or more embodiments, when the first electrode 110 is a semi-transmissive electrode or a reflexive electrode, a material for forming a first electrode may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but embodiments of the present disclosure are not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

[Organic Layer 150]

The organic layer 150 is disposed on the first electrode 110. The organic layer 150 may include an emission layer.

The organic layer 150 may further include a hole transport region between the first electrode 110 and the emission layer, and an electron transport region between the emission layer and the second electrode 190.

[Hole Transport Region in Organic Layer 150]

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the first electrode 110 in this stated order, but the structure of the hole transport region is not limited thereto.

The hole transport region may include at least one selected from m-MTDATA, TDATA, 2-TNATA, NPB (NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

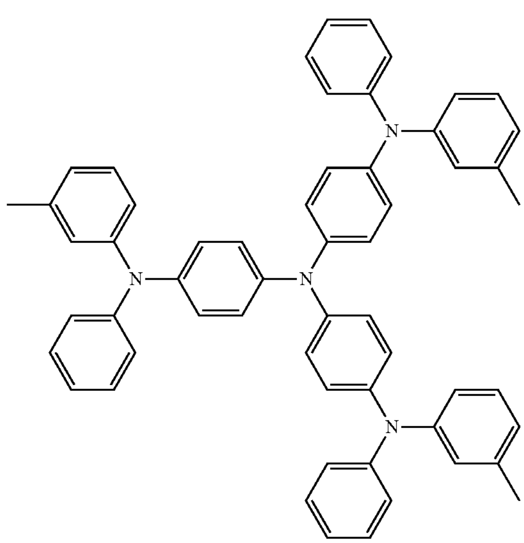

m-MTDATA

-continued

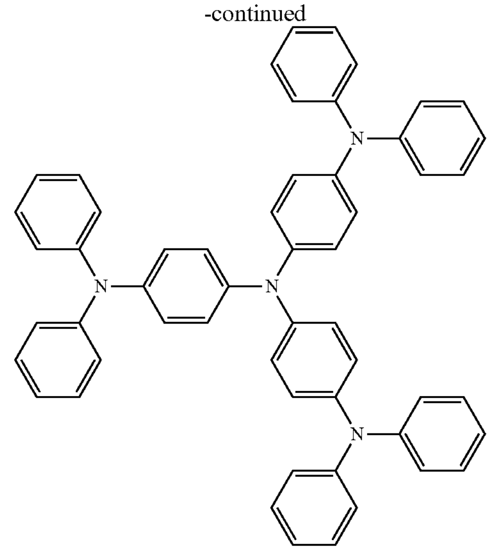

TDATA

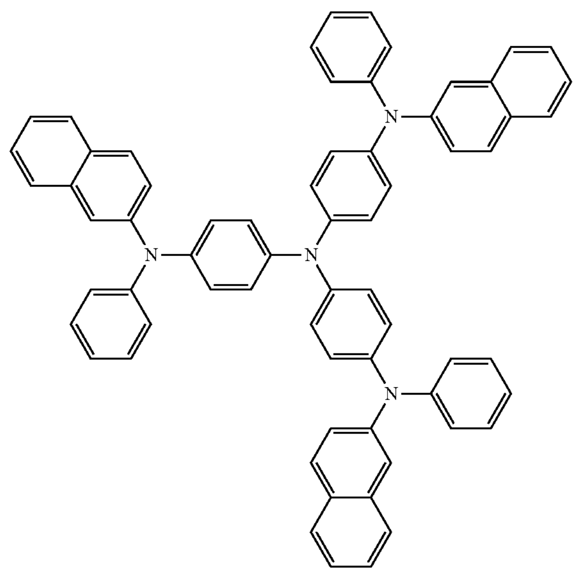

2-TNATA

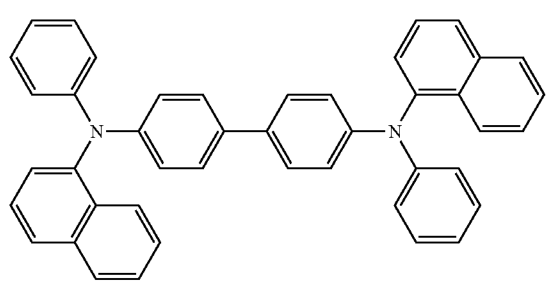

NPB

-continued

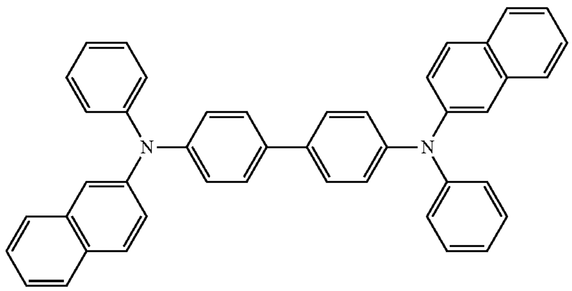

β-NPB

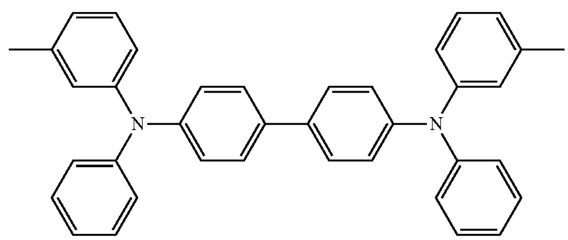

TPD

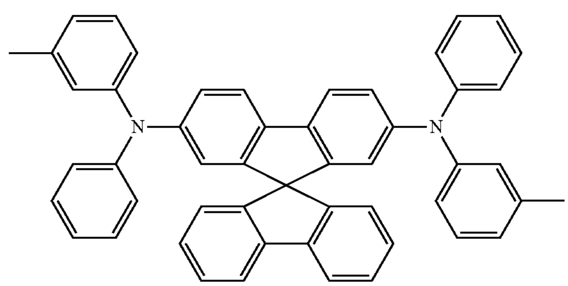

Spiro-TPD

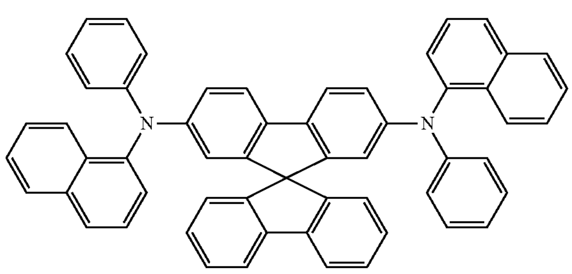

Spiro-NPB

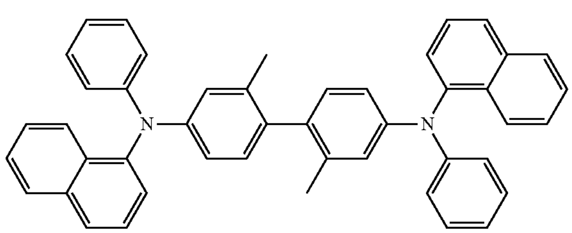

methylated NPB

-continued

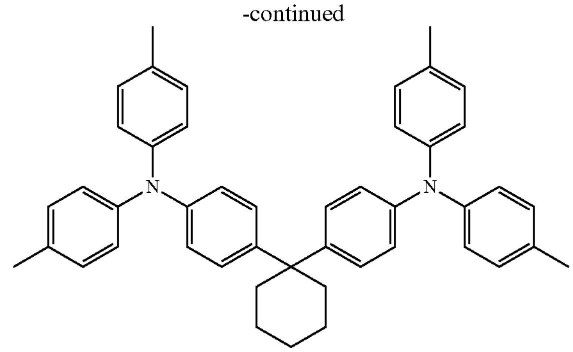

TAPC

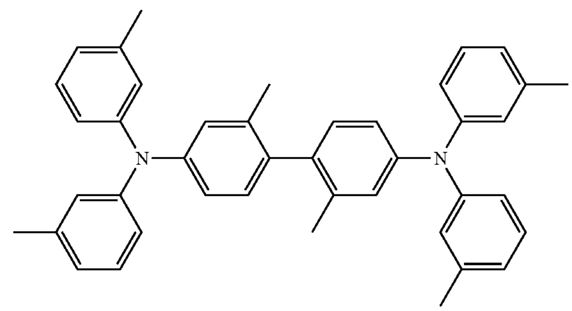

HMTPD

Formula 201

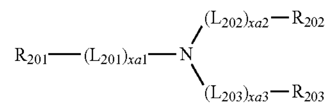

Formula 202

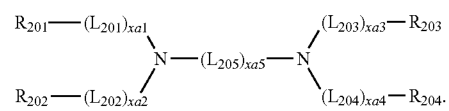

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

$L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one embodiment, in Formula 202, $R_{201}$ and $R_{202}$ may optionally be linked via a single bond, a dimethyl-methylene group, or a diphenyl-methylene group, and $R_{203}$ and $R_{204}$ may optionally be linked via a single bond, a dimethyl-methylene group, or a diphenyl-methylene group.

In one or more embodiments, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one embodiment, xa1 to xa4 may each independently be 0, 1, or 2.

In one embodiment, xa5 may be 1, 2, 3, or 4.

In one embodiment, $R_{201}$ to $R_{204}$ and $Q_{201}$ may each independently be selected from:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, and $Q_{31}$ to $Q_{33}$ are each independently the same as described herein.

In one embodiment, at least one of $R_{201}$ to $R_{203}$ in Formula 201 may be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one embodiment, in Formula 202, i) $R_{201}$ and $R_{202}$ may be linked via a single bond, and/or ii) $R_{203}$ and $R_{204}$ may be linked via a single bond.

In one embodiment, at least one of $R_{201}$ to $R_{204}$ in Formula 202 may be selected from:

a carbazolyl group; and a carbazolyl group, substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

The compound represented by Formula 201 may be represented by Formula 201A:

Formula 201A

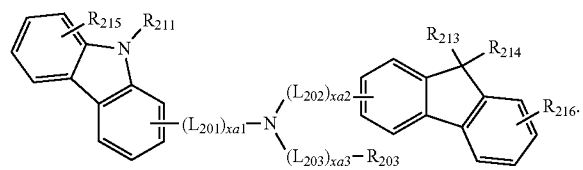

In one embodiment, the compound represented by Formula 201 may be represented by Formula 201A(1) below, but embodiments of the present disclosure are not limited thereto:

Formula 201A(1)

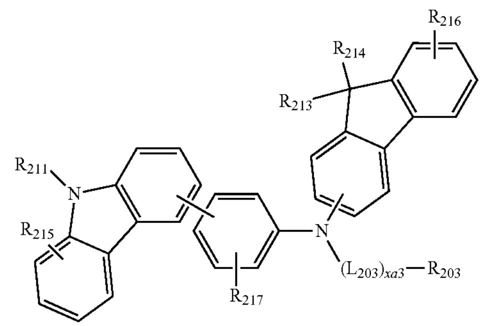

In one embodiment, the compound represented by Formula 201 may be represented by Formula 201A-1 below, but embodiments of the present disclosure are not limited thereto:

Formula 201A-1

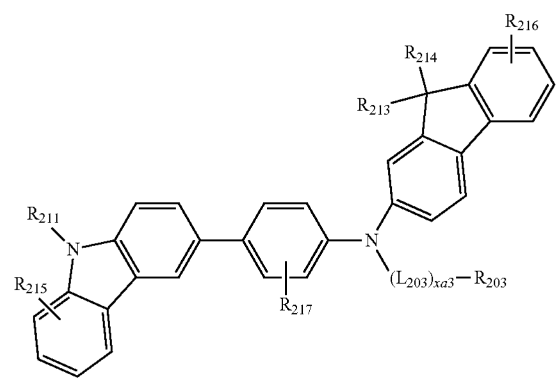

In one embodiment, the compound represented by Formula 202 may be represented by Formula 202A:

Formula 202A

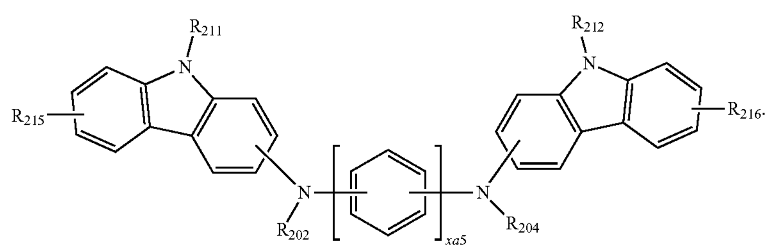

In one embodiment, the compound represented by Formula 202 may be represented by Formula 202A-1:

Formula 202A-1

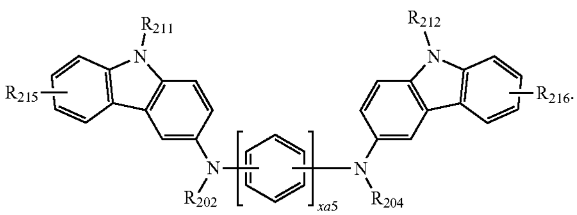

In Formulae 201A, 201A(1), 201A-1, 202A, and 202A-1, $L_{201}$ to $L_{203}$, xa1 to xa3, xa5, and $R_{202}$ to $R_{204}$ are the same as described above, $R_{211}$ and $R_{212}$ are the same as described above in connection with $R_{203}$, and $R_{213}$ to $R_{217}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but embodiments of the present disclosure are not limited thereto:

HT1

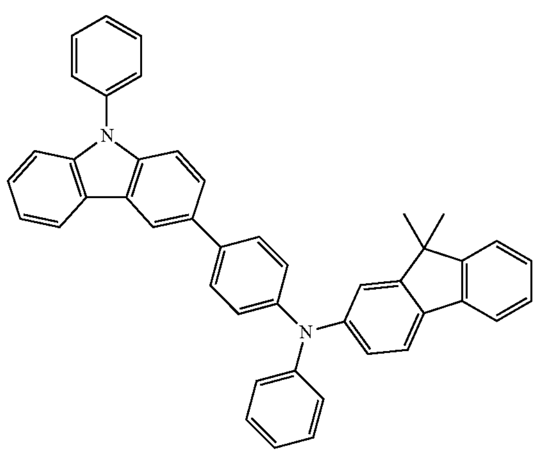

HT2

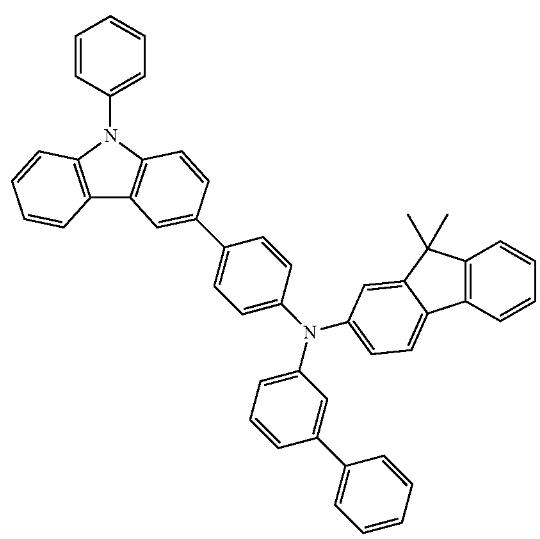

HT3

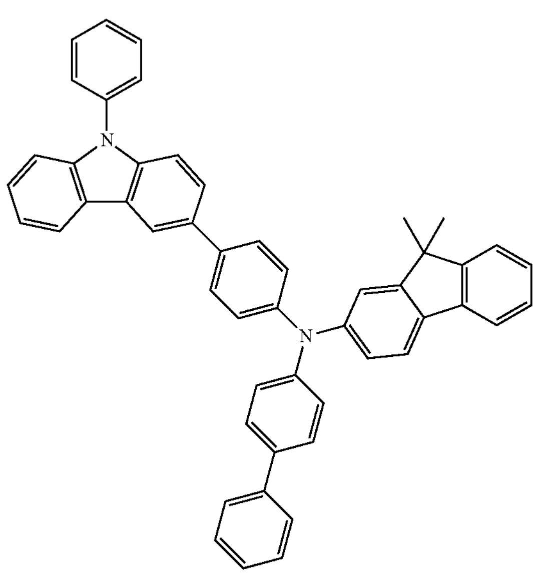

HT4

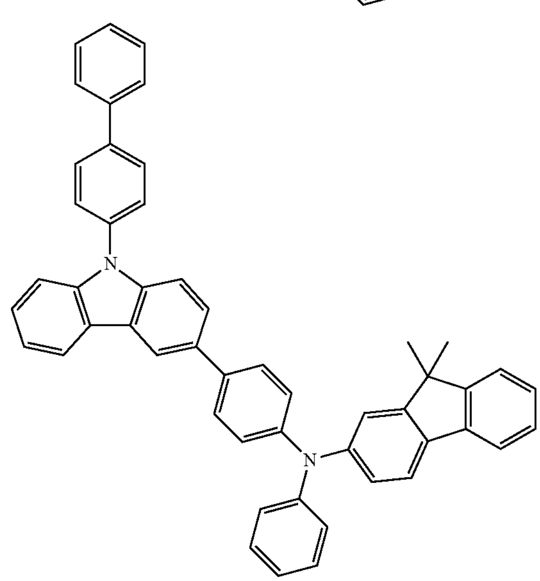

-continued
HT5
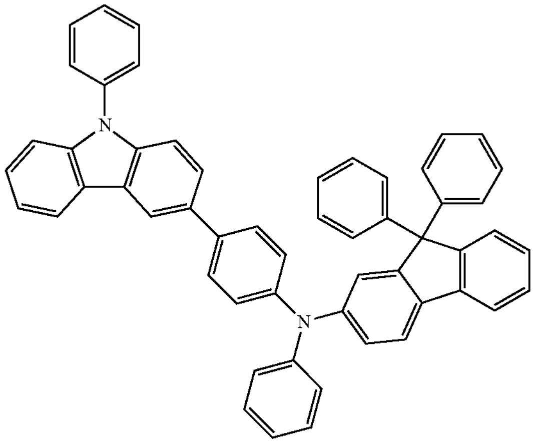
HT6
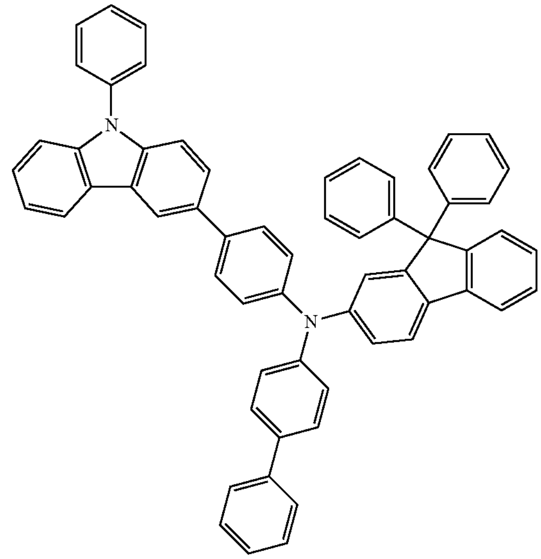
HT7
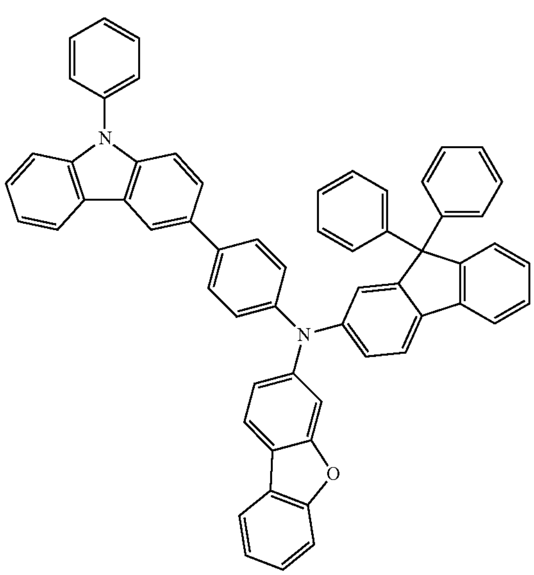
HT8
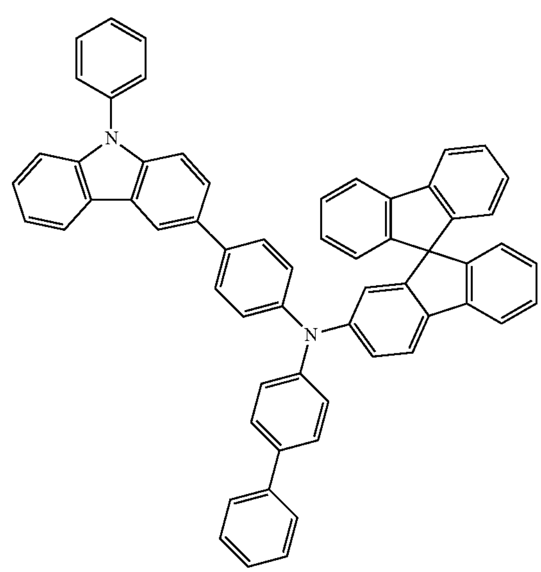

-continued
HT9
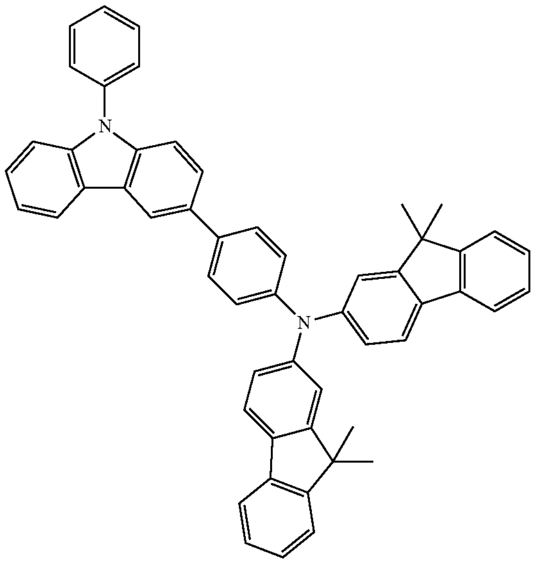
HT10
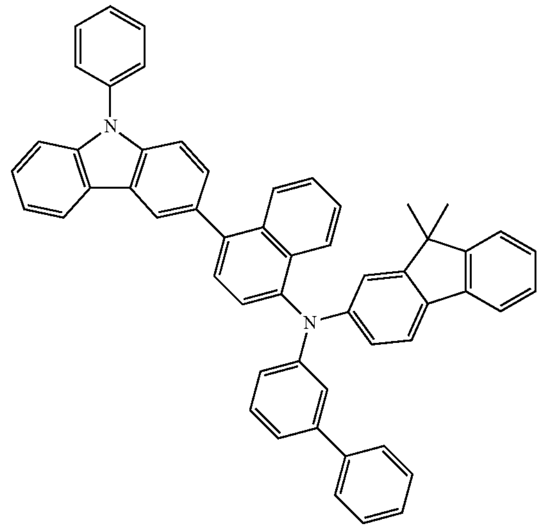
HT11
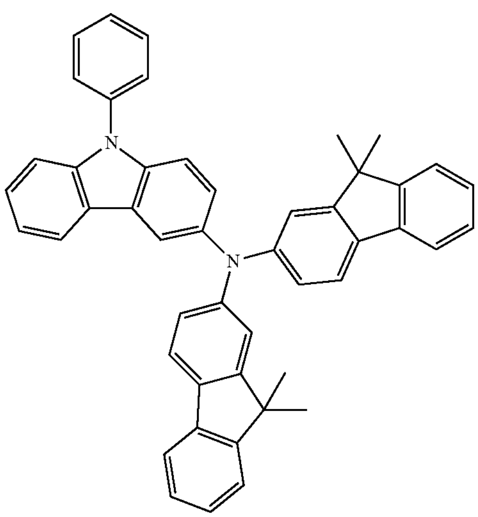
HT12
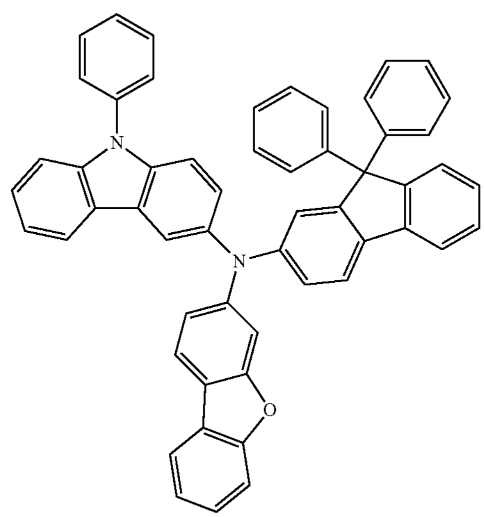

-continued
HT13
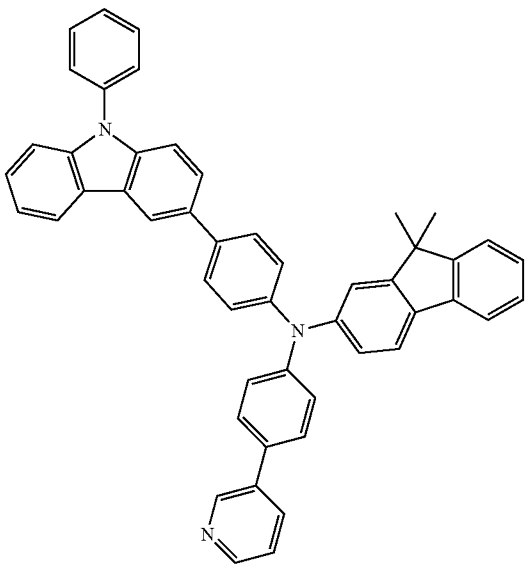
HT14
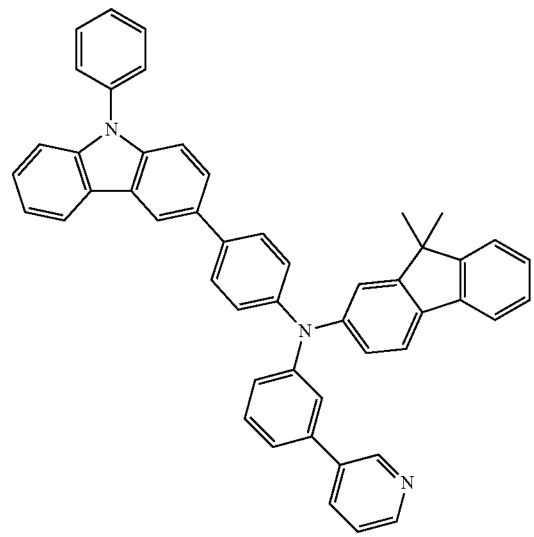
HT15
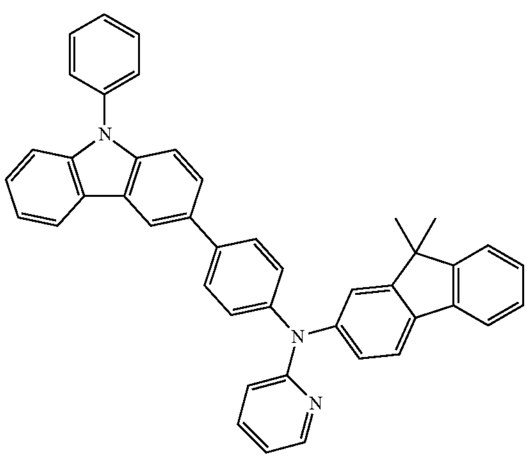
HT16
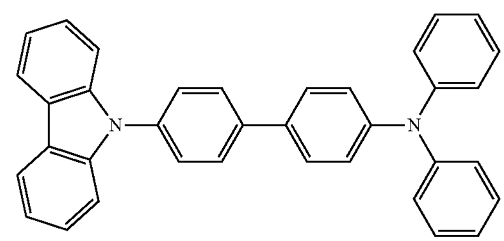
HT17
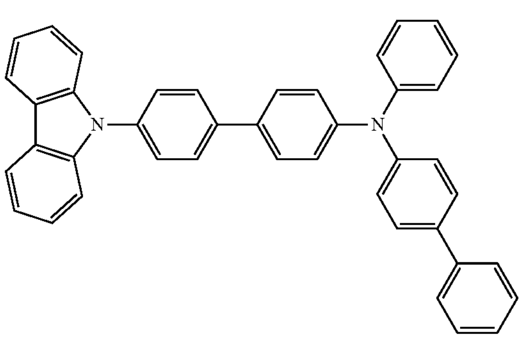
HT18
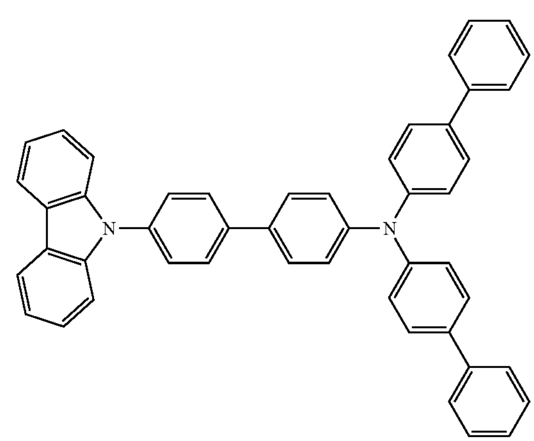

-continued
HT19
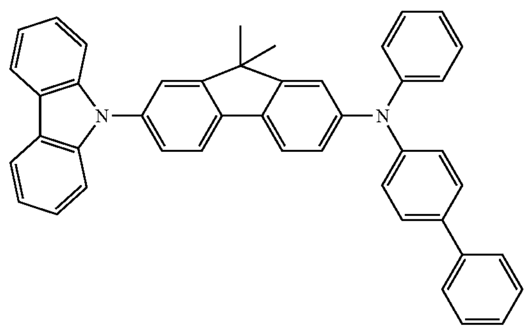
HT20
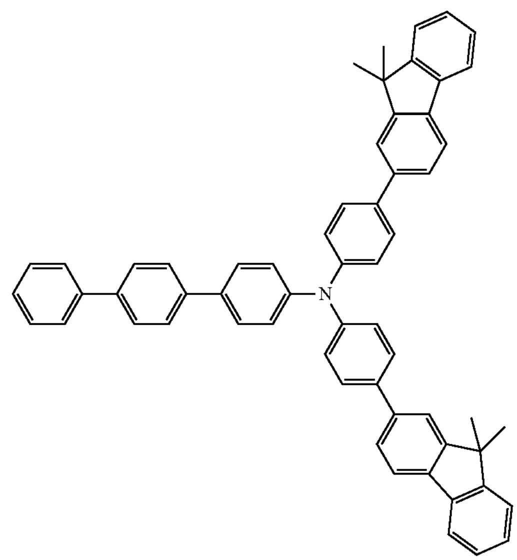
HT21
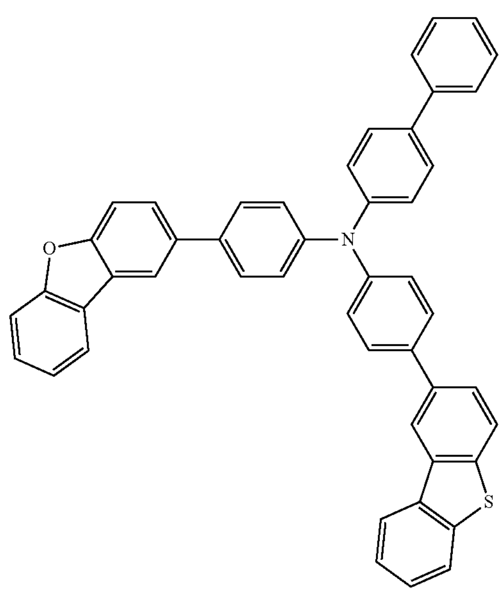
HT22
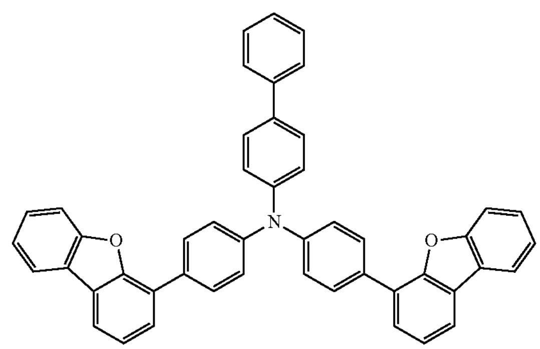
HT23
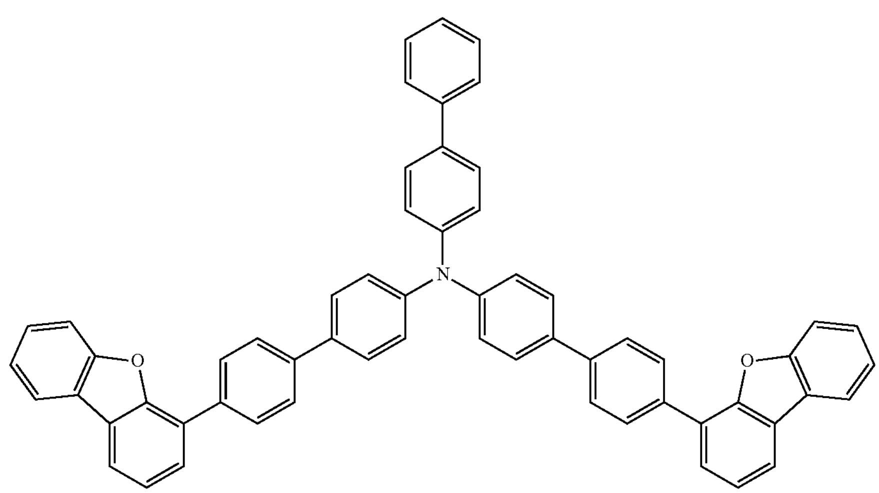

-continued
HT24
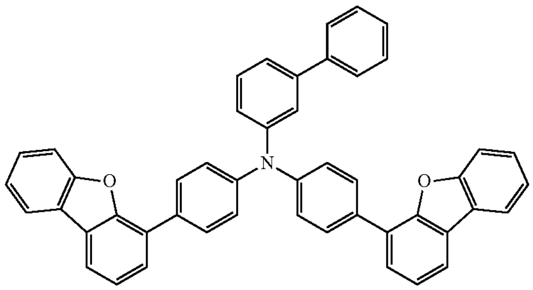
HT25
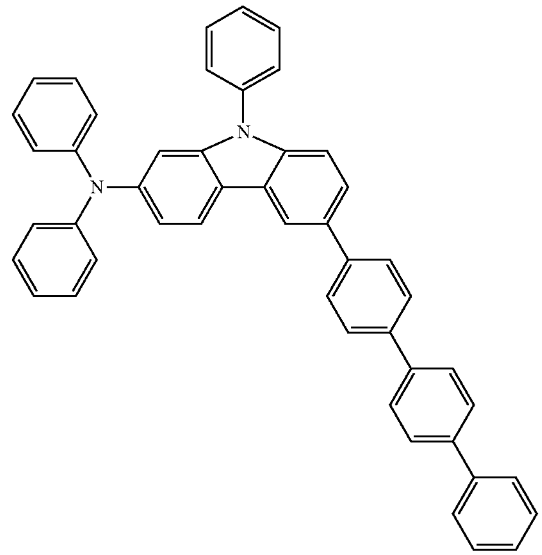
HT26
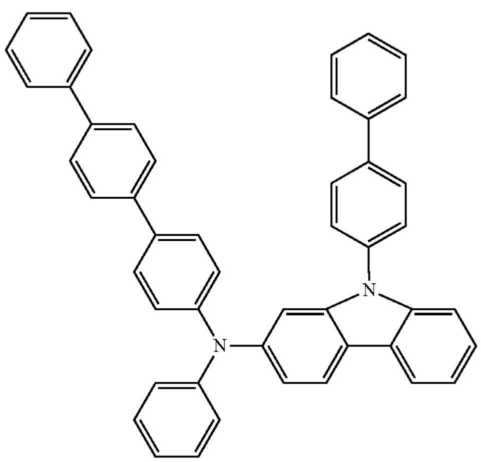
HT27
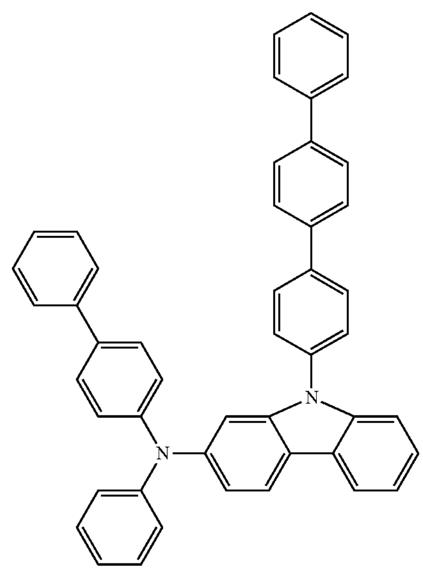
HT28
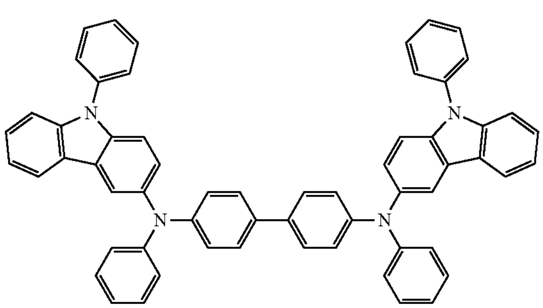
HT29
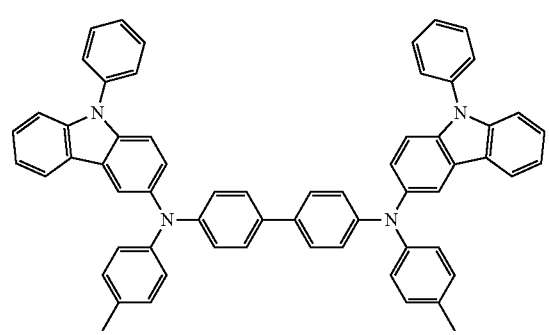

-continued
HT30
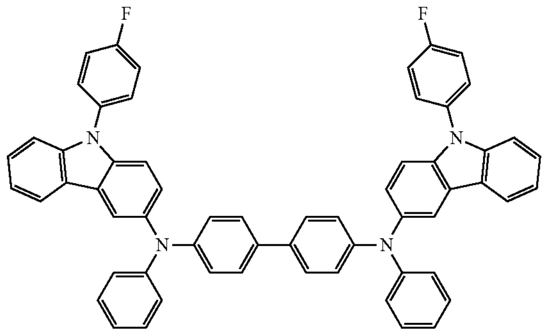
HT31
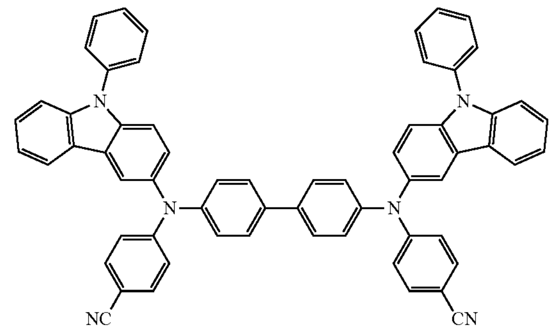
HT32
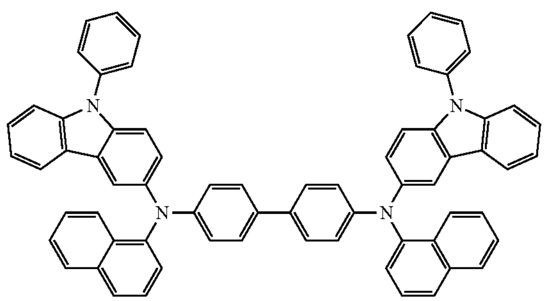
HT33
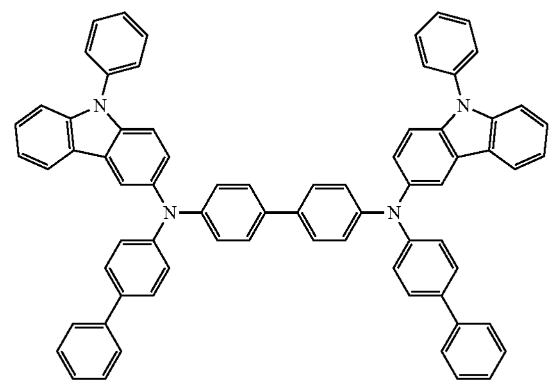
HT34
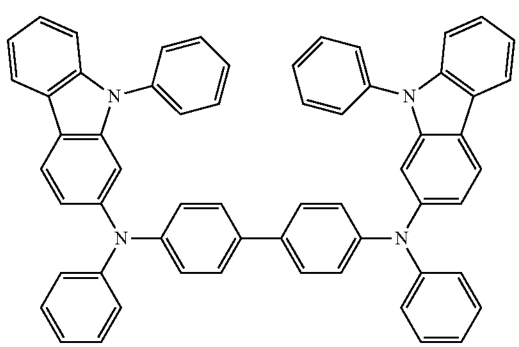
HT35
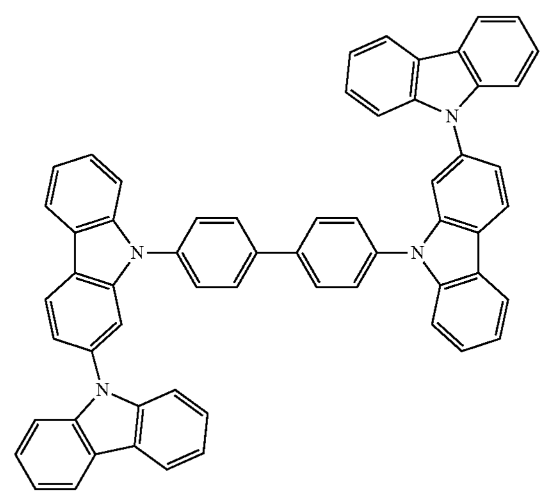

-continued

HT36

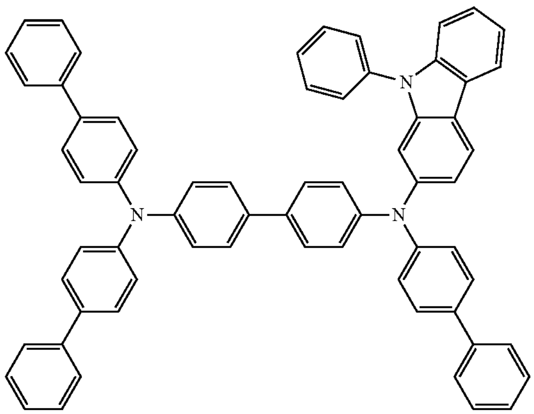

HT37

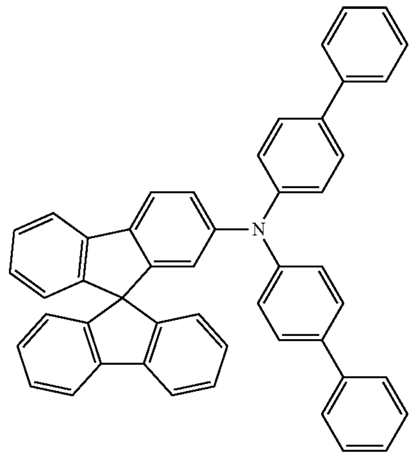

HT38

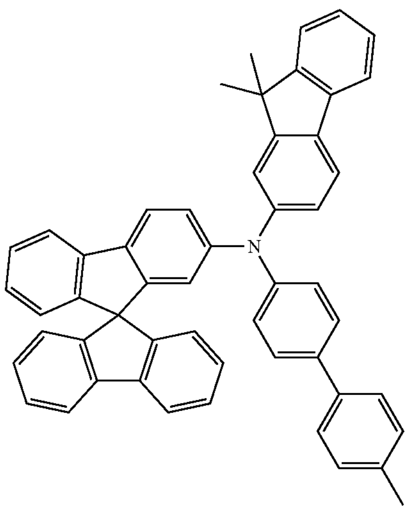

HT39

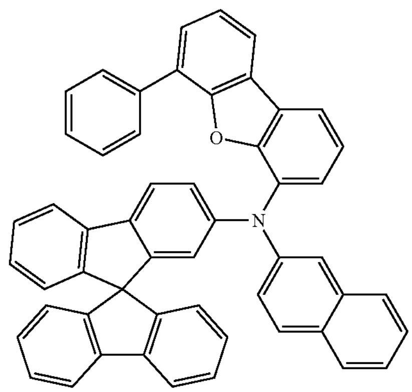

A thickness of the hole transport region may be in a range of about 100 Å to about 10,000 Å, or, for example, about 100 Å to about 1,000 Å. When the hole transport region includes at least one of a hole injection layer and a hole transport layer, a thickness of the hole injection layer may be in a range of about 100 Å to about 9,000 Å, or, for example, about 100 Å to about 1,000 Å, and a thickness of the hole transport layer may be in a range of about 50 Å to about 2,000 Å, or, for example about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the flow of electrons from an electron transport region. The emission auxiliary layer and the electron blocking layer may include the materials as described above.

[P-Dopant]

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In an embodiment, the p-dopant may have a lowest unoccupied molecular orbital (LUMO) energy level of about −3.5 eV or less.

The p-dopant may include at least one selected from a quinone derivative, a metal oxide, and a cyano group-containing compound, but embodiments of the present disclosure are not limited thereto. Examples of the p-dopant include:

a quinone derivative, such as tetracyanoquinodimethane (TCNQ) or 2,3,5,6-tetrafluoro-7,7,8,8-tetracyanoquinodimethane (F4-TCNQ);

a metal oxide, such as tungsten oxide or molybdenum oxide;

1,4,5,8,9,11-hexaazatriphenylene-hexacarbonitrile (HAT-CN); and a compound represented by Formula 221 below, but embodiments of the present disclosure are not limited thereto:

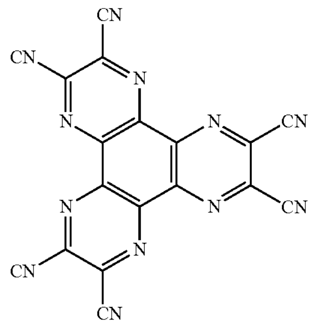

HAT-CN

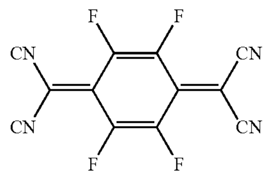

F4-TCNQ

Formula 221

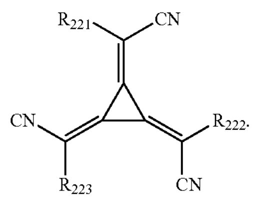

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

[Emission Layer in Organic Layer 150]

When the organic light-emitting device 10 is a full-color organic light-emitting device, the emission layer may be patterned into a red emission layer, a green emission layer, or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other. In one or more embodiments, the emission layer may include two or more materials selected from a red light-emitting material, a green light-emitting material, and a blue light-emitting material, in which the two or more materials are mixed with each other in a single layer to emit white light.

The emission layer may include a host and a dopant. The dopant may include the organometallic compound represented by Formula 1. In one or more embodiments, the dopant may further include, in addition to the organometallic compound represented by Formula 1, at least one of a phosphorescent dopant and a fluorescent dopant.

An amount of the dopant in the emission layer may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

[Host in Emission Layer]

In one or more embodiments, the host may include a compound represented by Formula 301 below.

$$[Ar_{301}]_{xb11}\text{-}[(L_{301})_{xb1}\text{-}R_{301}]_{xb21}. \qquad \text{Formula 301}$$

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, and $—P(=O)(Q_{301})(Q_{302})$, xb21 may be an integer from 1 to 5, and $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one or more embodiments, $Ar_{301}$ in Formula 301 may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

When xb11 in Formula 301 is two or more, two or more $Ar_{301}$(s) may be linked via a single bond.

In one or more embodiments, the compound represented by Formula 301 may be represented by Formula 301-1 or 301-2:

$R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may each independently be 0, 1, or 2, $L_{301}$, xb1, $R_{301}$, and $Q_{31}$ to $Q_{33}$ are the same as described above, $L_{302}$ to $L_{304}$ may each independently be the same as described in connection with $L_{301}$, xb2 to xb4 may each independently be the same as described in connection with xb1, and $R_{302}$ to $R_{304}$ may each independently be the same as described in connection with $R_{301}$.

For example, $L_{301}$ to $L_{304}$ in Formulae 301, 301-1, and 301-2 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a Formula 301-1

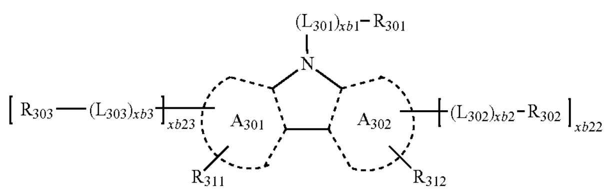

Formula 301-2

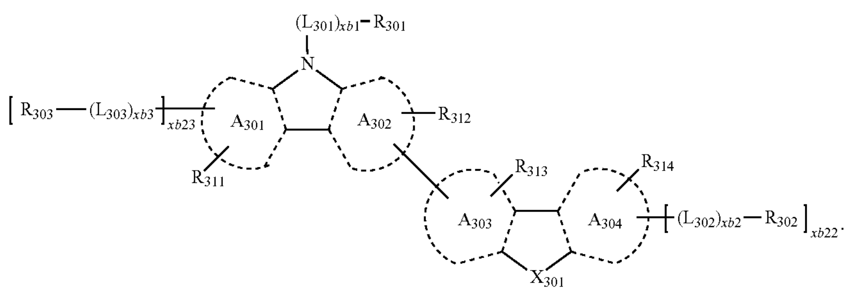

In Formulae 301-1 and 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonaphthothiophene group, and dinaphthothiophene group, $X_{301}$ may be O, S, or N-[($L_{304}$)$_{xb4}$-$R_{304}$], triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), and $Q_{31}$ to $Q_{33}$ are the same as described above.

In one embodiment, $R_{301}$ to $R_{304}$ in Formulae 301, 301-1, and 301-2 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ are the same as described above.

In one embodiment, the host may include an alkaline earth metal complex. For example, the host may be selected from a Be complex (for example, Compound H55), a Mg complex, and a Zn complex.

The host may include at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), bis(4-(9H-carbazol-9-yl)phenyl)diphenylsilane (BCPDS), 4-(1-(4-(diphenylamino)phenyl)cyclohexyl)phenyl)diphenyl-phosphine oxide (POPCPA), and Compounds H1 to H55, but embodiments of the present disclosure are not limited thereto:

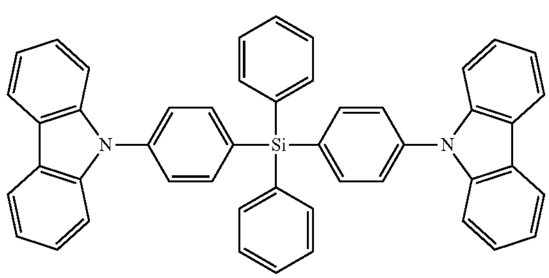

BCPDS

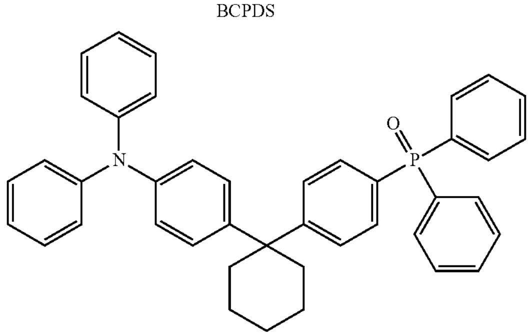

POPCPA

H1

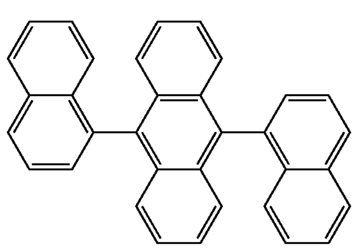

-continued

H2

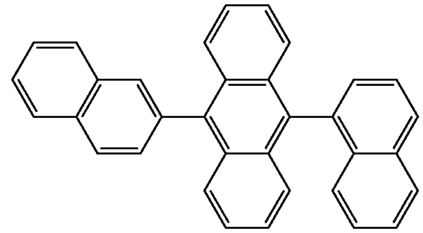

H3

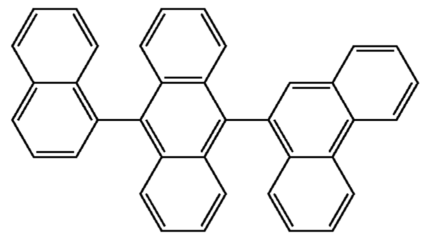

H4

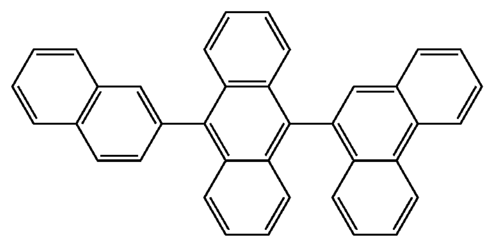

H5

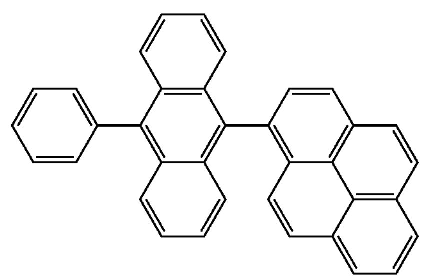

H6

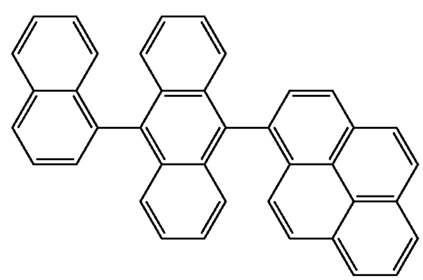

H7

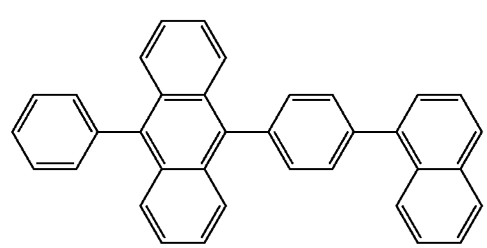

H8
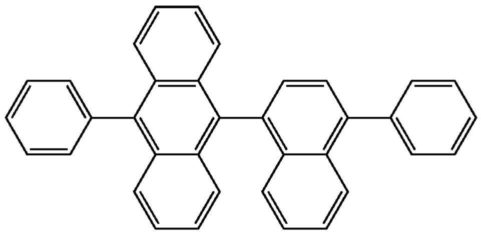
H9
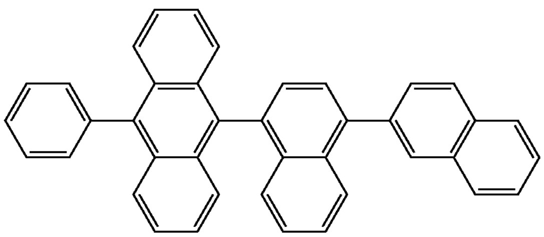
H10
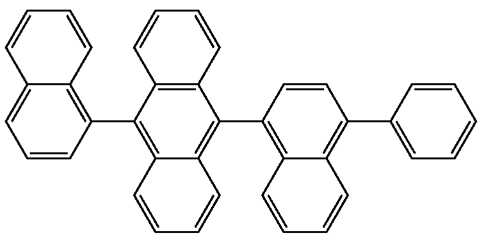
H11
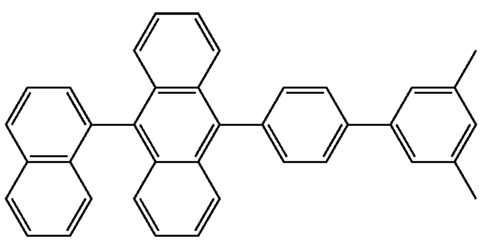
H12
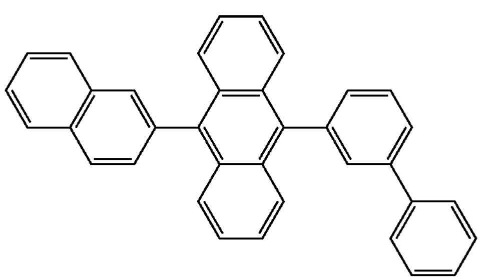
H13
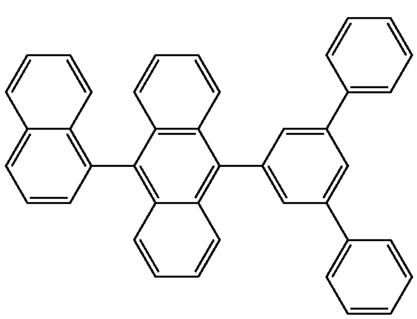
H14
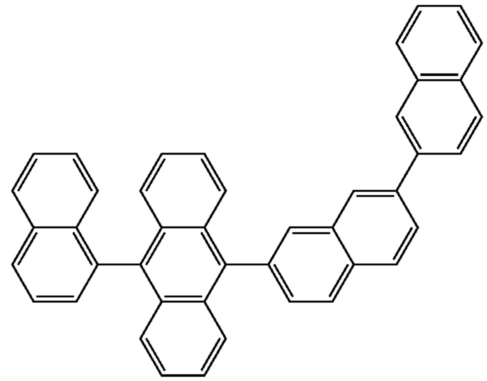
H15
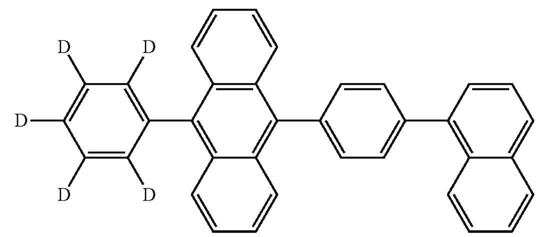
H16
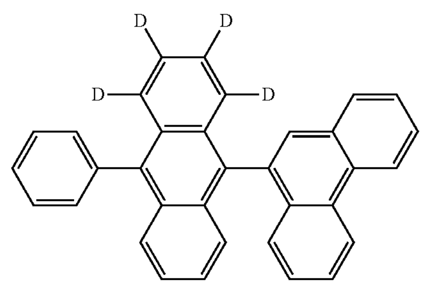
H17
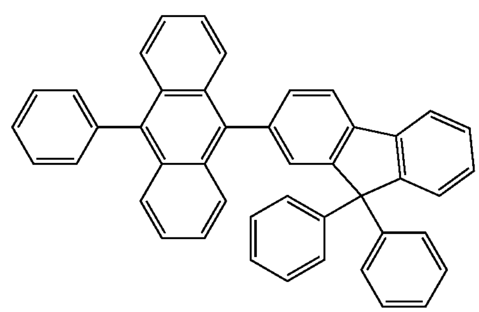
H18
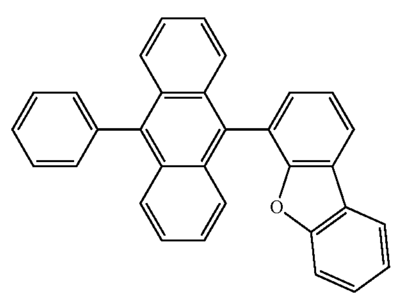

-continued
H19
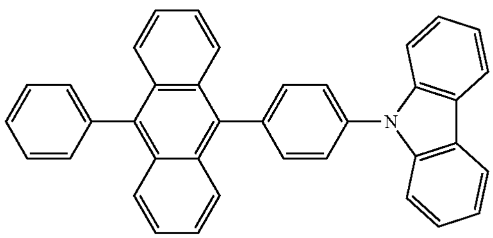
H20
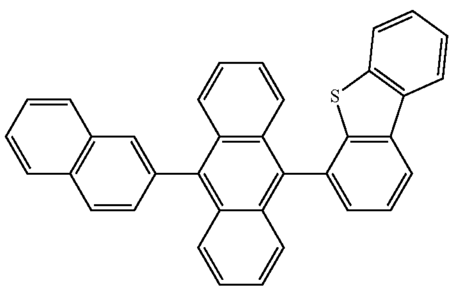
H21
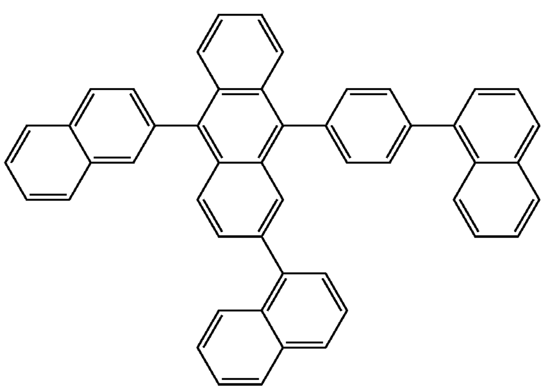
H22
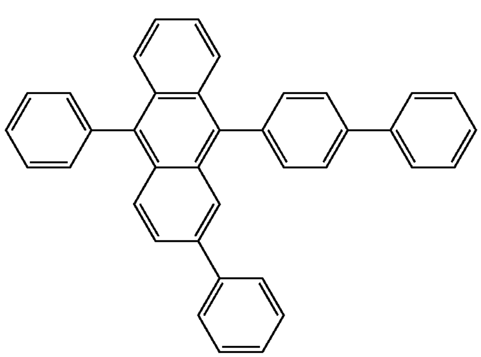
-continued
H23
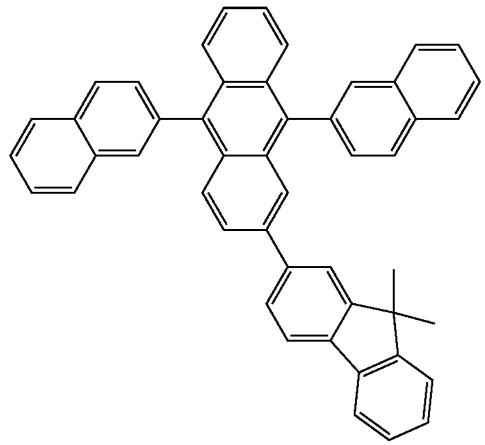
H24
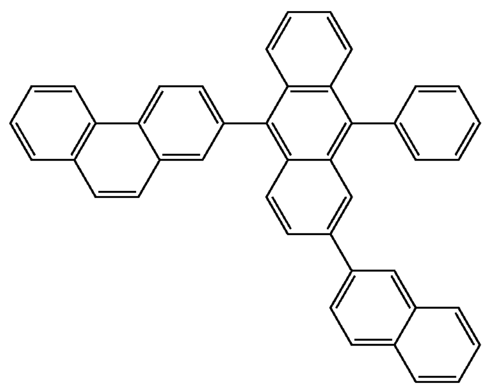
H25
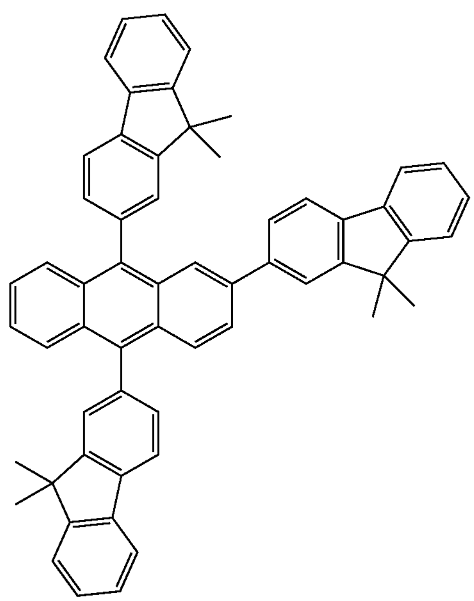

-continued
H26
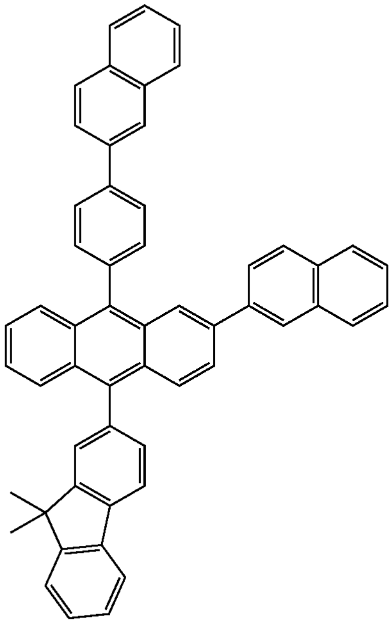
H27
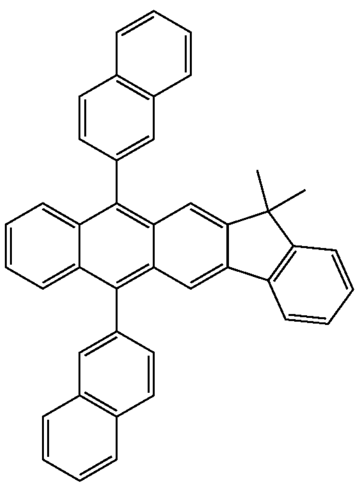
H28
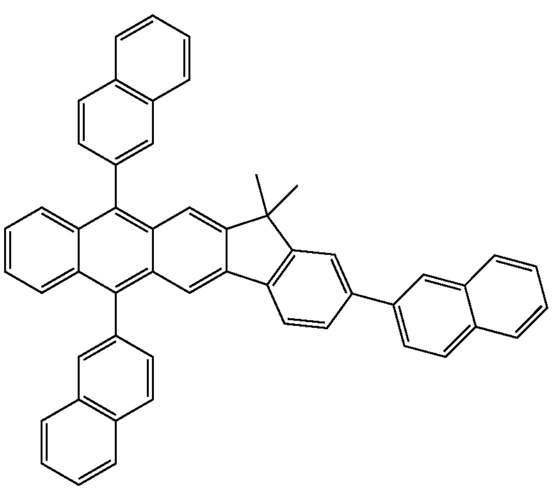
-continued
H29
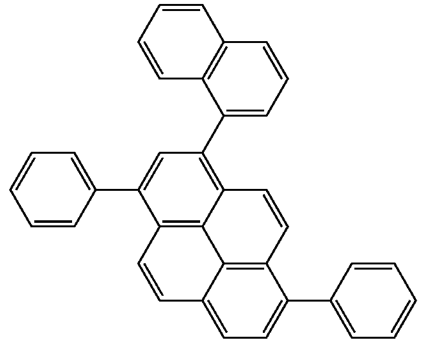
H30
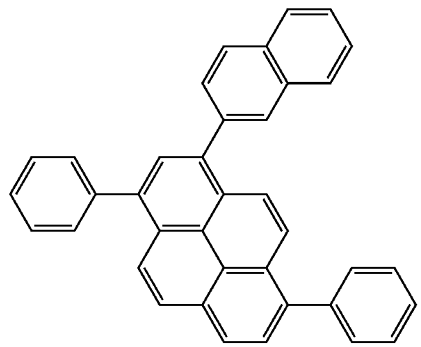
H31
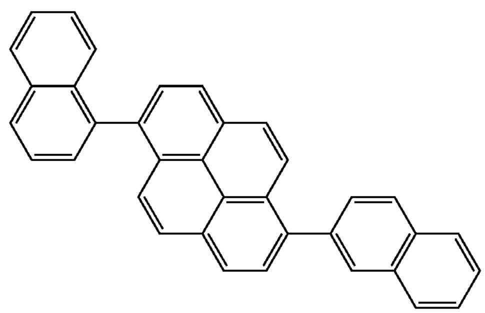
H32
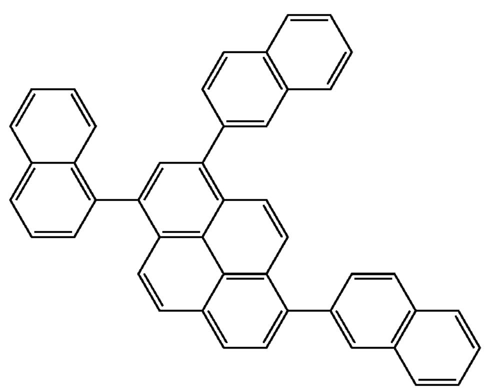
H33
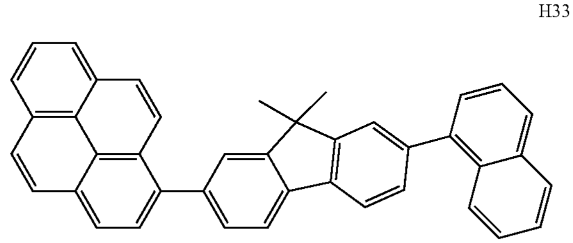

-continued
H34
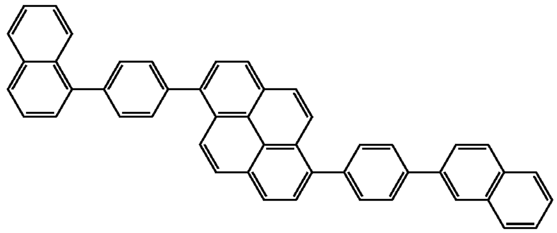
H35
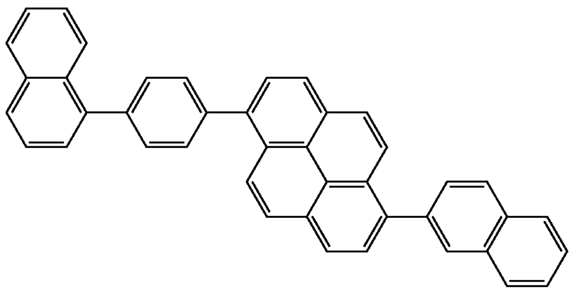
H36
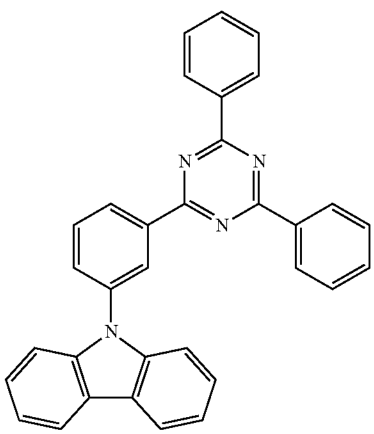
H37
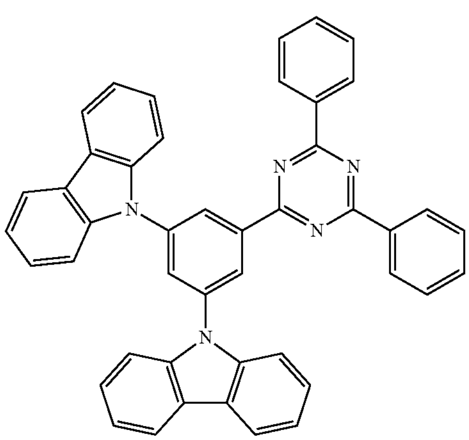
-continued
H38
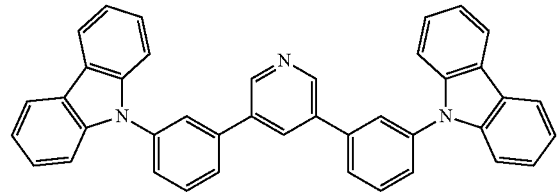
H39
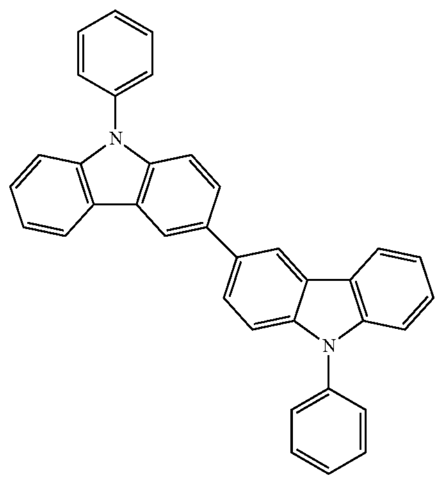
H40
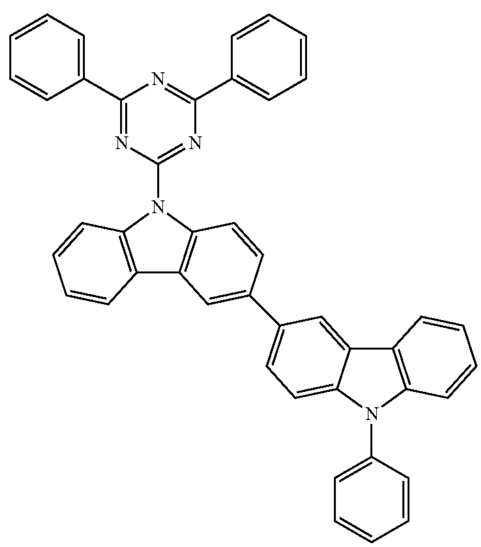

-continued
H41
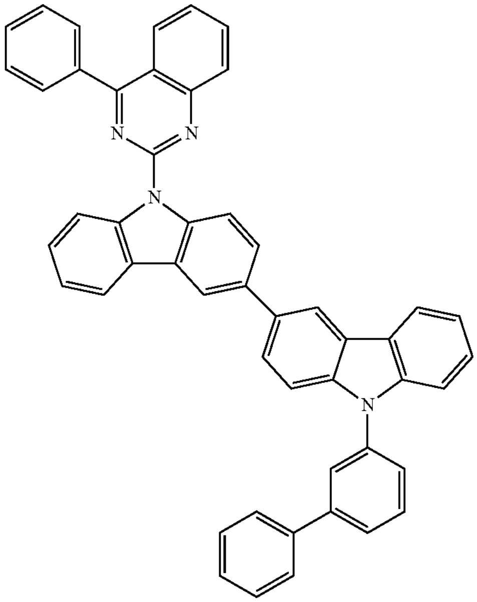
H42
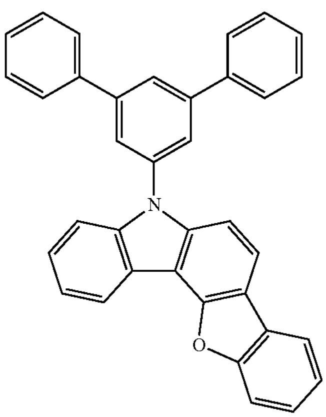
H43
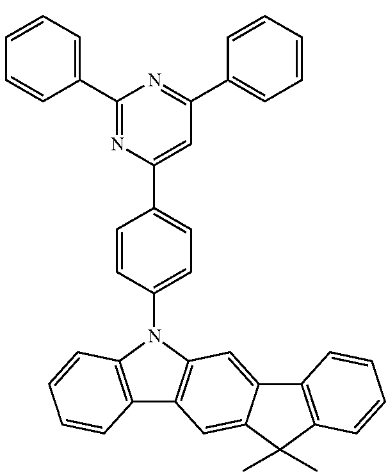
-continued
H44
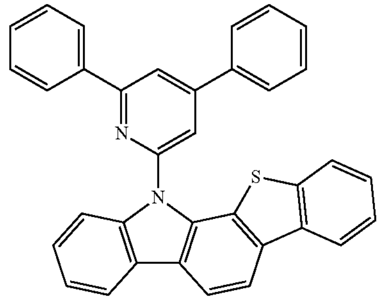
H45
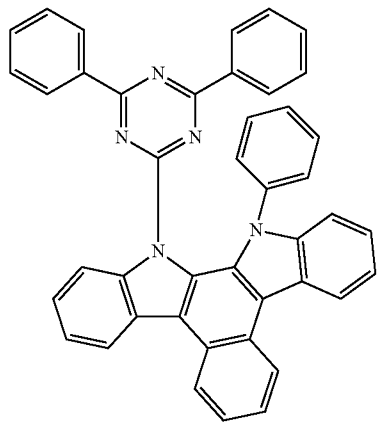
H46
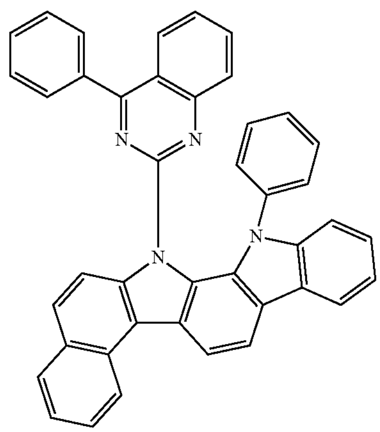
H47
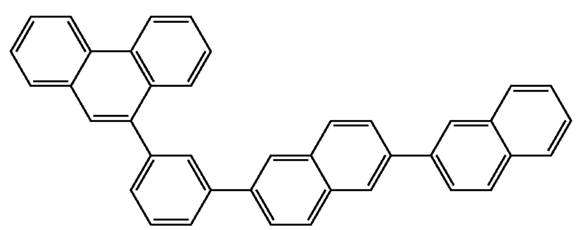
H48
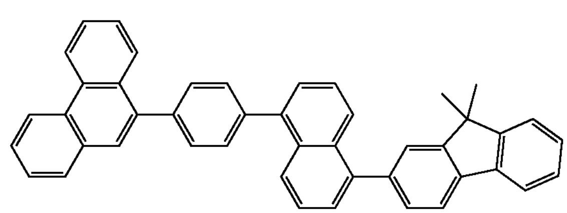

-continued

H49

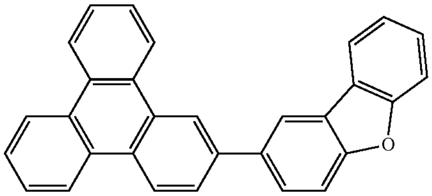

H50

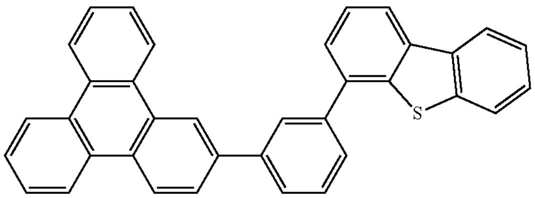

H51

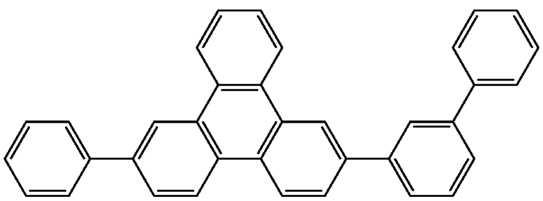

H52

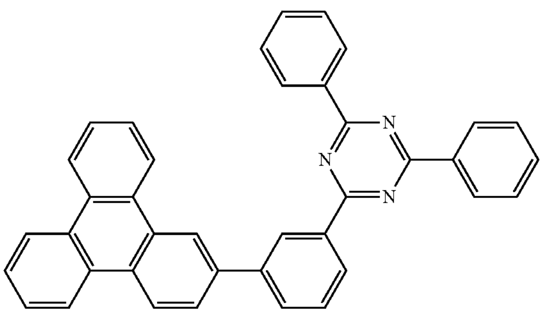

H53

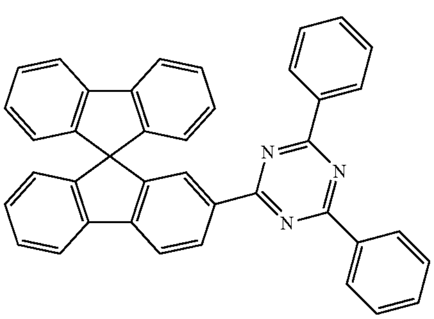

-continued

H54

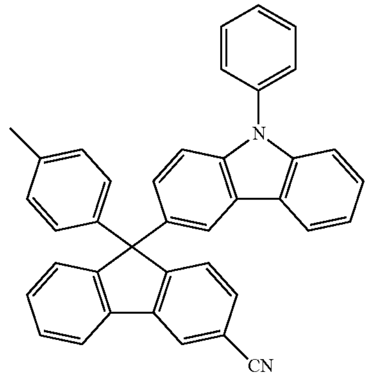

H55

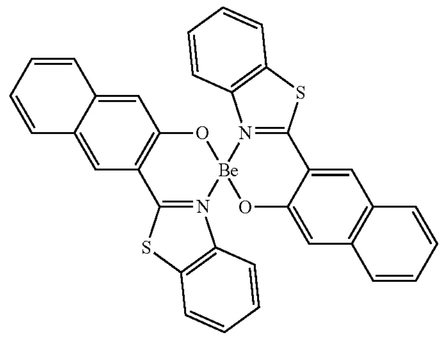

In one embodiment, the host may include at least one selected from a silicon-containing compound (for example, BCPDS used in the following examples or the like) and a phosphine oxide-containing compound (for example, POPCPA used in the following examples or the like).

However, embodiments of the present disclosure are not limited thereto. In one embodiment, the host may include only one compound, or two or more different compounds (for example, a host used in the following examples includes BCPDS and POPCPA).

[Phosphorescent Dopant Included in Emission Layer in Organic Layer 150]

The phosphorescent dopant may include the organometallic compound represented by Formula 1.

In one or more embodiments, the phosphorescent dopant may further include, in addition to the organometallic compound represented by Formula 1, an organometallic complex represented by Formula 401 below:

$$M(L_{401})_{xc1}(L_{402})_{xc2}$$ Formula 401

Formula 402

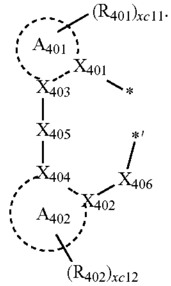

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3, wherein, when xc1 is two or more, two or more $L_{401}$(s) may be identical to or different from each other, $L_{402}$ may be an organic ligand, and xc2 may be an integer from 0 to 4, wherein, when xc2 is two or more, two or more $L_{402}$(s) may be identical to or different from each other, $X_{401}$ to $X_{404}$ may each independently be nitrogen or carbon, $X_{401}$ and $X_{403}$ may be linked via a single bond or a double bond, and $X_{402}$ and $X_{401}$ may be linked via a single bond or a double bond, $A_{401}$ and $A_{402}$ may each independently be a $C_5$-$C_{60}$ cyclic group or a $C_1$-$C_{60}$ heterocyclic group, $X_{405}$ may be a single bond, *—O—*', *—S—*', *—C(═O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', wherein $Q_{411}$ and $Q_{412}$ may be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$) and —P(═O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer from 0 to 10, and

* and *' in Formula 402 each indicate a binding site to M in Formula 401.

In one embodiment, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen, and $X_{402}$ may be carbon, or ii) $X_{401}$ may $X_{402}$ may each be nitrogen at the same time.

In one or more embodiments, $R_{401}$ and $R_{402}$ in Formula 402 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), and —P(═O)($Q_{401}$)($Q_{402}$), and $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments of the present disclosure are not limited thereto.

In one or more embodiments, when xc1 in Formula 401 is two or more, two $A_{401}$(s) in two or more $L_{401}$(s) may optionally be linked via $X_{407}$, which is a linking group, or two $A_{402}$(s) in two or more $L_{401}$(s) may optionally be linked via $X_{408}$, which is a linking group (see Compounds PD1 to PD4 and PD7). $X_{407}$ and $X_{408}$ may each independently be a single bond, *—O—*', *—S—*', *—C(═O)—*', *—N($Q_{413}$)-*', *—C($Q_{413}$)($Q_{414}$)-*', or *—C($Q_{413}$)═C($Q_{414}$)-*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments of the present disclosure are not limited thereto.

$L_{402}$ in Formula 401 may be a monovalent, divalent, or trivalent organic ligand. For example, $L_{402}$ may be selected from halogen, diketone (for example, acetylacetonate), carboxylic acid (for example, picolinate), —C(═O), isonitrile, —CN, and phosphorus (for example, phosphine or phosphite), but embodiments of the present disclosure are not limited thereto.

In one or more embodiments, the phosphorescent dopant may be selected from, for example, Compounds PD1 to PD25, but embodiments of the present disclosure are not limited thereto:

PD1

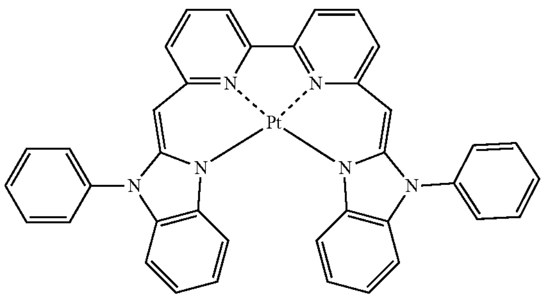

PD2

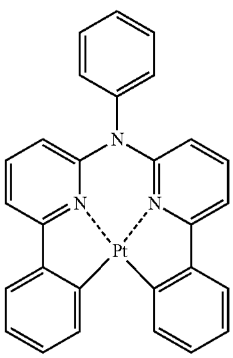

PD3

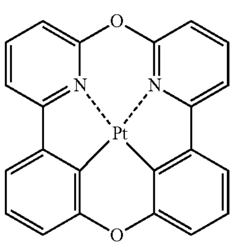

PD4

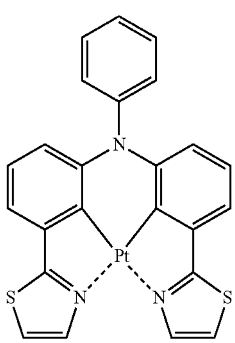

-continued

PD5

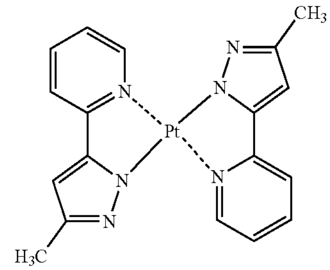

PD6

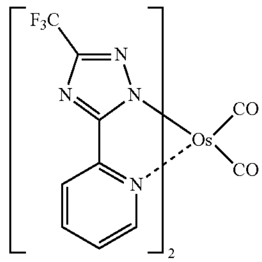

PD7

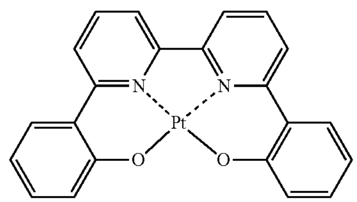

PD8

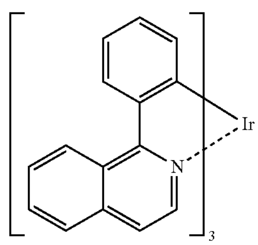

PD9

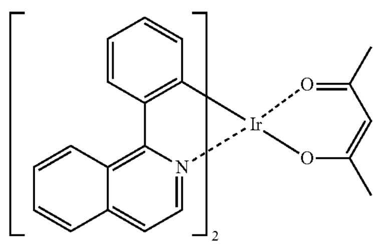

PD10

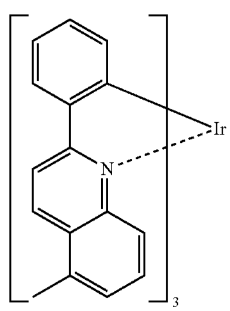

-continued
PD11
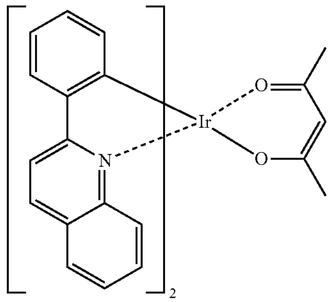
PD12
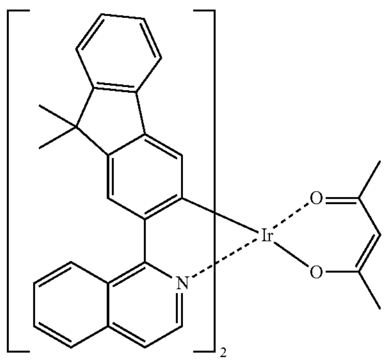
PD13
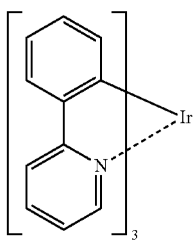
PD14
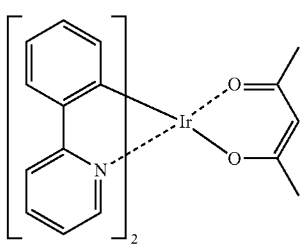
PD15
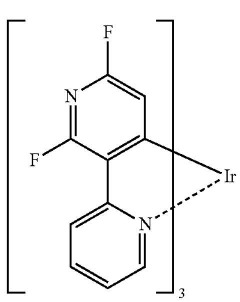
-continued
PD16
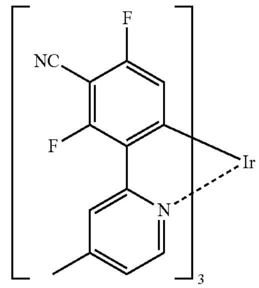
PD17
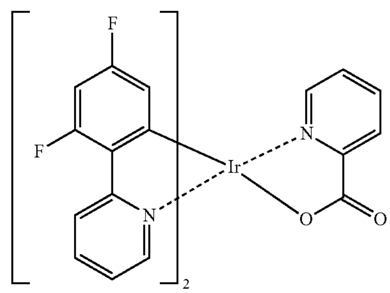
PD18
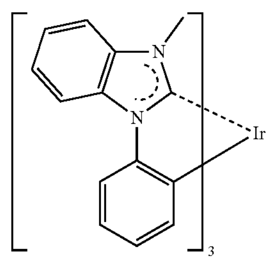
PD19
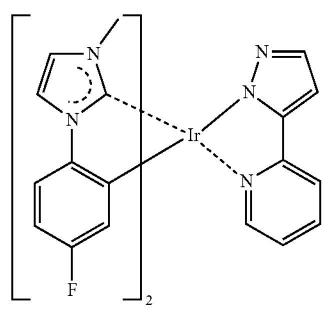
PD20
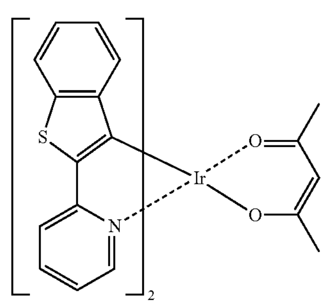

-continued

PD21

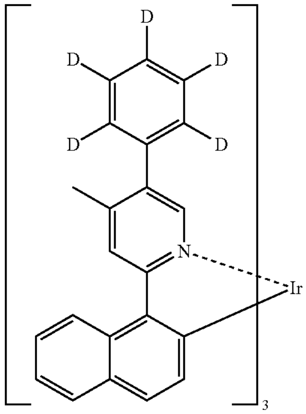

PD22

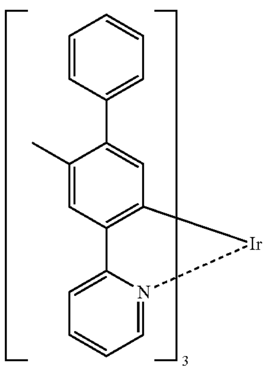

PD23

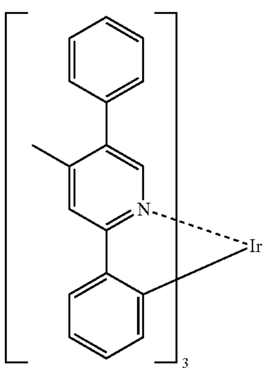

PD24

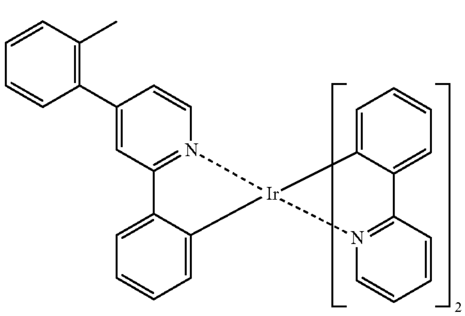

-continued

PD25

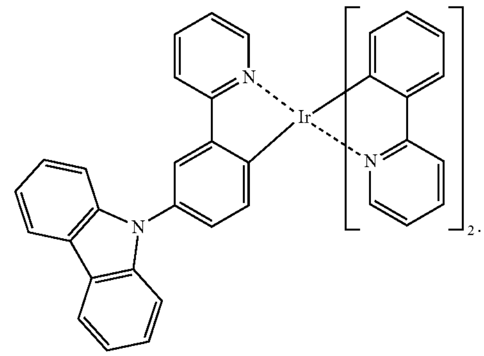

[Fluorescent Dopant in Emission Layer]

The fluorescent dopant may include an arylamine compound or a styrylamine compound.

The fluorescent dopant may include a compound represented by Formula 501 below.

Formula 501

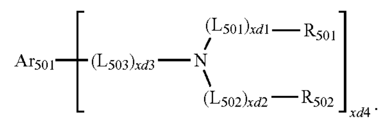

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer of 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer of 1 to 6.

In one embodiment, $Ar_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, $L_{501}$ to $L_{503}$ in Formula 501 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one or more embodiments, $R_{501}$ and $R_{502}$ in Formula 501 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —$Si(Q_{31})(Q_{32})(Q_{33})$, and $Q_{31}$ to $Q_{33}$ may be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but embodiments of the present disclosure are not limited thereto.

For example, the fluorescent dopant may be selected from Compounds FD1 to FD22:

FD1

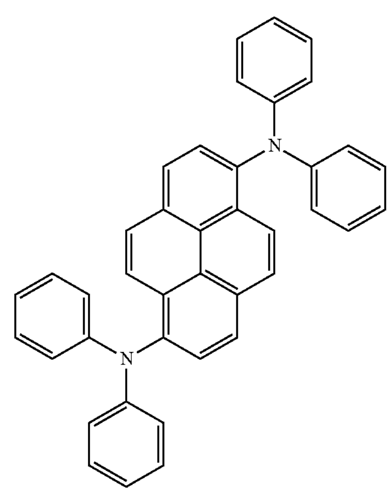

FD2
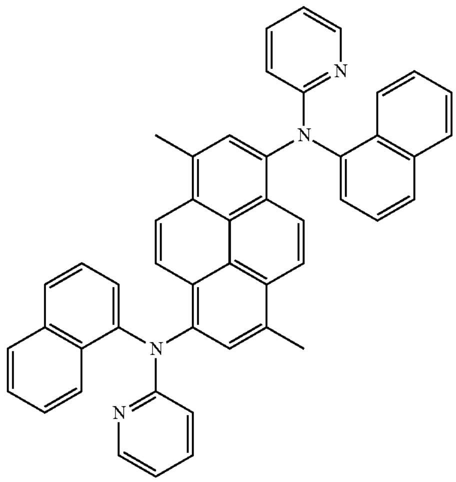
FD3
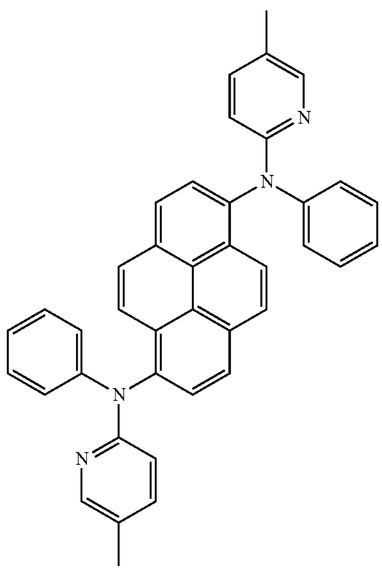
FD4
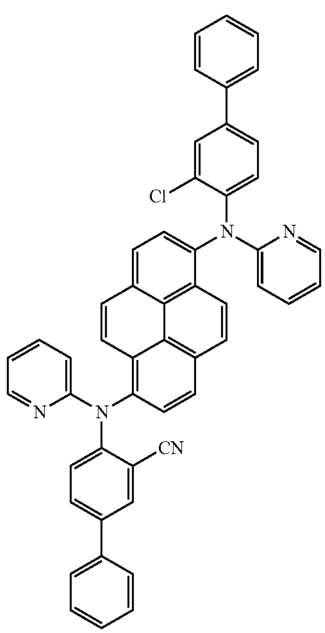
FD5
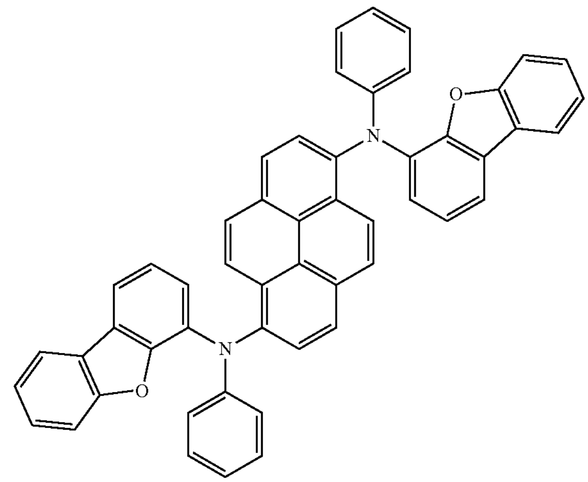
FD6
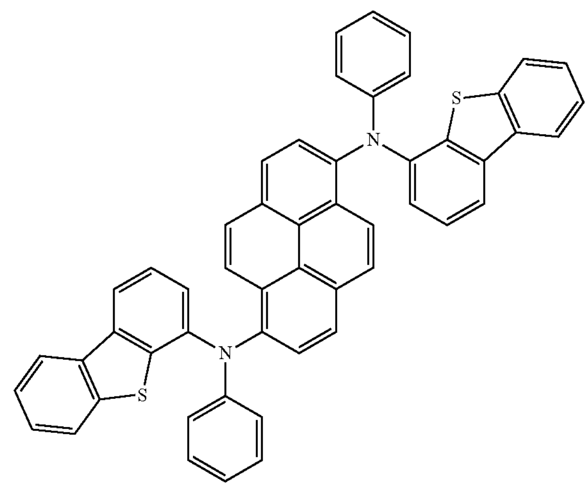
FD7
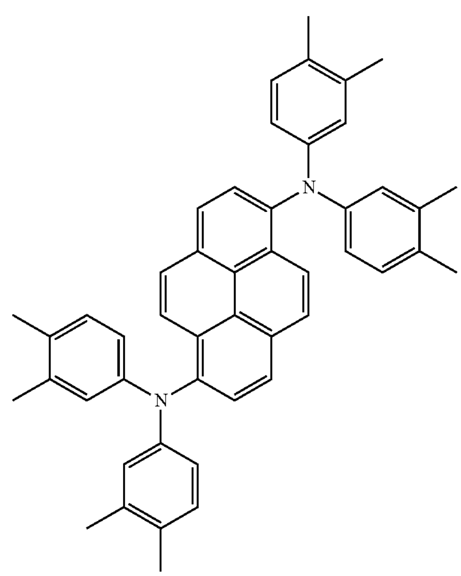

FD8
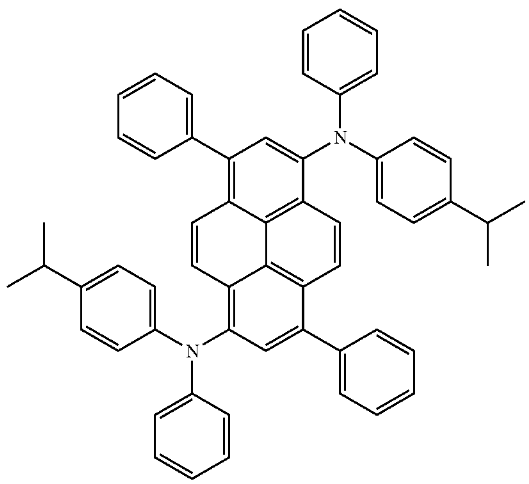
FD9
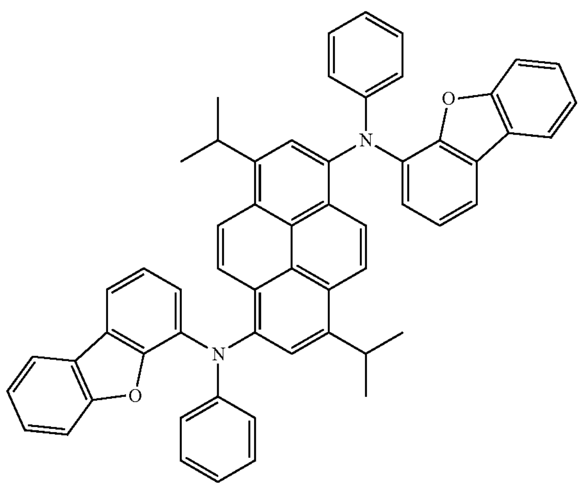
FD10
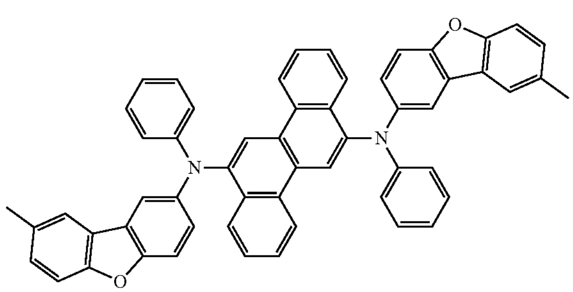
FD11
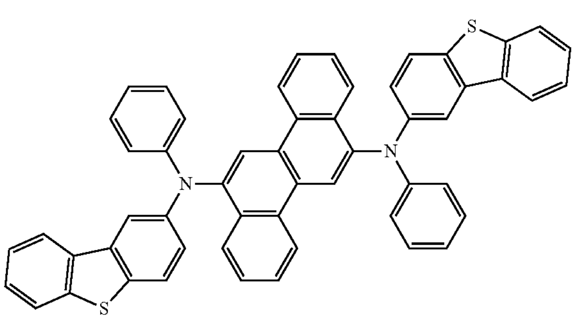
FD12
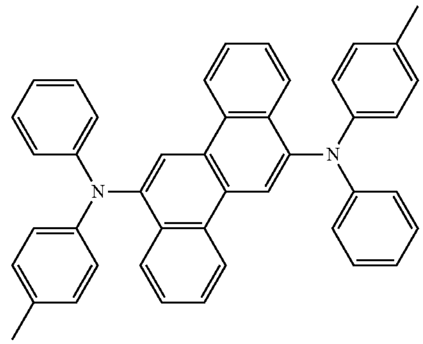
FD13
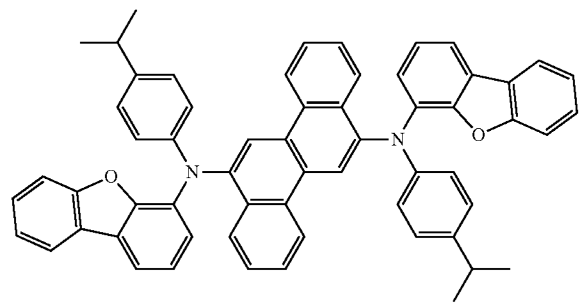
FD14
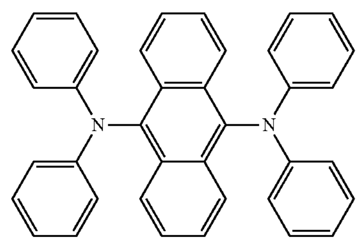
FD15
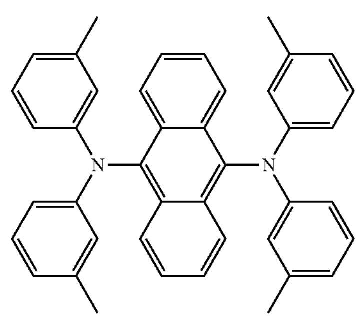
FD16
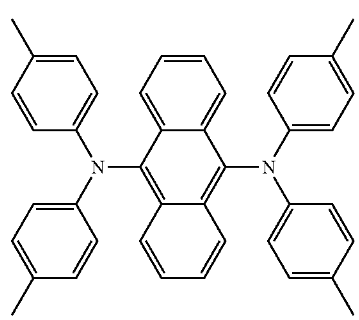

-continued
FD17
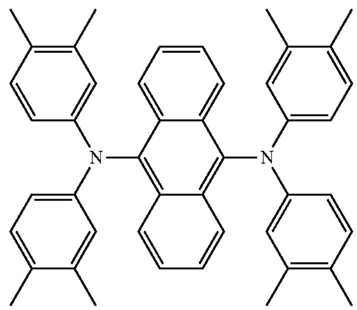
FD18
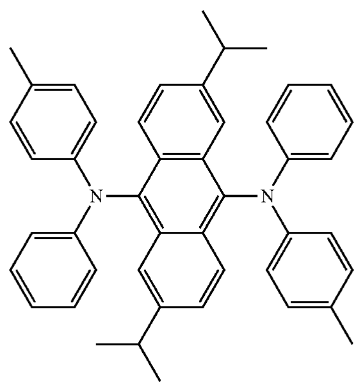
FD19
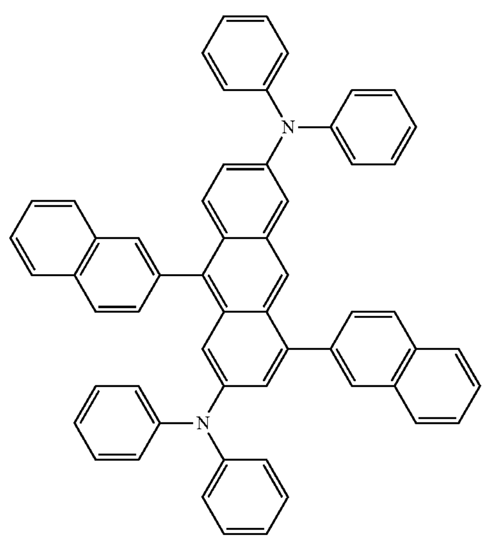
-continued
FD20
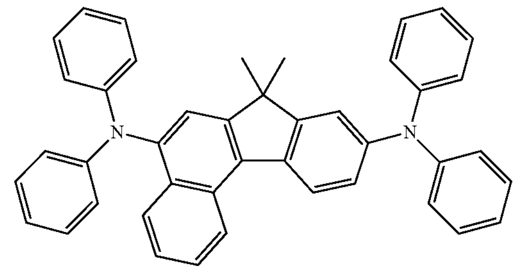
FD21
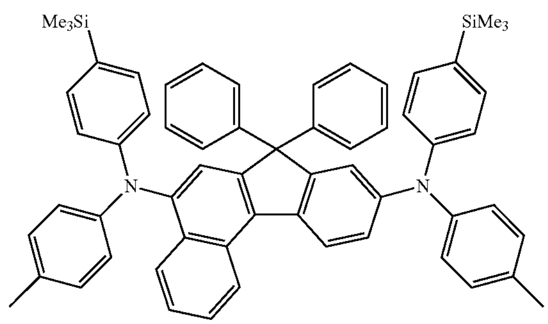
FD22
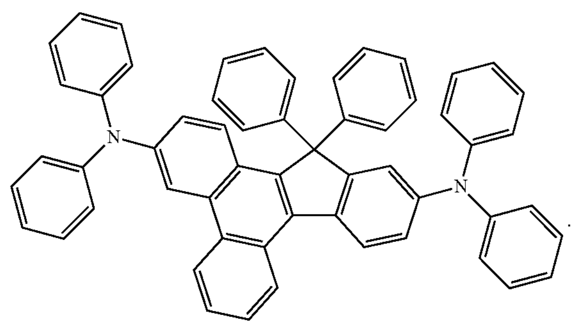
In one or more embodiments, the fluorescent dopant may be selected from the following compounds, but embodiments of the present disclosure are not limited thereto:

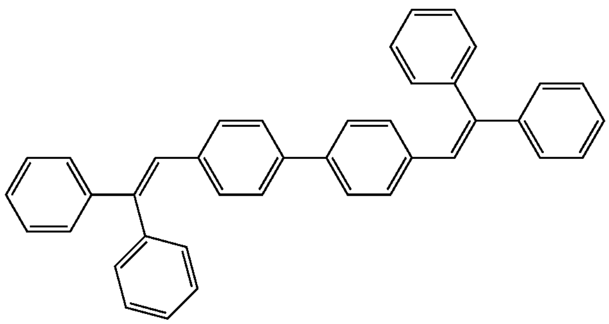

DPVBi

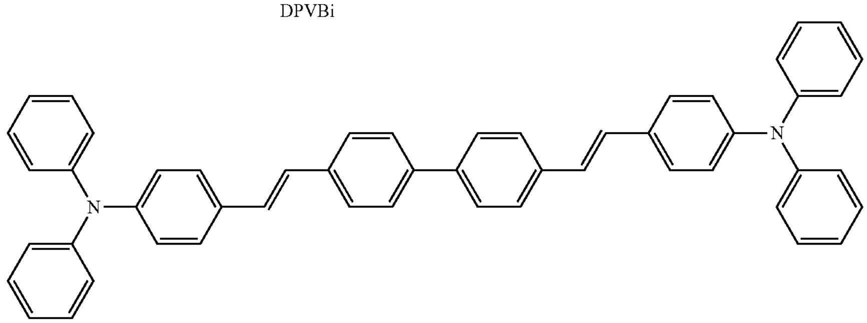

DPAVBi

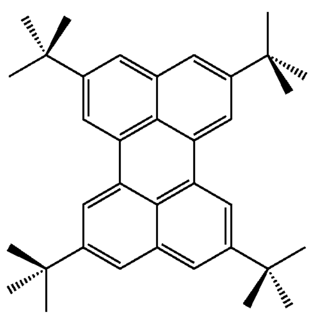

TBPe

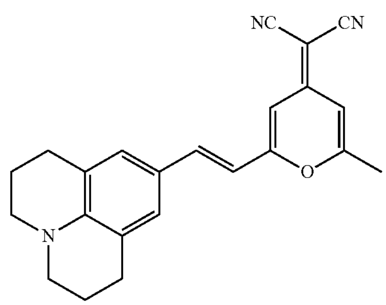

DCM

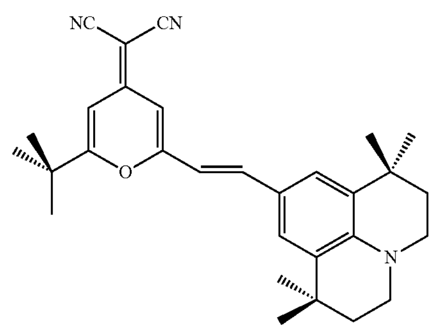

DCJTB

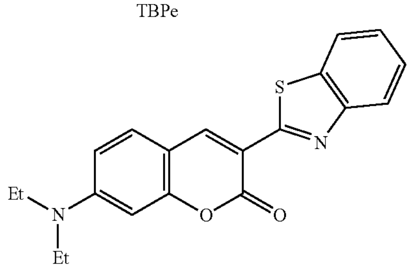

Coumarin 6

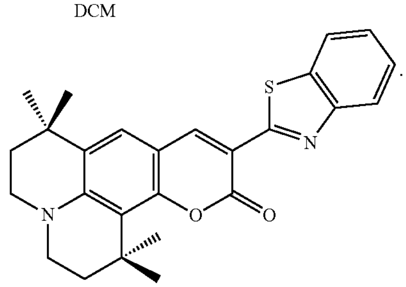

C545T

[Electron Transport Region in Organic Layer 150]

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but embodiments of the present disclosure are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from an emission layer. However, embodiments of the structure of the electron transport region are not limited thereto.

The electron transport region (for example, a buffer layer, a hole blocking layer, an electron control layer, or an electron transport layer in the electron transport region) may include a metal-free compound containing at least one π electron-depleted nitrogen-containing ring.

As used herein, the term "w electron-depleted nitrogen-containing ring" indicates a $C_1$-$C_{60}$ heterocyclic group having at least one *—N═*' moiety as a ring-forming moiety.

For example, the "π electron-depleted nitrogen-containing ring" may be i) a 5-membered to 7-membered heteromonocyclic group having at least one *—N═*' moiety, ii) a heteropolycyclic group in which two or more 5-membered to 7-membered heteromonocyclic groups each having at least one *—N═*' moiety are condensed with each other (e.g., combined together), or iii) a heteropolycyclic group in which at least one of 5-membered to 7-membered heteromonocyclic groups, each having at least one *—N═*' moiety, is condensed with (e.g., combined with) at least one $C_5$-$C_{60}$ carbocyclic group.

Examples of the π electron-depleted nitrogen-containing ring include an imidazole group, a pyrazole group, a thiazole group, an isothiazole group, an oxazole group, an isoxazole group, a pyridine group, a pyrazine group, a pyrimidine group, a pyridazine group, indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, but embodiments of the present disclosure are not limited thereto.

For example, the electron transport region may include a compound represented by Formula 601:

$$[Ar_{601}]_{xe11}\text{-}[(La_{601})_{xe1}\text{-}R_{601}]_{xe21}. \qquad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(═O)($Q_{601}$), —S(═O)$_2$($Q_{601}$), and —P(═O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one embodiment, at least one of $Ar_{601}$(s) in the number of xe11 and $R_{601}$(s) in the number of xe21 may include the π electron-depleted nitrogen-containing ring.

In one embodiment, ring $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(═O)$_2$($Q_{31}$) and —P(═O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more Ar601(s) may be linked via a single bond.

In one or more embodiments, $Ar_{601}$ in Formula 601 may be an anthracene group.

In one or more embodiments, a compound represented by Formula 601 may be represented by Formula 601-1:

Formula 601-1

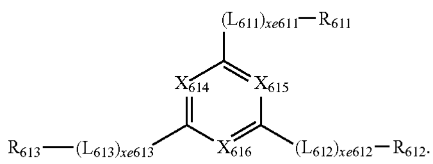

In Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, in Formulae 601 and 601-1, $L_{601}$ and $L_{611}$ to $L_{613}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, in Formulae 601 and 601-1, xe1 and xe611 to xe613 may each independently be 0, 1, or 2.

In one or more embodiments, in Formulae 601 and 601-1, $R_{601}$ and $R_{611}$ to $R_{613}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$($Q_{601}$) and —P(=O)($Q_{601}$)($Q_{602}$), and $Q_{601}$ and $Q_{602}$ are the same as described above.

The electron transport region may include at least one compound selected from Compounds ET1 to ET36, but embodiments of the present disclosure are not limited thereto:

ET1

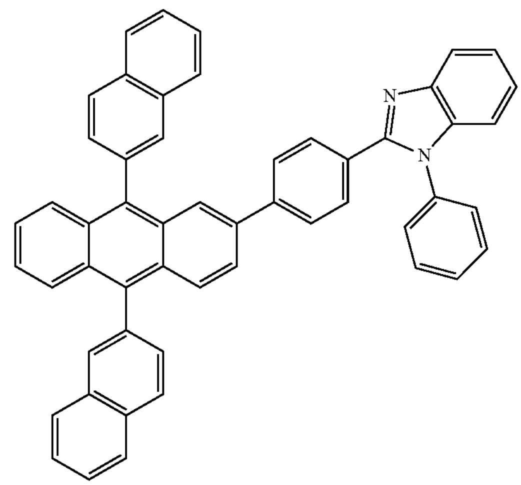

ET2

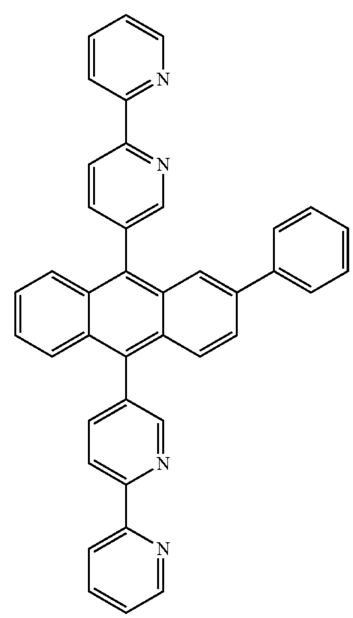

-continued
ET3
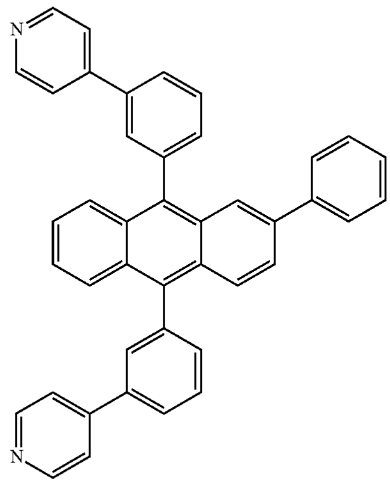
ET4
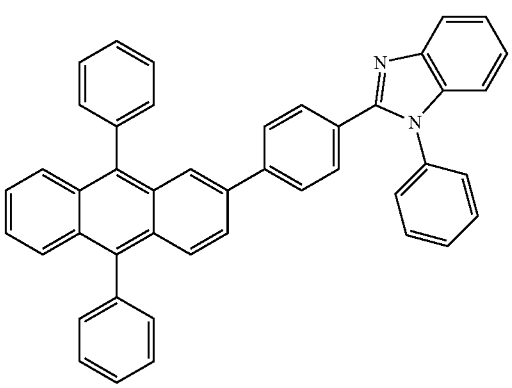
ET5
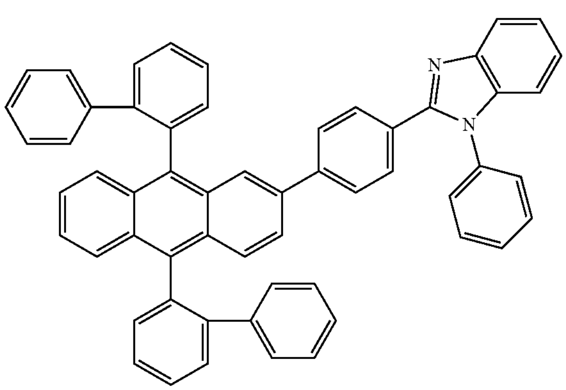
-continued
ET6
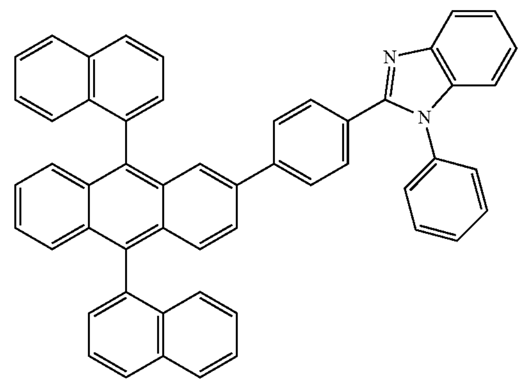
ET7
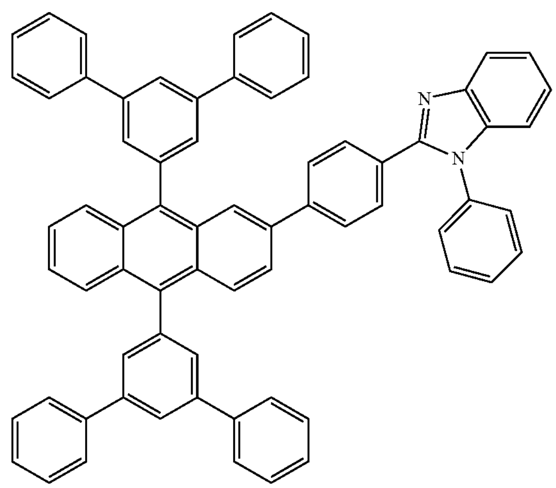
ET8
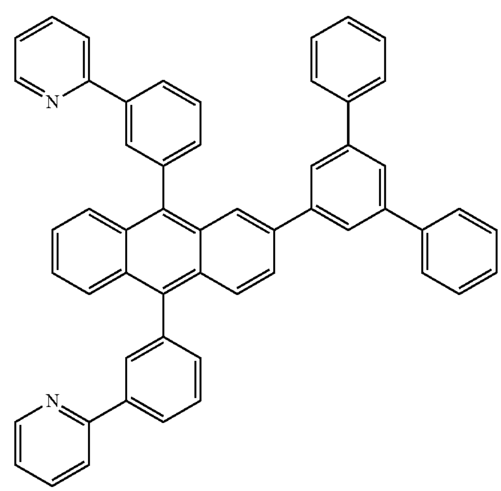

-continued
ET9
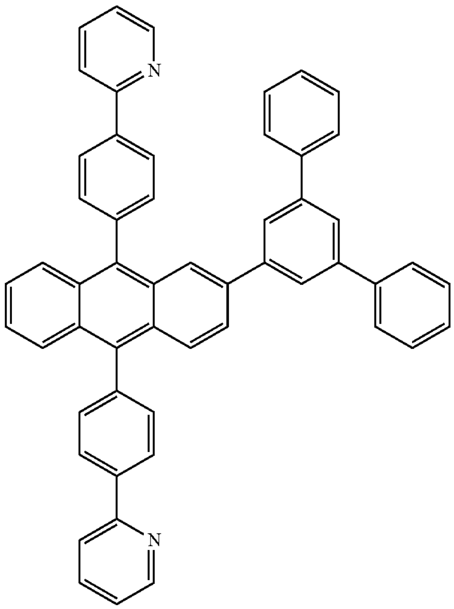
ET10
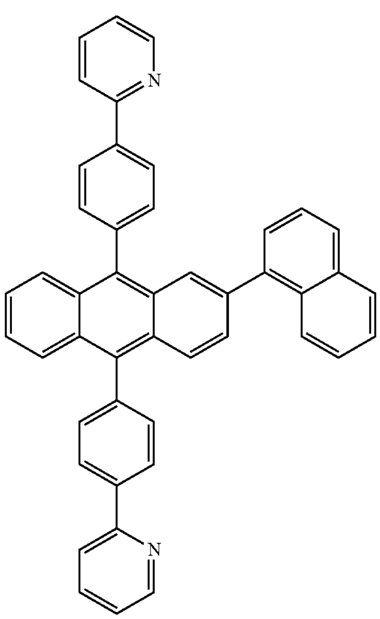
-continued
ET11
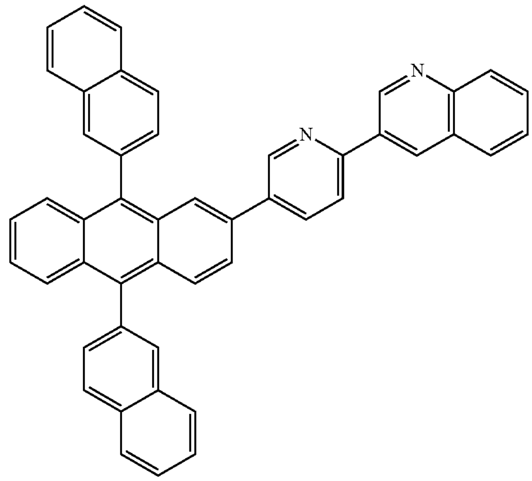
ET12
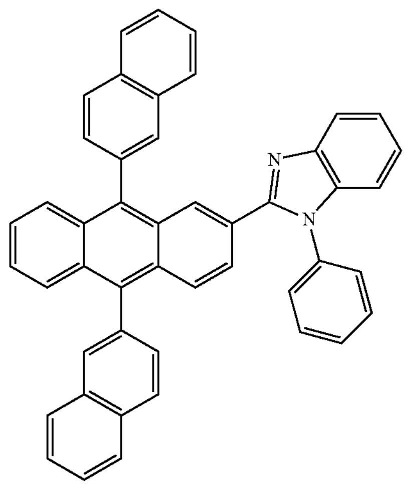
ET13
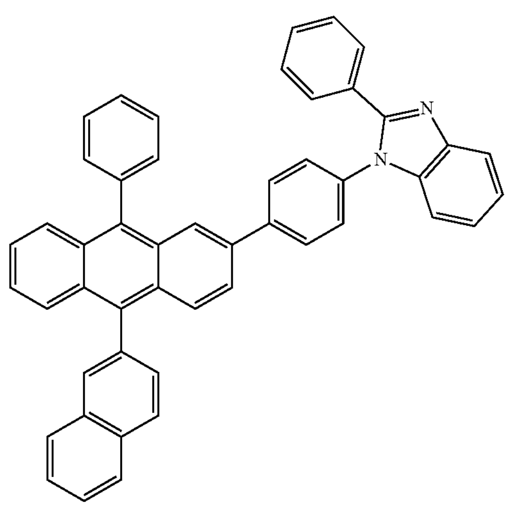

ET14
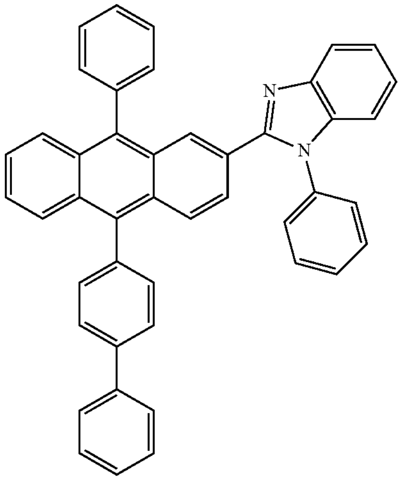
ET15
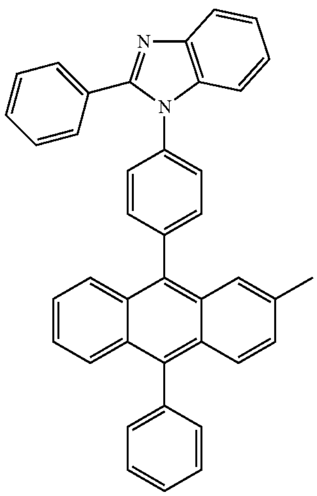
ET16
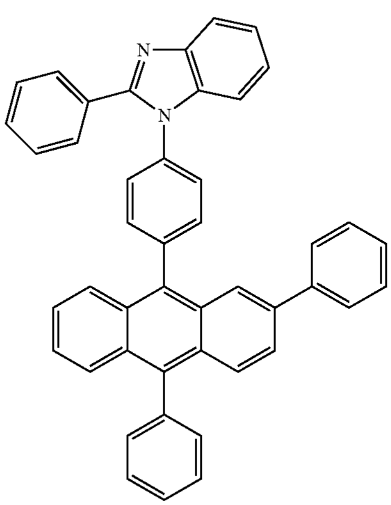
ET17
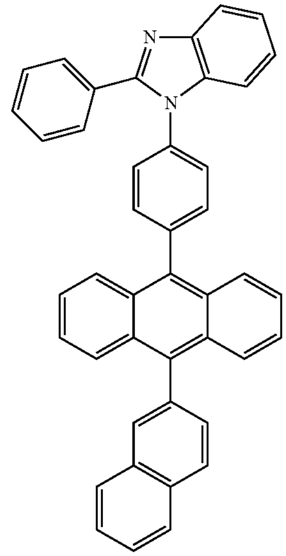
ET18
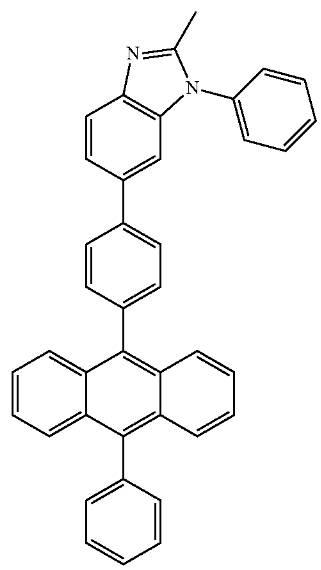
ET19
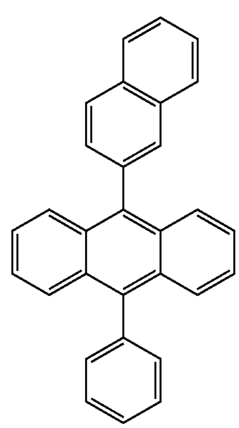

-continued
ET20
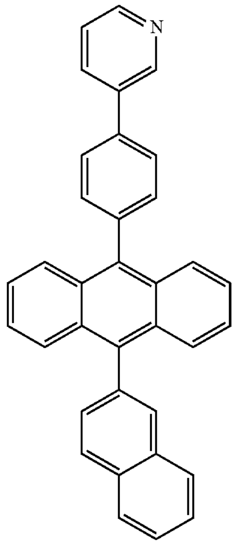
ET21
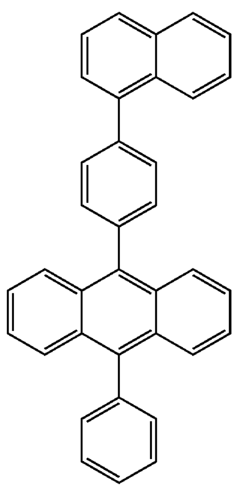
ET22
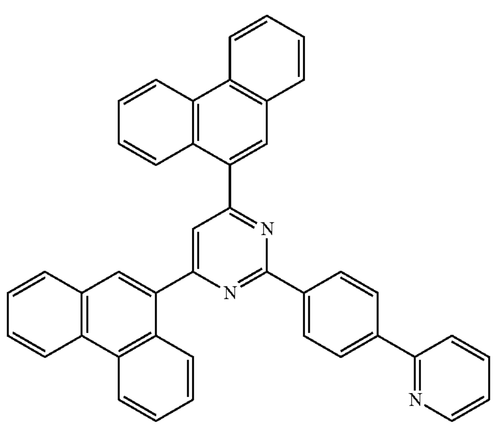
-continued
ET23
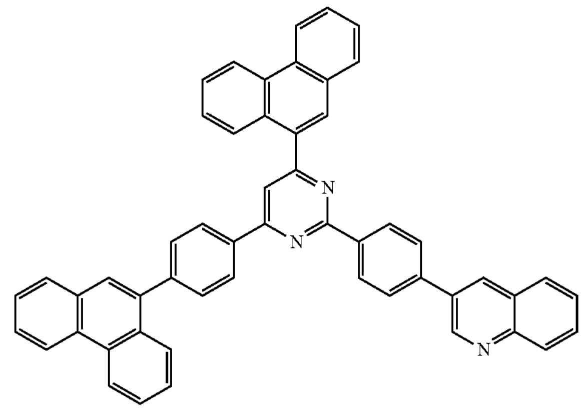
ET24
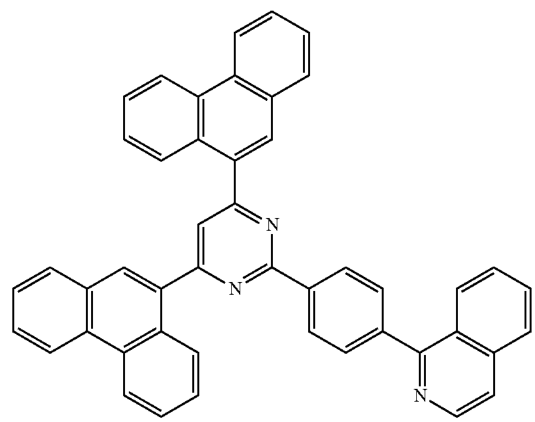
ET25
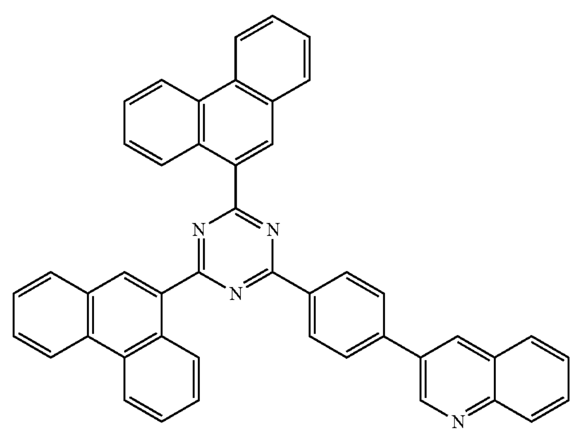

-continued
ET26
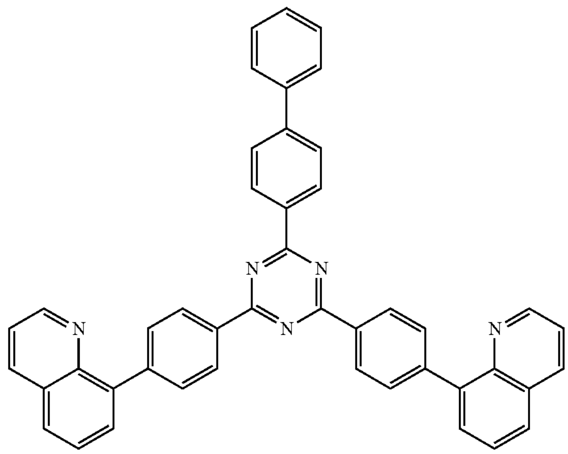
ET27
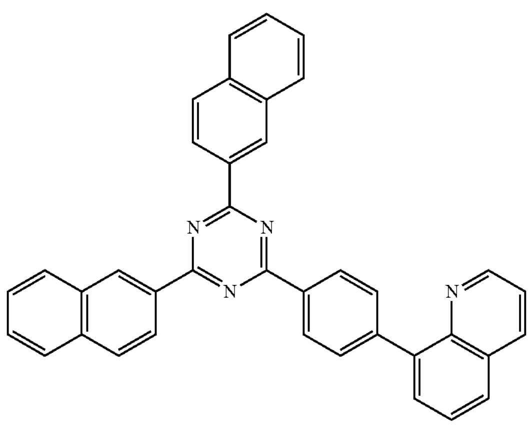
ET28
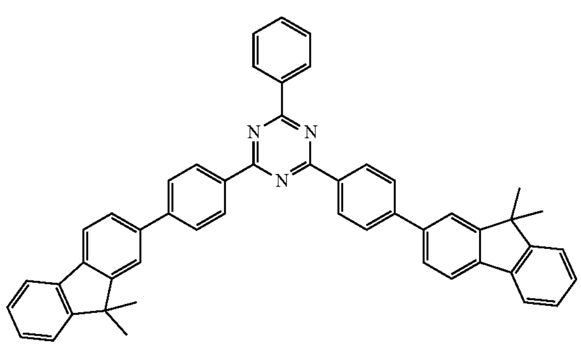
-continued
ET29
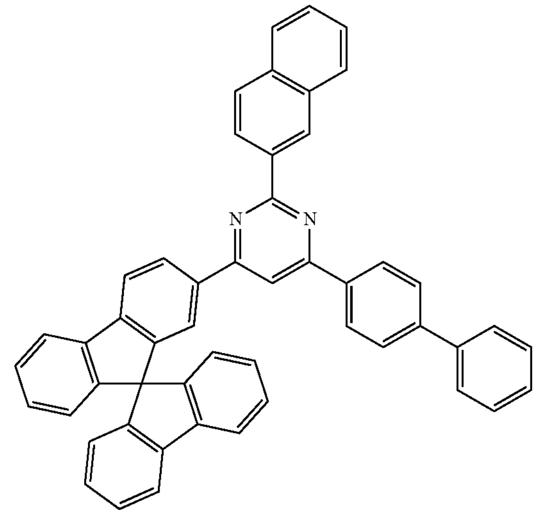
ET30
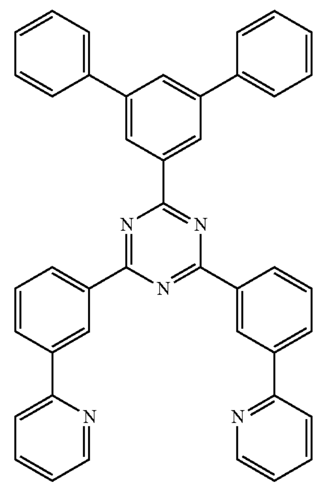
ET31
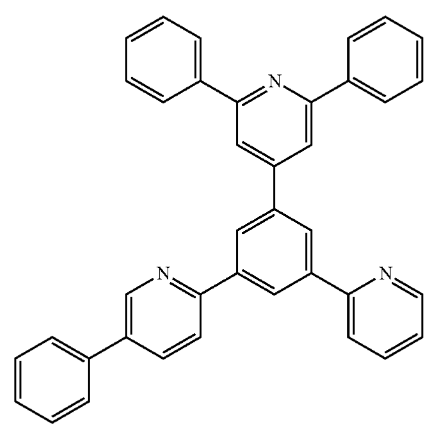

-continued
ET32
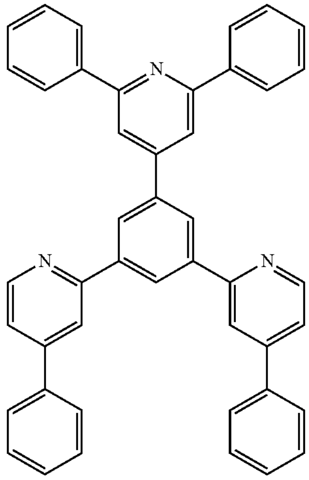
ET33
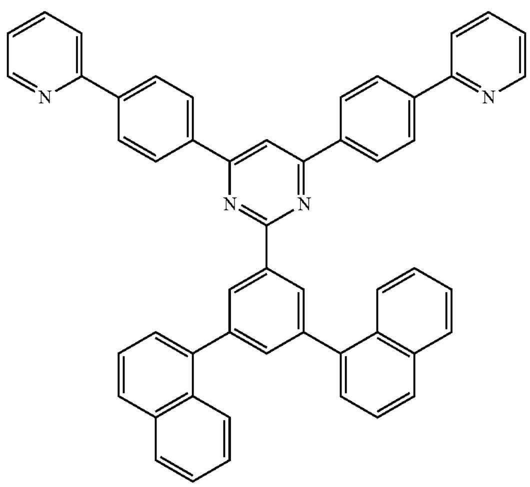
ET34
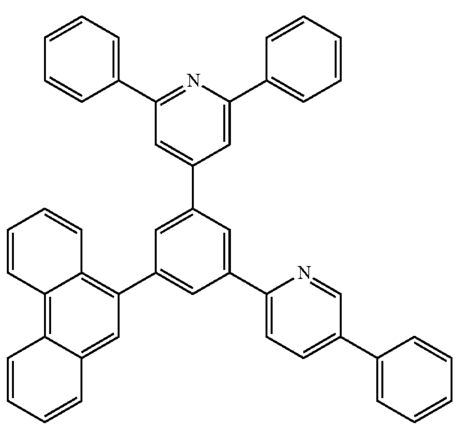
-continued
ET35
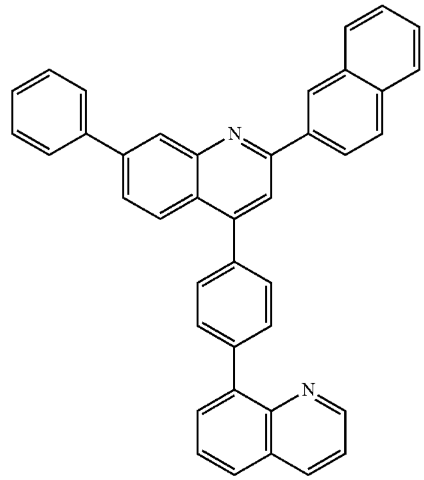
ET36
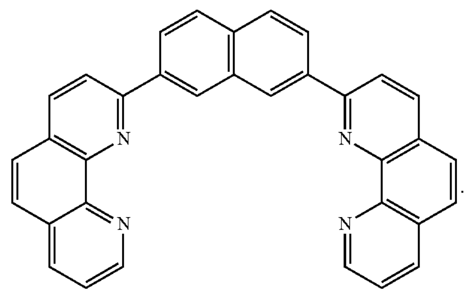
In one or more embodiments, the electron transport region may include at least one selected from dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), NTAZ, and diphenyl(4-(triphenylsilyl)phenyl)-phosphine oxide (TSPO1):
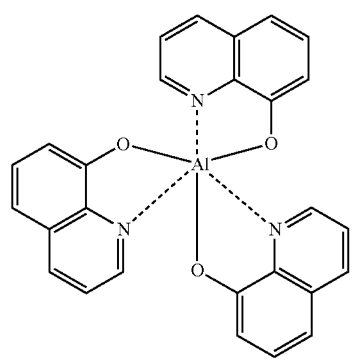
$Alq_3$ -continued

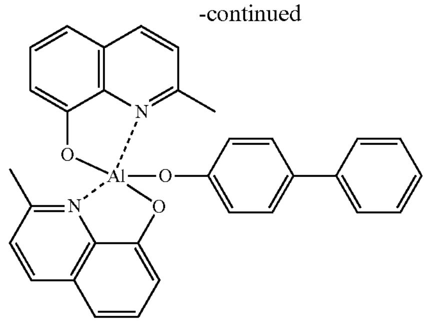

BAlq

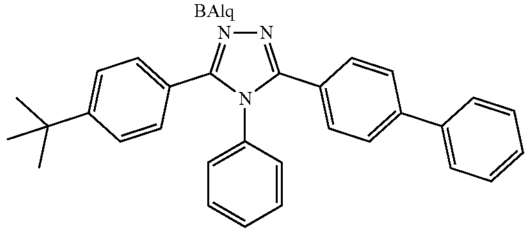

TAZ

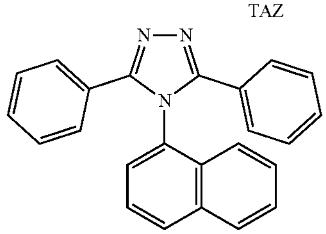

NTAZ

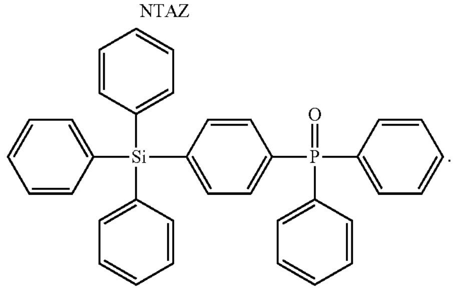

TSPO1

A thickness of the buffer layer, the hole blocking layer, and/or the electron control layer may be in a range of about 20 Å to about 1,000 Å, for example, about 30 A to about 300 Å. When the thicknesses of the buffer layer, the hole blocking layer, and the electron control layer are within these ranges, the electron blocking layer may have excellent electron blocking characteristics or electron control characteristics without a substantial increase in driving voltage.

A thickness of the electron transport layer may be in a range of about 100 Å to about 1,000 Å, or, for example, about 150 Å to about 500 Å. When the thickness of the electron transport layer is within the range described above, the electron transport layer may have suitable or satisfactory electron transport characteristics without a substantial increase in driving voltage.

The electron transport region (for example, the electron transport layer in the electron transport region) may further include, in addition to the materials described above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) or ET-D2:

ET-D1

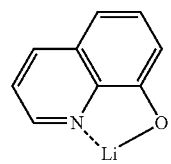

ET-D2

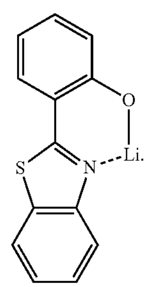

The electron transport region may include an electron injection layer that facilitates injection of electrons from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, a Na, K, Rb, and Cs. In one embodiment, the alkali metal may be Li, a Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, KI, or RbI. In one embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}O$ (0<x<1), $Ba_xCa_{1-x}O$ (0<x<1). In one embodiment, the alkaline earth-metal compound may be selected from BaO, SrO, and CaO, but embodiments of the present disclosure are not limited thereto.

The rare earth metal compound may be selected from $YbF_3$, $ScF_3$, $ScO_3$, $Y_2O_3$, $Ce_2O_3$, $GdF_3$, and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenylan oxazole, hydroxy phenylthiazole, hydroxy diphenylan oxadiazole, hydroxy diphenylthiadiazol, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may include or consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, or, for example, about 3 Å to about 90 Å. When the thickness of the electron injection layer is within the range described above, the electron injection layer may have suitable or satisfactory electron injection characteristics without a substantial increase in driving voltage.

[Second Electrode 190]

The second electrode 190 may be disposed on the organic layer 150 having such a structure. The second electrode 190 may be a cathode which is an electron injection electrode, and in this regard, a material for forming the second electrode 190 may be selected from metal, an alloy, an electrically conductive compound, and a combination thereof, which have a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layered structure, or a multi-layered structure including two or more layers.

Figure 2:
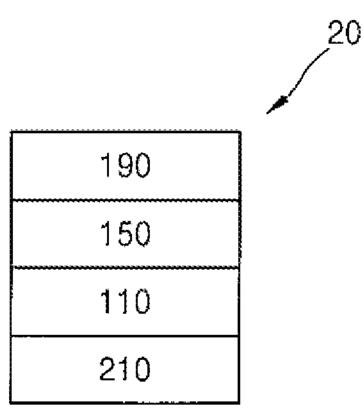
FIG. 2 is a schematic cross-sectional view of an organic light-emitting device according to an embodiment.
Figure 3:
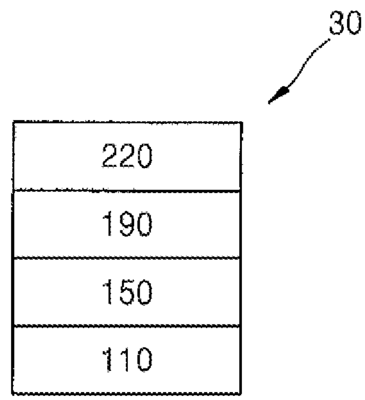
FIG. 3 is a schematic cross-sectional view of an organic light-emitting device according to an embodiment.
Figure 4:
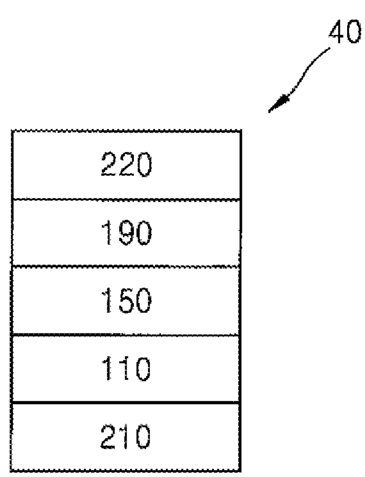
FIG. 4 is a schematic cross-sectional view of an organic light-emitting device according to an embodiment.

[Description of FIGS. 2 to 4]

An organic light-emitting device 20 of FIG. 2 includes a first capping layer 210, a first electrode 110, an organic layer 150, and a second electrode 190 which are sequentially stacked in this stated order, an organic light-emitting device 30 of FIG. 3 includes a first electrode 110, an organic layer 150, a second electrode 190, and a second capping layer 220 which are sequentially stacked in this stated order, and an organic light-emitting device 40 of FIG. 4 includes a first capping layer 210, a first electrode 110, an organic layer 150, a second electrode 190, and a second capping layer 220.

Regarding FIGS. 2 to 4, the first electrode 110, the organic layer 150, and the second electrode 190 may be understood by referring to the description presented in connection with FIG. 1.

In the organic layer 150 of each of the organic light-emitting devices 20 and 40, light generated in an emission layer may pass through the first electrode 110, which is a semi-transmissive electrode or a transmissive electrode, and the first capping layer 210 toward the outside, and in the organic layer 150 of each of the organic light-emitting devices 30 and 40, light generated in an emission layer may pass through the second electrode 190, which is a semi-transmissive electrode or a transmissive electrode, and the second capping layer 220 toward the outside.

The first capping layer 210 and the second capping layer 220 may increase external luminescent efficiency according to the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may each independently include at least one material selected from carbocyclic compounds, heterocyclic compounds, amine-based compounds, porphyrine derivatives, phthalocyanine derivatives, a naphthalocyanine derivatives, alkali metal complexes, and alkaline earth-based complexes. The carbocyclic compound, the heterocyclic compound, and the amine-based compound may be optionally substituted with a substituent containing at least one element selected from O, N, S, Se, Si, F, Cl, Br, and I. In one embodiment, at least one selected from the first capping layer 210 and the second capping layer 220 may each independently include an amine-based compound.

In one embodiment, at least one selected from the first capping layer 210 and the second capping layer 220 may each independently include the compound represented by Formula 201 or the compound represented by Formula 202.

In one or more embodiments, at least one selected from the first capping layer 210 and the second capping layer 220 may each independently include a compound selected from Compounds HT28 to HT33 and Compounds CP1 to CP5, but embodiments of the present disclosure are not limited thereto:

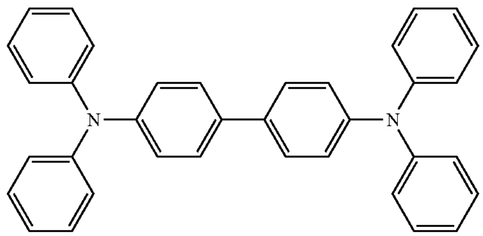

CP1

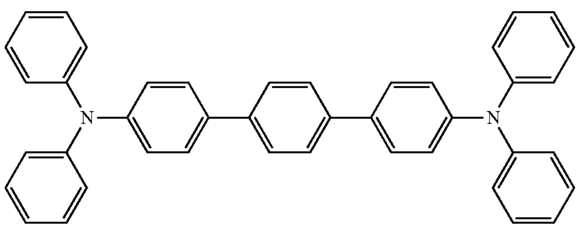

CP2

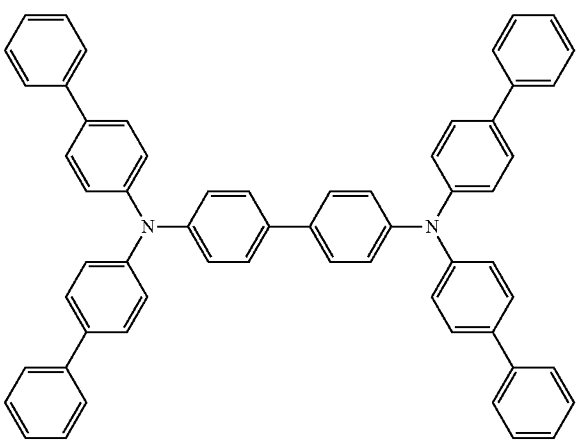

CP3

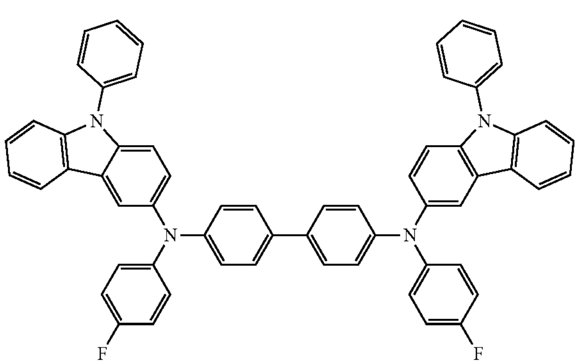

CP4

-continued

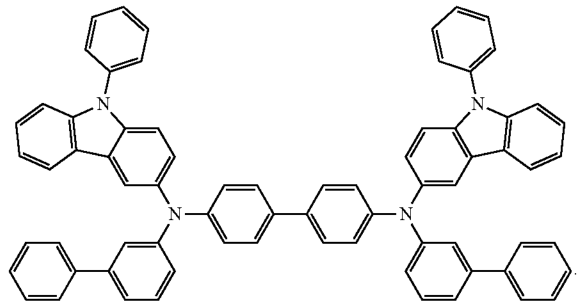

CP5

Hereinbefore, the organic light-emitting device according to an embodiment has been described in connection with FIGS. 1 to 4. However, embodiments of the present disclosure are not limited thereto.

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, for example, the vacuum deposition may be performed at a deposition temperature of about 100° C. to about 500° C., at a vacuum degree of about $10^{-8}$ torr to about $10^{-3}$ torr, and at a deposition rate of about 0 Å/sec to about 100 Å/sec by taking into account a material to be included in a layer to be formed, and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed, and the structure of a layer to be formed.

[General Definition of Some of the Substituents]

The term "$C_1$-$C_{60}$ alkyl group," as used herein, refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group," as used herein, refers to a divalent group having substantially the same structure as the $C_1$-$C_{60}$ alkyl group, except that the $C_1$-$C_{60}$ alkylene group is divalent instead of monovalent.

The term "$C_2$-$C_{60}$ alkenyl group," as used herein, refers to a hydrocarbon group having at least one carbon-carbon double bond at a main chain (e.g., in the middle) or at an end (e.g., the terminus) of the $C_2$-$C_{60}$ alkyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group, except that the $C_2$-$C_{60}$ alkenylene group is divalent instead of monovalent.

The term "$C_2$-$C_{60}$ alkynyl group," as used herein, refers to a hydrocarbon group having at least one carbon-carbon triple bond at a main chain (e.g., in the middle) or at an end (e.g., the terminus) of the $C_2$-$C_{60}$ alkyl group, and examples thereof include an ethynyl group, and a propynyl group. The term "$C_2$-$C_{60}$ alkynylene group," as used herein, refers to a divalent group having substantially the same structure as the $C_2$-$C_{60}$ alkynyl group, except that the $C_2$-$C_{60}$ alkynylene group is divalent instead of monovalent.

The term "$C_1$-$C_{60}$ alkoxy group," as used herein, refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group," as used herein, refers to a divalent group having substantially the same structure as the $C_3$-$C_{10}$ cycloalkyl group, except that the $C_3$-$C_{10}$ cycloalkylene group is divalent instead of monovalent.

The term "$C_1$-$C_{10}$ heterocycloalkyl group," as used herein, refers to a monovalent monocyclic group having at least one heteroatom selected from N, O, Si, P, and S as a ring-forming atom and 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group, except that the $C_1$-$C_{10}$ heterocycloalkylene group is divalent instead of monovalent.

The term "$C_3$-$C_{10}$ cycloalkenyl group," as used herein, refers to a monovalent monocyclic group that has 3 to 10 carbon atoms and at least one carbon-carbon double bond in the ring thereof and no aromaticity (e.g., the ring is not aromatic), and examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group, except that the $C_3$-$C_{10}$ cycloalkenylene group is divalent instead of monovalent.

The term "$C_1$-$C_{10}$ heterocycloalkenyl group," as used herein, refers to a monovalent monocyclic group that has at least one heteroatom selected from N, O, Si, P, and S as a ring-forming atom, 1 to 10 carbon atoms, and at least one carbon-carbon double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group, except that the $C_1$-$C_{10}$ heterocycloalkenylene group is divalent instead of monovalent.

The term "$C_6$-$C_{60}$ aryl group," as used herein, refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other (e.g., combined together).

The term "$C_1$-$C_{60}$ heteroaryl group," as used herein, refers to a monovalent group having a carbocyclic aromatic system that has at least one heteroatom selected from N, O, Si, P, and S as a ring-forming atom, in addition to 1 to 1 carbon atoms. The term "$C_1$-$C_{60}$ heteroarylene group," as used herein refers to a divalent group having a carbocyclic aromatic system that has at least one heteroatom selected from N, O, Si, P, and S as a ring-forming atom, in addition to 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other (e.g., combined together).

The term "$C_6$-$C_{60}$ aryloxy group," used herein, indicates —$OA_{102}$ (wherein $A_{102}$ is the $C_6$-$C_{60}$ aryl group), and a $C_6$-$C_{60}$ arylthio group indicates —$SA_{103}$ (wherein $A_{103}$ is the $C_6$-$C_{60}$ aryl group).

The term "$C_1$-$C_{60}$ heteroaryloxy group," as used herein, indicates —$OA_{104}$ (wherein $A_{104}$ is the $C_1$-$C_{60}$ heteroaryl group), and the term "$C_6$-$C_{60}$ heteroarylthio group," as used herein, indicates —$SA_{105}$ (wherein $A_{105}$ is the $C_1$-$C_{60}$ heteroaryl group).

The term "monovalent non-aromatic condensed polycyclic group," as used herein, refers to a monovalent group (for example, having 8 to 60 carbon atoms) having two or more rings condensed with each other (e.g., combined together), only carbon atoms as ring-forming atoms, and no aromaticity in its entire molecular structure (e.g., the entire compound or group is not aromatic). A non-limiting example of the monovalent non-aromatic condensed polycyclic group is a fluorenyl group. The term "divalent non-aromatic condensed polycyclic group," as used herein, refers to a divalent group having substantially the same structure as the monovalent non-aromatic condensed polycyclic group, except that the divalent non-aromatic condensed polycyclic group is divalent instead of monovalent.

The term "monovalent non-aromatic condensed heteropolycyclic group," as used herein, refers to a monovalent group (for example, having 1 to 60 carbon atoms) having two or more rings condensed to each other, at least one heteroatom selected from N, O, Si, P, and S, other than carbon atoms, as a ring-forming atom, and no aromaticity in its entire molecular structure (e.g., the entire compound or group is not aromatic). A non-limiting example of the monovalent non-aromatic condensed heteropolycyclic group is a carbazolyl group. The term "divalent non-aromatic condensed heteropolycyclic group," as used herein, refers to a divalent group having substantially the same structure as the monovalent non-aromatic condensed heteropolycyclic group, except that the divalent non-aromatic condensed heteropolycyclic group is divalent instead of monovalent.

The term "$C_5$-$C_{60}$ carbocyclic group," as used herein, refers to a monocyclic or polycyclic group having 5 to 60 carbon atoms in which a ring-forming atom is a carbon atom only (e.g., the atoms forming the ring only include carbon atoms). The $C_5$-$C_{60}$ carbocyclic group may be an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more embodiments, depending on the number of substituents coupled or connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group," as used herein, refers to a group having substantially the same structure as the $C_5$-$C_{60}$ carbocyclic group, except that as a ring-forming atom, at least one heteroatom selected from N, O, Si, P, and S is used in addition to carbon (the number of carbon atoms may be in a range of 1 to 60).

At least one substituent of the substituted $C_5$-$C_{60}$ carbocyclic group, the substituted $C_1$-$C_{60}$ heterocyclic group, the substituted $C_3$-$C_{60}$ cycloalkylene group, the substituted $C_1$-$C_{10}$ heterocycloalkylene group, the substituted $C_3$-$C_{60}$ cycloalkenylene group, the substituted $C_1$-$C_{60}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from:

- deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;
- a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_6$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and
- —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and
- $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph," as used herein, represents a phenyl group, the term "Me," as used herein, represents a methyl group, the term "Et," as used herein, represents an ethyl group, the term "ter-Bu" or "Bu$^t$," as used herein, represents a tert-butyl group, and the term "OMe," as used herein, represents a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In other words, the "terphenyl group" is a phenyl group having, as a substituent, a $C_6$-$C_{60}$ aryl group substituted with a $C_6$-$C_{60}$ aryl group.

* and *', as used herein, unless defined otherwise, each refer to a binding site to a neighboring atom in a corresponding formula.

Hereinafter, a compound according to embodiments and an organic light-emitting device according to embodiments will be described in more detail with reference to Synthesis Examples and Examples. The wording "B was used instead of A" used in describing Synthesis Examples refers to that an identical molar equivalent of B was used in place of A.

EXAMPLES

Synthesis Example 1: Synthesis of Compound 4

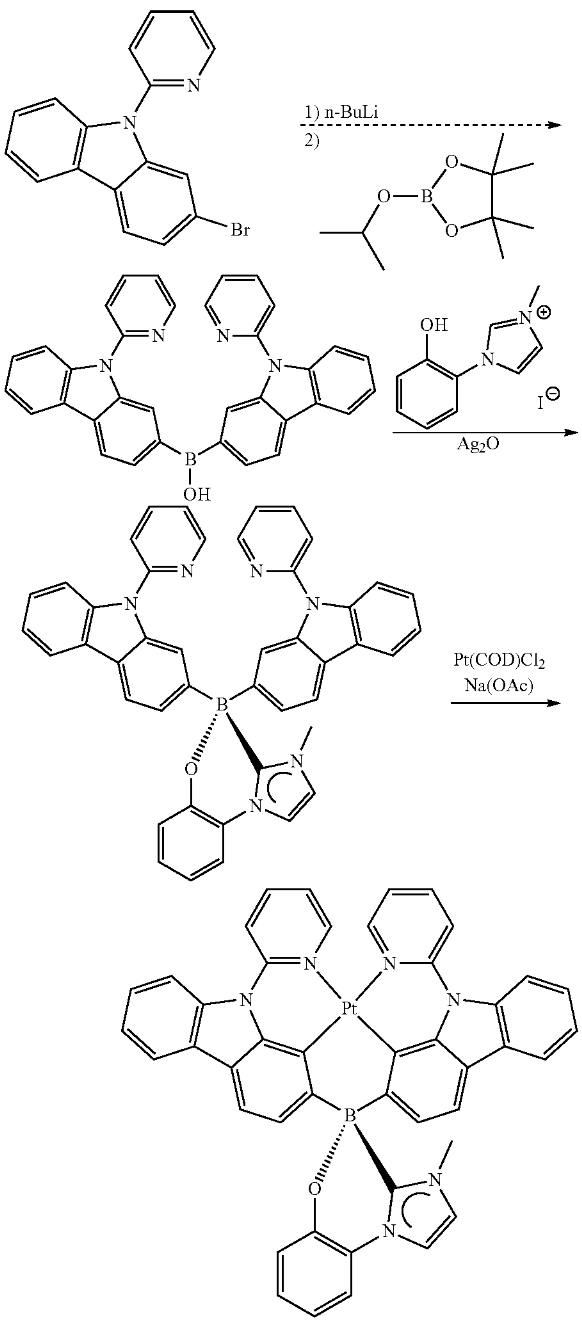

4

10.64 mL (17.08 mmol) of n-BuLi (1.6 M sol. in hexane) was slowly added dropwise to a solution, in which 5.00 g (15.47 mmol) of 2-bromo-9-(pyridin-2-yl)-9H-carbazole was dissolved in 50 mL of tetrahydrofuran (THF), at a temperature of −78° C. The reaction mixture was stirred at a temperature of −78° C. for 1 hour, and 2-isopropoxy-4,4,5,5-tetramethyl-1,3,2-dioxaborolane (1.2 equiv.) was slowly added dropwise thereto. The reaction mixture was heated to room temperature and stirred for 24 hours. A solvent was removed from the reaction mixture, and an organic layer was extracted therefrom three times by using dichloromethane and water. 3.04 g (10.06 mmol) of 1-(2-hydroxyphenyl)-3-methyl-1H-imidazol-3-ium iodine, 3.50 g (15.09 mmol) of $Ag_2O$, and 50 mL of THF were added to 2,2'-(hydroxyborandiyl)bis(9-(pyridin-2-yl)-9H-carbazole) obtained by drying an organic layer filtrate, and the reaction mixture was heated to a temperature of 50° C. and stirred for 24 hours. Then, the reaction mixture was cooled to room temperature, and 3.74 g (10.00 mmol) of dichloro(1,5-cyclooctadiene) platinum(II) and 2.46 g (30 mmol) of NaOAc were added thereto. Then, the reaction mixture was stirred at a temperature of 70° C. for 60 hours. The reaction mixture was cooled to room temperature, and an organic layer was extracted therefrom three times by using dichloromethane and water. The extracted organic layer was dried by using magnesium sulfate and filtered by using celite. Then, column chromatography was performed thereon to synthesize 2.14 g (2.48 mmol, yield=16%) of Compound 4.

Synthesis Example 2: Synthesis of Compound 14

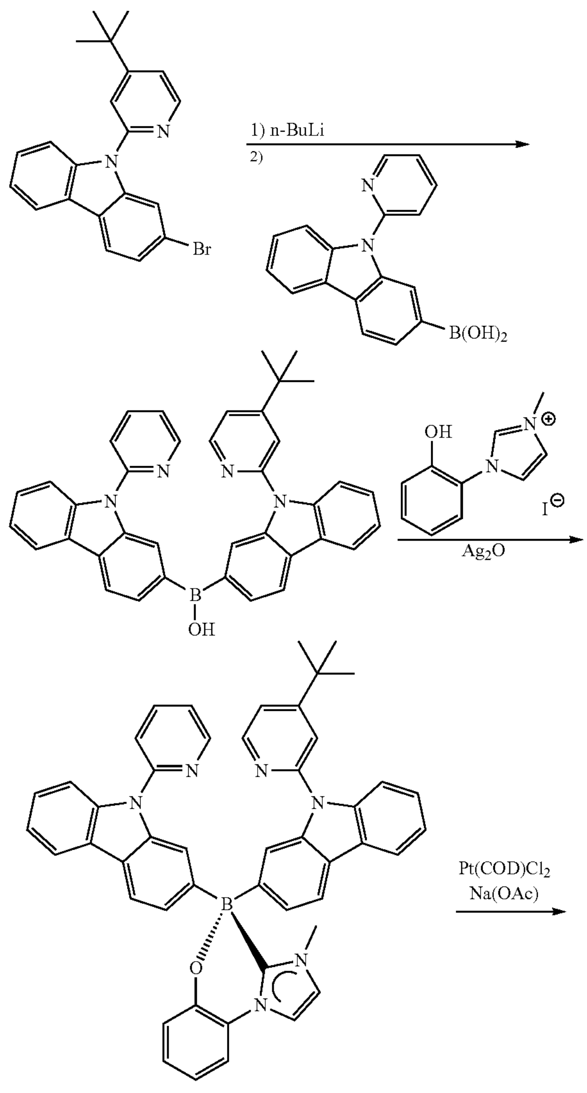

-continued

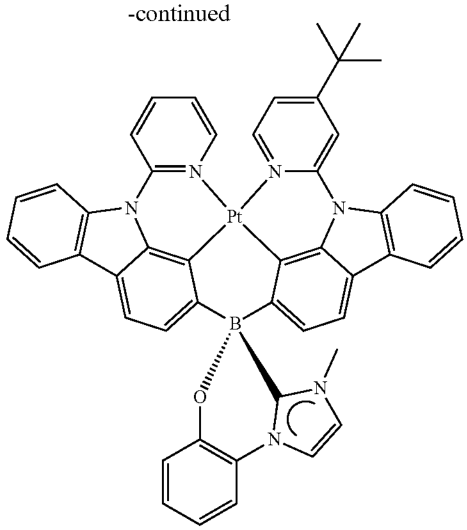

14

10.64 mL (17.08 mmol) of n-BuLi (1.6 M sol. in hexane) was added dropwise to a solution, in which 5.87 g (15.47 mmol) of 2-bromo-9-(4-(tert-butyl)pyridin-2-yl)-9H-carbazole was dissolved in 50 mL of THF, at a temperature of −78° C. The reaction mixture was stirred at a temperature of −78° C. for 1 hour, and (9-(pyridin-2-yl)-9H-carbazol-2-yl) boronic acid (1.2 equivalent) was slowly added dropwise thereto. A solvent was removed from the reaction mixture, and an organic layer was extracted therefrom three times by using dichloromethane and water. 3.04 g (10.06 mmol) of 1-(2-hydroxyphenyl)-3-methyl-1H-imidazol-3-ium iodine, 3.50 g (15.09 mmol) of $Ag_2O$, and 50 mL of THF were added to 9-(4-(tert-butyl)pyridin-2-yl)-2-(hydroxy(9-(pyridin-2-yl)-9H-carbazol-2-yl)boranyl)-9H-carbazole obtained by drying an organic layer filtrate, and the reaction mixture was heated to a temperature of 50° C. and stirred for 24 hours. Then, the reaction mixture was cooled to room temperature, and 3.74 g (10.00 mmol) of dichloro(1,5-cyclooctadiene)platinum(II) and 2.46 g (30 mmol) of NaOAc were added thereto and stirred at a temperature of 70° C. for 60 hours. The reaction mixture was cooled to room temperature, and an organic layer was extracted therefrom three times by using dichloromethane and water. The extracted organic layer was dried by using magnesium sulfate and filtered by using celite. Then, column chromatography was performed thereon to synthesize 2.56 g (2.78 mmol, yield=18%) of Compound 14.

Synthesis Example 3: Synthesis of Compound 24

24

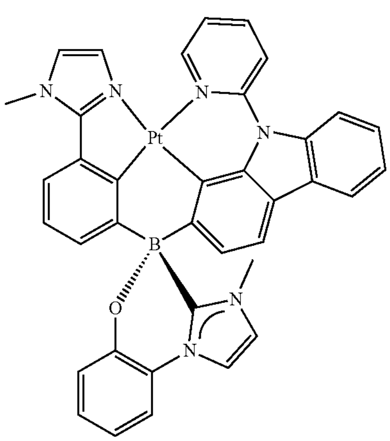

1.80 g (2.32 mmol, yield=15%) of Compound 24 was synthesized in substantially the same manner as in Synthesis Example 2, except that 2-(3-bromophenyl)-1-methyl-1H-imidazole was used instead of 2-bromo-9-(4-(tert-butyl)pyridin-2-yl)-9H-carbazole.

Synthesis Example 4: Synthesis of Compound 44

44

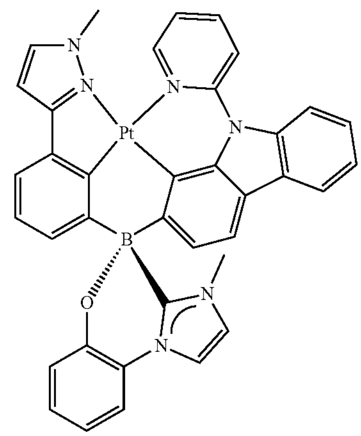

2.16 g (2.78 mmol, yield=18%) of Compound 44 was synthesized in substantially the same manner as in Synthesis Example 2, except that 1-methyl-3-phenyl-1H-pyrazole was used instead of 2-bromo-9-(4-(tert-butyl)pyridin-2-yl)-9H-carbazole.

Synthesis Example 5: Synthesis of Compound 64

64

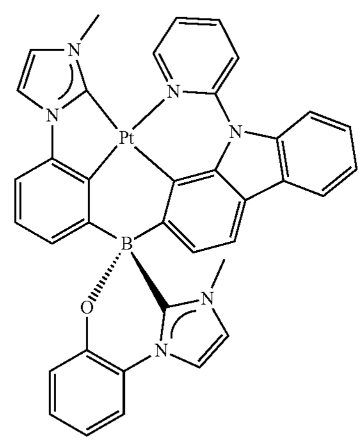

1.92 g (2.78 mmol, yield=16%) of Compound 64 was synthesized in substantially the same manner as in Synthesis Example 2, except that 1-(3-bromophenyl)-3-methyl-1H-imidazol-3-ium bromine was used instead of 2-bromo-9-(4-(tert-butyl)pyridin-2-yl)-9H-carbazole.

Synthesis Example 6: Synthesis of Compound 84

84

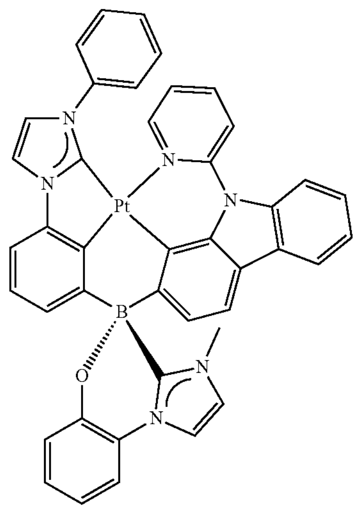

2.21 g (2.63 mmol, yield=17%) of Compound 84 was synthesized in substantially the same manner as in Synthesis Example 2, except that 1-(3-bromophenyl)-3-phenyl-1H-imidazol-3-ium bromine was used instead of 2-bromo-9-(4-(tert-butyl)pyridin-2-yl)-9H-carbazole.

Synthesis Example 7: Synthesis of Compound 104

104

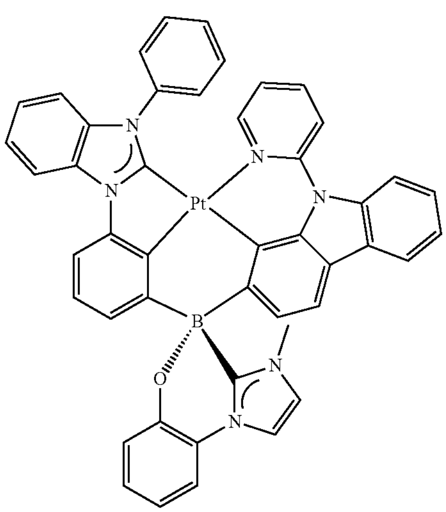

1.79 g (2.01 mmol, yield=13%) of Compound 104 was synthesized in substantially the same manner as in Synthesis Example 2, except that 1-(3-bromophenyl)-3-phenyl-1H-benzo[d]imidazol-3-ium bromine was used instead of 2-bromo-9-(4-(tert-butyl)pyridin-2-yl)-9H-carbazole.

Synthesis Example 8: Synthesis of Compound 124

124

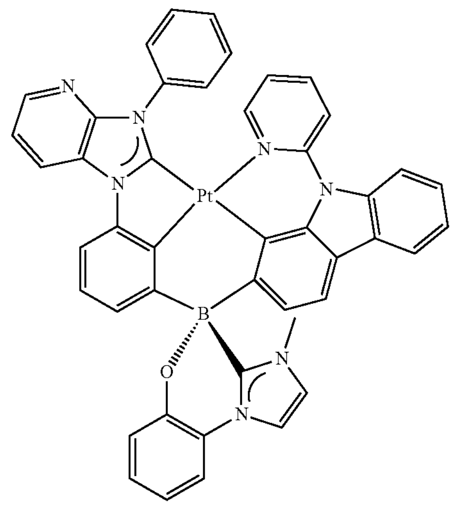

0.96 g (1.08 mmol, yield=7%) of Compound 124 was synthesized in substantially the same manner as in Synthesis Example 2, except that 1-(3-bromophenyl)-3-phenyl-1H-imidazo[4,5-b]pyridin-3-ium bromine was used instead of 2-bromo-9-(4-(tert-butyl)pyridin-2-yl)-9H-carbazole.

Synthesis Example 9: Synthesis of Compound 144

144

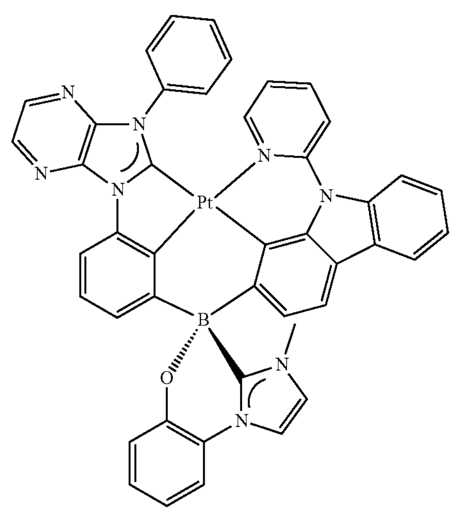

0.96 g (0.70 mmol, yield=5%) of Compound 144 was synthesized in substantially the same manner as in Synthesis Example 2, except that 1-(3-bromophenyl)-3-phenyl-1H-imidazo[4,5-b]pyrazin-3-ium bromine was used instead of 2-bromo-9-(4-(tert-butyl)pyridin-2-yl)-9H-carbazole.

Synthesis Example 10: Synthesis of Compound 164

164

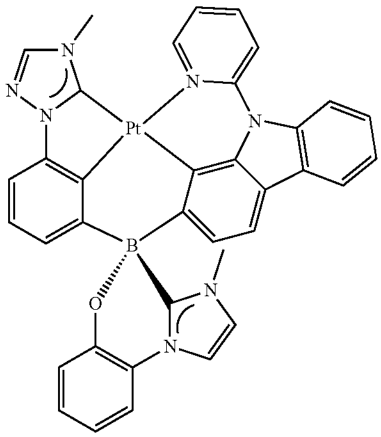

0.78 g (0.93 mmol, yield=6%) of Compound 164 was synthesized in substantially the same manner as in Synthesis Example 2, except that 1-(3-bromophenyl)-4-methyl-1H-1,2,4-triazol-4-ium bromine was used instead of 2-bromo-9-(4-(tert-butyl)pyridin-2-yl)-9H-carbazole.

Synthesis Example 11: Synthesis of Compound 184

184

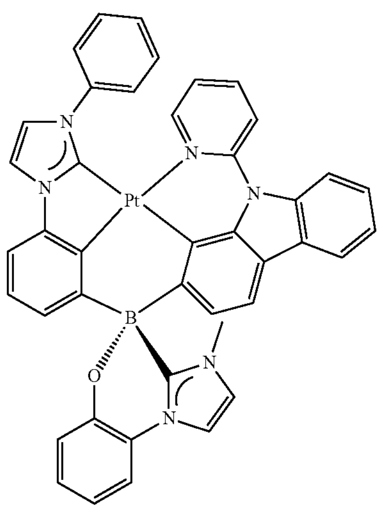

0.65 g (0.77 mmol, yield=5%) of Compound 184 was synthesized in substantially the same manner as in Synthesis Example 2, except that 1-(3-bromophenyl)-4-phenyl-1H-1,2,4-triazol-4-ium bromine was used instead of 2-bromo-9-(4-(tert-butyl)pyridin-2-yl)-9H-carbazole.

Synthesis Example 12: Synthesis of Compound 204

204

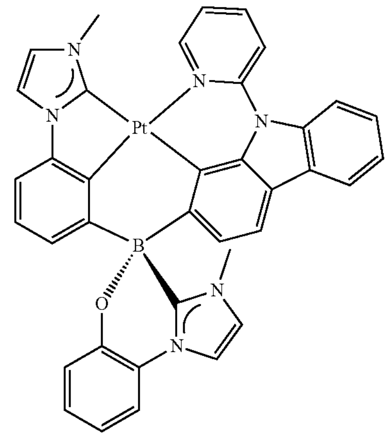

1.49 g (2.17 mmol, yield=14%) of Compound 204 was synthesized in substantially the same manner as in Synthesis Example 5, except that palladium acetate was used instead of dichloro(1,5-cyclooctadiene)platinum(II).

Synthesis Example 13: Compound 214

214

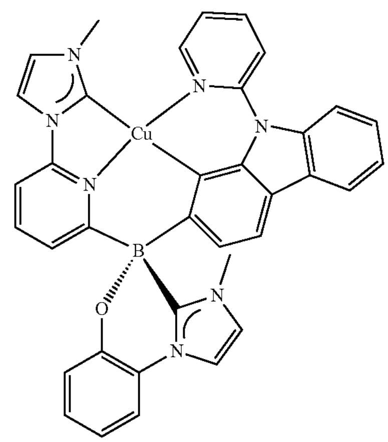

1.49 g (2.17 mmol, yield=14%) of Compound 214 was synthesized in substantially the same manner as in Synthesis Example 5, except that CuI was used instead of dichloro(1,5-cyclooctadiene) platinum(II).

Synthesis Example 14: Synthesis of Compound 224

224

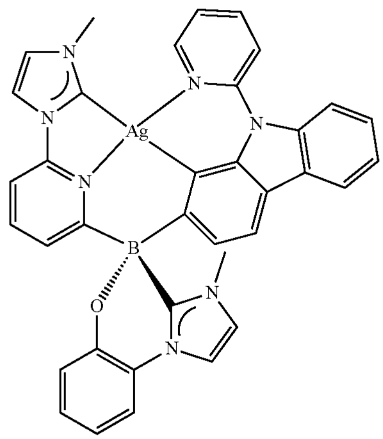

1.29 g (1.86 mmol, yield=12%) of Compound 224 was synthesized in substantially the same manner as in Synthesis Example 5, except that AgOTf was used instead of dichloro (1,5-cyclooctadiene)-platinum(II).

Synthesis Example 15: Synthesis of Compound 234

234

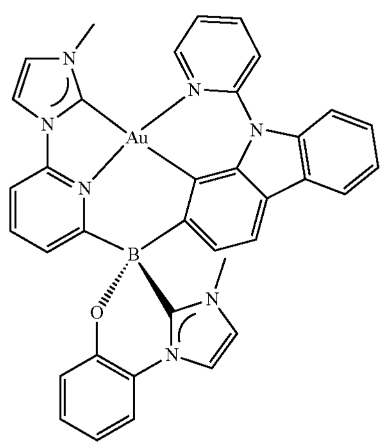

1.69 g (2.17 mmol, yield=14%) of Compound 234 was synthesized in substantially the same manner as in Synthesis Example 5, except that $(PPh)_3AuCl$ was used instead of dichloro(1,5-cyclooctadiene)-platinum(II).

Synthesis Example 16: Synthesis of Compound 241

241

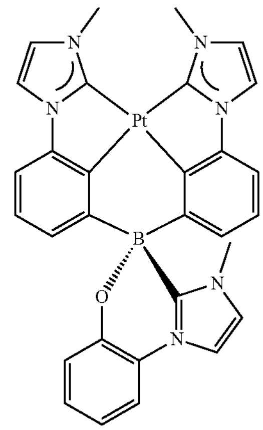

3.74 g (5.42 mmol, yield=35%) of Compound 241 was synthesized in substantially the same manner as in Synthesis Example 1, except that 1-(3-bromophenyl)-3-methyl-1H-imidazol-3-ium bromine was used instead of 2-bromo-9-(pyridin-2-yl)-9H-carbazole, and 2-(1-methyl-1H-pyrazol-3-yl)phenol was used instead of 1-(3-hydroxyphenyl)-3-methyl-1H-imidazol-3-ium iodine.

$^1H$ NMR and FAB-MS of Compounds synthesized according to Synthesis Examples 1 to 16 are shown in Table 1.

Methods of synthesizing compounds other than the compound shown in Table 1 are recognizable by those of ordinary skill in the art by referring to the synthesis mechanisms and source materials described above.

TABLE 1

| Compound | $^1H$ NMR ($CDCl_3$, 500 MHz) | FAB-MS [M+] | |
|---|---|---|---|
| | | Found | Calc. |
| 4 | δ = 8.73 (d, 1H), 8.43 (d, 2H), 8.19-8.15 (m, 4H), 8.02 (d, 2H), 7.88-7.27 (m, 16H), 6.80 (d, 1H), 3.62 (s, 3H). | 868.26 | 863.21 |
| 14 | δ = 8.74 (d, 1H), 8.42 (d, 2H), 8.18-8.14 (m, 4H), 8.01 (d, 2H), 7.86-7.24 (m, 15H), 6.81 (d, 1H), 3.61 (s, 3H), 1.28 (s, 9H). | 919.33 | 919.28 |
| 24 | δ = 8.73 (d, 1H), 8.44 (d, 2H), 8.15-8.13 (m, 2H), 8.02 (d, 2H), 7.88 (d, 1H), 7.77 (d, 1H), 7.55-7.24 (m, 11H), 6.80 (d, 1H), 3.71 (s, 3H), 3.69 (s, 3H). | 777.24 | 777.20 |
| 44 | δ = 8.72 (d, 1H), 8.43 (d, 2H), 8.19-8.15 (m, 2H), 8.02 (d, 1H), 7.85 (d, 1H), 7.77-7.75 (m, 2H), 7.55-7.40 (m, 5H), 7.26-7.10 (m, 5H), 6.93 (d, 1H), 6.81 (d, 1H), 3.95 (s, 3H), 3.72 (s, 3H). | 777.26 | 777.20 |
| 64 | δ = 8.73 (d, 1H), 8.41 (d, 2H), 8.20-8.16 (m, 2H), 8.08 (d, 1H), 7.84 (d, 1H), 7.76-7.70 (m, 2H), 7.54-7.44 (m, 5H), 7.20-7.05 (m, 5H), 6.92 (d, 1H), 6.83 (d, 1H), 3.74 (s, 3H), 3.72 (s, 3H). | 777.27 | 777.20 |

TABLE 1-continued

| Compound | $^1H$ NMR ($CDCl_3$, 500 MHz) | FAB-MS [$M^+$] Found | Calc. |
|---|---|---|---|
| 84 | δ = 8.74 (d, 1H), 8.43 (d, 1H), 8.19-8.15 (m, 2H), 8.02 (d, 1H), 7.75-7.73 (m, 3H), 7.62-7.30 (m, 17H), 6.82 (d, 1H), 3.73 (s, 3H). | 839.25 | 839.21 |
| 104 | δ = 8.76 (d, 1H), 8.56-8.54 (m, 2H), 8.43 (d, 1H), 8.19-8.15 (m, 2H), 8.02 (d, 1H), 7.75 (d, 1H), 7.54-7.00 (m, 19H), 6.92 (d, 1H), 3.72 (s, 3H). | 889.28 | 889.23 |
| 124 | δ = 8.77 (d, 1H), 8.42-8.39 (m, 2H), 8.20-8.16 (m, 2H), 8.01-7.99 (m, 1H), 7.76 (d, 1H), 7.60-7.02 (m, 19H), 6.81 (d, 1H), 3.71 (s, 3H). | 890.26 | 890.23 |
| 144 | δ = 8.76 (d, 1H), 8.60-8.58 (m, 2H), 8.43 (d, 1H), 8.19-8.15 (m, 2H), 8.02 (d, 1H), 7.74 (d, 1H), 7.58-7.02 (m, 17H), 6.80 (d, 1H), 3.71 (s, 3H). | 891.25 | 891.22 |
| 164 | δ = 8.79 (s, 1H), 8.73 (d, 1H), 8.19-8.15 (m, 2H), 7.75 (d, 1H), 7.65-7.00 (m, 19H), 6.82 (d, 1H), 3.71 (s, 3H). | 778.30 | 778.19 |
| 184 | δ = 9.28 (s, 1H), 8.75 (d, 1H), 8.43 (d, 1H), 8.18-8.16 (m, 2H), 8.02 (m, 1H), 7.75 (d, 1H), 7.61-7.00 (m, 17H), 6.80 (d, 1H), 3.71 (s, 3H). | 840.23 | 840.21 |
| 204 | δ = 8.70 (d, 1H), 8.41 (d, 1H), 8.17-8.10 (m, 2H), 8.01 (d, 1H), 7.88 (d, 1H), 7.62-7.45 (m, 8H), 7.20-7.02 (m, 10H), 6.82 (d, 1H), 3.72 (3H), 3.72 (s, 3H). | 688.17 | 688.14 |
| 214 | δ = 8.70 (d, 1H), 8.41 (d, 1H), 8.17-8.10 (m, 2H), 8.01 (d, 1H), 7.88 (d, 1H), 7.62-7.45 (m, 8H), 7.20-7.02 (m, 10H), 6.82 (d, 1H), 3.72 (3H), 3.72 (s, 3H). | 647.19 | 647.17 |
| 224 | δ = 8.71 (d, 1H), 8.40 (d, 1H), 8.18-8.13 (m, 2H), 8.00 (d, 1H), 7.87 (d, 1H), 7.65-7.42 (m, 8H), 7.24-7.10 (m, 10H), 6.85 (d, 1H), 3.74 (3H), 3.73 (s, 3H). | 691.16 | 691.14 |
| 234 | δ = 8.73 (d, 1H), 8.43 (d, 1H), 8.19-8.15 (m, 2H), 8.02 (d, 1H), 7.90 (d, 1H), 7.66-7.44 (m, 8H), 7.28-7.12 (m, 10H), 6.81 (d, 1H), 3.75 (3H), 3.72 (s, 3H). | 797.29 | 797.23 |
| 241 | δ = 8.36 (d, 1H), 7.77-7.75 (m, 3H), 7.61-7.58 (m, 2H), 7.44-7.25 (m, 8H), 7.05 (d, 1H), 6.95 (d, 1H), 3.95 (s, 3H), 3.74 (s, 3H), 3.72 (s, 3H) | 691.22 | 691.18 |

Example 1

As an anode, an ITO (thickness=1,200 Å) substrate was cut to a size of 50 mm×50 mm×0.7 mm, sonicated with isopropyl alcohol and pure water each for 5 minutes, and then cleaned by exposure to ultraviolet rays and ozone for 30 minutes. Then, the resultant ITO substrate was provided to a vacuum deposition apparatus.

2-TNATA was vacuum-deposited on the ITO substrate to form a hole injection layer having a thickness of 600 Å, and NPB was vacuum-deposited on the hole injection layer to form a hole transport layer having a thickness of 300 Å.

BCPDS, POPCPA, and Compound 4 were co-deposited on the hole transport layer at a weight ratio of 45:45:10 to form an emission layer having a thickness of 300 Å.

Then, TSPO1 was vacuum-deposited on the emission layer to form a hole blocking layer having a thickness of 50 Å, $Alq_3$ was vacuum-deposited on the hole blocking layer to form an electron transport layer having a thickness of 300 Å, LiF was deposited on the electron transport layer to form an electron injection layer having a thickness of 10 Å, and Al was vacuum-deposited on the electron injection layer to form a cathode electrode having a thickness of 3,000 Å, thereby completing the manufacture of an organic light-emitting device.

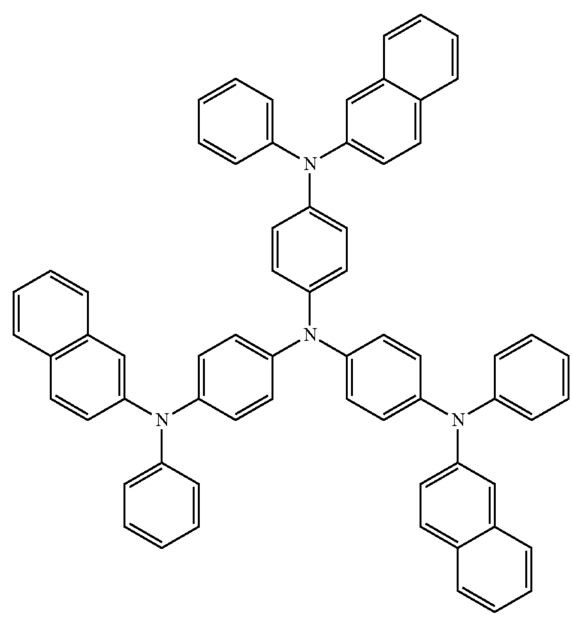

2-TNATA

-continued

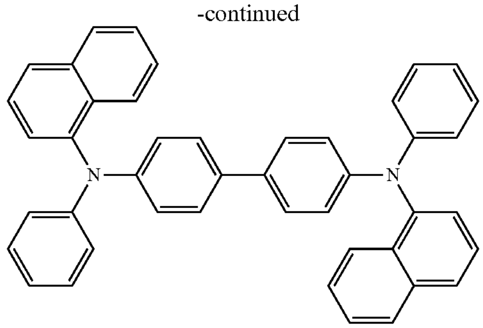

NPB

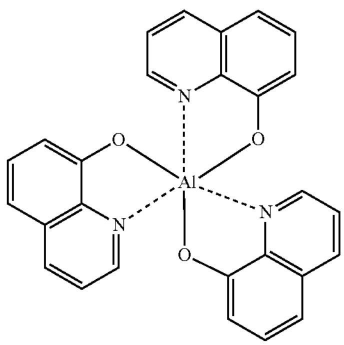

$Alq_3$

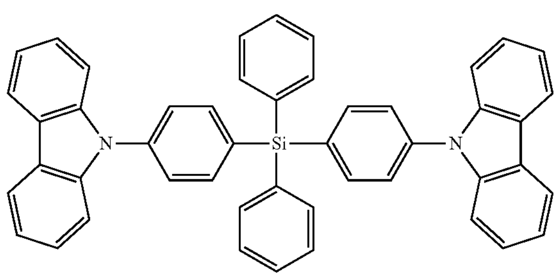

BCPDS

-continued

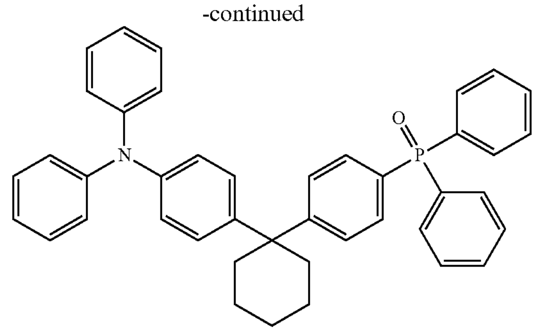

POPCPA

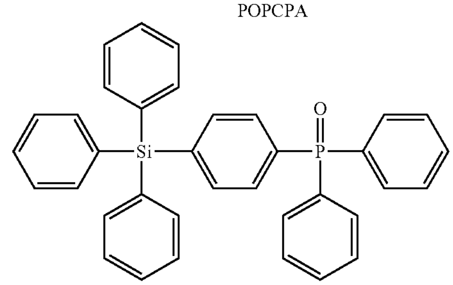

TSPO1

Examples 2 to 16 and Comparative Examples 1 to 3

Organic light-emitting devices were manufactured in substantially the same manner as in Example 1, except that Compounds shown in Table 2 were each used instead of Compound 4 in forming an emission layer.

Evaluation Example

The driving voltage, luminance, efficiency, lifespan, emission color, and emission wavelength of the organic light-emitting devices manufactured according to Examples 1 to 16 and Comparative Examples 1 to 3 were measured at a current density 50 mA/cm$^2$ by using Keithley SMU 236 and a luminance meter PR650, and results thereof are shown in Table 1. The lifespan indicates an amount of time that lapsed when luminance was 70% of initial luminance after the organic light-emitting devices was driven at a current density 5.0 mA/cm$^2$.

TABLE 2

| | Emission layer | Driving voltage (V) | Current density (mA/cm$^2$) | Luminance (cd/m$^2$) | Efficiency (cd/A) | lifespan ($T_{70}$) (@ 5.0 mA/cm$^2$) | Emission color | Emission wavelength (nm) |
|---|---|---|---|---|---|---|---|---|
| Example 1 | 4 | 5.02 | 50 | 4425 | 25.45 | 350 | Blue | 485 |
| Example 2 | 14 | 5.02 | 50 | 4525 | 26.05 | 360 | Blue | 483 |
| Example 3 | 24 | 5.08 | 50 | 4433 | 18.60 | 150 | Blue | 463 |
| Example 4 | 44 | 5.06 | 50 | 4424 | 18.65 | 190 | Blue | 458 |
| Example 5 | 64 | 5.02 | 50 | 4855 | 19.05 | 160 | Blue | 460 |
| Example 6 | 84 | 5.00 | 50 | 4752 | 19.65 | 170 | Blue | 462 |
| Example 7 | 104 | 5.08 | 50 | 4732 | 18.74 | 165 | Blue | 465 |
| Example 8 | 124 | 5.18 | 50 | 4710 | 18.73 | 160 | Blue | 458 |
| Example 9 | 144 | 5.04 | 50 | 4768 | 19.74 | 165 | Blue | 463 |
| Example 10 | 164 | 5.18 | 50 | 4790 | 19.74 | 170 | Blue | 462 |
| Example 11 | 184 | 5.22 | 50 | 4435 | 18.85 | 175 | Blue | 466 |
| Example 12 | 204 | 5.06 | 50 | 4049 | 10.36 | 120 | Blue | 462 |
| Example 13 | 214 | 5.18 | 50 | 3953 | 7.35 | 125 | Blue | 455 |

TABLE 2-continued
| | Emission layer | Driving voltage (V) | Current density (mA/cm²) | Luminance (cd/m²) | Efficiency (cd/A) | lifespan ($T_{70}$) (@ 5.0 mA/cm²) | Emission color | Emission wavelength (nm) |
|---|---|---|---|---|---|---|---|---|
| Example 14 | 224 | 5.06 | 50 | 3632 | 6.55 | 125 | Blue | 458 |
| Example 15 | 234 | 5.16 | 50 | 4432 | 14.28 | 175 | Blue | 458 |
| Example 16 | 241 | 5.20 | 50 | 4432 | 13.65 | 170 | Blue | 455 |
| Comparative Example 1 | Flrpic | 6.56 | 50 | 3870 | 10.65 | 1 | Blue | 478 |
| Comparative Example 2 | A | 6.20 | 50 | 2950 | 7.05 | 10 | Blue | 485 |
| Comparative Example 3 | B | 6.05 | 50 | 3235 | 9.53 | 20 | Blue | 495 |
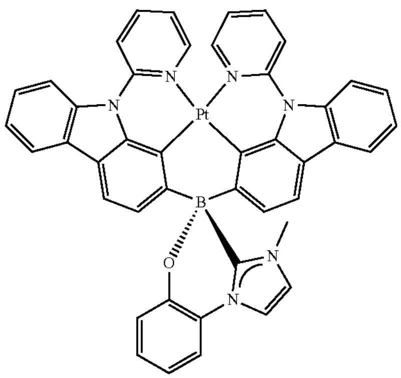
4
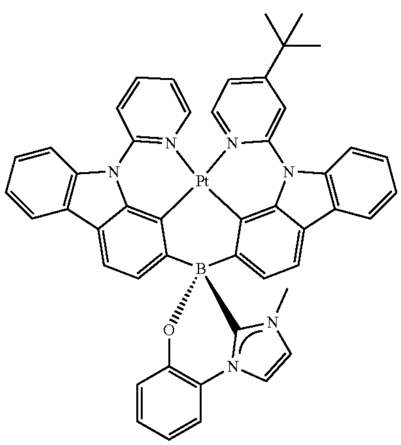
14
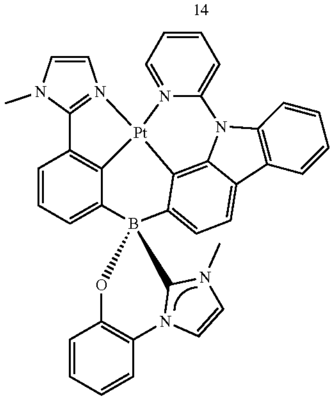
24

TABLE 2-continued
| | Emission layer | Driving voltage (V) | Current density ($mA/cm^2$) | Luminance ($cd/m^2$) | Efficiency (cd/A) | lifespan ($T_{70}$) (@ 5.0 $mA/cm^2$) | Emission color | Emission wavelength (nm) |
|---|---|---|---|---|---|---|---|---|
| 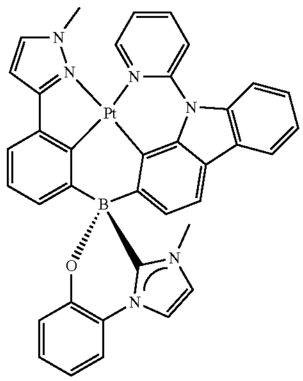 44 | | | | | | | | |
| 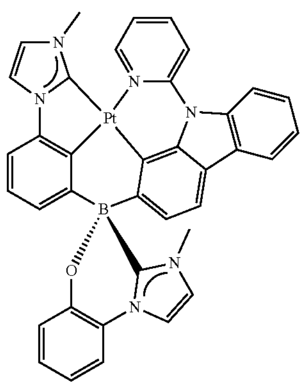 64 | | | | | | | | |
| 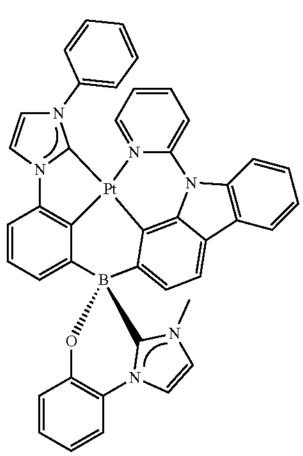 84 | | | | | | | | |

TABLE 2-continued
| Emission layer | Driving voltage (V) | Current density (mA/cm²) | Luminance (cd/m²) | Efficiency (cd/A) | lifespan ($T_{70}$) (@ 5.0 mA/cm²) | Emission color | Emission wavelength (nm) |
|---|---|---|---|---|---|---|---|
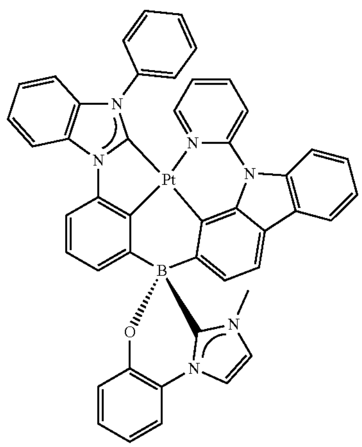
104
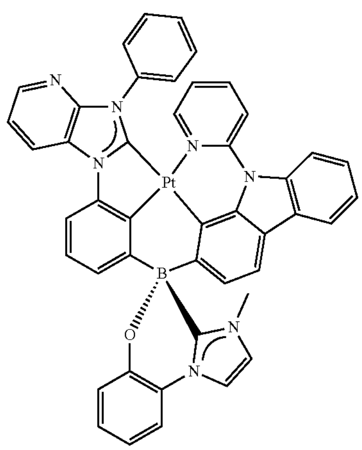
124
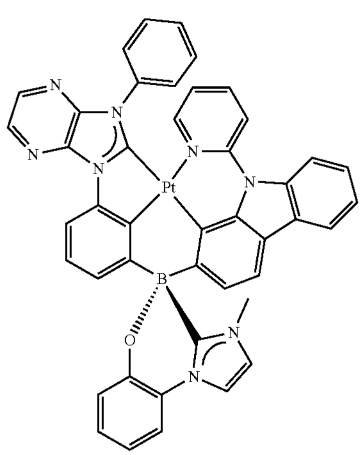
144

TABLE 2-continued
| Emission layer | Driving voltage (V) | Current density ($mA/cm^2$) | Luminance ($cd/m^2$) | Efficiency (cd/A) | lifespan ($T_{70}$) (@ 5.0 $mA/cm^2$) | Emission color | Emission wavelength (nm) |
|---|---|---|---|---|---|---|---|
| 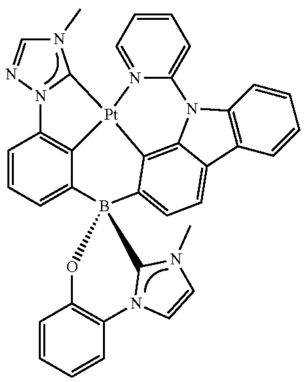 164 | | | | | | | |
| 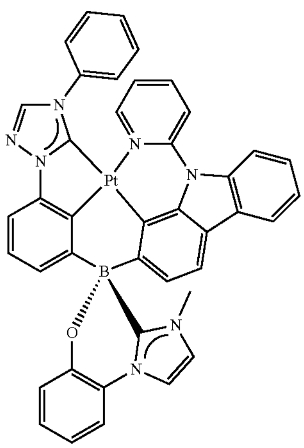 184 | | | | | | | |
| 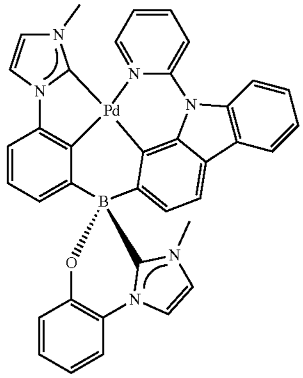 204 | | | | | | | |

TABLE 2-continued
| Emission layer | Driving voltage (V) | Current density (mA/cm$^2$) | Luminance (cd/m$^2$) | Efficiency (cd/A) | lifespan ($T_{70}$) (@ 5.0 mA/cm$^2$) | Emission color | Emission wavelength (nm) |
|---|---|---|---|---|---|---|---|
| 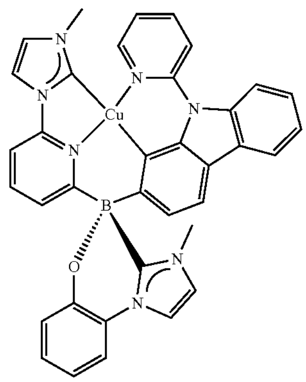 214 | | | | | | | |
| 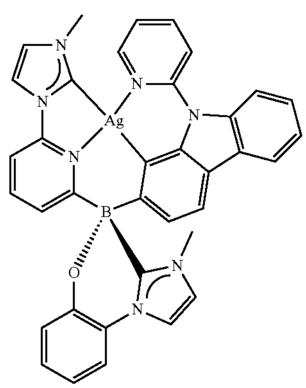 224 | | | | | | | |
| 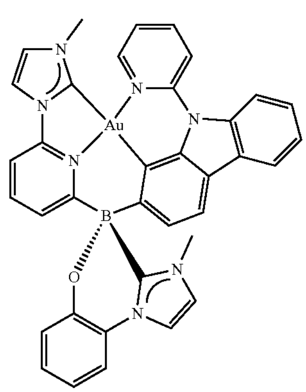 234 | | | | | | | |

TABLE 2-continued

| | Emission layer | Driving voltage (V) | Current density (mA/cm$^2$) | Luminance (cd/m$^2$) | Efficiency (cd/A) | lifespan ($T_{70}$) (@ 5.0 mA/cm$^2$) | Emission color | Emission wavelength (nm) |
|---|---|---|---|---|---|---|---|---|

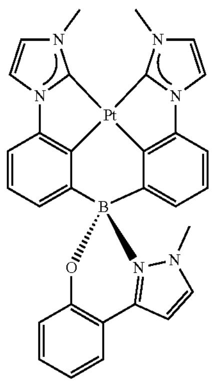

241

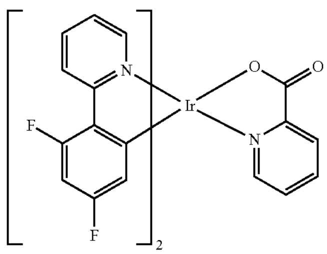

FIrpic

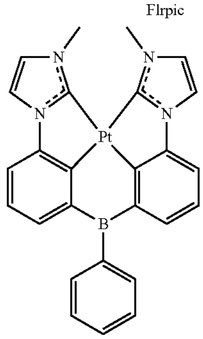

A

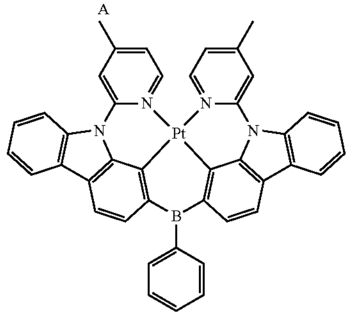

B

Referring to Table 1, it is confirmed that the organic light-emitting devices of Examples 1 to 16 are excellent in terms of the driving voltage, luminance, efficiency, lifespan, and emission color, as compared with those of the organic light-emitting devices of Comparative Examples 1 to 3.

An organic light-emitting device including the organometallic compound may have a low driving voltage, high efficiency, high luminance, high color purity, and a long lifespan.

It should be understood that embodiments described herein should be considered in a descriptive sense only and not for purposes of limitation. Descriptions of features or aspects within each embodiment should typically be considered as available for other similar features or aspects in other embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the figures, it will be understood by those of ordinary skill in the art that various changes in form and details may be made therein without departing from the spirit and scope as defined by the following claims, and equivalents thereof.

What is claimed is:

1. An organic light-emitting device comprising:

a first electrode;

a second electrode; and an organic layer disposed between the first electrode and the second electrode, wherein the organic layer comprises an emission layer, the emission layer comprises a phosphorescent dopant, and the phosphorescent dopant comprises an organometallic compound represented by Formula 1:

Formula 1

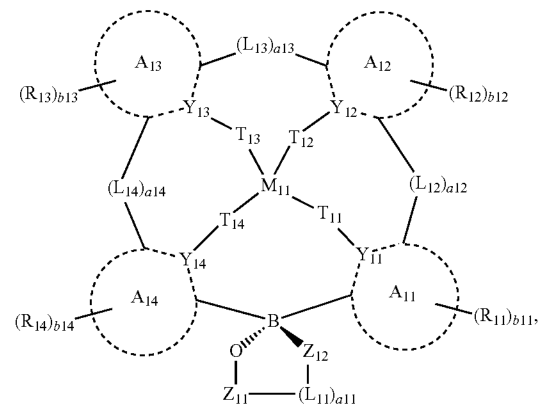

wherein, in Formula 1, $M_{11}$ is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm), $A_{11}$ to $A_{14}$ are each independently a $C_5$-$C_{60}$ carbocyclic group or a $C_1$-$C_{60}$ heterocyclic group, $Y_{11}$ to $Y_{14}$ are each independently N or C, $Z_{11}$ is selected from N, C, O, S, a single bond, a substituted or unsubstituted $C_5$-$C_{60}$ carbocyclic group, and a substituted or unsubstituted $C_1$-$C_{60}$ heterocyclic group, $Z_{12}$ is a substituted or unsubstituted $C_2$ or $C_3$ heterocyclic group, a bond between the B atom and the O atom is a covalent bond, a bond between the B atom and $Z_{12}$ is a coordinate bond, the B atom is coordinated with a C atom of $Z_{12}$, $T_{11}$ to $T_{14}$ are each independently selected from a single bond, O, and S, $L_{11}$ to $L_{14}$ are each independently selected from a single bond, *—O—*', *—S—*', *—C($R_{17}$)($R_{18}$)—*', *—C($R_{17}$)=*', *=C($R_{17}$)—*', *—C($R_{17}$)=C($R_{18}$)—*', *—C(=O)—*', *—C(=S)—*', *—C≡C—*', *—B($R_{17}$)—*', *—N($R_{17}$)—*', *—P($R_{17}$)—*', *—Si($R_{17}$)($R_{18}$)—*', *—P($R_{17}$)($R_{18}$)—', and *—Ge($R_{17}$)($R_{18}$)—*', a11 to a14 are each independently selected from 0, 1, 2, and 3, at least two of a12, a13, and a14 are each independently selected from 1, 2, and 3, when a11 is zero, $(L_{11})_{a11}$ is a single bond, when a12 is zero, $A_{11}$ and $A_{12}$ are not linked to each other, when a13 is zero, $A_{12}$ and $A_{13}$ are not linked to each other, and when a14 is zero, $A_{13}$ and $A_{14}$ are not linked to each other, $R_{11}$ to $R_{14}$, $R_{17}$, and $R_{18}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(═O)($Q_1$), —S(═O)($Q_1$), —S(═O)$_2$ ($Q_1$), —P(═O)($Q_1$)($Q_2$), and —P(═S)($Q_1$)($Q_2$), $R_{17}$ and $R_{11}$, $R_{17}$ and $R_{12}$, $R_{17}$ and $R_{13}$, and/or $R_{17}$ and $R_{14}$ are optionally linked to form a substituted or unsubstituted $C_5$-$C_{60}$ carbocyclic group or a substituted or unsubstituted $C_1$-$C_{60}$ heterocyclic group, $R_{17}$ and $R_{18}$ are optionally linked to form a substituted or unsubstituted $C_5$-$C_{60}$ carbocyclic group or a substituted or unsubstituted $C_1$-$C_{60}$ heterocyclic group, b11 to b14 are each independently selected from 1, 2, 3, 4, 5, 6, 7, and 8, $Q_1$ to $Q_3$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group, and

* and *' each indicate a binding site to a neighboring atom.

2. The organic light-emitting device of claim 1, wherein:

$A_{11}$ to $A_{14}$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indeno pyridine group, an indolopyridine group, a benzofuropyridine group, a benzothienopyridine group, a benzosilolopyridine group, an indeno pyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline.

3. The organic light-emitting device of claim 1, wherein:

$A_{11}$ to $A_{14}$ are each independently represented by one of Formulae 2-1 to 2-43:

2-1

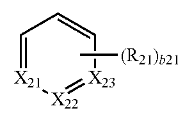

2-2

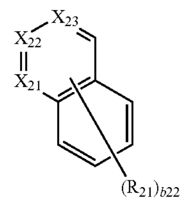

2-3

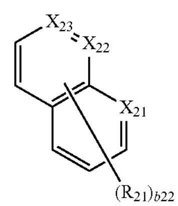

2-4

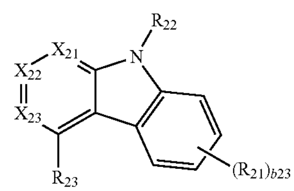

2-5

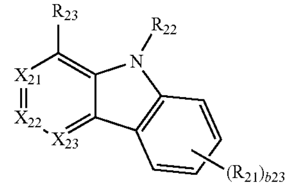

2-6

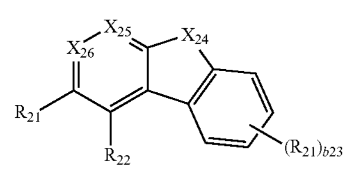

-continued
2-7
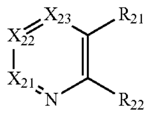
2-8
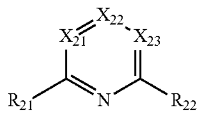
2-9
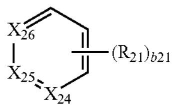
2-10
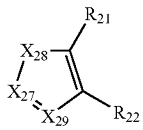
2-11
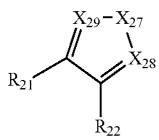
2-12
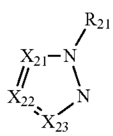
2-13
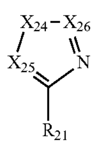
2-14
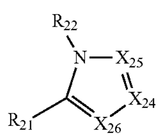
2-15
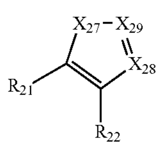
2-16
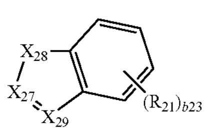
2-17
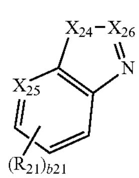
-continued
2-18
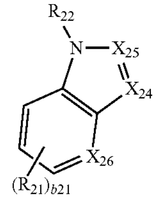
2-19
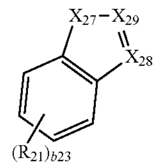
2-20
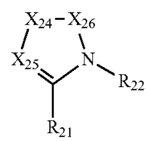
2-21
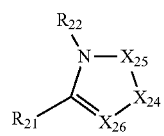
2-22
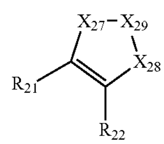
2-23
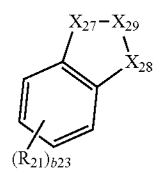
2-24
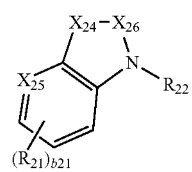
2-25
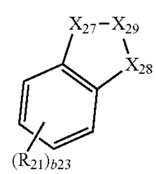
2-26
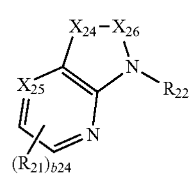

-continued 2-27

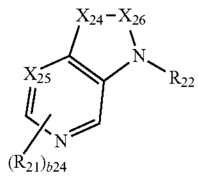

2-28

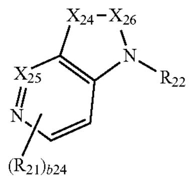

2-29

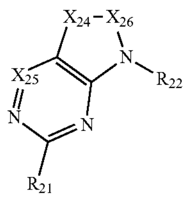

2-30

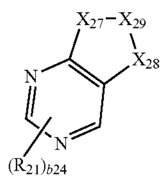

2-31

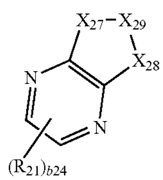

2-32

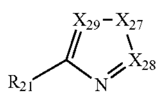

2-33

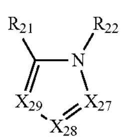

2-34

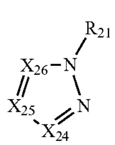

2-35

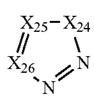

2-36

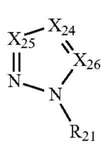

-continued 2-37

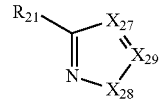

2-38

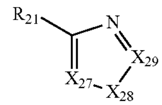

2-39

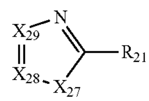

2-40

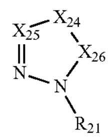

2-41

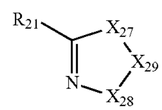

2-42

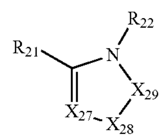

2-43

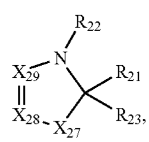

wherein, in Formulae 2-1 to 2-43, $X_{21}$ to $X_{23}$ are each independently $C(R_{24})$ or C—*, provided that at least two of $X_{21}$ to $X_{23}$ are each C—*, $X_{24}$ is N—*, and $X_{25}$ and $X_{26}$ are each independently $C(R_{24})$ or C—*, provided that at least one of $X_{25}$ and $X_{26}$ is C—*, $X_{27}$ and $X_{28}$ are each independently selected from N, $N(R_{25})$, and N—*, and $X_{29}$ is $C(R_{24})$ or C—*, provided that i) at least one of $X_{27}$ and $X_{28}$ is N—*, and $X_{29}$ is C—*, or ii) $X_{27}$ and $X_{28}$ are each N—*, and $X_{29}$ is $C(R_{24})$, $R_{21}$ to $R_{24}$ are each independently the same as described in connection with $R_{11}$ in Formula 1, b21 is selected from 1, 2, and 3, b22 is selected from 1, 2, 3, 4, and 5, b23 is selected from 1, 2, 3, and 4, b24 is 1 or 2, and

* indicates a binding site to a neighboring atom.

4. The organic light-emitting device of claim 1, wherein:

$Y_{11}$, $Y_{12}$, and $Y_{13}$ are each C, and $Y_{14}$ is N;

$Y_{11}$, $Y_{12}$, and $Y_{14}$ are each C, and $Y_{13}$ is N, $Y_{11}$, $Y_{13}$, and $Y_{14}$ are each C, and $Y_{12}$ is N;

$Y_{12}$, $Y_{13}$, and $Y_{14}$ are each C, and $Y_{11}$ is N;

$Y_{11}$ and $Y_{14}$ are each C, and $Y_{12}$ and $Y_{13}$ are each N;

$Y_{11}$ and $Y_{14}$ are each N, and $Y_{12}$ and $Y_{13}$ are each C;

$Y_{11}$ and $Y_{12}$ are each C, and $Y_{13}$ and $Y_{14}$ are each N;

$Y_{11}$ and $Y_{12}$ are each N, and $Y_{13}$ and $Y_{14}$ are each C;

$Y_{11}$ and $Y_{13}$ are each C, and $Y_{12}$ and $Y_{14}$ are each N; or $Y_{11}$ and $Y_{13}$ are each N, and $Y_{12}$ and $Y_{14}$ are each C.

5. The organic light-emitting device of claim 1, wherein: $Z_{11}$ is selected from:

N, C, O, S, a single bond, a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indeno pyridine group, an indolopyridine group, a benzofuropyridine group, a benzothienopyridine group, a benzosilolopyridine group, an indeno pyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline;

a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indeno pyridine group, an indolopyridine group, a benzofuropyridine group, a benzothienopyridine group, a benzosilolopyridine group, an indeno pyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline, each substituted with at least one selected from deuterium, —F, —Cl, —Br, —I, a hydroxyl group, a cyano group, a nitro group, an amidino group, a hydrazino group, a hydrazono group, $—CD_3$, $—CD_2H$, $—CDH_2$, $—CF_3$, $—CF_2H$, $—CFH_2$, $C_1$-$C_{60}$ alkyl group, a $C_2$-$C_{60}$ alkenyl group, a $C_2$-$C_{60}$ alkynyl group, and a $C_1$-$C_{60}$ alkoxy group; and a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indeno pyridine group, an indolopyridine group, a benzofuropyridine group, a benzothienopyridine group, a benzosilolopyridine group, an indeno pyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, and a 5,6,7,8-tetrahydroquinoline, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

6. The organic light-emitting device of claim 1, wherein: a substructure represented by

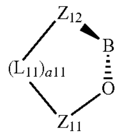

is represented by Formula 9:

Formula 9

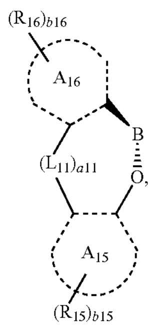

wherein, in Formula 9, $A_{15}$ and $A_{16}$ are each independently a $C_5$-$C_{60}$ carbocyclic group or a $C_1$-$C_{60}$ heterocyclic group, $R_{15}$ and $R_{16}$ are each independently the same as described in connection with $R_{11}$ in Formula 1, and b15 and b16 are each independently the same as described in connection with b11 in Formula 1.

7. The organic light-emitting device of claim 6, wherein:

$A_{15}$ is selected from a benzene group, a pyridine group, a pyrimidine group, a pyrazine group, a pyridazine group, and a triazine group, and $A_{16}$ is selected from a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group;

$A_{15}$ is selected from a benzene group, a pyridine group, a pyrimidine group, a pyrazine group, a pyridazine group, and a triazine group, and $A_{16}$ is selected from a benzene group, a pyridine group, a pyrimidine group, a pyrazine group, a pyridazine group, and a triazine group;

$A_{15}$ is selected from a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group, and $A_{16}$ is selected from a benzene group, a pyridine group, a pyrimidine group, a pyrazine group, a pyridazine group, and a triazine group; or $A_{15}$ is selected from a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group, and $A_{16}$ is selected from a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, and a thiadiazole group.

8. The organic light-emitting device of claim 1, wherein: a substructure represented by

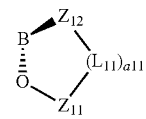

is represented by one of Formulae 9-71 to 9-112:

9-71

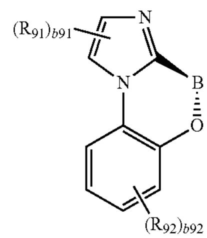

9-72

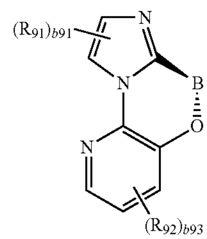

9-73

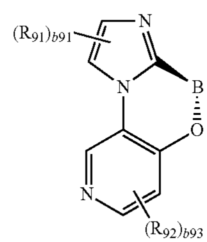

9-74

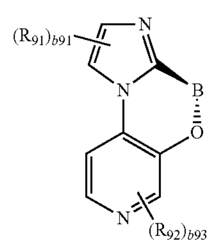

9-75

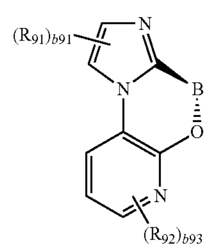

9-76
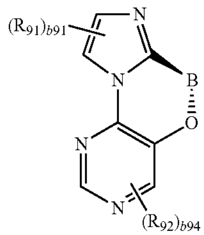
9-77
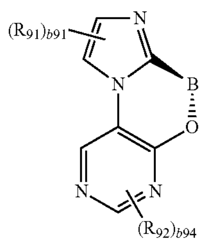
9-78
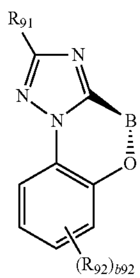
9-79
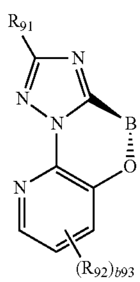
9-80
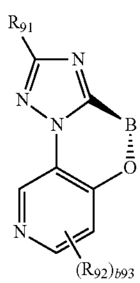
9-81
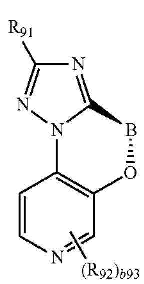
9-82
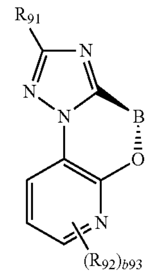
9-83
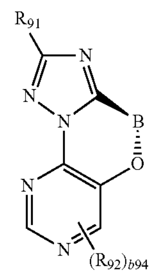
9-84
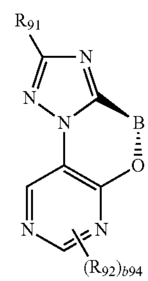
9-85
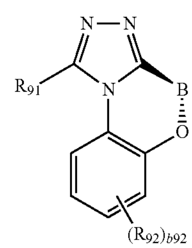
9-86
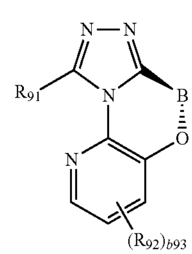
9-87
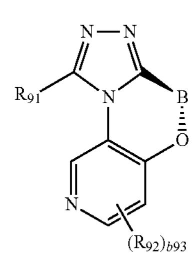

9-88
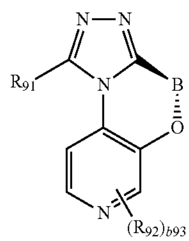
9-89
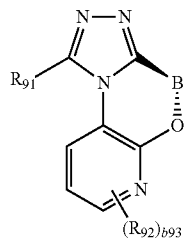
9-90
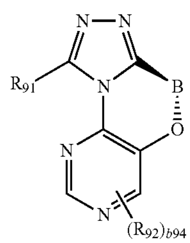
9-91
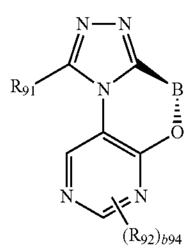
9-92
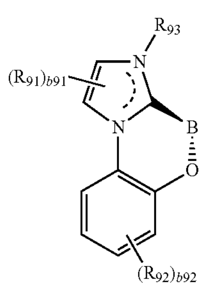
9-93
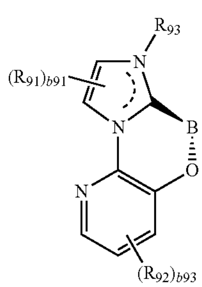
9-94
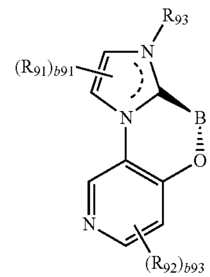
9-95
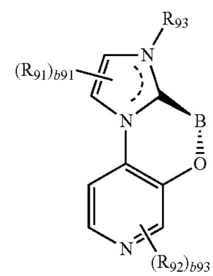
9-96
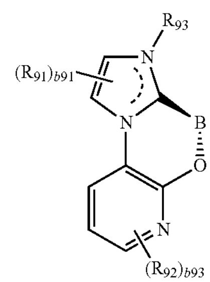
9-97
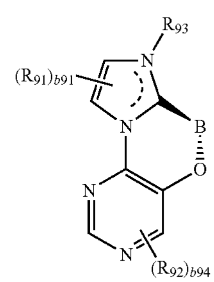
9-98
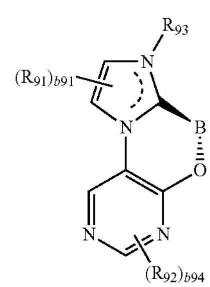

-continued
9-99
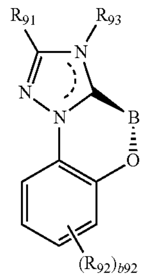
9-100
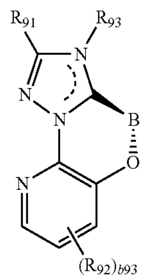
9-101
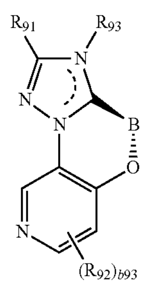
9-102
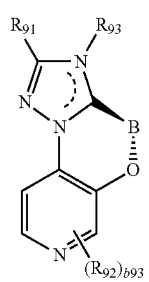
9-103
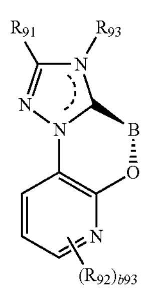
-continued
9-104
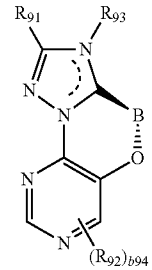
9-105
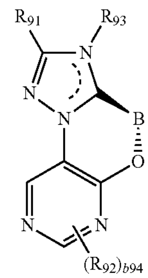
9-106
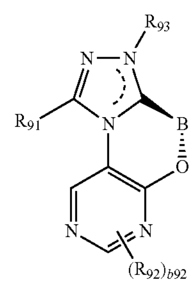
9-107
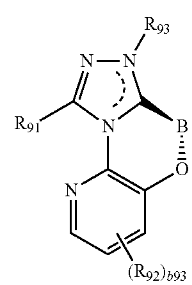
9-108
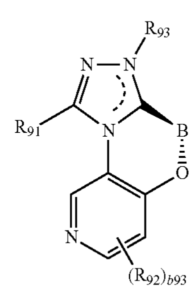

-continued 9-109

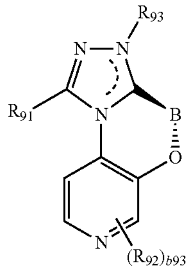

9-110

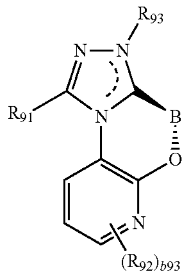

9-111

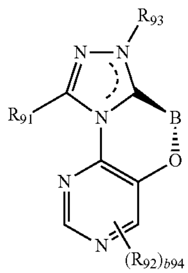

9-112

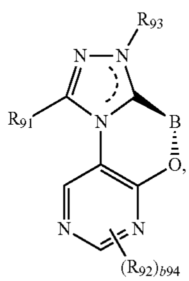

wherein, in Formulae 9-71 to 9-112, $R_{91}$ to $R_{93}$ are each independently selected from:

hydrogen, —F, a cyano group, a nitro group, a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decanyl group, an iso-decanyl group, a sec-decanyl group, a tert-decanyl group, a methoxy group, an ethoxy group, a propoxy group, a butoxy group, a pentoxy group, a phenyl group, a naphthyl group, a pyridinyl group, a pyrimidinyl group, a triazinyl group, a dibenzofuranyl group, and a dibenzothiophenyl group; and a methyl group, an ethyl group, a propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decanyl group, an iso-decanyl group, a sec-decanyl group, a tert-decanyl group, a methoxy group, an ethoxy group, a propoxy group, a butoxy group, a pentoxy group, a phenyl group, a naphthyl group, a pyridinyl group, a pyrimidinyl group, a triazinyl group, a dibenzofuranyl group, and a dibenzothiophenyl group, each substituted with at least one selected from —F, a cyano group, and a nitro group, b91 and b94 are each independently 1 or 2, b93 and b95 are each independently selected from 1, 2, and 3, b92 and b96 are each independently selected from 1, 2, 3, and 4.

9. The organic light-emitting device of claim 1, wherein:

a ring formed by B, O, $Z_{11}$, $Z_{12}$, and $(L_{11})_{a11}$ is selected from a 5-membered ring, a 6-membered ring, a 7-membered ring, an 8-membered ring, and a 9-membered ring.

10. The organic light-emitting device of claim 1, wherein:

$T_{11}$ to $T_{14}$ are each a single bond;

$T_{11}$ is O or S, and $T_{12}$ to $T_{14}$ are each a single bond;

$T_{12}$ is O or S, and $T_{11}$, $T_{13}$, and $T_{14}$ are each a single bond;

$T_{13}$ is O or S, and $T_{11}$, $T_{12}$, and $T_{14}$ are each a single bond; or $T_{14}$ is O or S, and $T_{11}$, $T_{12}$, and $T_{13}$ are each a single bond.

11. The organic light-emitting device of claim 1, wherein:

$L_{11}$ to $L_{14}$ are each independently selected from a single bond, *—O—*', *—S—*', *—C($R_{15}$)($R_{16}$)-*', *—C($R_{15}$)=*', *=C($R_{15}$)-*', *—B($R_{15}$)-*', *—N($R_{15}$)-*', *—Si($R_{15}$)($R_{16}$)-*', and *—P($R_{15}$)($R_{16}$)-*'.

12. The organic light-emitting device of claim 1, wherein:

a11 is 0 or 1.

13. The organic light-emitting device of claim 1, wherein:

a12, a13, and a14 are each independently selected from 1, 2, and 3;

a12 is 0, and a13 and a14 are each independently selected from 1, 2, and 3;

a13 is 0, and a12 and a14 are each independently selected from 1, 2, and 3; or a14 is 0, and a12 and a13 are each independently selected from 1, 2, and 3.

14. The organic light-emitting device of claim 1, wherein:

$R_{11}$ to $R_{14}$, $R_{17}$, and $R_{18}$ are each independently selected from:

hydrogen, deuterium, —F, —Cl, —Br, —I, a cyano group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a cyano group, a phenyl group, and a biphenyl group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, an isoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, and an indolocarbazolyl group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, an isoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, and an indolocarbazolyl group, each substituted with at least one selected from deuterium, —F, —Cl, —Br, —I, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, an isoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, an indolocarbazolyl group, —Si($Q_{31}$)($Q_{32}$)($Q_{33}$), —N($Q_{31}$)($Q_{32}$), —B($Q_{31}$)

$(Q_{32})$, —C(=O)$(Q_{31})$, —S(=O)$(Q_{31})$, —S(=O)$_2(Q_{31})$, —P(=O)$(Q_{31})(Q_{32})$, and —P(=S)$(Q_{31})(Q_{32})$; and —Si$(Q_1)(Q_2)(Q_3)$, —B$(Q_1)(Q_2)$, —N$(Q_1)(Q_2)$, —P$(Q_1)(Q_2)$, —C(=O)$(Q_1)$, —S(=O)$(Q_1)$, —S(=O)$_2(Q_1)$, —P(=O)$(Q_1)(Q_2)$, and —P(=S)$(Q_1)(Q_2)$, and $Q_1$ to $Q_3$ and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

15. The organic light-emitting device of claim 1, wherein:

$R_{11}$ to $R_{14}$, $R_{17}$, and $R_{18}$ are each independently selected from:

hydrogen, deuterium, —F, —Cl, —Br, —I, a cyano group, a methyl group, an ethyl group, an n-propyl group, an iso-propyl group, an n-butyl group, an iso-butyl group, a sec-butyl group, and a tert-butyl group;

a methyl group, an ethyl group, an n-propyl group, an iso-propyl group, an n-butyl group, an iso-butyl group, a sec-butyl group, and a tert-butyl group, each substituted with at least one selected from deuterium, —F, —Cl, —Br, —I and a cyano group; and a phenyl group, a naphthyl group, and a pyridinyl group.

16. The organic light-emitting device of claim 1, wherein:

the organometallic compound represented by Formula 1 is represented by one of Formulae 1-1 to 1-4:

1-1

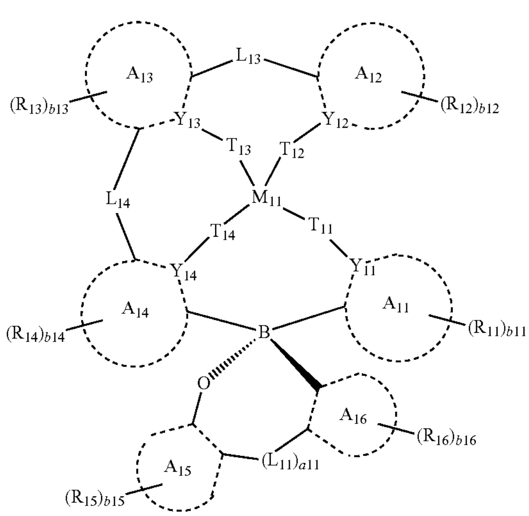

-continued 1-2

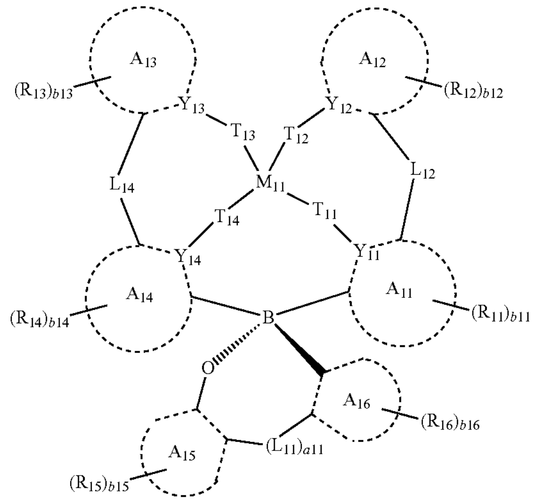

1-3

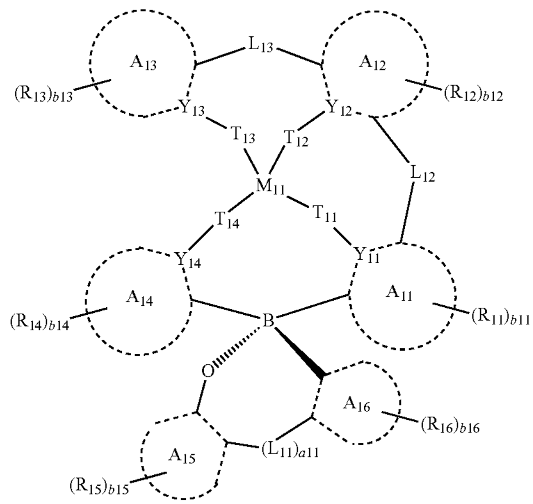

1-4

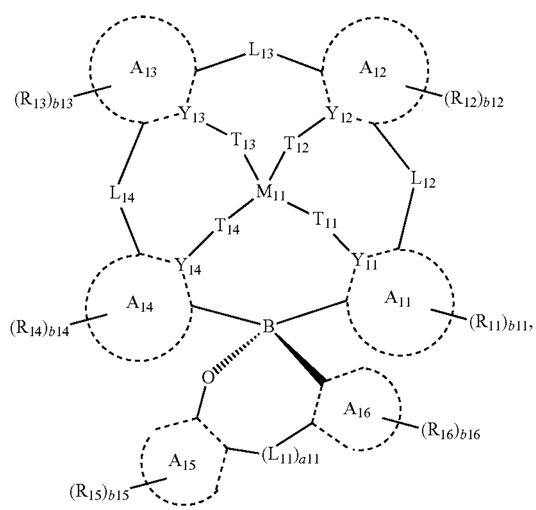

wherein, in Formulae 1-1 to 1-4, $M_{11}$, $A_{11}$ to $A_{14}$, $Y_{11}$ to $Y_{14}$, $T_{11}$ to $T_{14}$, $L_{11}$ to $L_{14}$, a11 to a14, $R_{11}$ to $R_{14}$, and b11 to b14 are each independently the same as described in Formula 1, $A_{15}$ and $A_{16}$ are each independently a $C_5$-$C_{60}$ carbocyclic group or a $C_1$-$C_{60}$ heterocyclic group, $R_{15}$ and $R_{16}$ are each independently the same as described in connection with $R_{11}$ in Formula 1, and b15 and b16 are each independently the same as described in connection with b11 in Formula 1.

17. The organic light-emitting device of claim 1, wherein:

the organometallic compound represented by Formula 1 is selected from Compounds below:

4

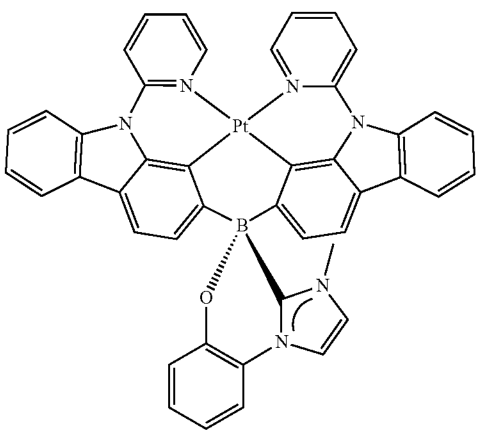

5

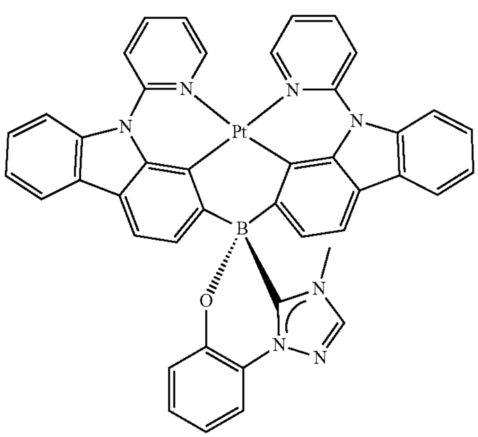

9

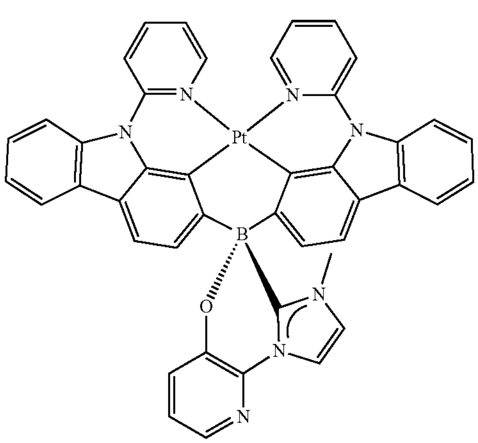

-continued

10

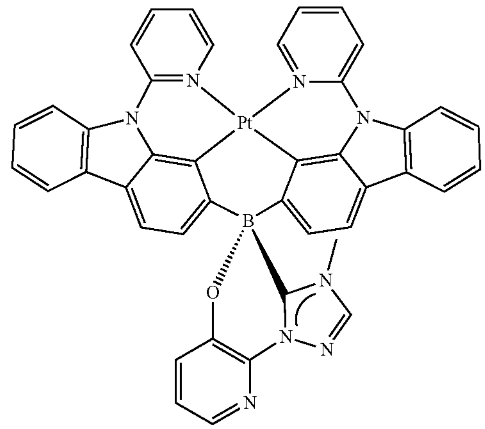

14

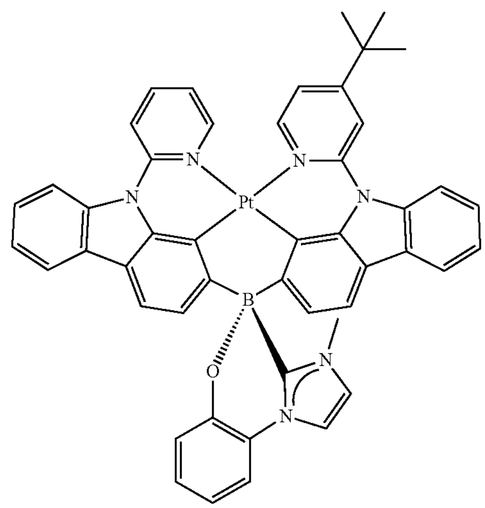

15

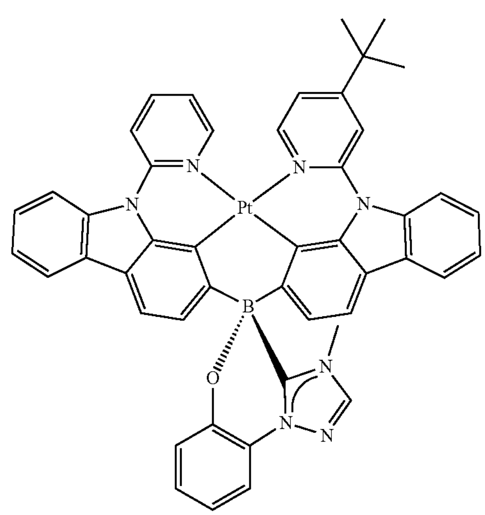

-continued
19
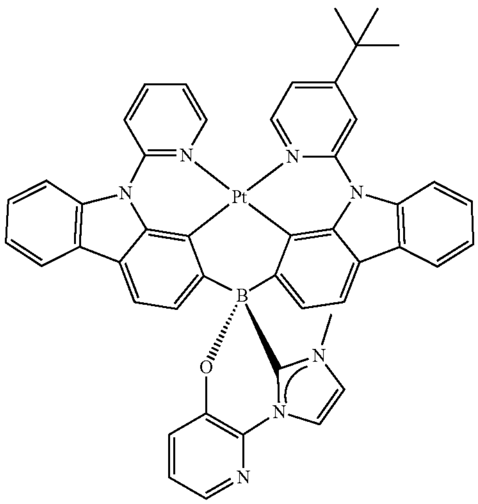
20
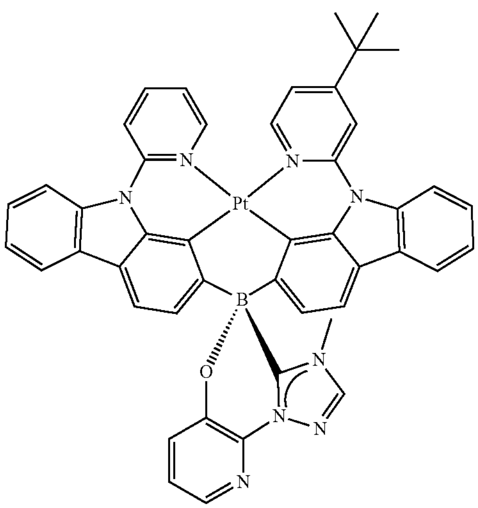
24
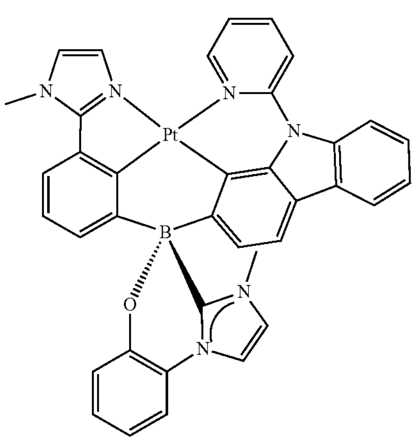
-continued
25
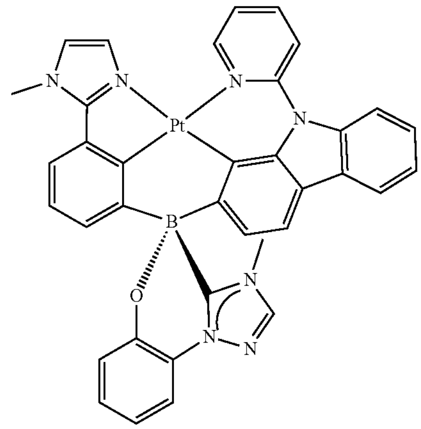
29
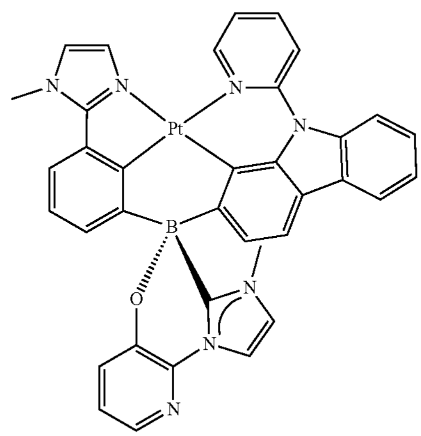
30
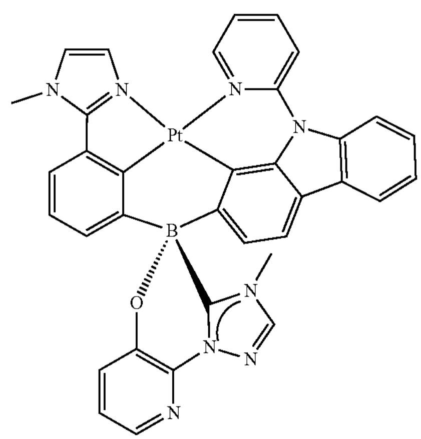

-continued
34
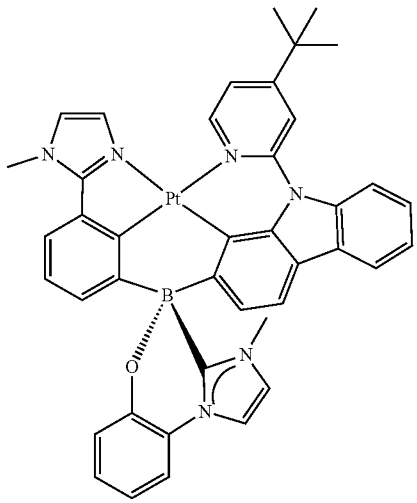
35
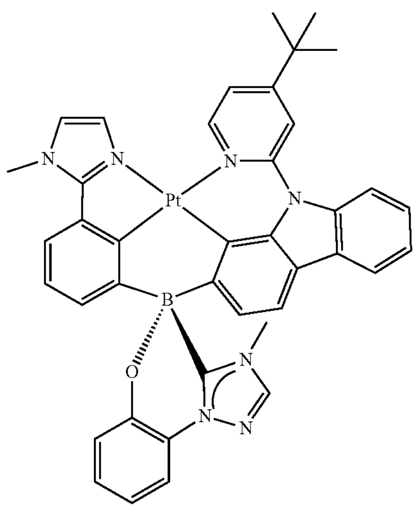
39
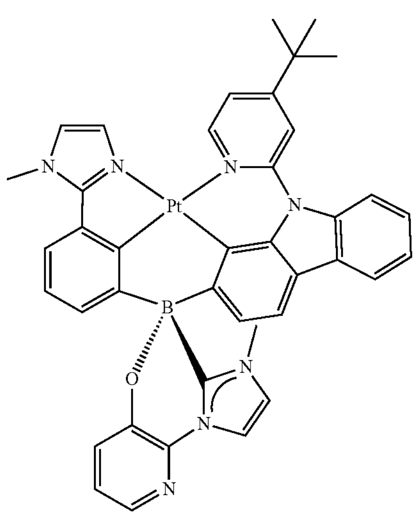
-continued
40
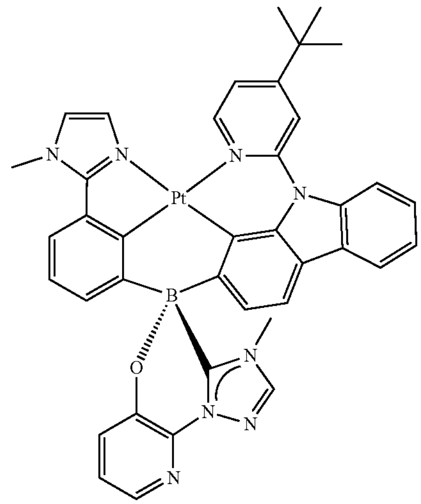
44
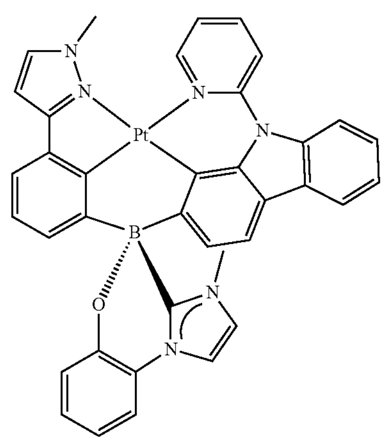
45
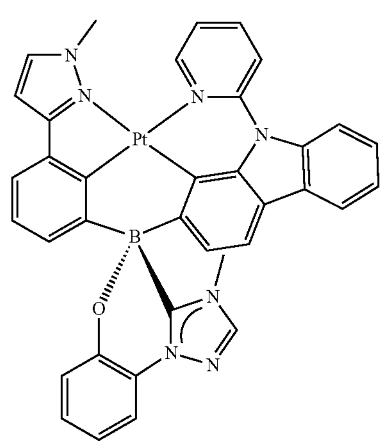

49
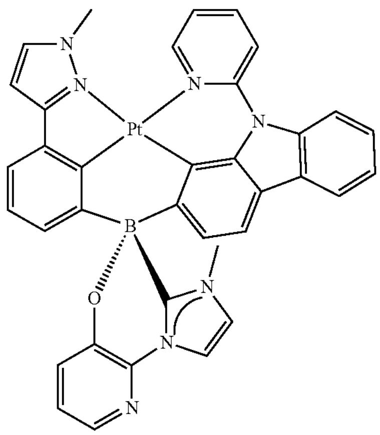
50
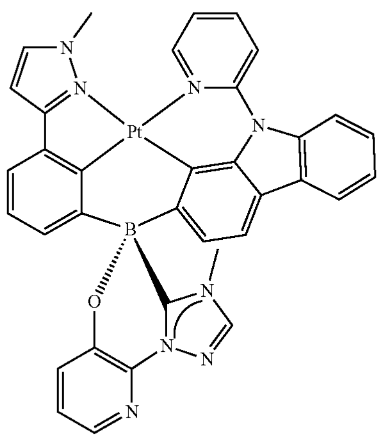
54
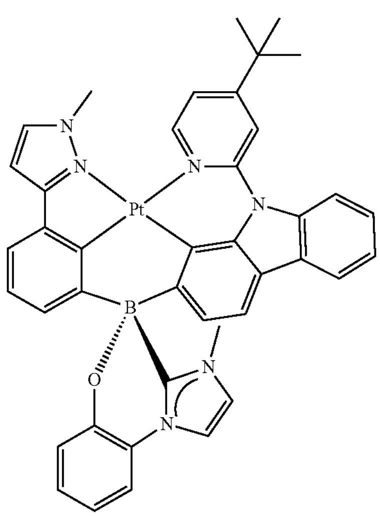
55
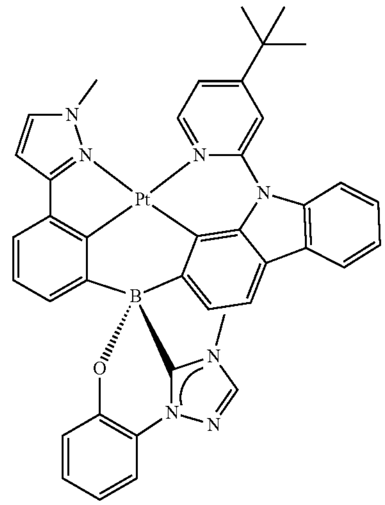
59
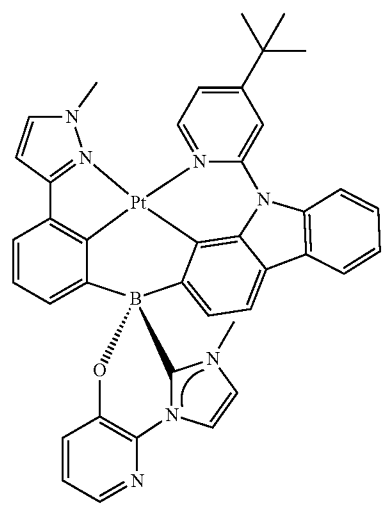
60
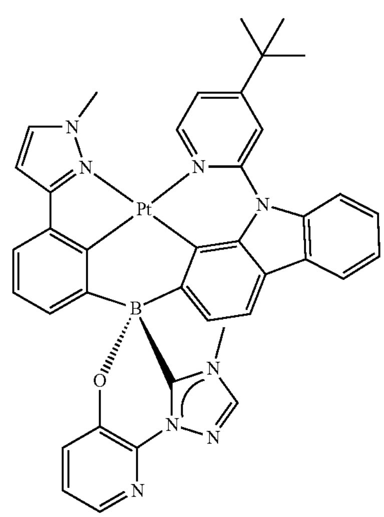

-continued
64
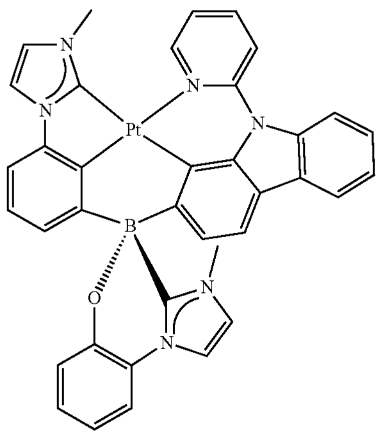
65
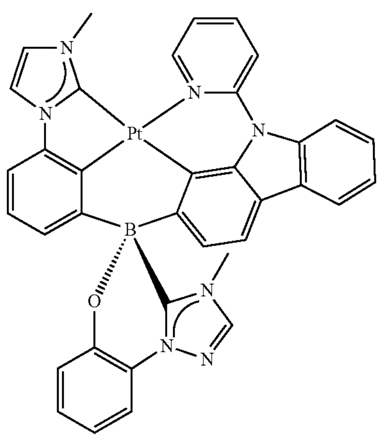
69
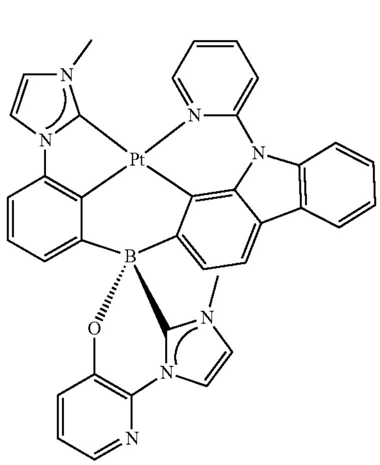
-continued
70
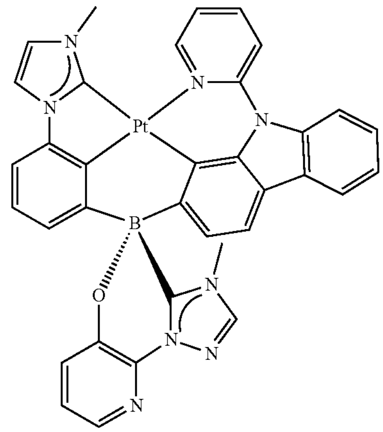
74
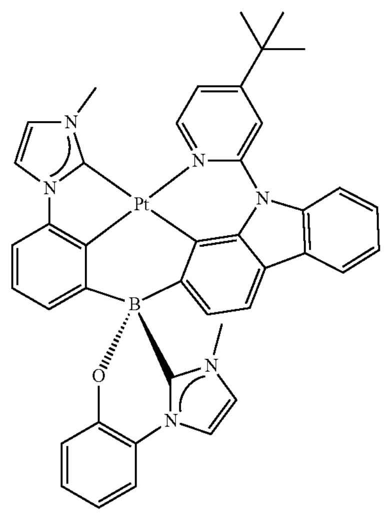
75
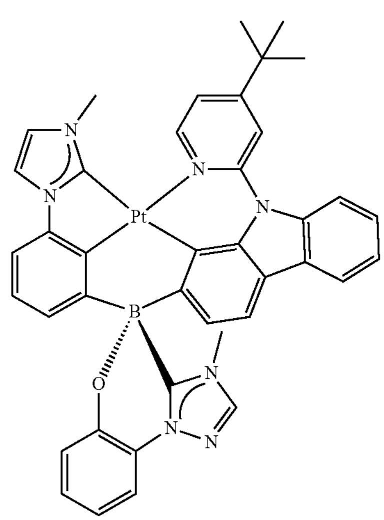

-continued
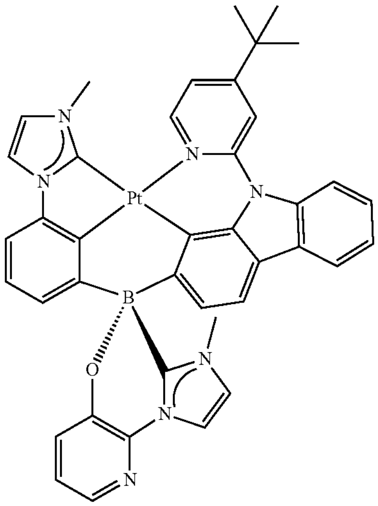
79
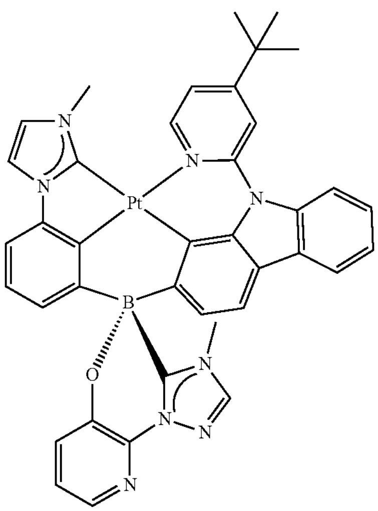
80
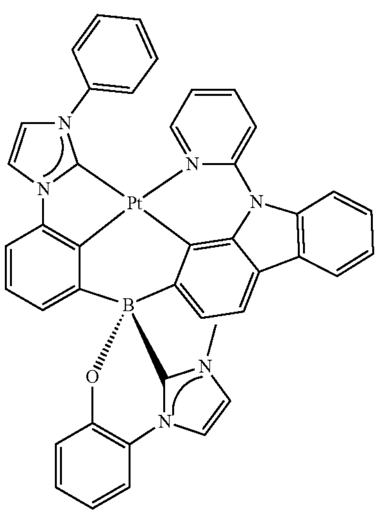
84
-continued
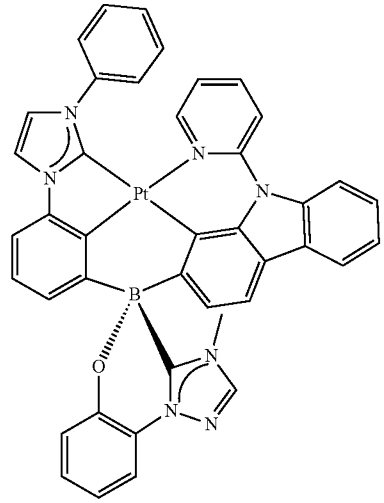
85
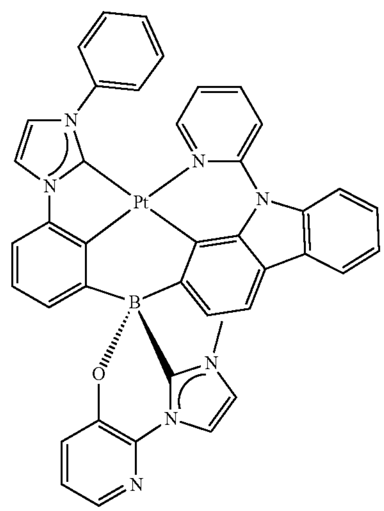
89
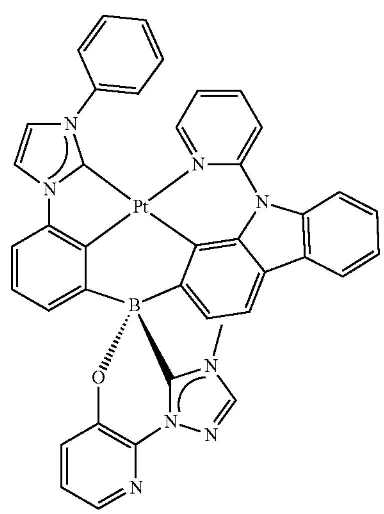
90

-continued
94
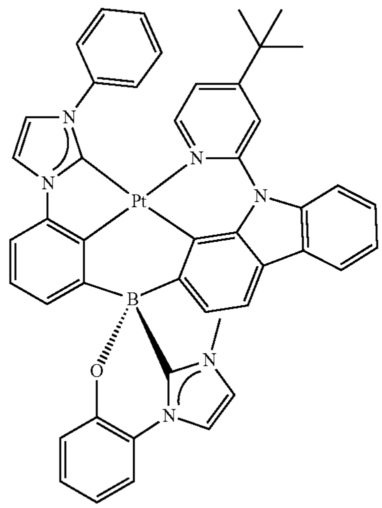
95
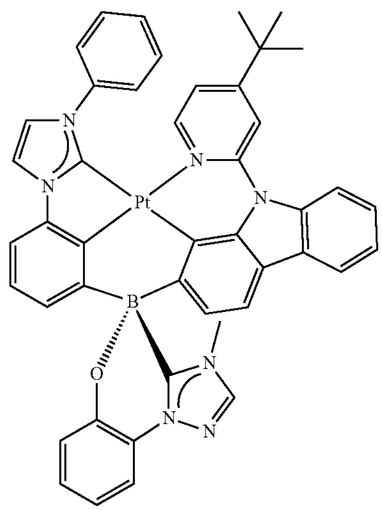
99
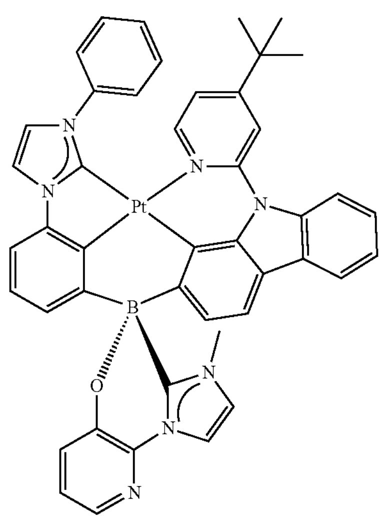
-continued
100
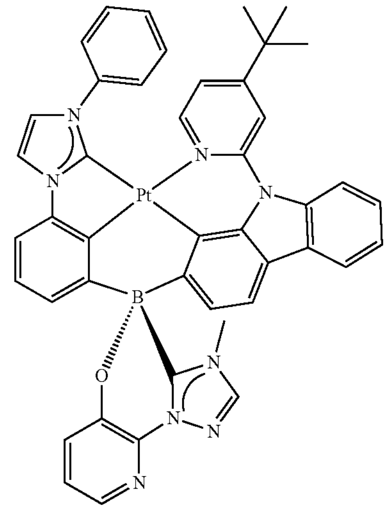
104
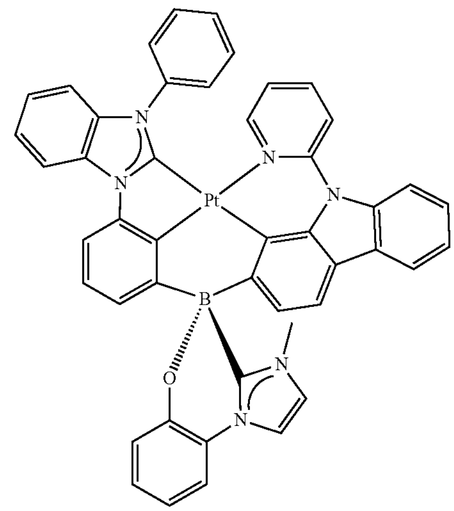
105
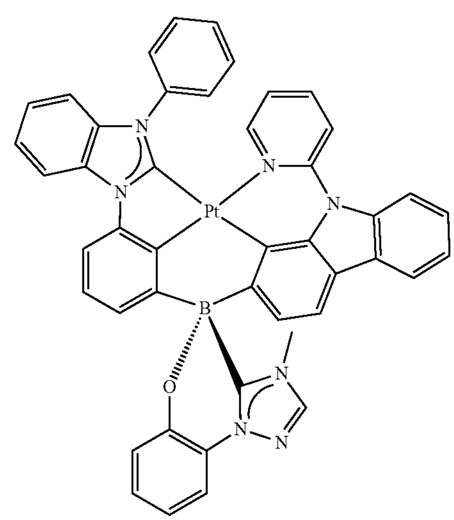

-continued
109
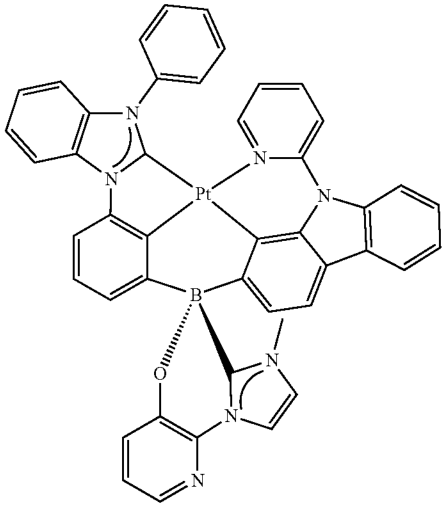
110
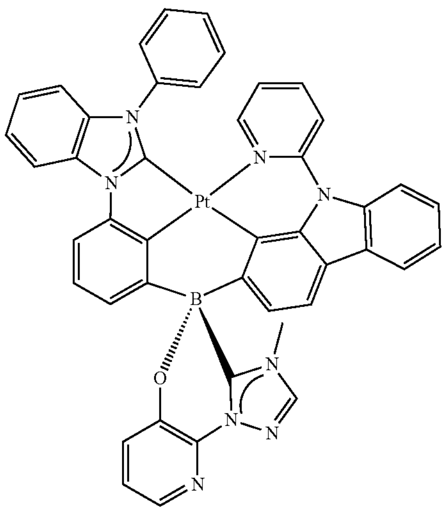
114
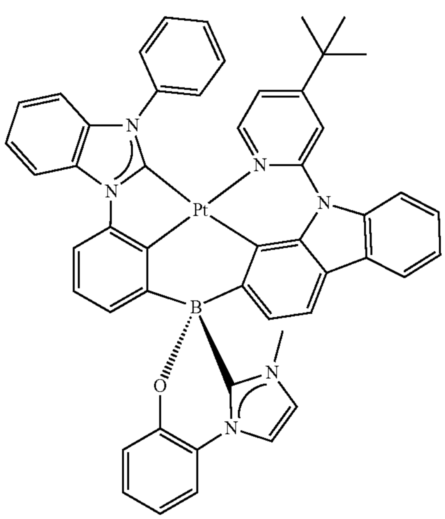
-continued
115
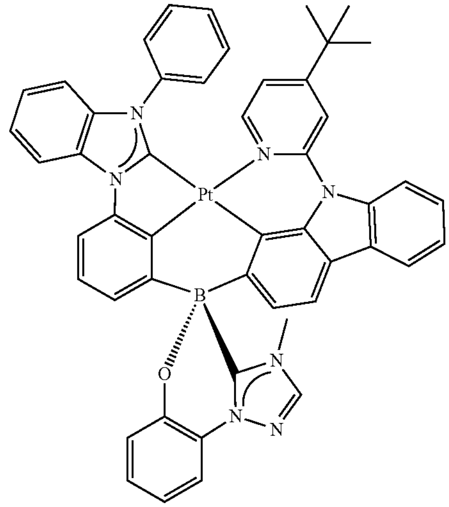
119
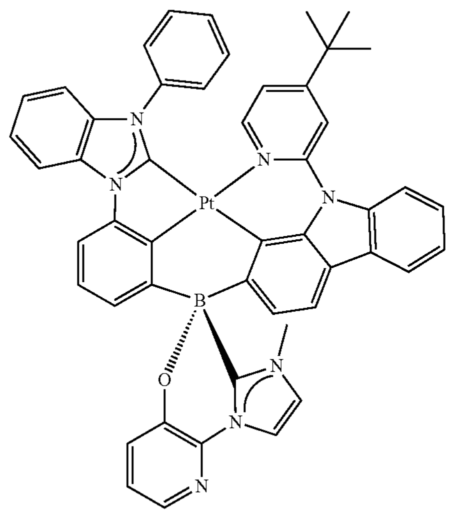
120
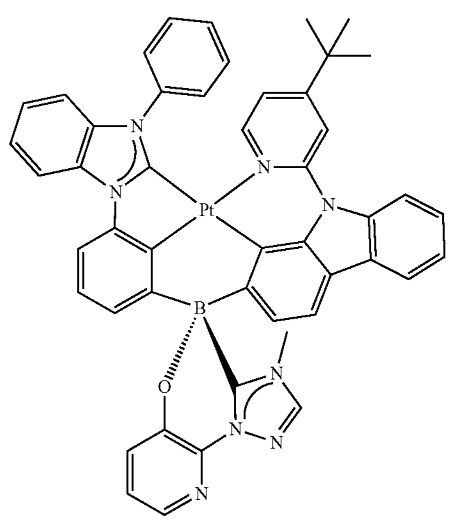

-continued
124
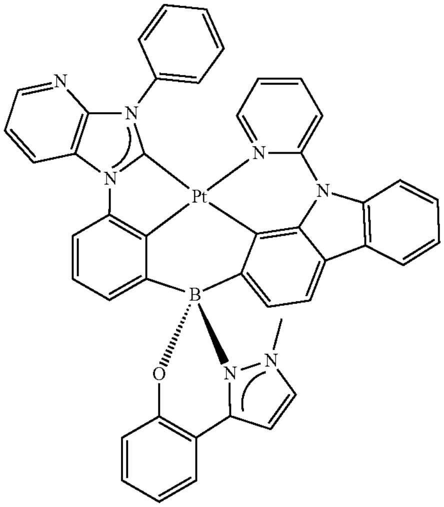
125
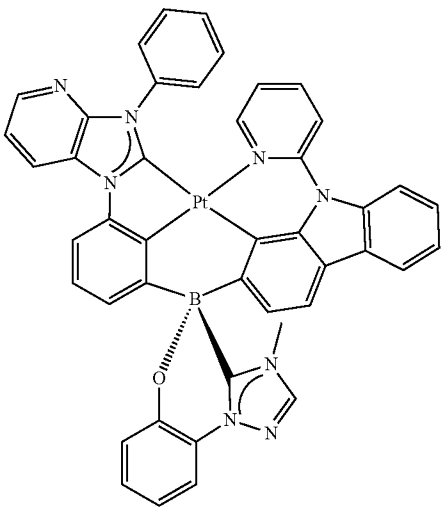
129
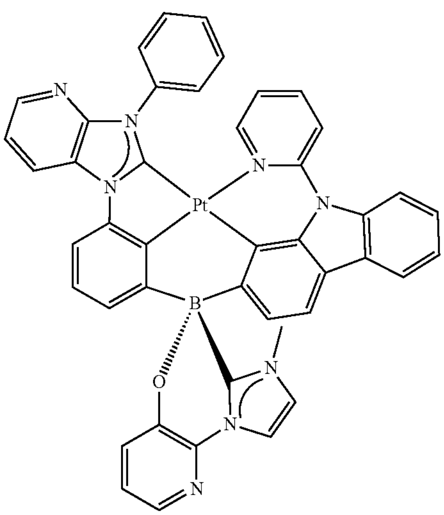
-continued
130
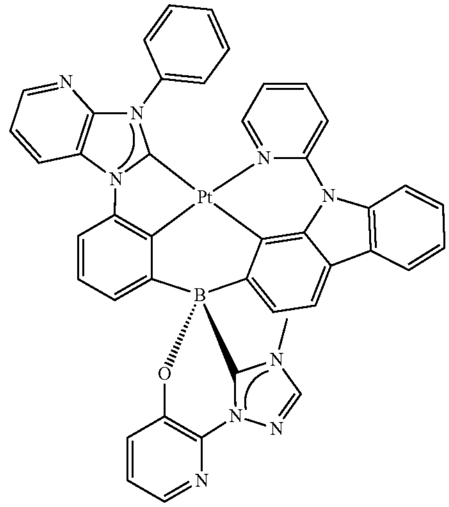
134
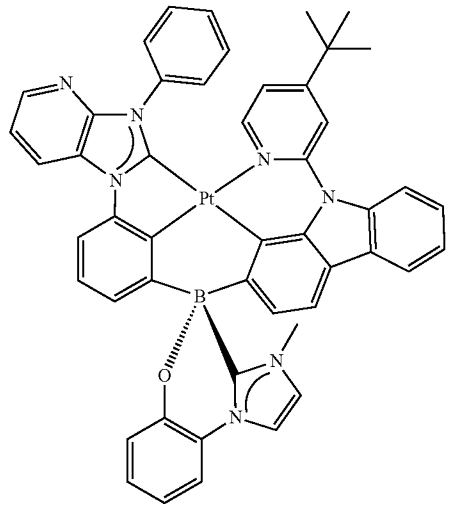
135
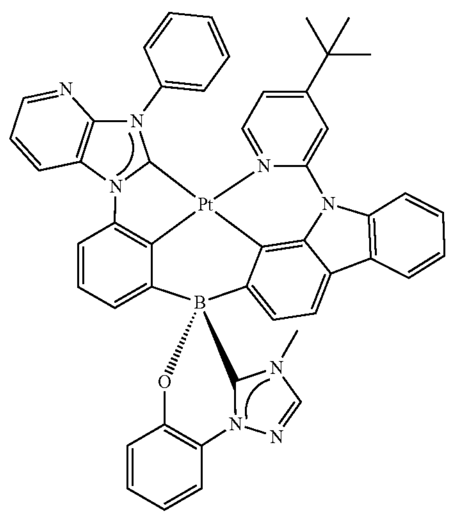

-continued
139
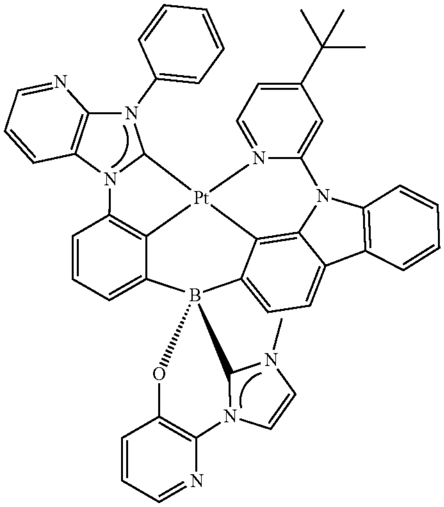
140
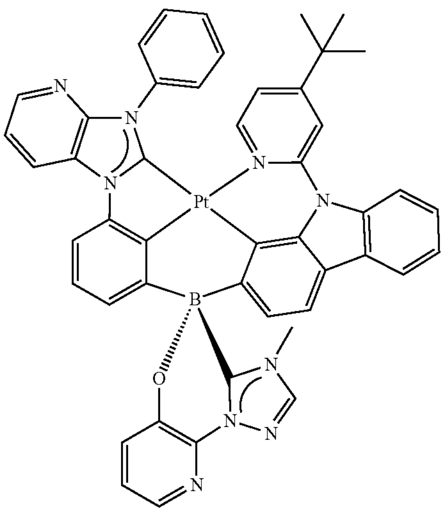
144
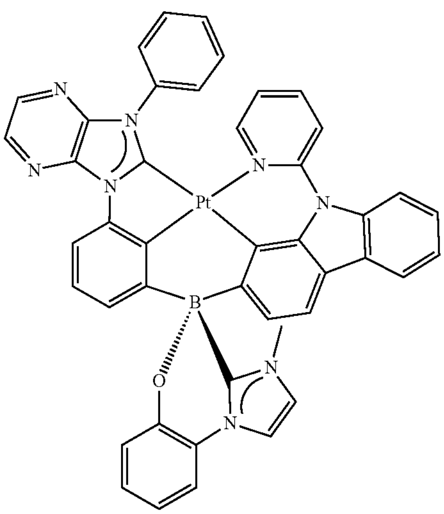
-continued
145
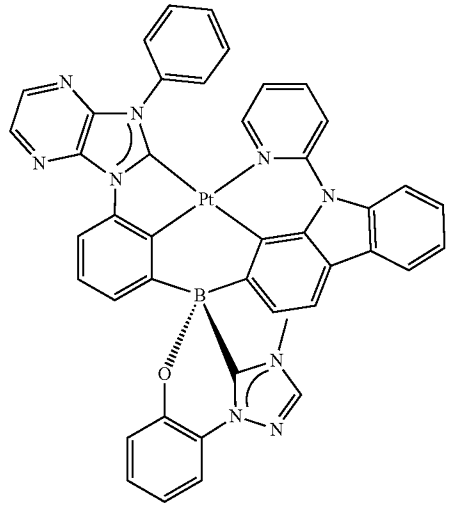
149
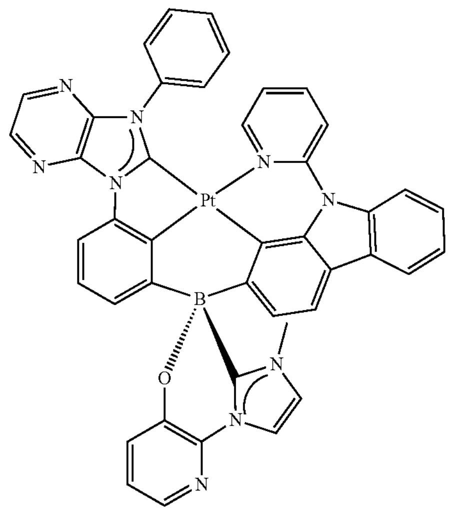
150
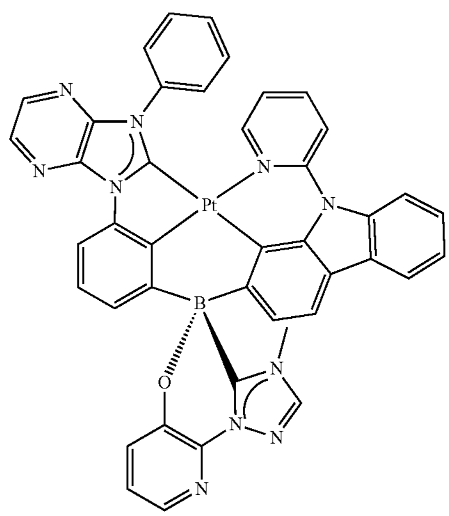

-continued
154
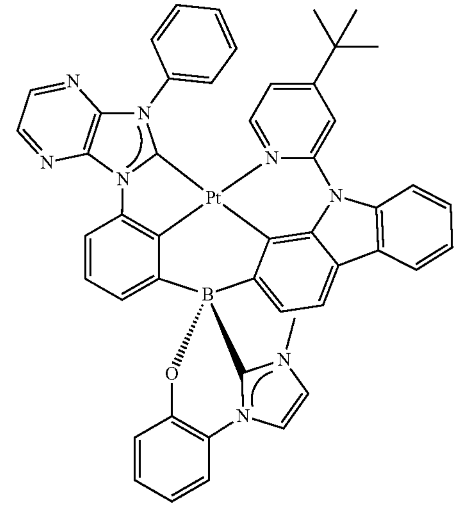
155
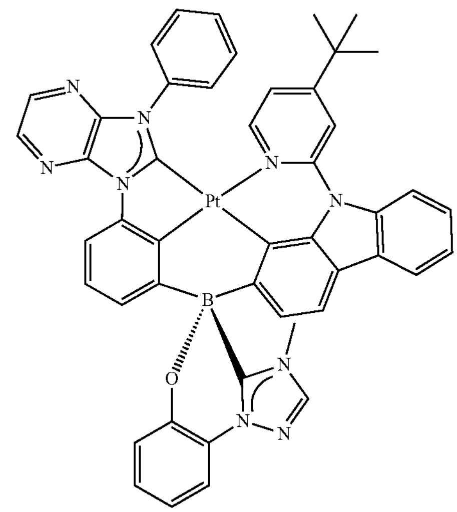
159
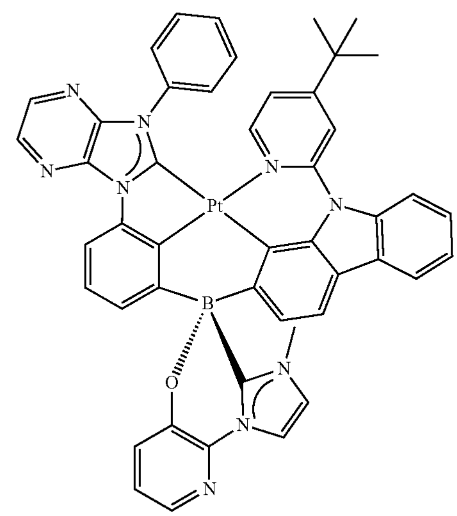
-continued
160
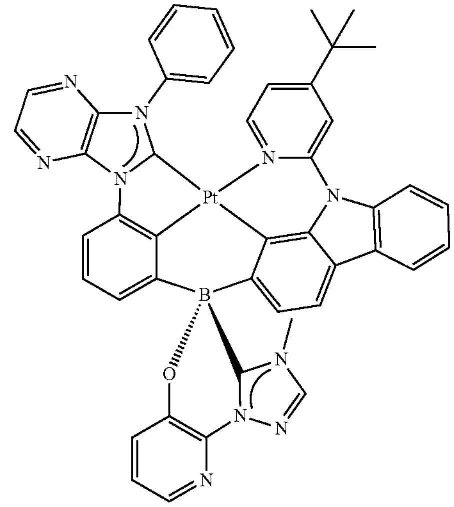
164
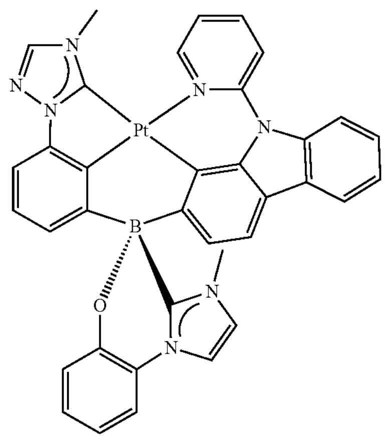
165
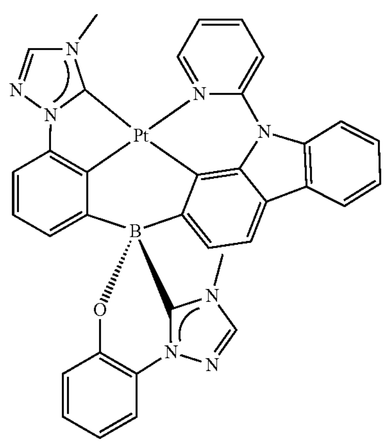

-continued
169
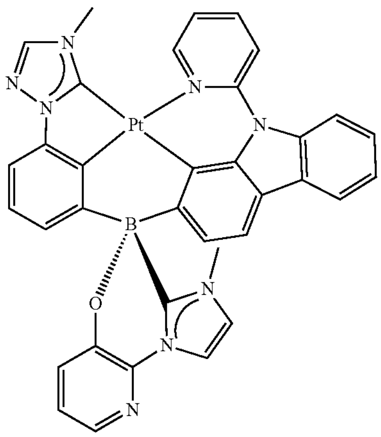
170
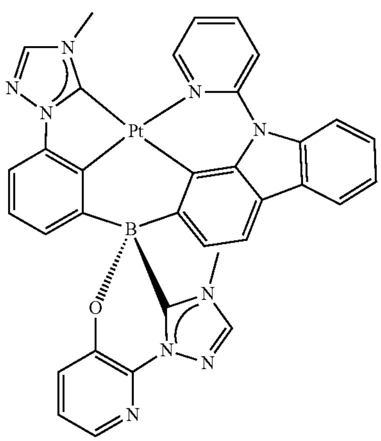
174
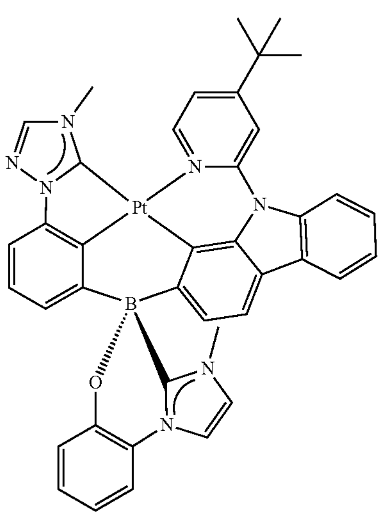
-continued
175
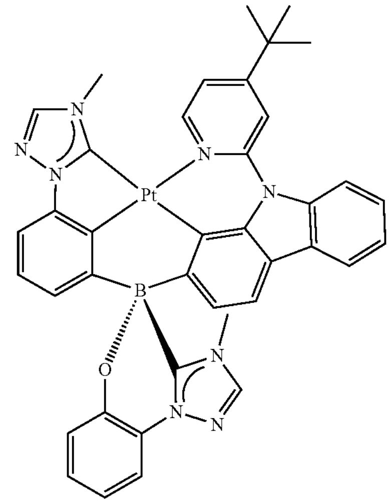
179
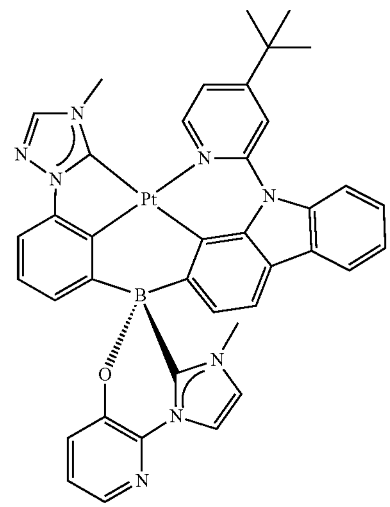
180
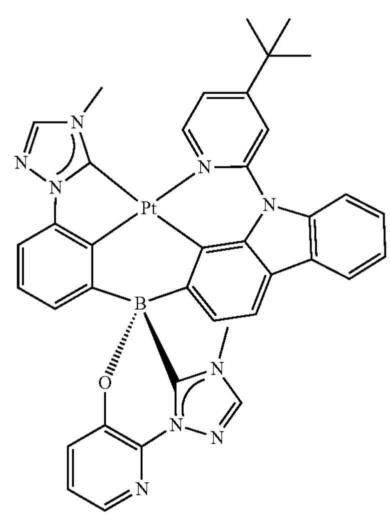

-continued
184
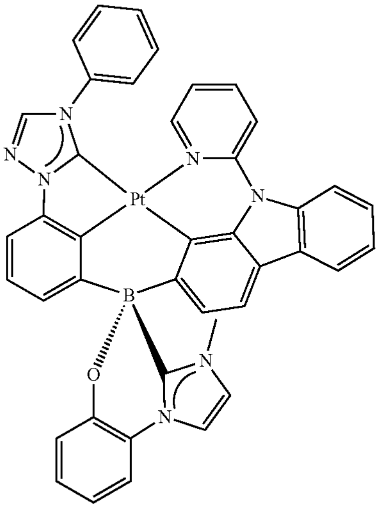
185
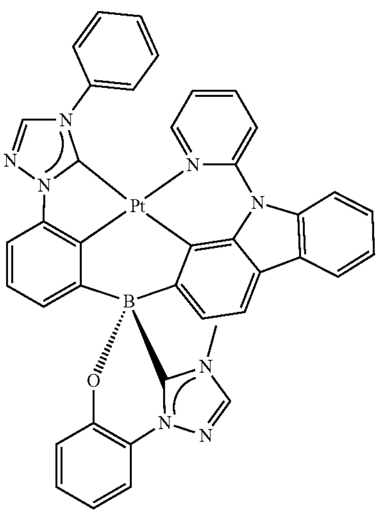
189
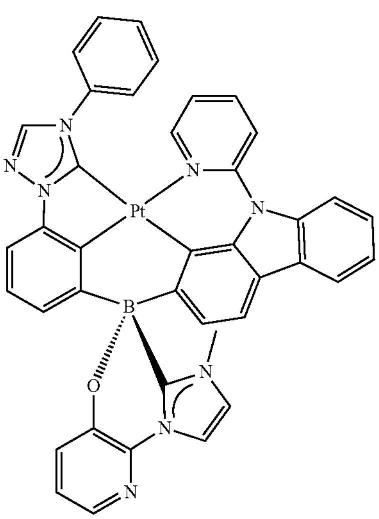
-continued
190
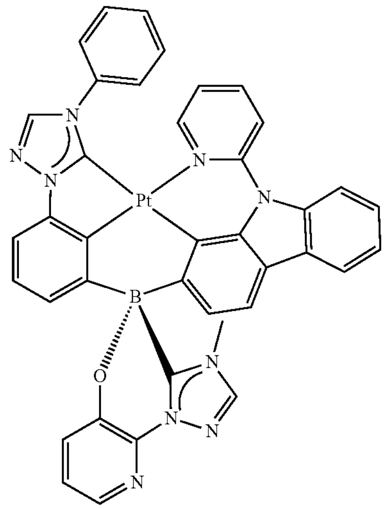
194
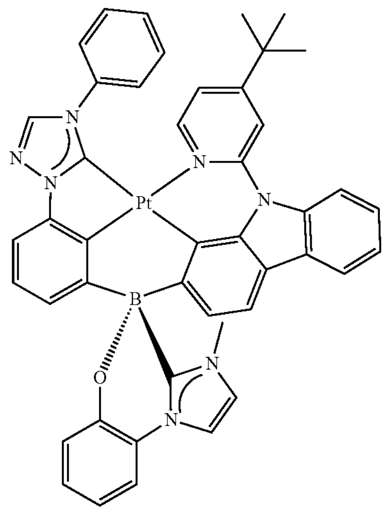
195
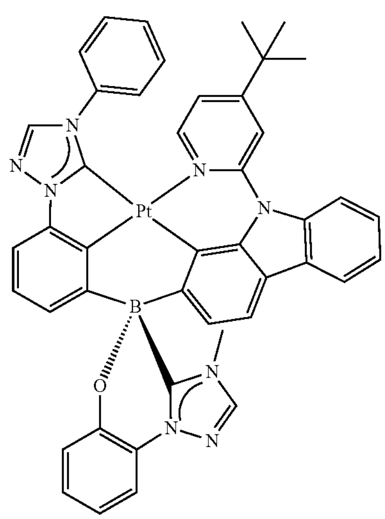

-continued
199
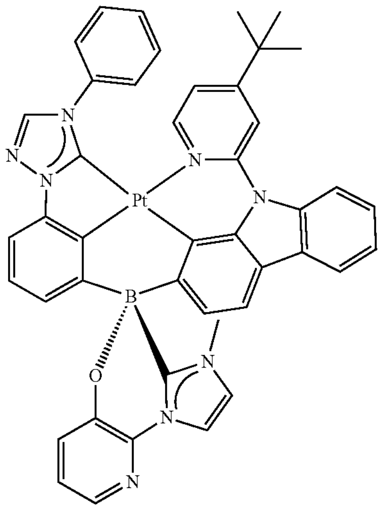
200
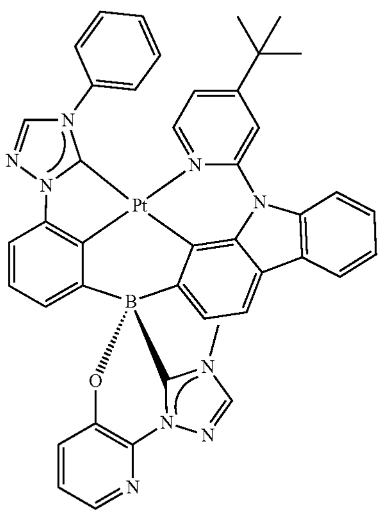
204
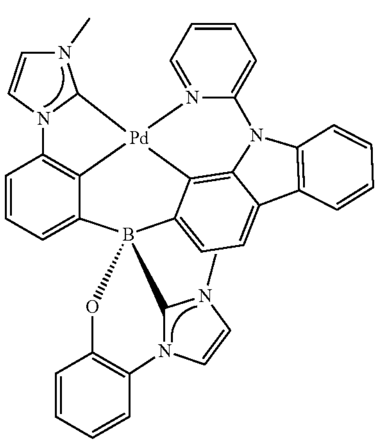
-continued
205
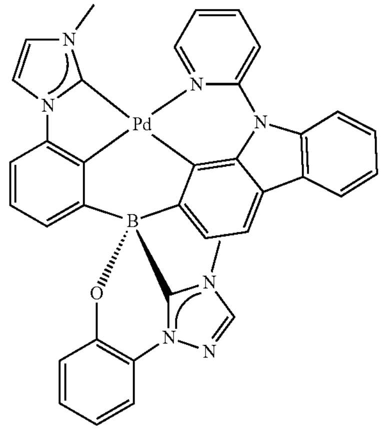
209
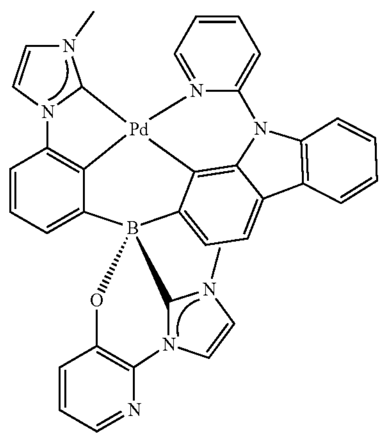
210
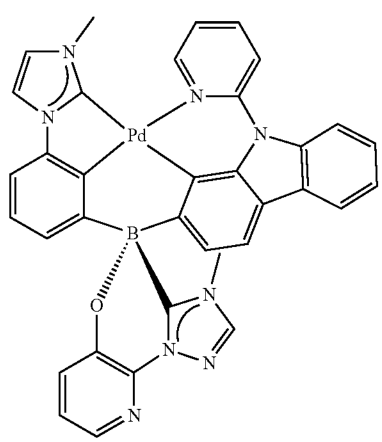

214
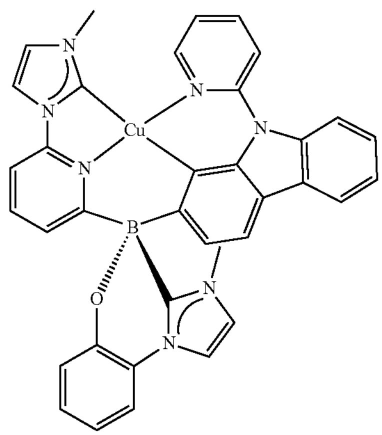
215
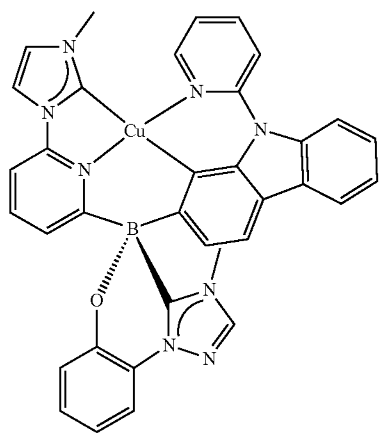
219
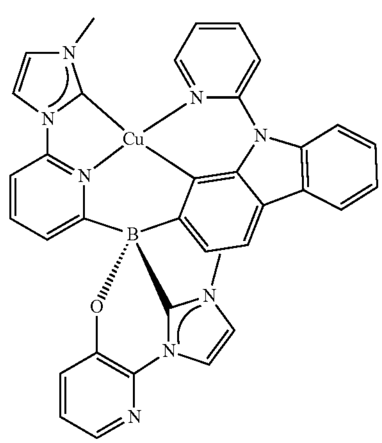
220
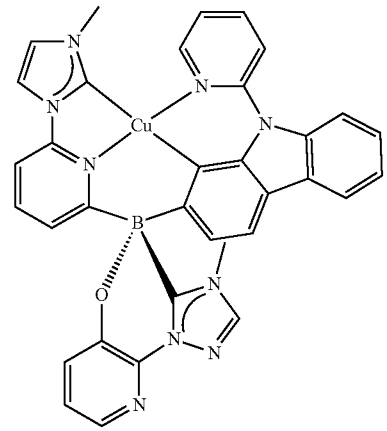
224
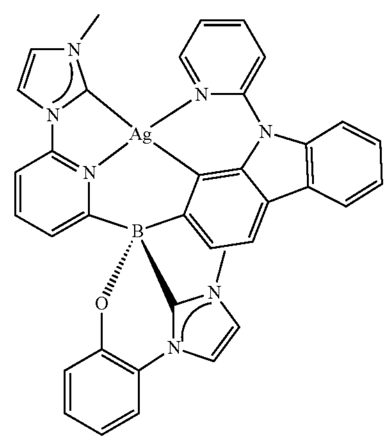
225
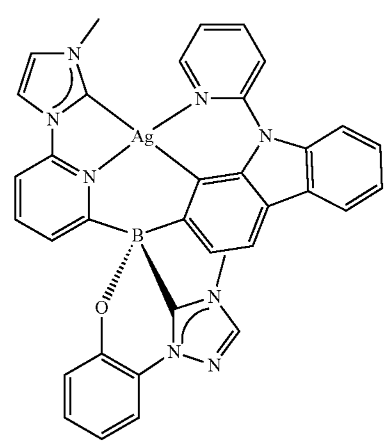

229
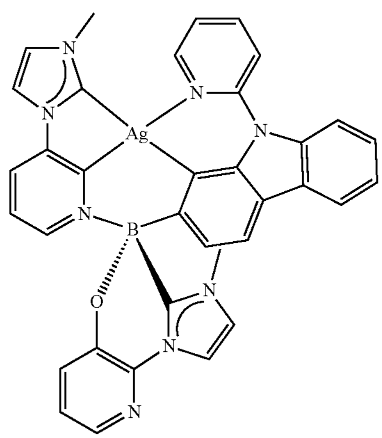
230
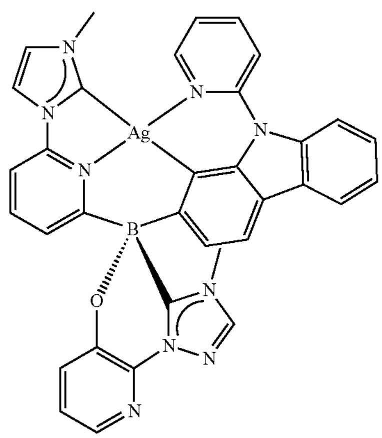
234
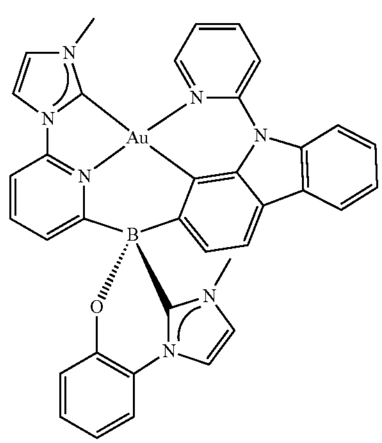
235
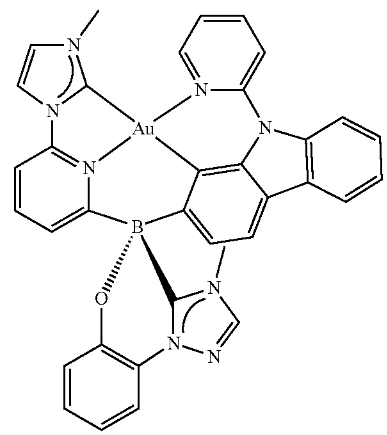
239
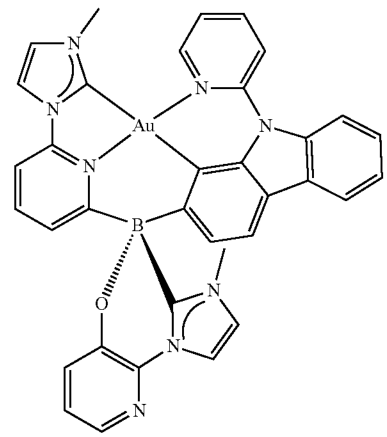
240
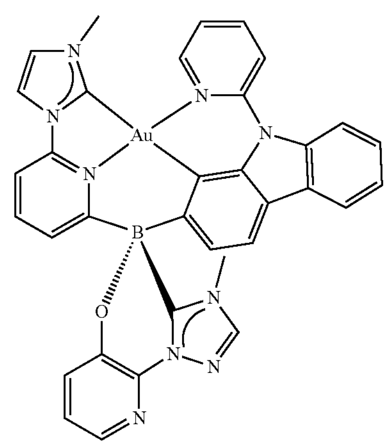

-continued
246
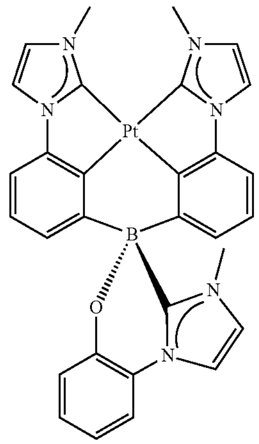
247
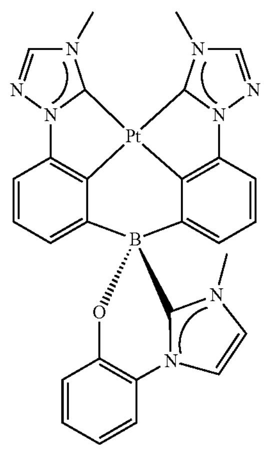
248
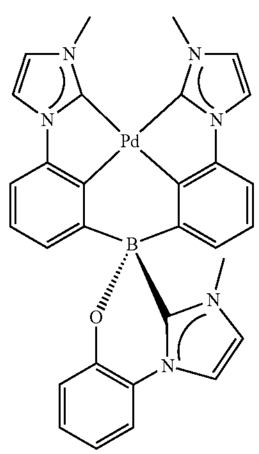
-continued
249
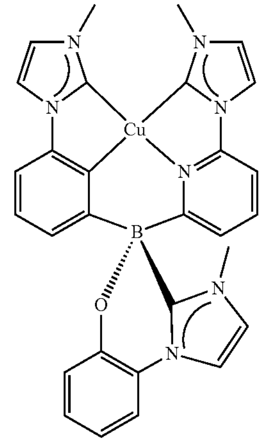
250
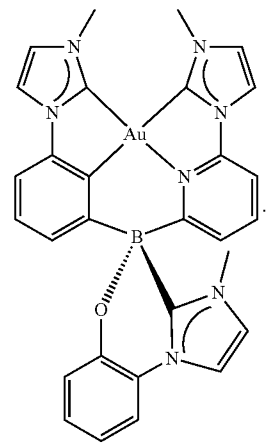
18. The organic light-emitting device of claim 1, wherein: the emission layer further comprises a fluorescent dopant.
19. An organometallic compound represented by Formula 1:
Formula 1
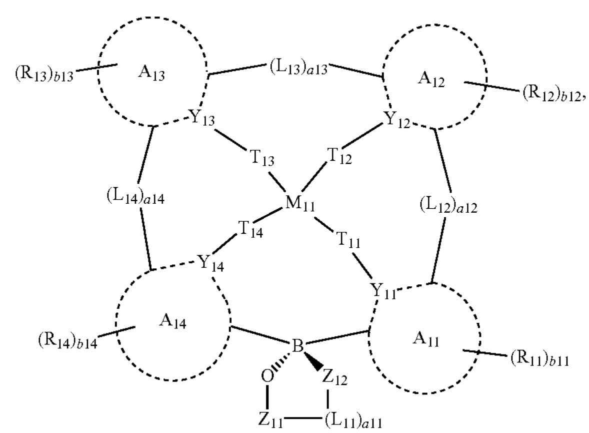
wherein, in Formula 1,
$M_{11}$ is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm), $A_{11}$ to $A_{14}$ are each independently a $C_5$-$C_{60}$ carbocyclic group or a $C_1$-$C_{60}$ heterocyclic group, $Y_{11}$ to $Y_{14}$ are each independently N or C, $Z_{11}$ selected from N, C, O, S, a single bond, a substituted or unsubstituted $C_5$-$C_{60}$ carbocyclic group, and a substituted or unsubstituted $C_1$-$C_{60}$ heterocyclic group, $Z_{12}$ is a substituted or unsubstituted $C_2$ or $C_3$ heterocyclic group, wherein $Z_{12}$ is not a pyridine group, a bond between the B atom and the O atom is a covalent bond, a bond between the B atom and $Z_{12}$ is a coordinate bond, the B atom is coordinated with a C atom of $Z_{12}$, $T_{11}$ to $T_{14}$ are each independently selected from a single bond, O, and S, $L_{11}$ to $L_{14}$ are each independently selected from a single bond, *—O—*', *—S—*', *—C($R_{17}$)($R_{18}$)-*', *—C($R_{17}$)=*', *=C($R_{17}$)-*', *—C($R_{17}$)=C($R_{18}$)-*', *—C(=O)—*', *—C(=S)—*', *—B($R_{17}$)-*', *—N($R_{17}$)-*', *—P($R_{17}$)-*', *—Si($R_{17}$)($R_{18}$)-*', *—P($R_{17}$)($R_{18}$)-*', and *—Ge($R_{17}$)($R_{18}$)-*', a11 to a14 are each independently selected from 0, 1, 2, and 3, at least two of a12, a13, and a14 are each independently selected from 1, 2, and 3, when a11 is zero, $(L_{11})_{a11}$ is a single bond, when a12 is zero, $A_{11}$ and $A_{12}$ are not linked to each other, when a13 is zero, $A_{12}$ and $A_{13}$ are not linked to each other, and when a14 is zero, $A_{13}$ and $A_{14}$ are not linked to each other, $R_{11}$ to $R_{14}$, $R_{17}$, and $R_{18}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$ ($Q_1$), —P(=O)($Q_1$)($Q_2$), and —P(=S)($Q_1$)($Q_2$), $R_{17}$ and $R_{11}$, $R_{17}$ and $R_{12}$, $R_{17}$ and $R_{13}$, and/or $R_{17}$ and $R_{14}$ are optionally linked to form a substituted or unsubstituted $C_5$-$C_{60}$ carbocyclic group or a substituted or unsubstituted $C_1$-$C_{60}$ heterocyclic group, $R_{17}$ and $R_{18}$ are optionally linked to form a substituted or unsubstituted $C_5$-$C_{60}$ carbocyclic group or a substituted or unsubstituted $C_1$-$C_{60}$ heterocyclic group, b11 to b14 are each independently selected from 1, 2, 3, 4, 5, 6, 7, and 8, $Q_1$ to $Q_3$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group, and

* and *' each indicate a binding site to a neighboring atom.

* * * * *